(12) United States Patent
Hatakeyama et al.

(10) Patent No.: US 8,507,175 B2
(45) Date of Patent: Aug. 13, 2013

(54) PATTERNING PROCESS AND RESIST COMPOSITION

(75) Inventors: Jun Hatakeyama, Joetsu (JP); Masaki Ohashi, Joetsu (JP); Youichi Ohsawa, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 195 days.

(21) Appl. No.: 12/905,426

(22) Filed: Oct. 15, 2010

(65) Prior Publication Data

US 2011/0091812 A1    Apr. 21, 2011

(30) Foreign Application Priority Data

Oct. 16, 2009  (JP) .................. 2009-239019

(51) Int. Cl.
*G03F 7/00*   (2006.01)
*G03F 7/004*  (2006.01)
*G03F 7/20*   (2006.01)
*G03F 7/028*  (2006.01)

(52) U.S. Cl.
USPC .................. 430/270.1; 430/913; 430/919

(58) Field of Classification Search
USPC .................... 430/270.1, 913, 919
See application file for complete search history.

(56) References Cited

U.S. PATENT DOCUMENTS

| | | | |
|---|---|---|---|
| 5,545,509 A | 8/1996 | Cameron et al. | |
| 5,726,246 A * | 3/1998 | Rehfuss et al. | 525/100 |
| 5,776,660 A | 7/1998 | Hakey et al. | |
| 6,114,082 A | 9/2000 | Hakey et al. | |
| 6,200,726 B1 | 3/2001 | Chen et al. | |
| 6,235,858 B1 * | 5/2001 | Swarup et al. | 526/301 |
| 6,313,492 B1 | 11/2001 | Hakey et al. | |
| 6,338,934 B1 * | 1/2002 | Chen et al. | 430/270.1 |
| 6,448,420 B1 | 9/2002 | Kinsho et al. | |

(Continued)

FOREIGN PATENT DOCUMENTS

| | | |
|---|---|---|
| JP | 07-134399 A | 5/1995 |
| JP | 10007709 A * | 1/1998 |

(Continued)

OTHER PUBLICATIONS

Cameron, J. F. et al. "Photogeneration of Organic Bases from o-Nitrobenzyl-Derived Carbamates," Journal of the American Chemical Society, Dec. 17, 1990, vol. 113, pp. 4303-4313, cited in spec.

(Continued)

*Primary Examiner* — Amanda C. Walke
(74) *Attorney, Agent, or Firm* — Westerman, Hattori, Daniels & Adrian, LLP

(57) ABSTRACT

The process forms a pattern by applying a resist composition onto a substrate to form a resist film, baking, exposure, post-exposure baking, and development. The resist composition comprises a polymer comprising recurring units having an acid labile group and substantially insoluble in alkaline developer, a PAG, a PBG capable of generating an amino group, a quencher for neutralizing the acid from PAG for inactivation, and an organic solvent. A total amount of amino groups from the quencher and PBG is greater than an amount of acid from PAG. An unexposed region and an over-exposed region are not dissolved in developer whereas only an intermediate exposure dose region is dissolved in developer. Resolution is doubled by splitting a single line into two through single exposure and development.

21 Claims, 14 Drawing Sheets

(56) References Cited

U.S. PATENT DOCUMENTS

| | | | |
|---|---|---|---|
| 6,858,693 B2 * | 2/2005 | Campbell et al. ............ 526/301 |
| 7,455,952 B2 | 11/2008 | Hatakeyama et al. |
| 7,537,880 B2 | 5/2009 | Harada et al. |
| 7,642,034 B2 | 1/2010 | Hatakeyama et al. |
| 7,670,750 B2 | 3/2010 | Harada et al. |
| 7,838,200 B2 * | 11/2010 | Chen et al. ................ 430/270.1 |
| 8,008,416 B2 * | 8/2011 | Ohrbom ....................... 526/301 |
| 8,057,982 B2 * | 11/2011 | Hatakeyama et al. ..... 430/270.1 |
| 8,114,571 B2 * | 2/2012 | Ohashi et al. .............. 430/270.1 |
| 8,129,086 B2 * | 3/2012 | Hatakeyama et al. ..... 430/270.1 |
| 8,198,016 B2 * | 6/2012 | Hatakeyama et al. ........ 430/312 |
| 8,236,476 B2 * | 8/2012 | Chen et al. ................ 430/270.1 |
| 8,273,521 B2 * | 9/2012 | Sato et al. ................. 430/270.1 |
| 2002/0115874 A1 | 8/2002 | Kinsho et al. |
| 2005/0233254 A1 | 10/2005 | Hatakeyama et al. |
| 2007/0122741 A1 | 5/2007 | Hatakeyama et al. |
| 2007/0231738 A1 | 10/2007 | Kaneko et al. |
| 2008/0085466 A1 | 4/2008 | Harada et al. |
| 2008/0090172 A1 | 4/2008 | Hatakeyama et al. |
| 2008/0241752 A1 * | 10/2008 | Mizutani et al. ........... 430/286.1 |
| 2009/0197200 A1 | 8/2009 | Hatakeyama et al. |
| 2010/0070787 A1 * | 3/2010 | Bieswanger et al. ......... 713/322 |
| 2010/0304297 A1 * | 12/2010 | Hatakeyama et al. ..... 430/270.1 |
| 2011/0033803 A1 * | 2/2011 | Hatakeyama et al. ..... 430/285.1 |
| 2011/0070542 A1 * | 3/2011 | Wang et al. ................ 430/270.1 |
| 2011/0086311 A1 * | 4/2011 | Katayama et al. ......... 430/280.1 |

FOREIGN PATENT DOCUMENTS

| | | | |
|---|---|---|---|
| JP | 10-083079 A | 3/1998 |
| JP | 10-104834 A | 4/1998 |
| JP | 2000-327633 A | 11/2000 |
| JP | 2003-005353 A | 1/2003 |
| JP | 2006-091798 A | 4/2006 |
| JP | 3790649 B2 | 6/2006 |
| JP | 2007121346 A | * 5/2007 |
| JP | 2007-297590 A | 11/2007 |
| JP | 2007-316581 A | 12/2007 |
| JP | 2008-081716 A | 4/2008 |
| JP | 2008-111089 A | 5/2008 |
| JP | 2008-111103 A | 5/2008 |
| JP | 2008-122932 A | 5/2008 |
| JP | 2009-205132 A | 9/2009 |

OTHER PUBLICATIONS

Graziano, K. A. et al. "Novel Acid-Hardening Positive Photoresist Technology," SPIE Advances in Resist Technology and Processing VIII, Jun. 1, 1991, vol. 1466, pp. 75-88, cited in spec.

Holmes, S. J. et al. "Edge Lithography as a Means of Extending the Limits of Optical and Non-Optical Lithographic Resolution," SPIE Proceedings Paper Advances in Resist Technology and Processing XVI, Jun. 11, 1999, vol. 3678, pp. 348-357, cited in spec.

Hsu, S. et al. "Double Exposure Technique for 45nm node and Beyond," SPIE Proceedings Paper 25th Annual BACUS Symposium on Photomask Technology, Nov. 5, 2005, vol. 5992, pp. 59921Q-1-59921Q-16, cited in spec.

Shibuya, M. et al. "Performance of Resolution Enhancement Technique Using Both Multiple Exposure and Nonlinear Resist," Japanese Journal of Applied Physics, Sep. 17, 1994, vol. 33, pp. 6874-6877, cited in spec.

* cited by examiner

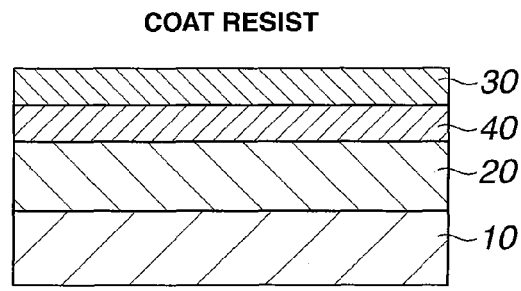
FIG.2A PRIOR ART — COAT RESIST
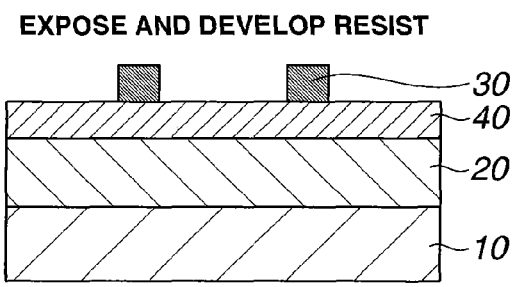
FIG.2B PRIOR ART — EXPOSE AND DEVELOP RESIST
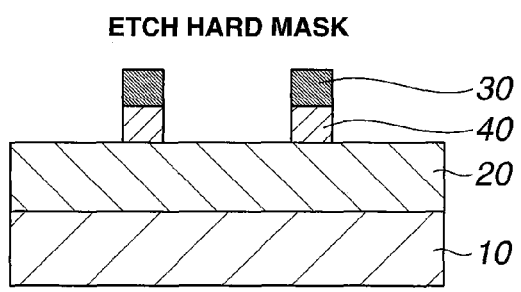
FIG.2C PRIOR ART — ETCH HARD MASK
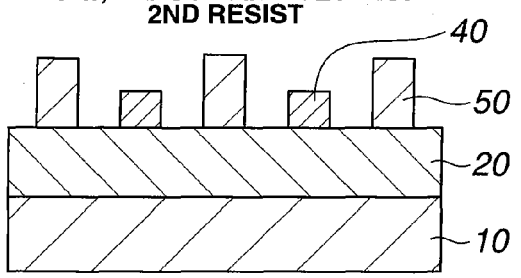
FIG.2D PRIOR ART — COAT, EXPOSE AND DEVELOP 2ND RESIST
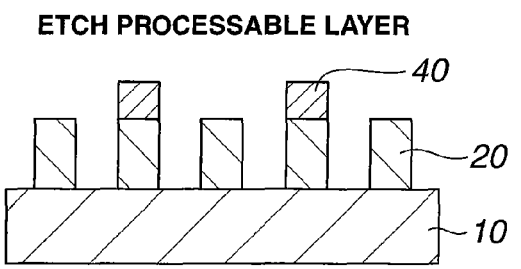
FIG.2E PRIOR ART — ETCH PROCESSABLE LAYER 204 202

204 202

*204* *202*

PATTERNING PROCESS AND RESIST COMPOSITION

CROSS-REFERENCE TO RELATED APPLICATION

This non-provisional application claims priority under 35 U.S.C. §119(a) on Patent Application No. 2009-239019 filed in Japan on Oct. 16, 2009, the entire contents of which are hereby incorporated by reference.

TECHNICAL FIELD

This invention relates to a pattern-forming process including single exposure and single development for forming a pattern having a half pitch from that of a mask pattern, thus doubling a resolution, and a resist composition used therein.

BACKGROUND ART

In the recent drive for higher integration and operating speeds in LSI devices, the pattern rule is made drastically finer. The photolithography succeeded in forming finer feature size patterns by reducing the wavelength of exposure light. Efforts are now made to jump from the ArF excimer laser of wavelength 193 nm to extreme ultraviolet (EUV) of wavelength 13.5 nm. The light source for EUV is of a considerably low power while the development works of appropriate multilayer reflection mirrors, multilayer reflection masks, and photoresists are retarded. With the advent of the immersion lithography, the projection lens which is one key for implementing miniaturization has a numerical aperture (NA) in excess of 1.0 and has already reached the maximum NA which is governed by the reflective index of water. With the prior art methods, no further miniaturization is possible.

The process that now draws attention under the above-discussed circumstances is a double patterning process involving a first set of exposure and development to form a first pattern and a second set of exposure and development to form a pattern between features of the first pattern. See Proc. SPIE Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS® method of coating a water-soluble film on the trench pattern as developed and heating to induce crosslinking at the resist film surface for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in an alcohol that does not dissolve away the positive resist material in a second exposure. Since negative resist materials with low resolution are used, these methods entail degradation of resolution.

Now under investigation is the resist pattern freezing technology involving forming a first resist pattern on a substrate, taking any suitable means for insolubilizing the resist pattern with respect to the resist solvent and alkaline developer, applying a second resist thereon, and forming a second resist pattern in space portions of the first resist pattern. With this freezing technology, etching of the substrate is required only once, leading to improved throughputs and avoiding the problem of misregistration due to stress relaxation of the hard mask during etching.

With respect to the freezing technology, a number of techniques are reported including thermal insolubilization, coating of a cover film and thermal insolubilization, insolubilization by irradiation of light having an extremely short wavelength, for example, of 172 nm, insolubilization by ion implantation, insolubilization through formation of thin-film oxide by CVD, and insolubilization by light irradiation and special gas treatment. These insolubilization methods, which involve heat treatment at elevated temperature, give rise to problems of pattern deformation, especially film slimming, and size narrowing or widening, which must be overcome.

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

If first exposure is followed by second exposure at a half-pitch shifted position, the optical energy of second exposure offsets the optical energy of first exposure so that the contrast becomes zero. If a contrast enhancement layer (CEL) is formed on the resist film, the incident light to the resist film becomes nonlinear so that the first and second exposures do not offset each other. Thus an image having a half pitch is formed. See Jpn. J. Appl. Phy. Vol. 33 (1994) p 6874-6877. It is expected that similar effects are produced by using an acid generator capable of two photon absorption to provide a nonlinear contrast. Using this double imaging method, the resolution can be doubled through two exposure steps and a single development.

A resist material having both positive and negative properties has been proposed. This resist material displays the positive tone response that it is substantially insoluble in alkaline developer where it receives a low exposure dose, but increases its alkaline dissolution rate as the exposure dose is increased, and the negative tone response that it starts reducing its alkaline dissolution rate as the exposure dose is further increased. Lithographic processing of such a positive/negative resist material can produce a resolution twice that of the mask pattern since those portions of resist film having received low and high exposure doses are left after development. Known positive/negative resist materials include a positive/negative hybrid resist composition obtained by adding a crosslinker to a positive resist material as described in U.S. Pat. No. 6,114,082 and Proc. SPIE Vol. 3678, p 348 (1999), and a positive/negative hybrid resist composition utilizing competitive positive and negative reactions in the co-presence of a benzyl alcohol and an acetal acid labile group as described in JP-A 2003-005353. The positive/negative hybrid resist composition permits a pattern to be formed at a double resolution by an ordinary process involving single exposure and single development.

The cost of double patterning is a problem. While the complexity of additional steps during double patterning is considered problematic, double exposures constitute the majority of cost. If a double pattern can be formed through a single exposure, then the process becomes of the lowest cost. The double patterning or double imaging process cannot be established unless the alignment accuracy of the exposure tool is significantly improved. On the other hand, if the positive/negative hybrid resist material is applicable to the ArF immersion lithography, the resolution can be doubled through a single exposure, overcoming the problems of cost and alignment accuracy of the exposure tool. Then the technology becomes a promising candidate for 32 nm and 22 nm.

Photobase generators proposed heretofore are nitrobenzyl carbamates (J. Am. Chem. Soc. 1991, 113, p 4303-4313). Photoresist materials having the photobase generator added thereto are described in U.S. Pat. No. 5,545,509 and Proc. SPIE Vol. 1466 p 75 (1991). Also a resist composition is obtained by adding a photobase generator to an ordinary positive photoresist material comprising a base polymer having acid labile groups and a photoacid generator (JP-A H10-083079).

CITATION LIST

Patent Document 1: U.S. Pat. No. 6,114,082 (JP-A H10-104834)
Patent Document 2: JP-A 2003-005353
Patent Document 3: U.S. Pat. No. 5,545,509 (JP-A H07-134399)
Patent Document 4: JP-A H10-083079
Non-Patent Document 1: Proc. SPIE Vol. 5992, 59921Q-1-16 (2005)
Non-Patent Document 2: Jpn. J. Appl. Phy. Vol. 33 (1994) p 6874-6877
Non-Patent Document 3: Proc. SPIE Vol. 3678, p 348 (1999)
Non-Patent Document 4: J. Am. Chem. Soc. 1991, 113, p 4303-4313
Non-Patent Document 5: Proc. SPIE Vol. 1466 p 75 (1991)

SUMMARY OF INVENTION

It is understood that when substrate processing is carried out by two dry etchings using resist patterns fabricated by two exposures and developments, the throughput is reduced to one half. Also an issue of misregistration between the two exposures occurs.

An object of the invention is to provide a pattern forming process using a single exposure and capable of achieving a resolution doubling that of a mask pattern. Another object is to provide a resist composition for use in the pattern forming process.

The inventors have found that when a resist film formed of a resist composition comprising a polymer having an acid labile group and substantially insoluble in an alkaline developer as a base, a photoacid generator, a photobase generator, and an acid quencher wherein a total amount of amino groups from the quencher and the photobase generator is greater than an amount of acid from the photoacid generator is lithographically processed, the resist film includes an unexposed region and an over-exposed region which do not dissolve in the developer, and an intermediate exposure dose region which dissolves in the developer. With this pattern forming process, the resolution is doubled by splitting a single line into two lines.

The invention provides a pattern forming process and a resist composition as set forth below.

[1] A process for forming a pattern comprising the steps of applying a resist composition onto a substrate to form a resist film, baking, exposure to radiation at a dose, post-exposure baking, and developing with an alkaline developer, said resist composition comprising a polymer comprising recurring units having an acid labile group and substantially insoluble in the alkaline developer, a photoacid generator capable of generating an acid, a photobase generator capable of generating an amino group, a quencher having an amino group for neutralizing the acid released from the photoacid generator for inactivation, and an organic solvent, whereby a pattern of the resist film is formed including an unexposed region at a low exposure dose and an over-exposed region at an excess exposure dose which are not dissolved in the developer, and an exposed region at an intermediate exposure dose which is dissolved in the developer.

[2] The process of [1] wherein the sum of a total molar amount of amino groups in the quencher and a total molar amount of amino groups released from the photobase generator is greater than a total molar amount of the acid released from the photoacid generator.

[3] A process for forming a pattern comprising the steps of applying a resist composition onto a substrate to form a resist film, baking, exposure to radiation at a dose, post-exposure baking, and developing with an alkaline developer, said resist composition comprising a polymer comprising recurring units having an acid labile group and recurring units having a sulfonium salt and substantially insoluble in an alkaline developer, a photoacid generator capable of generating an acid, a photobase generator capable of generating an amino group, a quencher having an amino group for neutralizing an acid released from the sulfonium salt-bearing units in the polymer and the acid released from the photoacid generator for inactivation, and an organic solvent, whereby a pattern of the resist film is formed including an unexposed region at a low exposure dose and an over-exposed region at an excess exposure dose which are not dissolved in the developer, and an exposed region at an intermediate exposure dose which is dissolved in the developer.

[4] The process of [3] wherein the sum of a total molar amount of amino groups in the quencher and a total molar amount of amino groups released from the photobase generator is greater than the sum of a total molar amount of the acid released from the sulfonium salt-bearing units and a total molar amount of the acid released from the photoacid generator.

[5] The process of any one of [1] to [4], wherein the photobase generator is photo-degradable to generate an amino group.

[6] The process of any one of [1] to [5], wherein the photobase generator has a partial structure having the formula (i), (ii) or (iii).

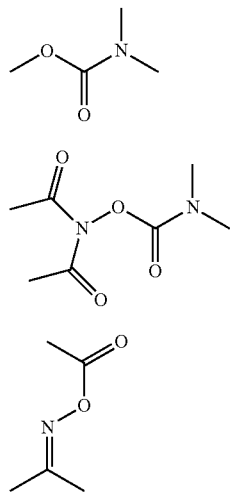

[7] The process of [6] wherein the photobase generator comprises a recurring unit (a1), (a2), (a3) or (a4) in the general formula (1), said recurring unit being attached to the backbone of the polymer.

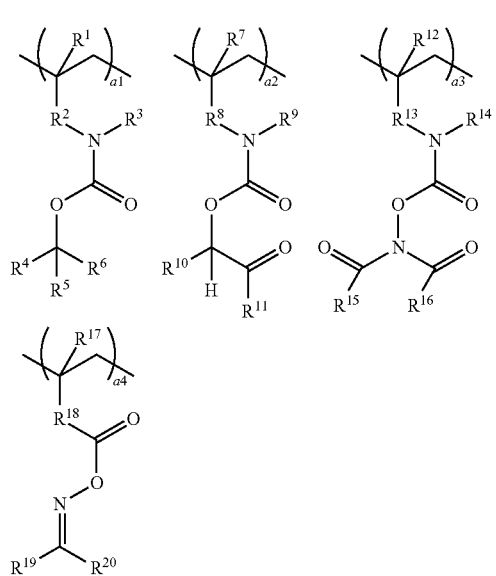

Herein $R^1$, $R^7$, $R^{12}$, and $R^{17}$ each are hydrogen or methyl, $R^2$, $R^8$, $R^{13}$, and $R^{18}$ each are a single bond, methylene, ethylene, phenylene, phenylmethylene, phenylethylene, phenylpropylene, or —C(=O)—O—$R^{21}$— wherein $R^{21}$ is a straight, branched or cyclic $C_1$-$C_{10}$ alkylene, $C_6$-$C_{10}$ arylene, or $C_2$-$C_{12}$ alkenylene group, $R^3$, $R^9$, and $R^{14}$ each are hydrogen, a straight, branched or cyclic $C_1$-$C_{10}$ alkyl or $C_6$-$C_{10}$ aryl group, or may bond with $R^{21}$ to form a ring with the nitrogen atom to which they are attached, $R^4$, $R^5$, and $R^6$ each are hydrogen, a straight, branched or cyclic $C_1$-$C_{10}$ alkyl group, or a $C_6$-$C_{14}$ aryl group which may have a straight, branched or cyclic $C_1$-$C_6$ alkyl, $C_1$-$C_6$ alkoxy, nitro, halogen, cyano or trifluoromethyl group, $R^4$ and $R^5$, $R^5$ and $R^6$, or $R^4$ and $R^6$ may bond together to form a ring with the carbon atom to which they are attached, with the proviso that not all $R^4$, $R^5$, and $R^6$ are hydrogen, or not all $R^4$, $R^5$, and $R^6$ are alkyl, $R^{10}$ and $R^{11}$ each are a $C_6$-$C_{14}$ aryl group which may have a straight, branched or cyclic $C_1$-$C_6$ alkyl, $C_1$-$C_6$ alkoxy, nitro, halogen, cyano, trifluoromethyl or carbonyl group, $R^{15}$ and $R^{16}$ each are a straight or branched $C_1$-$C_6$ alkyl group, $R^{15}$ and $R^{16}$ may bond together to form a ring with the carbon and nitrogen atoms to which they are attached, the ring optionally containing a benzene ring, naphthalene ring, double bond or ether bond, $R^{19}$ and $R^{20}$ each are hydrogen, a straight, branched or cyclic $C_1$-$C_8$ alkyl group or a $C_6$-$C_{14}$ aryl group which may have a substituent group as described for $R^4$, $R^5$ and $R^6$, at least one or both of $R^{19}$ and $R^{20}$ are aryl groups, or $R^{19}$ and $R^{20}$ may bond together to form a ring with the carbon atom to which they are attached, a1, a2, a3, a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

[8] The process of [6] wherein the photobase generator comprises at least one compound selected from compounds having the general formulae (2) to (9).

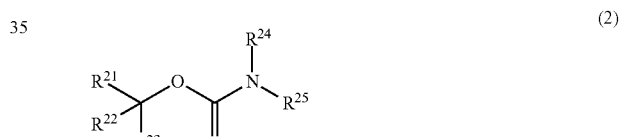

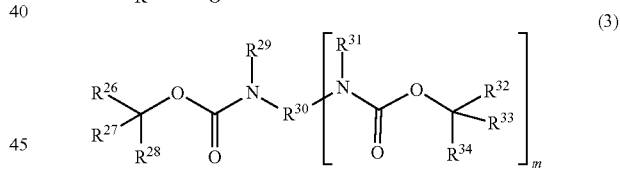

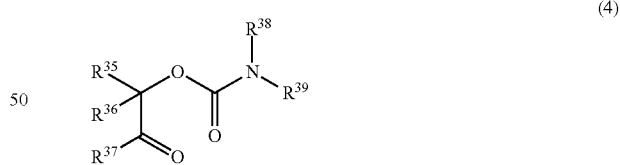

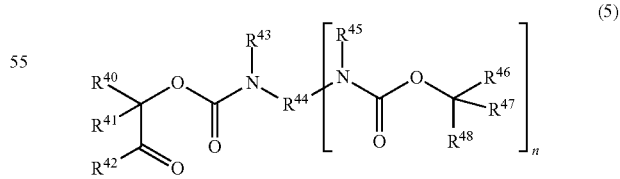

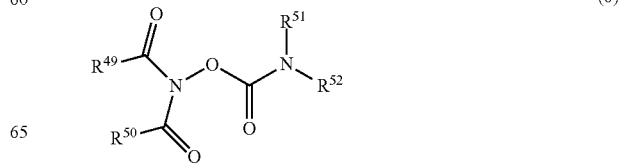

(7)

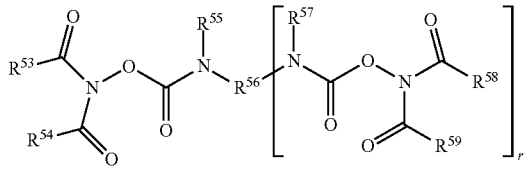

(8)

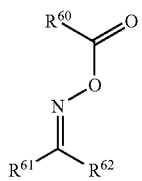

(9)

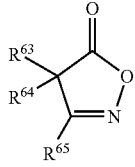

Herein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may have a straight, branched or cyclic $C_1$-$C_6$ alkyl or alkoxy, nitro, halogen, cyano or trifluoromethyl group, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring, $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester group, $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a ring, $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester group, $R^{49}$, $R^{50}$, $R^{53}$, $R^{54}$, $R^{58}$, and $R^{59}$ each are a straight or branched $C_1$-$C_6$ alkyl group, $R^{49}$ and $R^{50}$, $R^{53}$ and $R^{54}$, or $R^{58}$ and $R^{59}$ may bond together to form a ring, the ring optionally containing a benzene ring, naphthalene ring, double bond or ether bond, $R^{60}$ is a straight, branched or cyclic $C_1$-$C_{16}$ alkyl, $C_6$-$C_{20}$ aryl or $C_2$-$C_{20}$ alkenyl group, $R^{61}$ is a $C_6$-$C_{20}$ aryl group, $R^{62}$ is hydrogen, a straight, branched or cyclic $C_1$-$C_{16}$ alkyl group or $C_6$-$C_{20}$ aryl group, $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether group, m, n and r each are 1 or 2.

[9] The process of any one of [1] to [8] wherein the photoacid generator is adapted to generate a sulfonic acid, imidic acid or methide acid which is fluorinated at α-position upon light exposure.

[10] The process of [9] wherein the photoacid generator is a sulfonium or iodonium salt acid generator.

[11] The process of any one of [1] to [10] wherein the resist composition further comprises a base amplifier which is decomposed with the base to generate an amino group, and the sum of a total molar amount of amino groups in the quencher, a total molar amount of amino groups released from the photobase generator and a total molar amount of amino groups released from the base amplifier is greater than the sum of a total molar amount of the acid released from the photoacid generator and a total molar amount of the acid released from the sulfonium salt-bearing units if the polymer comprises recurring units having a sulfonium salt.

[12] The process of [11] wherein the base amplifier is a compound of addition mode having the formula (2') or (3').

(2')

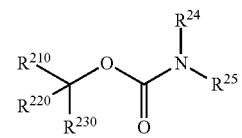

(3')

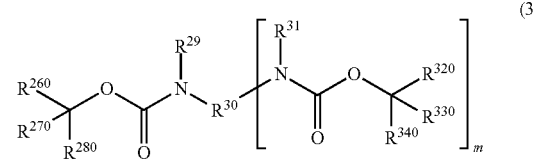

Herein $R^{210}$, $R^{220}$, $R^{230}$, $R^{260}$, $R^{270}$, $R^{280}$, $R^{320}$, $R^{330}$, and $R^{340}$ each are hydrogen, a straight, branched or cyclic $C_1$-$C_6$ alkyl, $C_6$-$C_{14}$ aryl or $C_7$-$C_{15}$ aralkyl group, at least one of $R^{210}$, $R^{220}$ and $R^{230}$, at least one of $R^{260}$, $R^{270}$ and $R^{280}$, or at least one of $R^{320}$, $R^{330}$ and $R^{340}$ is a $C_2$-$C_8$ alkenyl group or an organic group selected from straight, branched or cyclic $C_1$-$C_6$ alkyl, $C_6$-$C_{14}$ aryl, and $C_7$-$C_{15}$ aralkyl groups each containing a carbonyl, ester, lactone, carbonate, maleimide, amide or sulfo group, $R^{24}$, $R^{25}$, $R^{29}$, $R^{30}$, $R^{31}$, and m are as defined above.

[13] The process of any one of [1] to [12] wherein
the exposure step is a single exposure through a mask having a one-pair line-and-space pattern,
the subsequent PEB and development steps result in a two-pair line-and-space pattern being split from the mask pattern in a resolution doubling manner.

[14] The process of any one of [1] to [12] wherein
the exposure step is a single exposure through a mask having a single-line pattern,
the subsequent PEB and development steps result in a single-line and two-space pattern being split from the mask pattern in a resolution doubling manner.

[15] The process of any one of [1] to [12] wherein
the exposure step is a single exposure through a mask having a single-space pattern,
the subsequent PEB and development steps result in a single-line and two-space pattern being split from the mask pattern in a resolution doubling manner.

[16] A resist composition comprising
a sulfonium or iodonium salt photoacid generator adapted to generate a sulfonic acid, imidic acid or methide acid which is fluorinated at α-position upon light exposure,
a quencher having an amino group, and
a polymer comprising at least recurring units having a photobase generator group of the general formula (1) defined above and recurring units having an acid labile group, wherein the sum of a total molar amount of amino groups in the quencher and a total molar amount of amino groups released from the photobase generator-bearing units is greater than a total molar amount of the acid released from the photoacid generator.

[17] A resist composition comprising
a polymer comprising recurring units having an acid labile group,
a sulfonium or iodonium salt photoacid generator adapted to generate a sulfonic acid, imidic acid or methide acid which is fluorinated at α-position upon light exposure,
a quencher having an amino group, and
at least one photobase generator selected from compounds of the general formulae (2) to (9) defined above,
wherein the sum of a total molar amount of amino groups in the quencher and a total molar amount of amino groups released from the photobase generator is greater than a total molar amount of the acid released from the photoacid generator.

[18] The resist composition of [16] or [17] wherein the polymer further comprises recurring units having an adhesive group selected from the class consisting of hydroxyl, cyano, carbonyl, ester, ether, lactone, carboxyl and carboxylic anhydride groups.

[19] The resist composition of any one of [16] to [18] wherein the polymer further comprises recurring units having a sulfonium salt such that the sum of a total molar amount of amino groups in the quencher and a total molar amount of amino groups released from the photobase generator-bearing units is greater than the sum of a total molar amount of the acid released from the photoacid generator and a total molar amount of the acid released from the sulfonium salt-bearing recurring units.

[20] The resist composition of any one of [16] to [19], further comprising a base amplifier adapted to generate an amino group such that the sum of a total molar amount of amino groups in the quencher, a total molar amount of amino groups released from the photobase generator-bearing units and a total molar amount of amino groups released from the base amplifier is greater than the sum of a total molar amount of the acid released from the photoacid generator and a total molar amount of the acid released from the sulfonium salt-bearing units if the polymer comprises recurring units having a sulfonium salt.

[21] A process for forming a pattern comprising the steps of exposing a resist film through a mask having a one-pair line-and-space pattern, the pattern being a dark pattern in which a peripheral region outside the line pattern is light-shielded, PEB and development to form a two-pair line-and-space pattern as being split from the mask pattern, exchanging the mask with a second mask, exposing the peripheral region outside the line pattern through the second mask, PEB and development to dissolve away the peripheral region.

[22] A process for forming a pattern comprising the steps of exposing a resist film through a mask having a one-pair line-and-space pattern, the pattern being a dark pattern in which a peripheral region outside the line pattern is light-shielded, exposing the peripheral region outside the line pattern through a second mask, PEB and development to form a two-pair line-and-space pattern as being split from the one-pair line-and-space pattern and to dissolve away the peripheral region.

[23] The pattern forming process of [21] or [22] wherein the resist film is of a dual-tone resist, and the step of exposing the peripheral region outside the line pattern uses an exposure dose which is greater than the exposure dose at which the thickness of the resist film left after exposure and development reaches 0, but less than the exposure dose at which the film thickness starts increasing.

When the pattern forming process defined herein is applied, the resolution can be doubled via a single exposure by splitting a single line into two lines.

As used herein, the term "amino groups" including amino groups released from the photobase generator, amino groups in the quencher and amino groups released from a thermal base generator encompass, in addition to genuine amino groups, imino groups and other groups containing a nitrogen atom and providing basicity. That is, the term refers to nitrogen-containing basic groups.

ADVANTAGEOUS EFFECTS OF INVENTION

The resist composition comprising a polymer having an acid labile group and substantially insoluble in an alkaline developer as a base, a photoacid generator, a photobase generator, and an acid quencher wherein a total amount of amino groups from the quencher and the photobase generator is greater than an amount of acid from the photoacid generator advantageously ensures that an unexposed region and an over-exposed region are not dissolved in the developer, and only an intermediate exposure dose region is dissolved in the developer. With this pattern forming process, the resolution is doubled via single exposure and single development by splitting a single line into two lines.

BRIEF DESCRIPTION OF DRAWINGS

FIG. 1 is a cross-sectional view of a dual-tone resist patterning process according one embodiment of the invention.

FIG. 2 is a cross-sectional view of an exemplary prior art double patterning process. FIG. 2A shows a laminate of substrate, processable layer, hard mask and first resist film, FIG. 2B shows the first resist film being exposed and developed, FIG. 2C shows the hard mask being etched, FIG. 2D shows, after removal of the first resist film, a second resist film being formed, exposed and developed, and FIG. 2E shows the processable layer being etched.

DESCRIPTION OF EMBODIMENTS

Figure 1A:
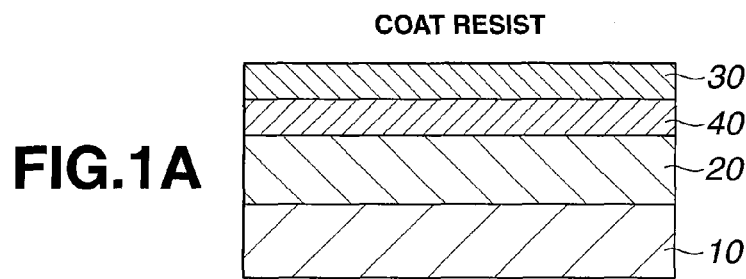
FIG. 1A shows a laminate of substrate, processable layer, hard mask and resist film.
Figure 1B:
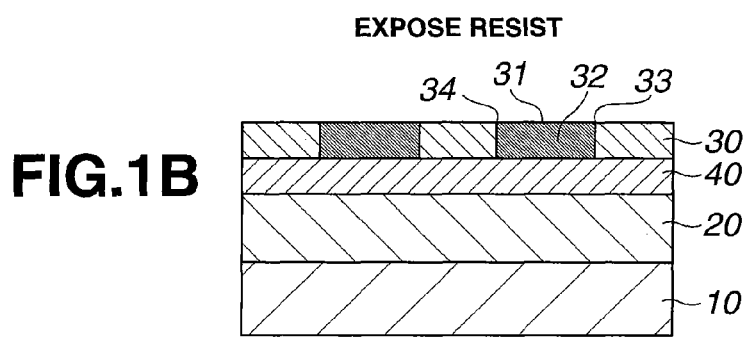
FIG. 1B shows the resist film being exposed.
Figure 1C:
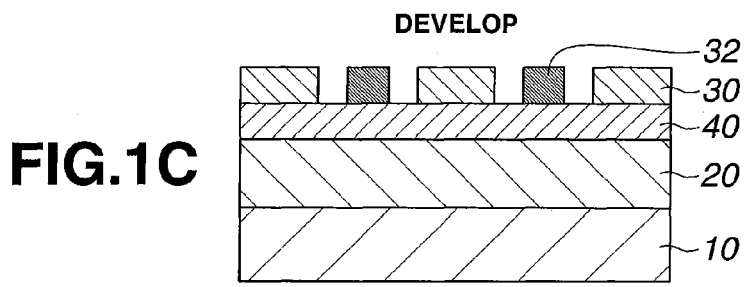
FIG. 1c shows the resist film being developed.
Figure 1D:
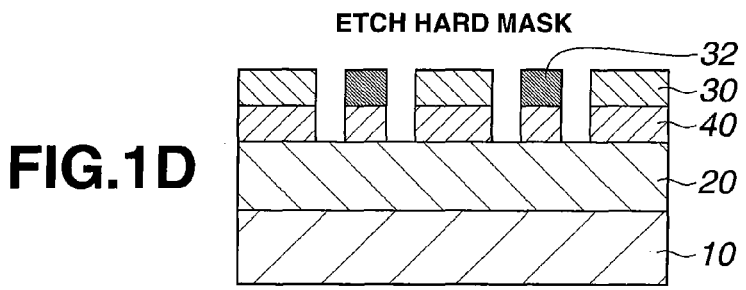
FIG. 1D shows the hard mask being etched.
Figure 1E:
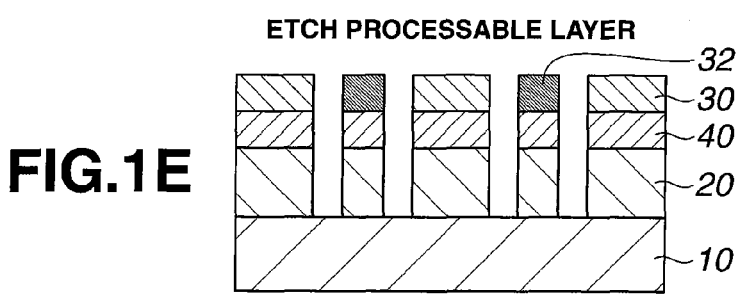
FIG. 1E shows the processable layer being etched.

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer." The term "processable layer" is interchangeable with patternable layer and refers to a layer that can be processed such as by etching to form a pattern therein.

The abbreviations and acronyms have the following meaning.

PAG: photoacid generator
PBG: photobase generator
Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide A study was made on a resist material and patterning process capable of forming a pattern at a half pitch through single exposure and single development, thus doubling a resolution. For resolution doubling, the resist material must have two thresholds. That is, the resist material displays a positive tone behavior at a certain exposure dose and a negative tone behavior at a different exposure dose. In Non-Patent Document 3, by adding a crosslinker to a KrF resist material based on a hydroxystyrene polymer having acid labile groups substituted thereon so that a catalyst may have different reactivity with respect to deprotection reaction of acid labile groups and crosslinking reaction by the crosslinker, the resist material is provided with the positive resist response due to deprotection reaction at a low exposure dose side and the negative resist response due to crosslinking reaction at a high exposure dose side. Since the acid labile group requiring low activation energy for deprotection reaction and having high reactivity and the acid generator capable of generating a weak acid at a high efficiency are used, the positive resist material behavior that only deprotection reaction takes place at the low exposure dose side is obtained. Since the crosslinker allowing crosslinking to proceed with a strong acid and requiring high activation energy for crosslinking reaction is used, the negative resist material attribute that crosslinking proceeds with the strong acid released from the acid generator having low acid generation efficiency is obtained. Since the timing of displaying positive and negative tone responses is thus shifted, an exposure dose gap can be produced. The KrF resist material based on hydroxystyrene can be formulated as a positive resist material by substituting acid labile groups, and as a negative resist material by adding a crosslinker. Then by adding a crosslinker to acid labile group-substituted polyhydroxystyrene, both positive and negative tone responses can be readily produced.

On the other hand, the ArF resist material which uses lactone as the adhesive group has the problem that no crosslinking occurs even when a crosslinker is added. Unlike the KrF resist material, the ArF resist material cannot be provided with the negative tone response simply by adding a crosslinker.

The inventors attempted to produce the negative tone resist response by inactivating acid so as to prevent the material from displaying the positive tone response rather than by adding a crosslinker. The resist material contains both a photoacid generator and a photobase generator wherein the photoacid generator has a higher generation efficiency than the photobase generator. As the exposure dose is increased, an acid is first generated whereby deprotection reaction takes place during PEB, leading to positive tone response. As the exposure dose is further increased, the acid release by decomposition of the acid generator is converged and instead, acid inactivation occurs when the total amount of the base released from the base generator and the base of the quencher exceeds the amount of acid, prohibiting deprotection reaction during PEB and thus leading to negative tone response.

The photobase generator used herein includes those compounds having a partial structure selected from (i) carbamate, (ii) imide carbamate, and (iii) oxime ester structure, shown below.

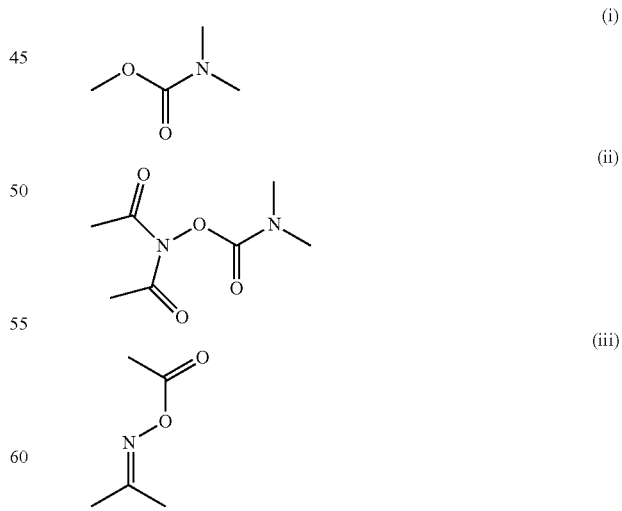

At an exposure dose which induces acid inactivation, the base is present in excess. In the area where deprotection reaction proceeds during PEB so that it may be dissolved away at the end of development, the acid is present in excess.

If the acid in that area is inactivated by evaporation and re-deposition of the base from the area where the base is present in excess, the region of resist film which is essentially to be dissolved in developer is insolubilized. To prevent evaporation and re-deposition of the base, it is preferred that amino groups to be generated by radiation are attached to the polymer backbone. It is also preferred for the polymer serving as a base resin in the resist composition that recurring units having the photobase generator be copolymerized with recurring units having an acid labile group. For example, a homopolymer of recurring units having the photobase generator may be blended with a base polymer comprising recurring units having an acid labile group, but the polymer blend may allow for phase separation between the polymers, separation between a possible inactivation phase and an impossible inactivation phase. As a result, the resist pattern after development may have increased edge roughness or suffer from defectives such as bridge defects and line losses. In order to uniformly disperse the photobase generator in the base polymer of the resist composition, it is preferred to incorporate the photobase generator in the polymer in copolymerized form.

Accordingly, in a preferred embodiment of the invention, the photobase generator used herein takes the form that recurring units having any structure of formulae (i) to (iii) are incorporated in the backbone of a polymer as the base resin.

The recurring units having a photobase generator to be copolymerized in the polymer serving as the base resin in the resist composition are preferably recurring units (a1), (a2), (a3) and (a4) in the general formula (1).

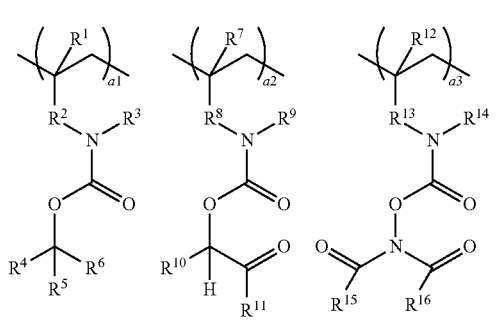

(1)

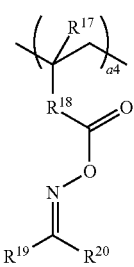

Herein $R^1$, $R^7$, $R^{12}$, and $R^{17}$ each are hydrogen or methyl. $R^2$, $R^8$, $R^{13}$, and $R^{18}$ each are a single bond, methylene, ethylene, phenylene, phenylmethylene, phenylethylene, phenylpropylene, or —C(=O)—O—$R^{21}$— wherein $R^{21}$ is a straight, branched or cyclic $C_1$-$C_{10}$ alkylene, $C_6$-$C_{10}$ arylene, or $C_2$-$C_{12}$ alkenylene group. $R^3$, $R^9$, and $R^{14}$ each are hydrogen, a straight, branched or cyclic $C_1$-$C_{10}$ alkyl or $C_6$-$C_{10}$ aryl group, or may bond with $R^{21}$ to form a $C_3$-$C_8$, preferably $C_4$-$C_6$ ring with the nitrogen atom to which they are attached. $R^4$, $R^5$, and $R^6$ each are hydrogen, a straight, branched or cyclic $C_1$-$C_{10}$ alkyl group, or a $C_6$-$C_{14}$ aryl group which aryl group may have a straight, branched or cyclic $C_1$-$C_6$ alkyl, $C_1$-$C_6$ alkoxy, nitro, halogen, cyano or trifluoromethyl radical, a pair of $R^4$ and $R^5$, $R^5$ and $R^6$, or $R^4$ and $R^6$ may bond together to form a $C_3$-$C_{10}$, preferably $C_4$-$C_8$ non-aromatic ring with the carbon atom to which they are attached, with the proviso that not all $R^4$, $R^5$, and $R^6$ are hydrogen, or not all $R^4$, $R^5$, and $R^6$ are alkyl. $R^{10}$ and $R^{11}$ each are a $C_6$-$C_{14}$, preferably $C_6$-$C_{10}$ aryl group, which aryl group may have a straight, branched or cyclic $C_1$-$C_6$ alkyl, $C_1$-$C_6$ alkoxy, nitro, halogen, cyano, trifluoromethyl or carbonyl radical. $R^{15}$ and $R^{16}$ each are a straight or branched $C_1$-$C_6$ alkyl group, $R^{15}$ and $R^{16}$ may bond together to form a $C_4$-$C_{12}$, preferably $C_4$-$C_{10}$ ring with the carbon and nitrogen atoms to which they are attached, which ring may contain a benzene ring, naphthalene ring, double bond or ether bond. $R^{19}$ and $R^{20}$ each are hydrogen, a straight, branched or cyclic $C_1$-$C_8$, preferably $C_1$-$C_6$ alkyl group or a $C_6$-$C_{14}$, preferably $C_6$-$C_{10}$ aryl group which may have a substituent radical as described for $R^4$, $R^5$ and $R^6$, at least one or both of $R^{19}$ and $R^{20}$ are aryl groups, or $R^{19}$ and $R^{20}$ may bond together to form a $C_4$-$C_{10}$, preferably $C_4$-$C_8$ non-aromatic ring with the carbon atom to which they are attached. The subscripts a1, a2, a3, a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$, preferably $0 \leq a1 \leq 0.5$, $0 \leq a2 \leq 0.5$, $0 \leq a3 \leq 0.5$, $0 \leq a4 \leq 0.5$, and $0.01 \leq a1+a2+a3+a4 \leq 0.5$, and more preferably $0 \leq a1 \leq 0.3$, $0 \leq a2 \leq 0.3$, $0 \leq a3 \leq 0.3$, $0 \leq a4 \leq 0.3$, and $0.015 \leq a1+a2+a3+a4 \leq 0.3$.

In formula (1), the benzyl carbamate base generator represented by recurring unit (a1) produces an amine through the decomposition mechanism shown by reaction scheme (1)-a1; the benzoin carbamate base generator represented by recurring unit (a2) produces an amine through the decomposition mechanism shown by reaction scheme (1)-a2; the imide carbamate base generator represented by recurring unit (a3) produces an amine through the decomposition mechanism shown by reaction scheme (1)-a3; and the oxime ester base generator represented by recurring unit (a4) produces an amine through the decomposition mechanism shown by reaction scheme (1)-a4. As a result of decomposition, carbon dioxide gas, a secondary or primary amine compound, and another compound(s) are released.

(1)-a1

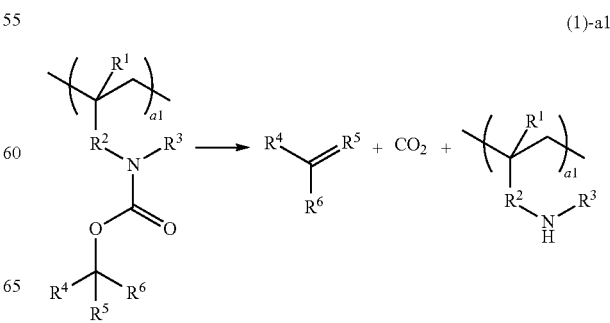

-continued

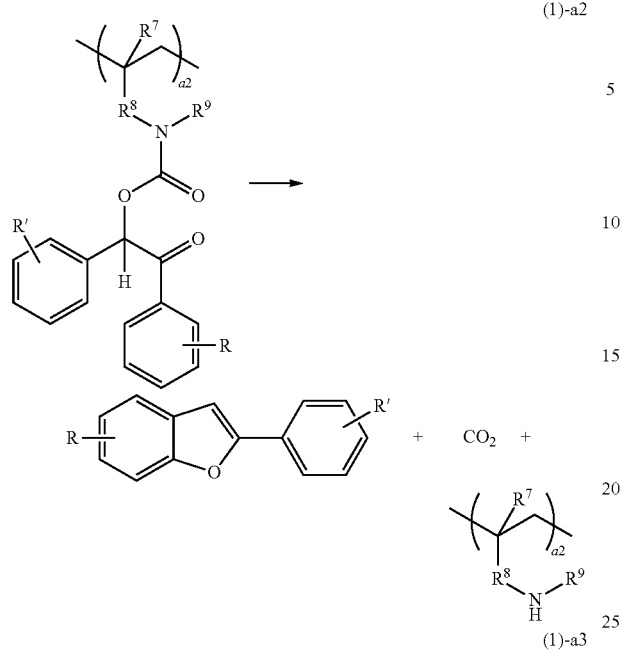

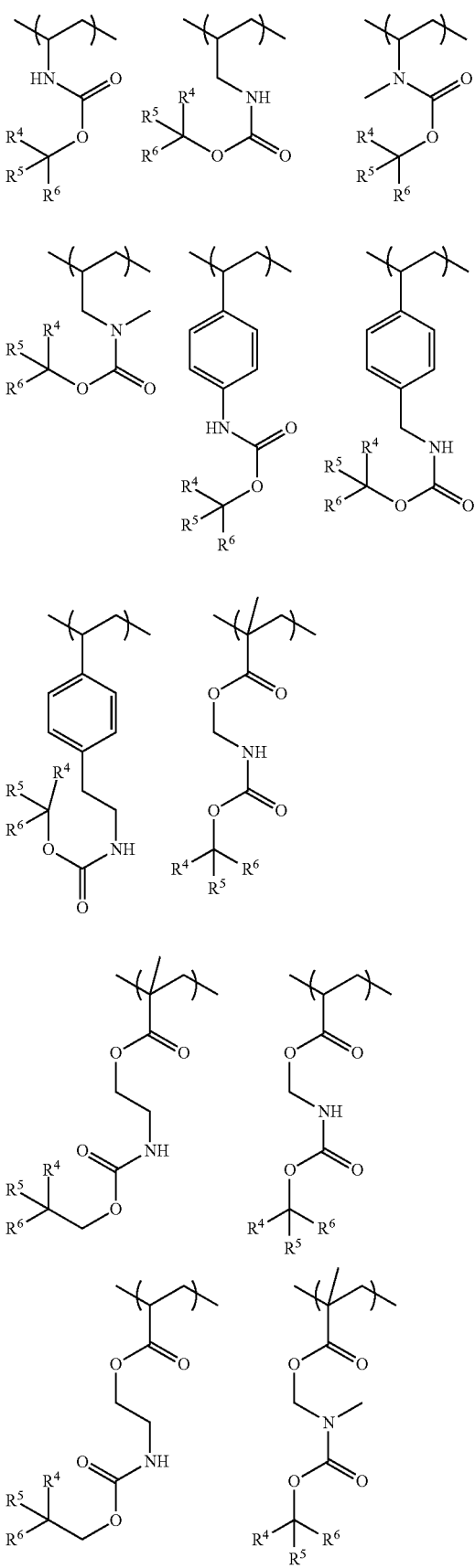

Herein $R^1$ to $R^9$, and $R^{12}$ to $R^{20}$ are as defined above, R and R' each are a substituent radical on aryl as illustrated for $R^{10}$ and $R^{11}$.

In recurring units (a1), (a2) and (a3), nitrogen is attached to the backbone. In recurring units (a4), an amino group attached to the backbone is created by rearrangement reaction during decomposition.

Examples of $R^1$ to $R^3$ in the base generator represented by recurring unit (a1) in formula (1) are shown below wherein $R^4$ to $R^6$ are as defined above.

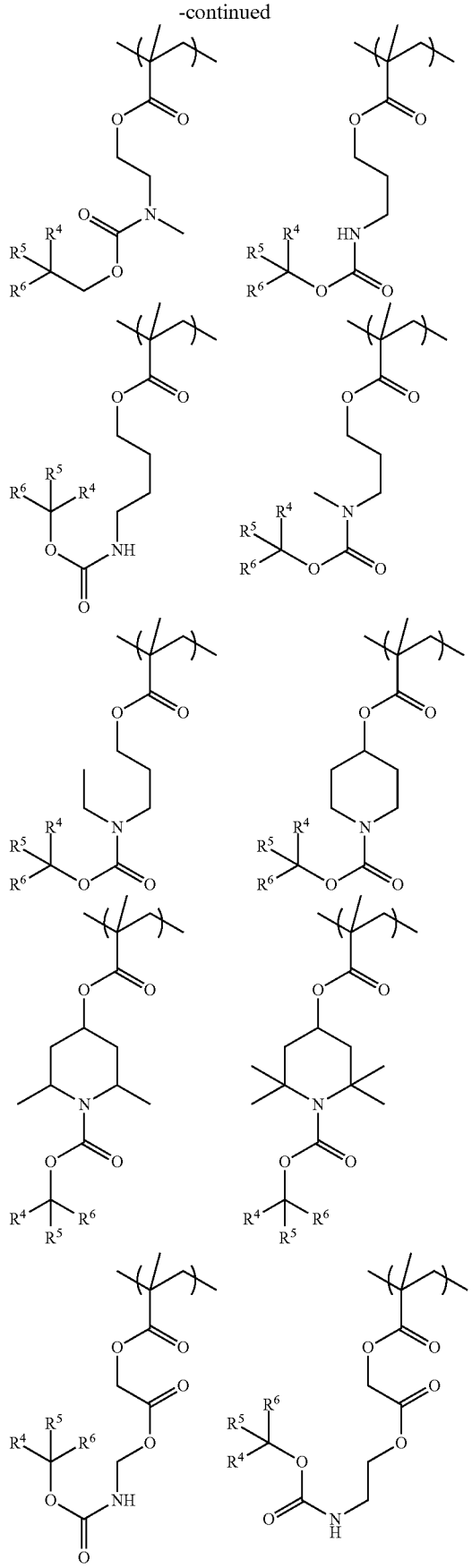
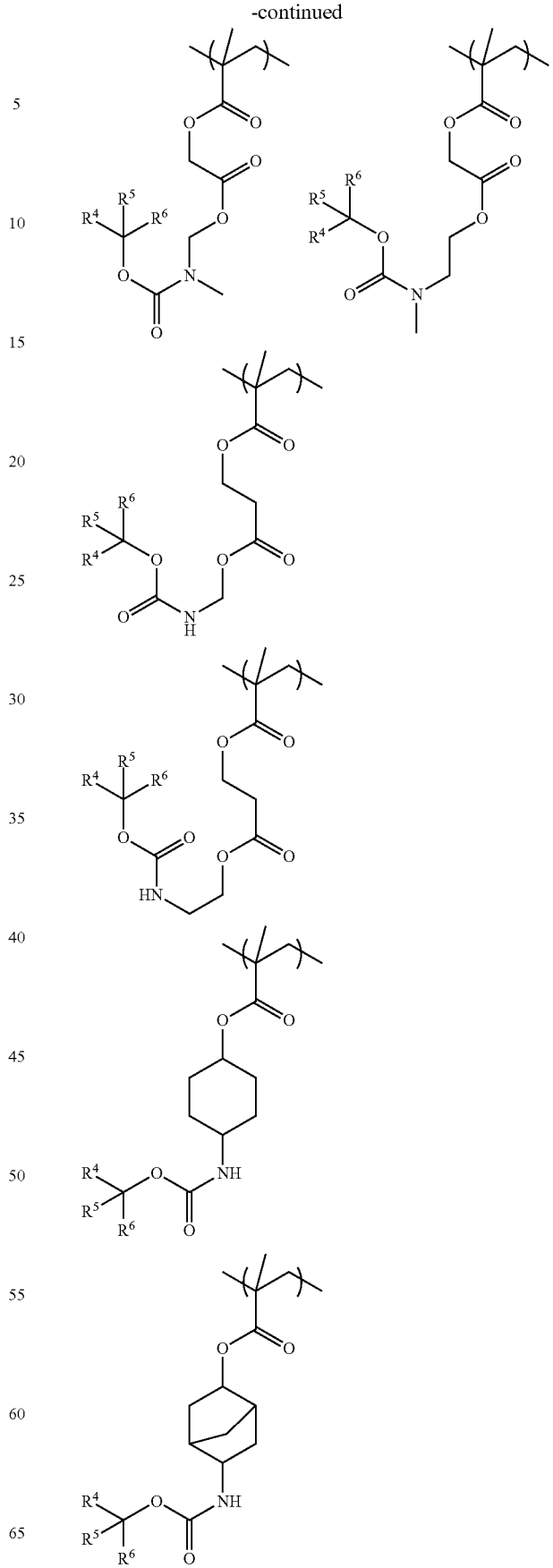

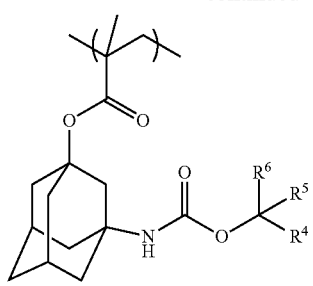
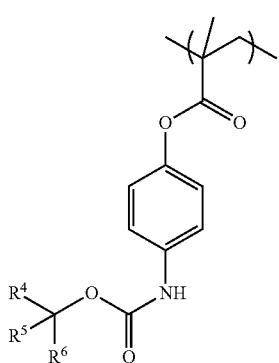
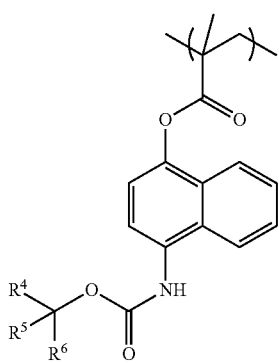
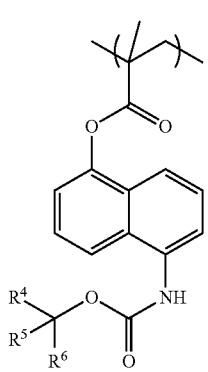
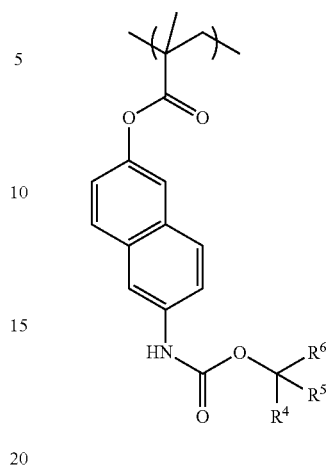
Examples of $R^4$ to $R^6$ in the base generator represented by recurring unit (a1) in formula (1) are shown below wherein $R^1$ to $R^3$ are as defined above.
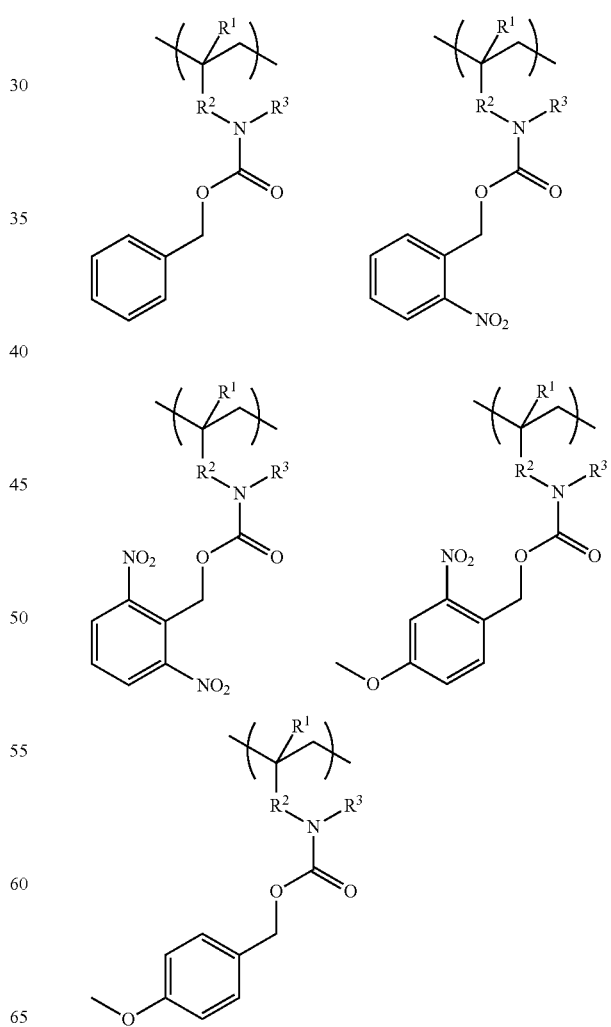

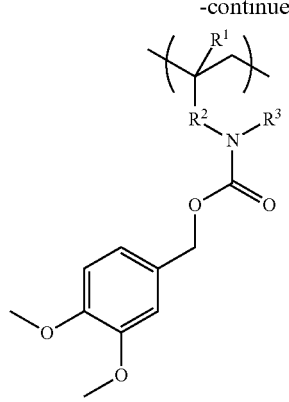
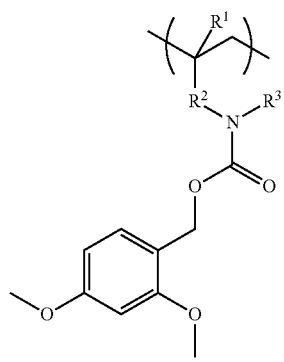
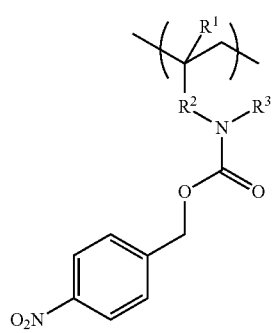
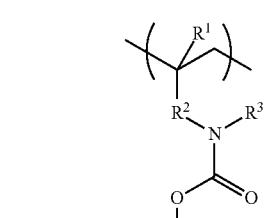
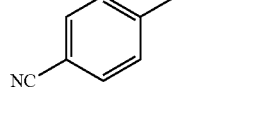
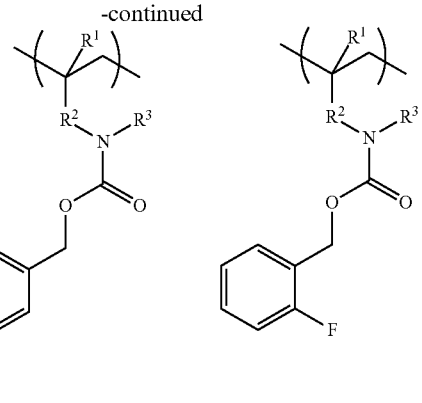
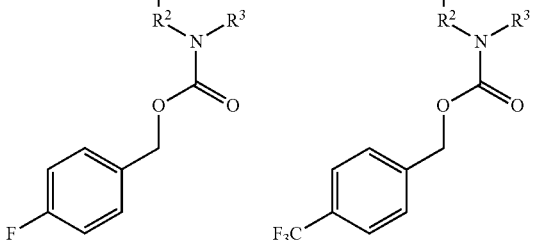
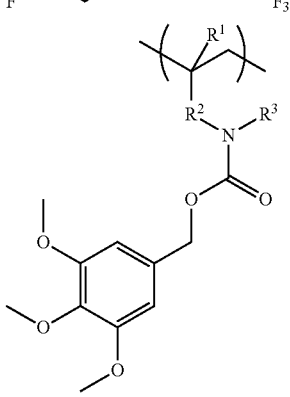
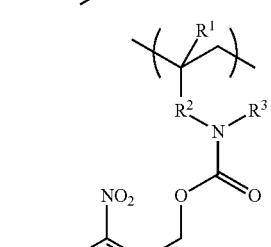
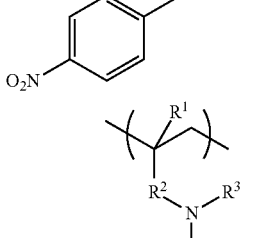
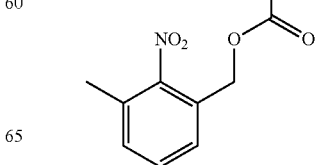

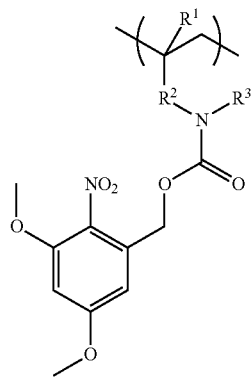
Recurring units (a1) may be selected from recurring units having any set of $R^1$ to $R^6$ combined with any set of $R^4$ to $R^6$ as exemplified above.
Examples of $R^7$ to $R^9$ in the base generator represented by recurring unit (a2) in formula (1) are shown below.
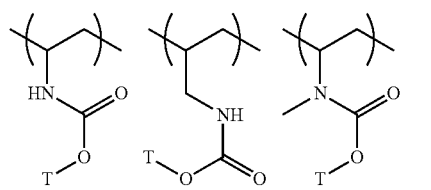
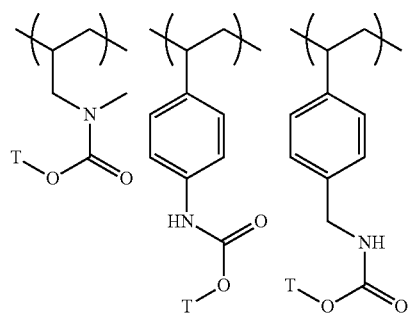
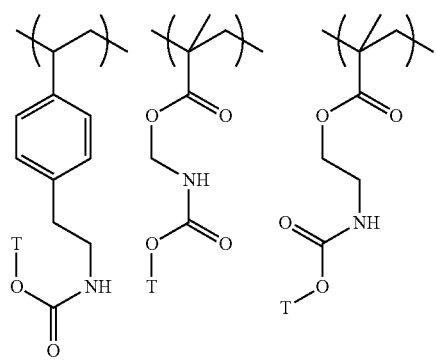
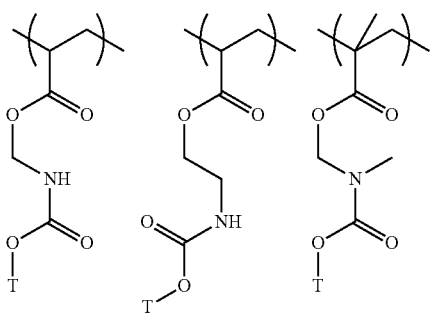
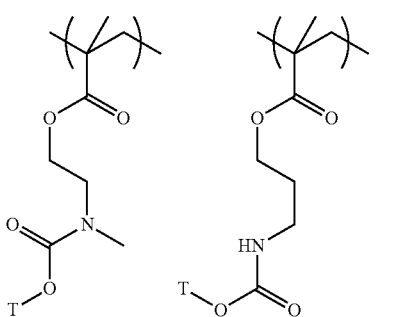
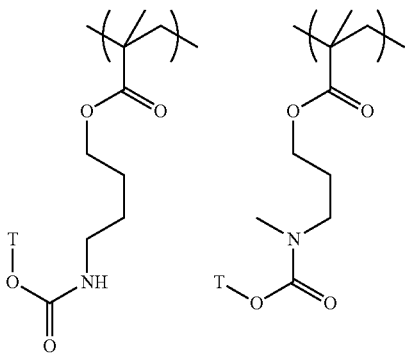
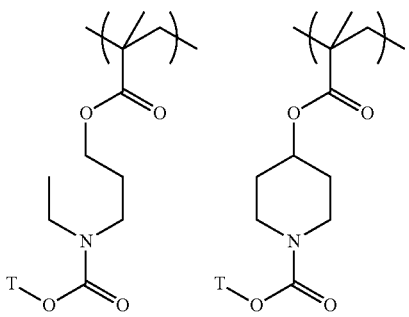
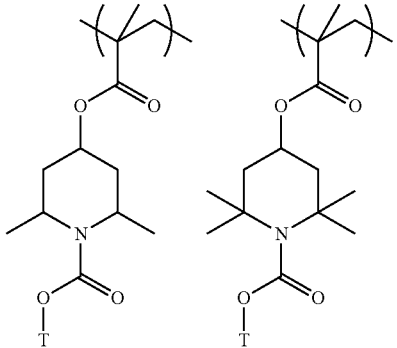

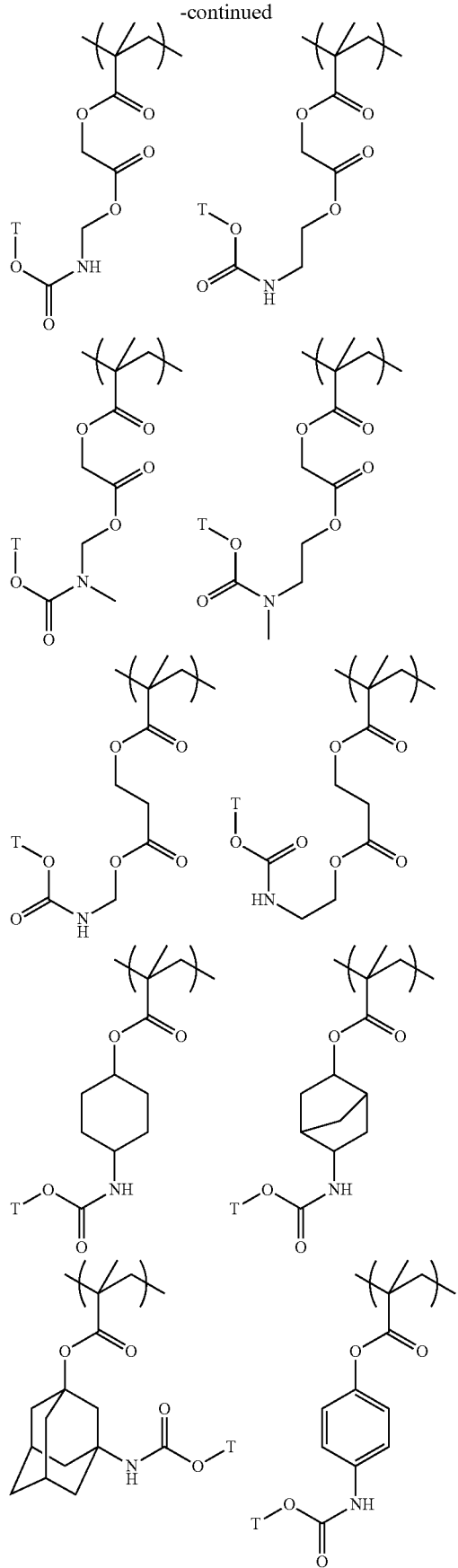
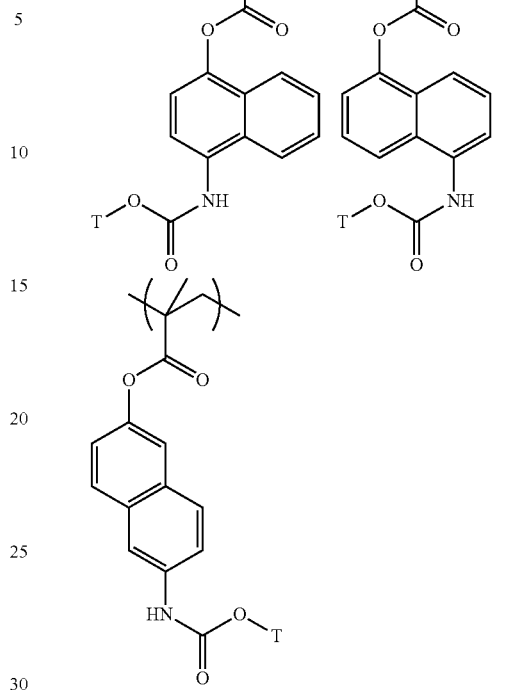
In the above formulae, T is a group of the following formula:
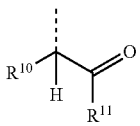
wherein the broken line designates a valence bond, $R^{10}$ and $R^{11}$ are as defined above.
Examples of $R^{10}$ and $R^{11}$ in the base generator represented by recurring unit (a2) in formula (1) are shown below wherein $R^7$ to $R^9$ are as defined above.
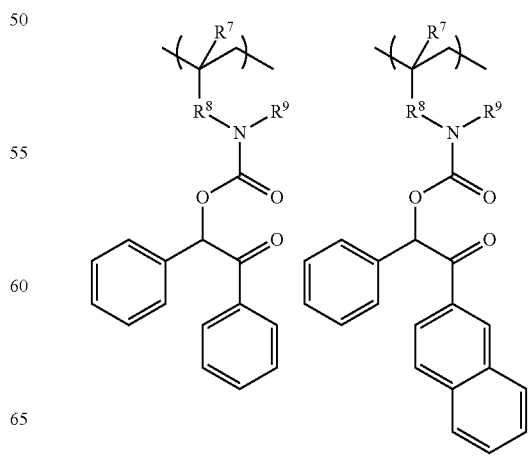

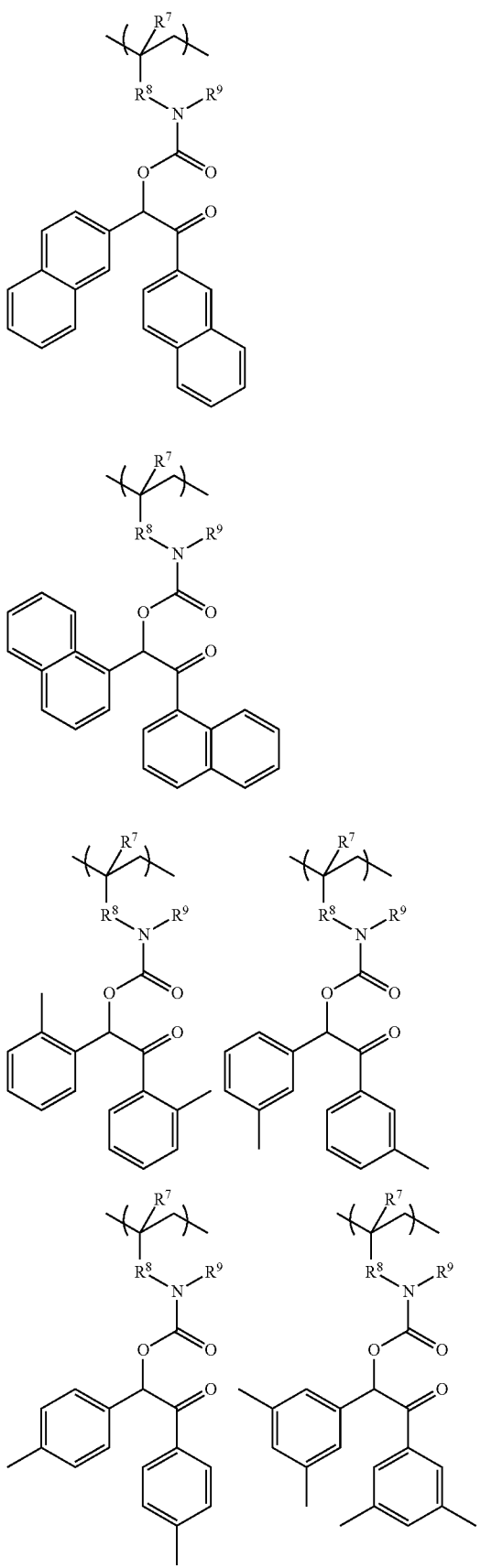
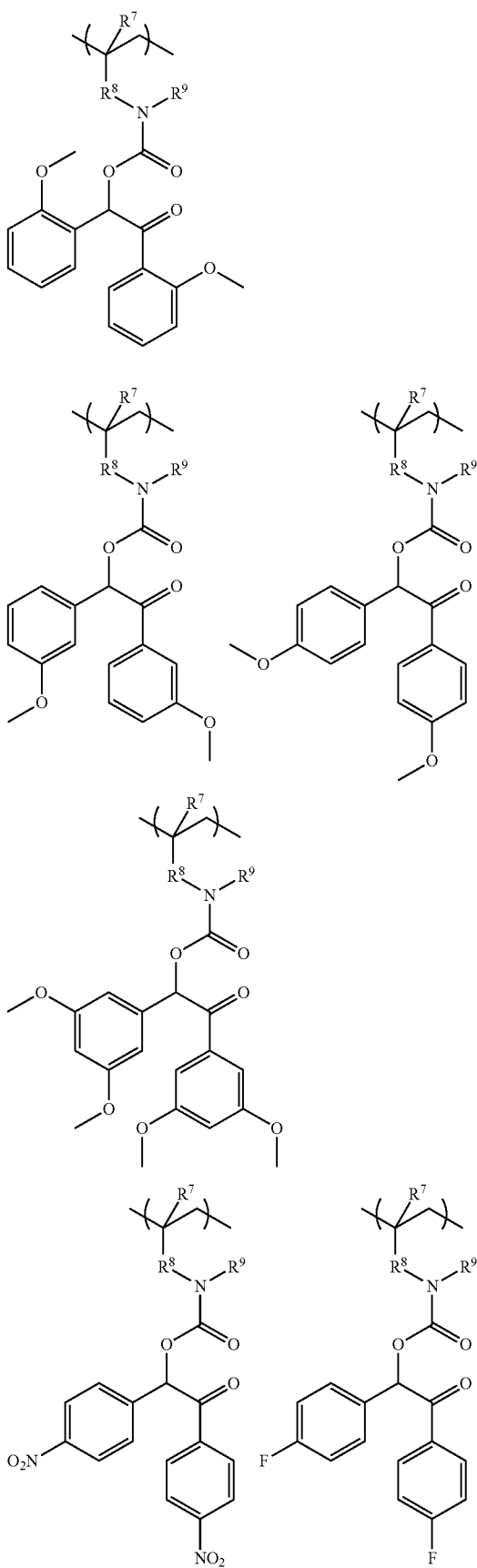

-continued
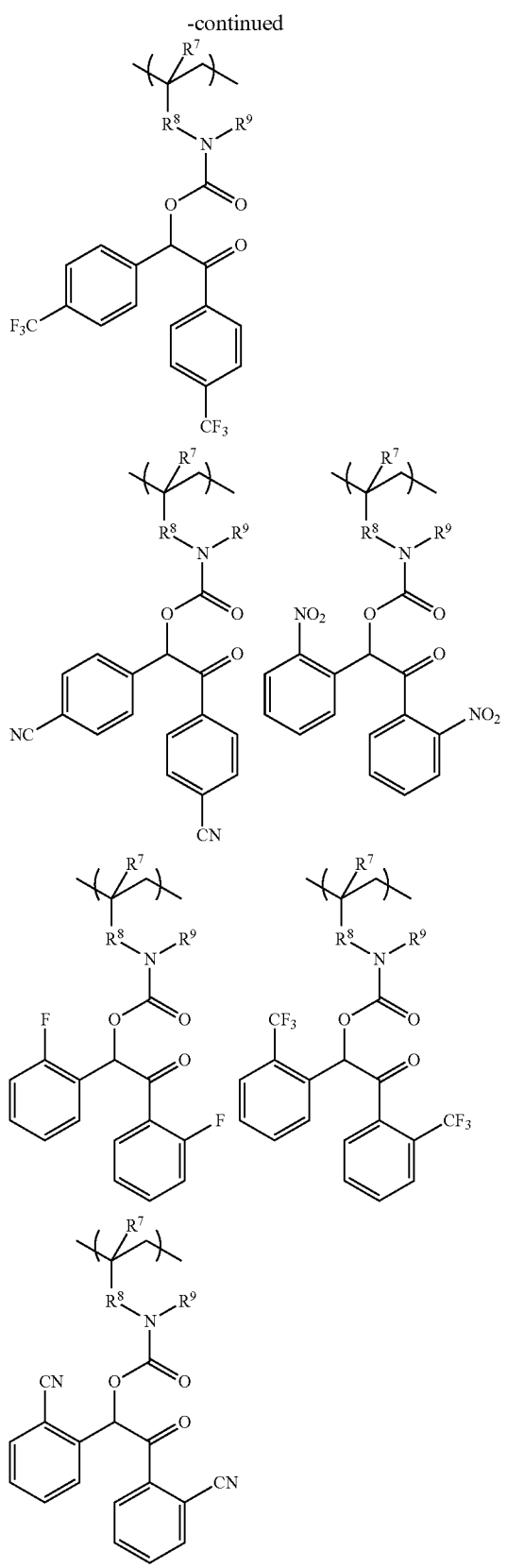
Recurring units (a2) may be selected from recurring units having any set of $R^7$ to $R^9$ combined with any set of $R^{10}$ and $R^{11}$ as exemplified above.
Examples of $R^{12}$ to $R^{14}$ in the base generator represented by recurring unit (a3) in formula (1) are shown blow.
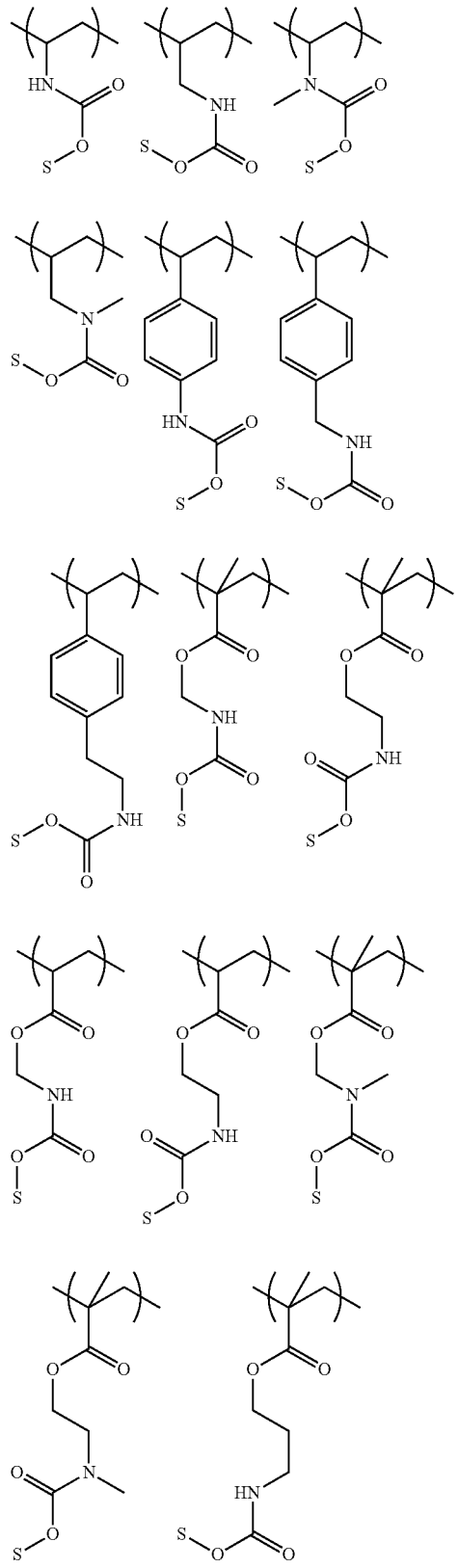

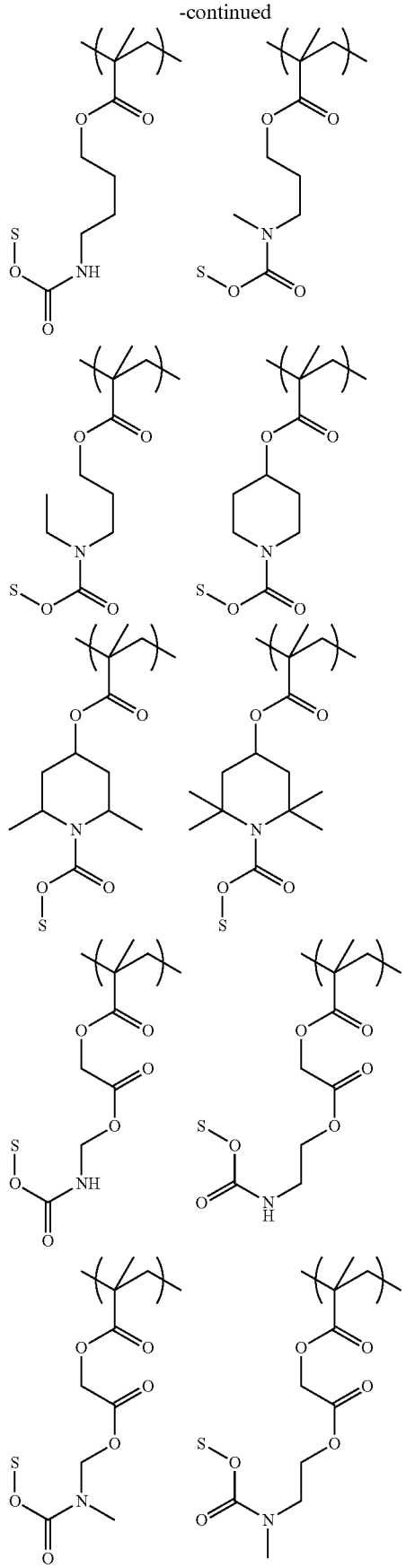
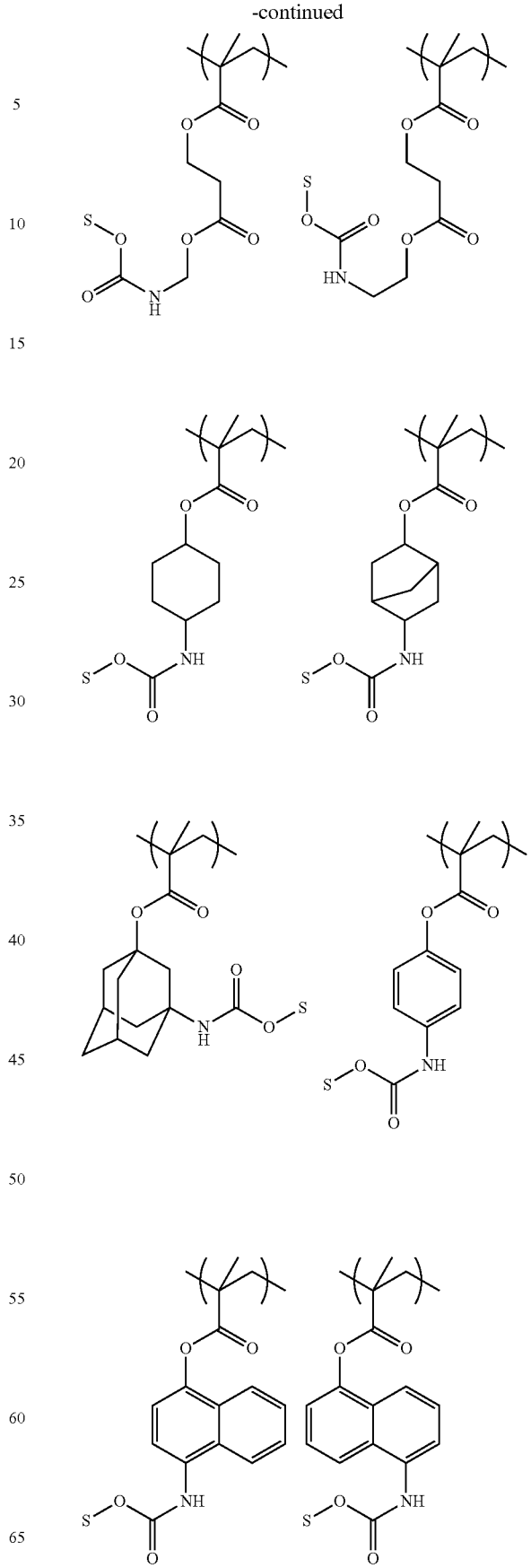

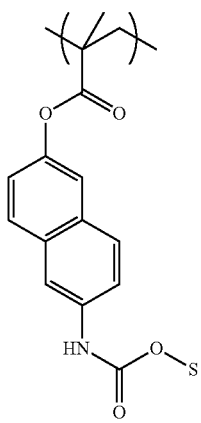
In the above formulae, S is a group of the following formula:
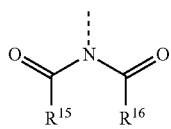
wherein the broken line designates a valence bond, $R^{15}$ and $R^{16}$ are as defined above.
Examples of $R^{15}$ and $R^{16}$ in the base generator represented by recurring unit (a3) in formula (1) are shown below wherein $R^{12}$ to $R^{14}$ are as defined above.
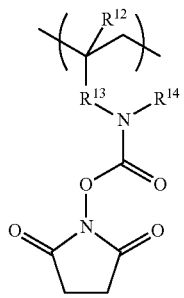 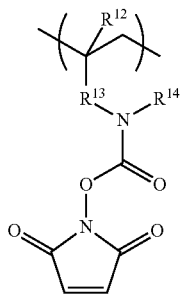
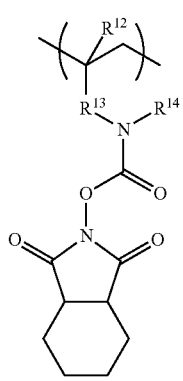 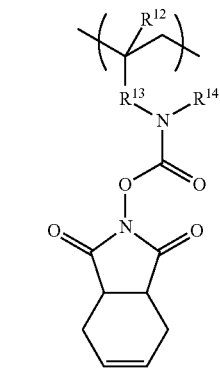
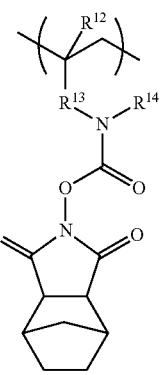 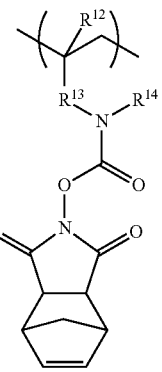
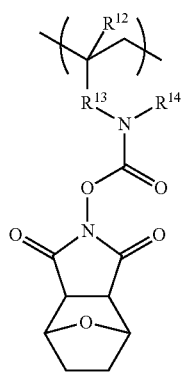 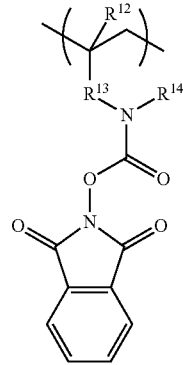
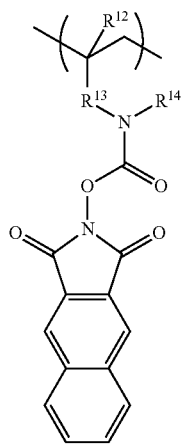 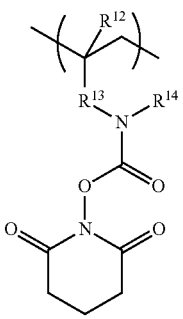
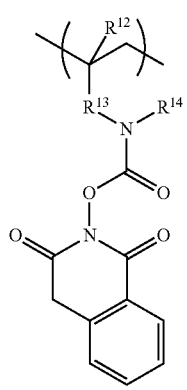 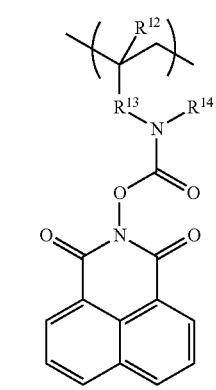

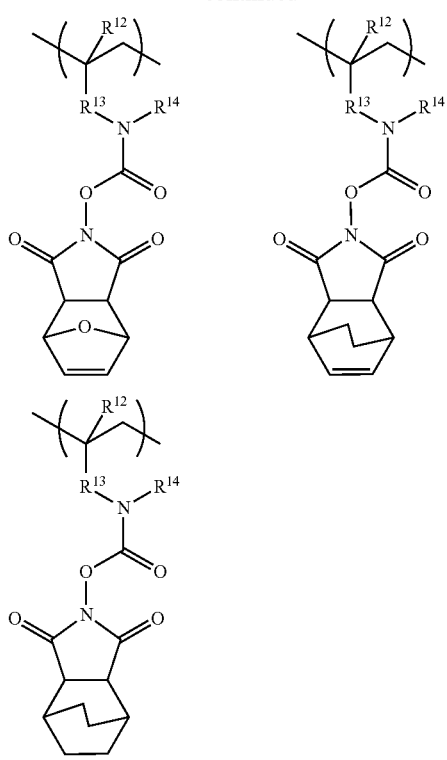
Recurring units (a3) may be selected from recurring units having any set of $R^{12}$ to $R^{14}$ combined with any set of $R^{15}$ and $R^{16}$ as exemplified above.
Examples of the base generator represented by recurring unit (a4) in formula (1) are shown below.
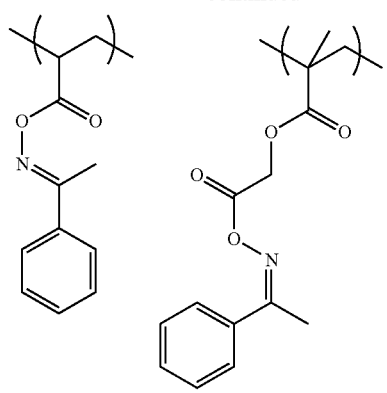
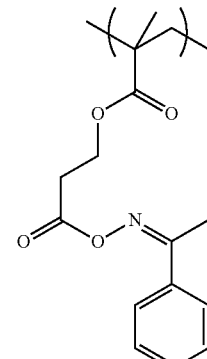
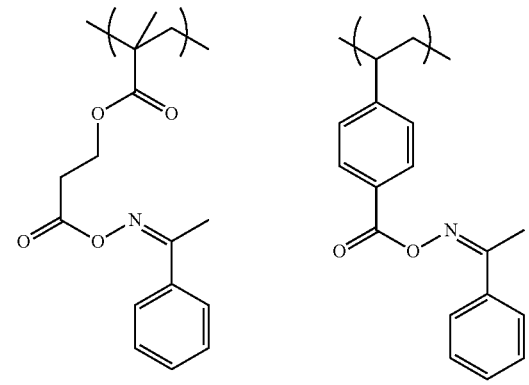
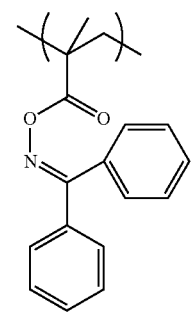
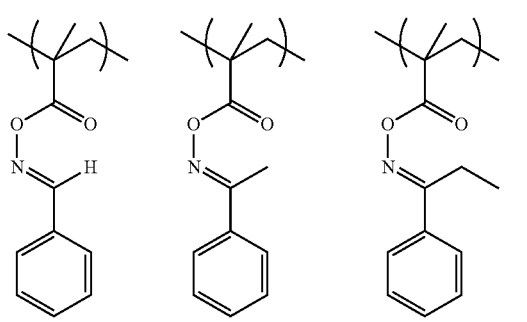
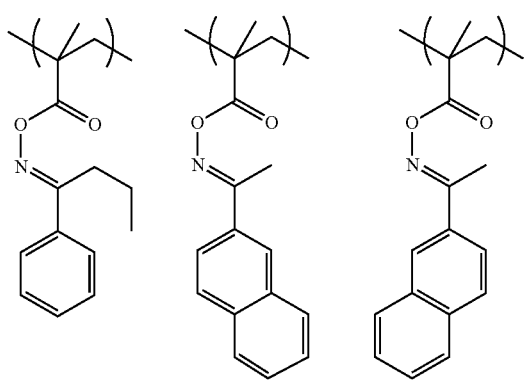
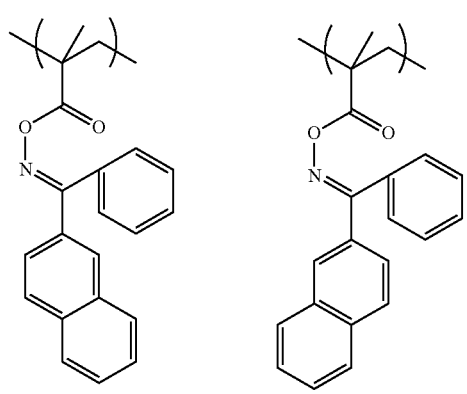

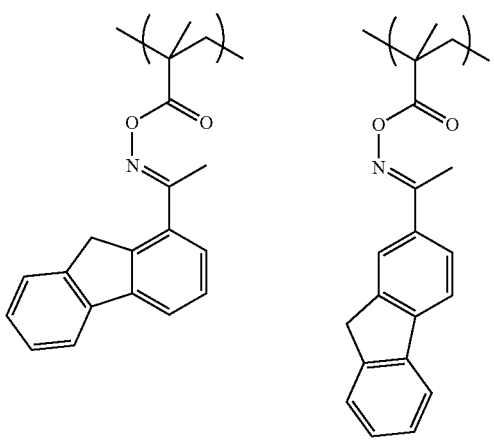

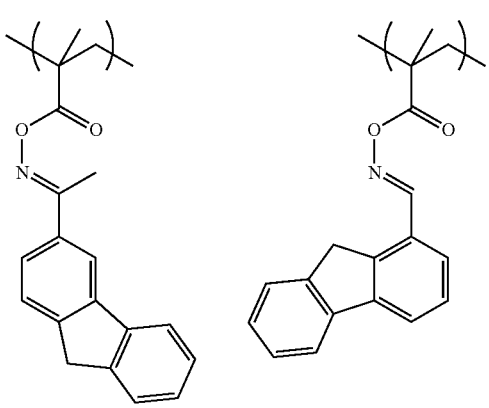

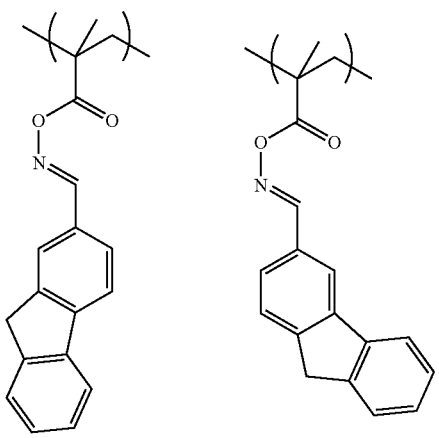

The base polymer in the resist composition used in the patterning process of the invention may be a polymer comprising recurring units (b) having an acid labile group, preferably represented by the general formula (AL). More preferred are polymers comprising base generator-bearing recurring units (a1), (a2), (a3) or (a4) represented by the general formula (1) as well as recurring units (b).

Herein $R^{024}$ is hydrogen or methyl, and $R^{025}$ is an acid labile group.

The acid labile groups represented by $R^{025}$ in formula (AL) may be selected from a variety of such groups. Preferred acid labile groups are groups of formulae (AL-10) and (AL-11), tertiary alkyl groups of formula (AL-12), and oxoalkyl groups of 4 to 20 carbon atoms, but not limited thereto.

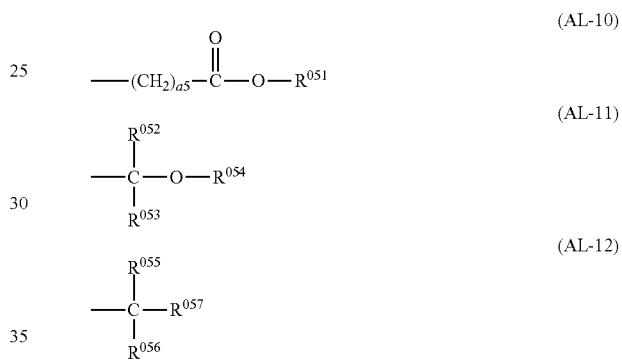

In formulae (AL-10) and (AL-11), $R^{051}$ and $R^{054}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{052}$ and $R^{053}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{052}$ and $R^{053}$, $R^{052}$ and $R^{054}$, or $R^{053}$ and $R^{054}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{055}$, $R^{056}$ and $R^{057}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{055}$ and $R^{056}$ $R^{055}$ and $R^{057}$, or $R^{056}$ and $R^{057}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

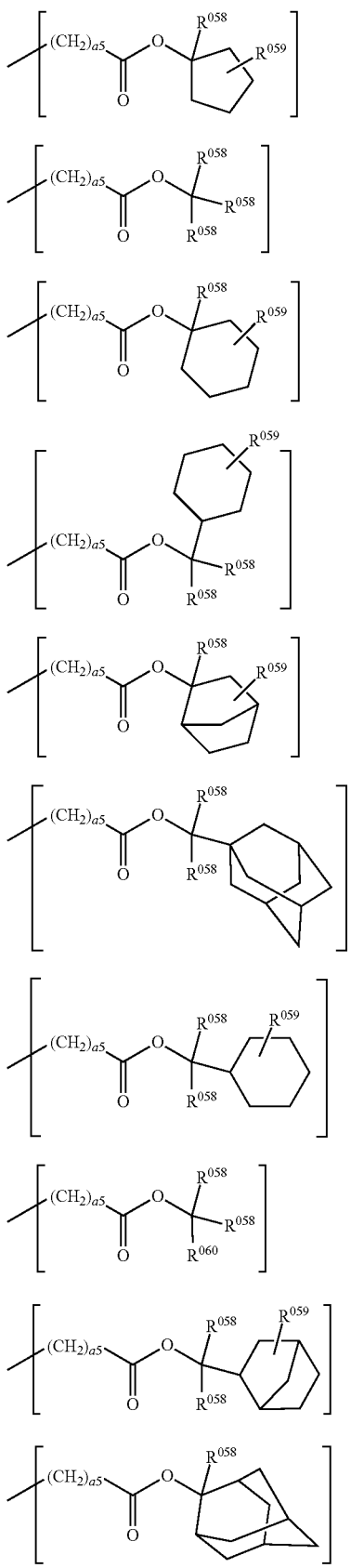

In formulae (AL-10)-1 to (AL-10)-10, $R^{058}$ is independently a straight, branched or cyclic $C_1$-$C_8$ alkyl group, $C_6$-$C_{20}$ aryl group or $C_7$-$C_{20}$ aralkyl group; $R^{059}$ is hydrogen or a straight, branched or cyclic $C_1$-$C_{20}$ alkyl group; $R^{060}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-34.

$$—CH_2—O—CH_3 \quad \text{(AL-11)-1}$$

$$—CH_2—O—CH_2—CH_3 \quad \text{(AL-11)-2}$$

$$—CH_2—O—(CH_2)_2—CH_3 \quad \text{(AL-11)-3}$$

$$—CH_2—O—(CH_2)_3—CH_3 \quad \text{(AL-11)-4}$$

$$—CH_2—O—\underset{\underset{CH_3}{|}}{CH}—CH_3 \quad \text{(AL-11)-5}$$

$$—CH_2—O—\underset{\underset{CH_3}{|}}{\overset{\overset{CH_3}{|}}{C}}—CH_3 \quad \text{(AL-11)-6}$$

$$—\underset{\underset{CH_3}{|}}{\overset{\overset{CH_3}{|}}{CH}}—O—CH_3 \quad \text{(AL-11)-7}$$

$$—\underset{\underset{CH_3}{|}}{\overset{\overset{CH_3}{|}}{\underset{\underset{CH_2}{|}}{CH}}}—O—CH_3 \quad \text{(AL-11)-8}$$

$$—\underset{\underset{CH_3}{|}}{\overset{\overset{(CH_2)_2}{|}}{CH}}—O—CH_3 \quad \text{(AL-11)-9}$$

$$—\underset{\underset{CH_3}{|}}{\overset{\overset{CH_3}{|}}{CH}}—O—CH_2—CH_3 \quad \text{(AL-11)-10}$$

$$—\underset{\underset{CH_3}{|}}{\overset{\overset{CH_2}{|}}{\underset{\underset{CH_3}{|}}{CH}}}—O—CH_2—CH_3 \quad \text{(AL-11)-11}$$

$$—\underset{\underset{CH_3}{|}}{\overset{\overset{CH—CH_3}{|}}{CH}}—O—CH_2—CH_3 \quad \text{(AL-11)-12}$$

$$—\underset{\underset{CH_3}{|}}{\overset{\overset{CH_3}{|}}{CH}}—O—(CH_2)_2—CH_3 \quad \text{(AL-11)-13}$$

$$—\underset{\underset{CH_3}{|}}{\overset{\overset{CH_2}{|}}{\underset{\underset{CH_3}{|}}{CH}}}—O—(CH_2)_2—CH_3 \quad \text{(AL-11)-14}$$

(AL-11)-15 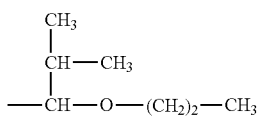

(AL-11)-16 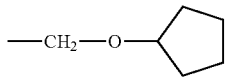

(AL-11)-17 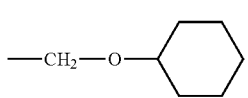

(AL-11)-18 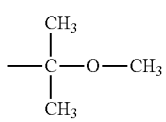

(AL-11)-19 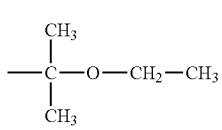

(AL-11)-20 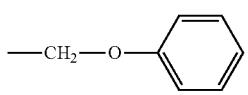

(AL-11)-21 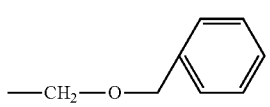

(AL-11)-22 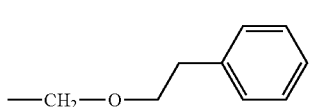

(AL-11)-23 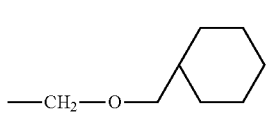

(AL-11)-24 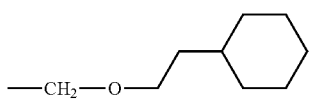

(AL-11)-25 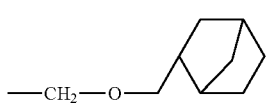

(AL-11)-26 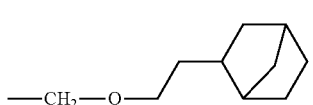

(AL-11)-27 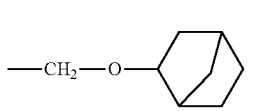

(AL-11)-28 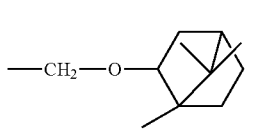

(AL-11)-29 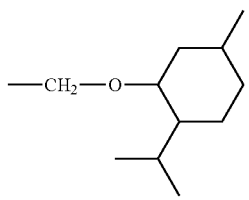

(AL-11)-30 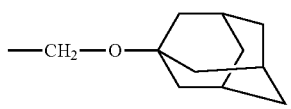

(AL-11)-31 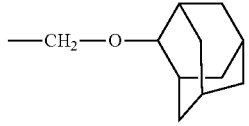

(AL-11)-32 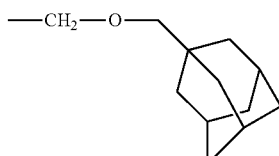

(AL-11)-33 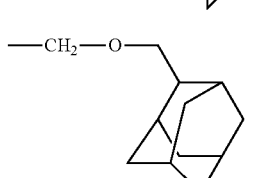

(AL-11)-34 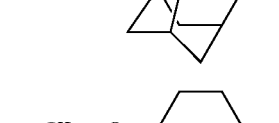

The polymer may be crosslinked within the molecule or between molecules with acid labile groups of formula (AL-11a) or (AL-11b).

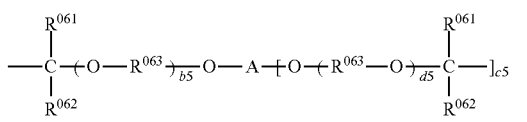

(AL-11a)

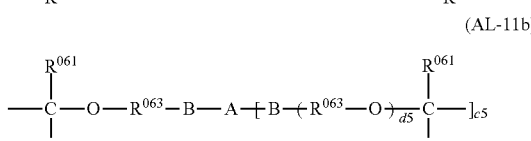

(AL-11b)

Herein $R^{061}$ and $R^{062}$ each are hydrogen or a straight, branched or cyclic $C_1$-$C_8$ alkyl group, or $R^{061}$ and $R^{062}$, taken together, may form a ring with the carbon atom to which they are attached, and $R^{061}$ and $R^{062}$ are straight or branched $C_1$-$C_8$ alkylene groups when they form a ring. $R^{063}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

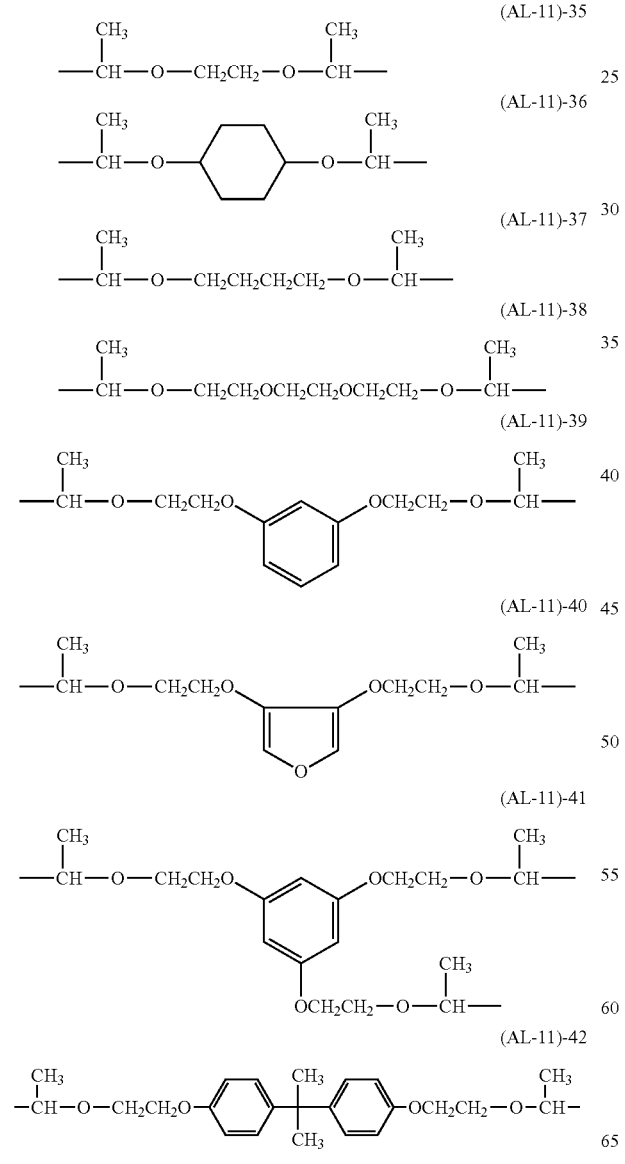

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

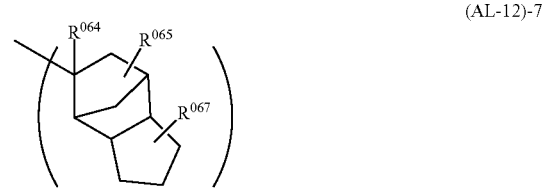

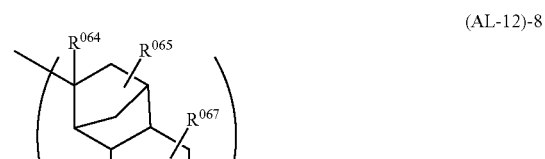

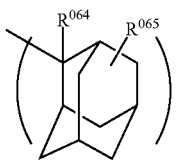
(AL-12)-10

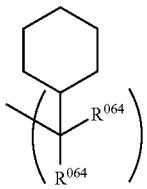
(AL-12)-11

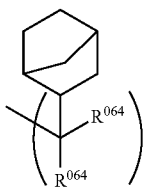
(AL-12)-12

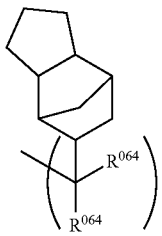
(AL-12)-13

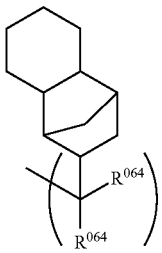
(AL-12)-14

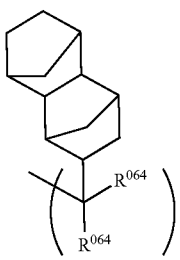
(AL-12)-15

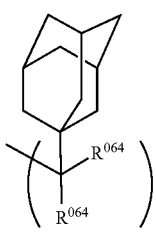
(AL-12)-16

Herein $R^{064}$ is independently a straight, branched or cyclic $C_1$-$C_8$ alkyl group, $C_6$-$C_{20}$ aryl group or $C_7$-$C_{20}$ aralkyl group; $R^{065}$ and $R^{067}$ each are hydrogen or a straight, branched or cyclic $C_1$-$C_{20}$ alkyl group; and $R^{066}$ is a $C_6$-$C_{20}$ aryl group or $C_7$-$C_{20}$ aralkyl group.

With acid labile groups comprising $R^{068}$ representative of a di- or more valent alkylene or arylene group being included as shown in formulae (AL-12)-17 and (AL-12)-18, the polymer may be crosslinked within the molecule or between molecules.

(AL-12)-17

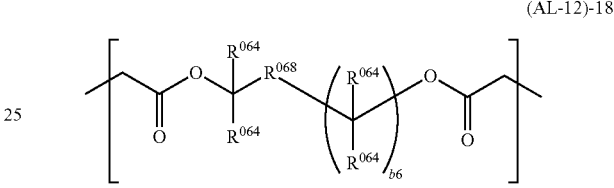
(AL-12)-18

In formulae (AL-12)-17 and (AL-12)-18, $R^{064}$ is as defined above; $R^{068}$ is a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{064}$, $R^{065}$, $R^{066}$ and $R^{067}$ may contain a heteroatom such as oxygen, nitrogen or sulfur. Such groups are exemplified by those of the following formulae (AL-13)-1 to (AL-13)-7.

(AL-13)-1

(AL-13)-2

(AL-13)-3

(AL-13)-4

(AL-13)-5

(AL-13)-6

(AL-13)-7

Of the acid labile groups of formula (AL-12), recurring units having an exo-form structure represented by the formula (AL-12)-19 are preferred.

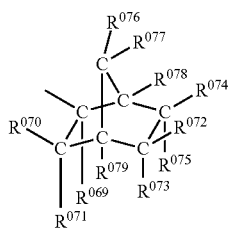

(AL-12)-19

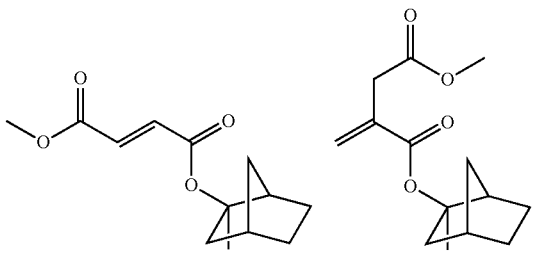

Herein, $R^{069}$ is a straight, branched or cyclic $C_1$-$C_8$ alkyl group or an optionally substituted $C_6$-$C_{20}$ aryl group; $R^{070}$ to $R^{075}$, $R^{078}$ and $R^{079}$ are each independently hydrogen or a monovalent hydrocarbon group, typically alkyl, of 1 to 15 carbon atoms which may contain a heteroatom; and $R^{076}$ and $R^{077}$ are hydrogen. Alternatively, a pair of $R^{070}$ and $R^{071}$, $R^{072}$ and $R^{074}$, $R^{072}$ and $R^{075}$, $R^{073}$ and $R^{075}$, $R^{073}$ and $R^{079}$, $R^{074}$ and $R^{078}$, $R^{076}$ and $R^{077}$, or $R^{077}$ and $R^{078}$ may bond together to form a ring, typically alicyclic, with the carbon atom to which they are attached, and in this case, each group participating in ring formation is a divalent hydrocarbon group, typically alkylene, of 1 to 15 carbon atoms which may contain a heteroatom. Also, a pair of $R^{070}$ and $R^{079}$, $R^{076}$ and $R^{079}$, or $R^{072}$ and $R^{074}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

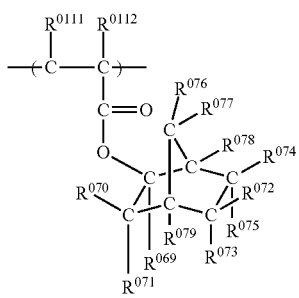

Illustrative non-limiting examples of suitable monomers are given below wherein $R^{0111}$ and $R^{0112}$ are each independently hydrogen, methyl, —COOCH$_3$ or —CH$_2$COOCH$_3$.

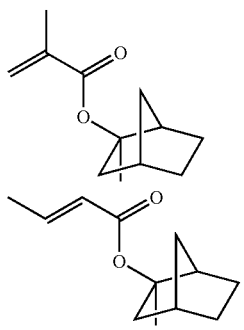

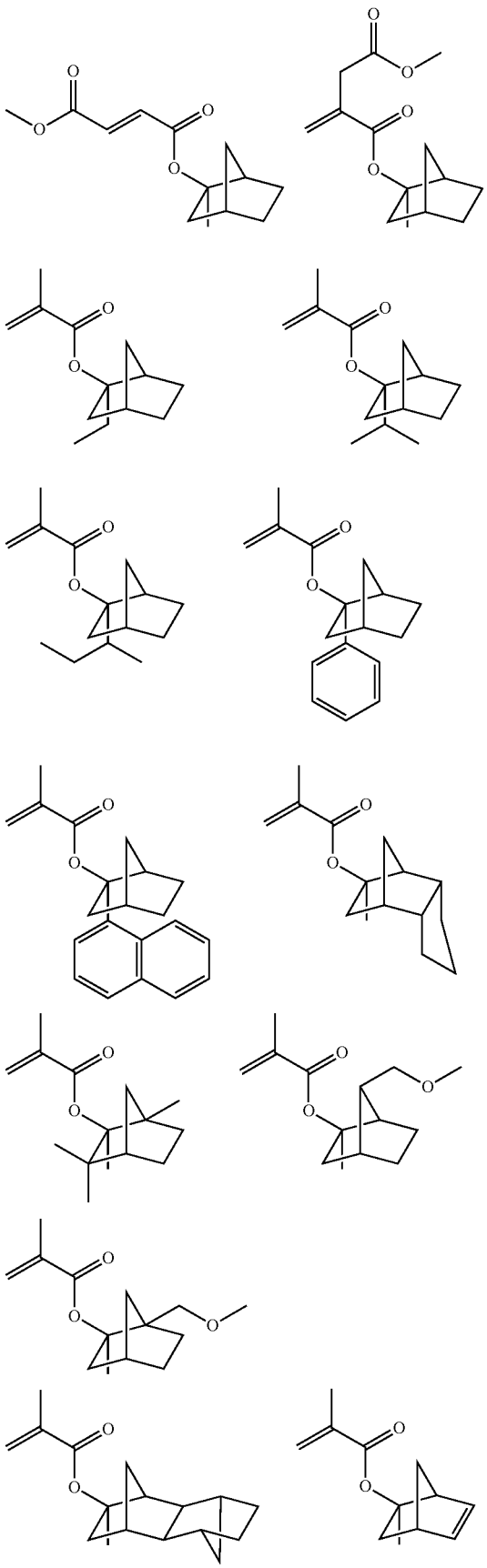

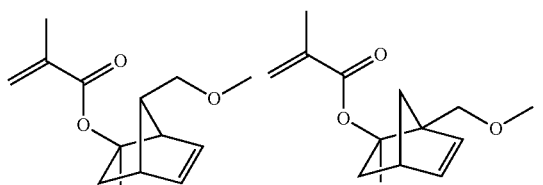

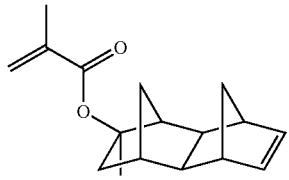

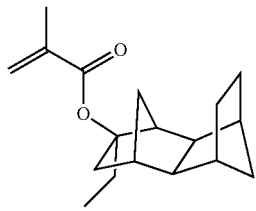

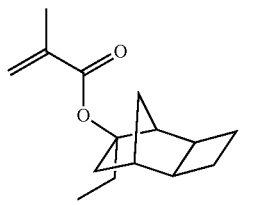

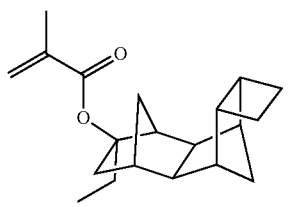

Also included in the acid labile groups of formula (AL-12) are acid labile groups having furandiyl, tetrahydrofurandiyl or oxanorbornanediyl as represented by the following formula (AL-12)-20.

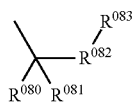
(AL-12)-20

Herein, $R^{080}$ and $R^{081}$ are each independently a monovalent hydrocarbon group, typically a straight, branched or cyclic $C_1$-$C_{10}$ alkyl group. $R^{080}$ and $R^{081}$, taken together, may form an aliphatic hydrocarbon ring of 3 to 20 carbon atoms with the carbon atom to which they are attached. $R^{082}$ is a divalent group selected from furandiyl, tetrahydrofurandiyl and oxanorbornanediyl. $R^{083}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

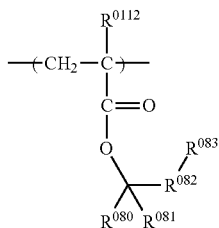

(wherein $R^{080}$ to $R^{083}$ and $R^{0112}$ are as defined above) are derived from monomers, examples of which are shown below. Note that Me is methyl and Ac is acety.

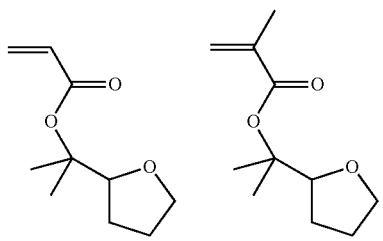

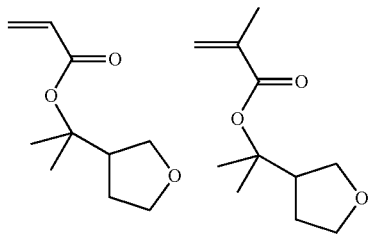

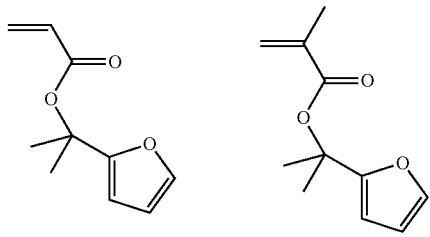

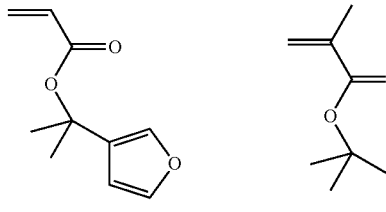

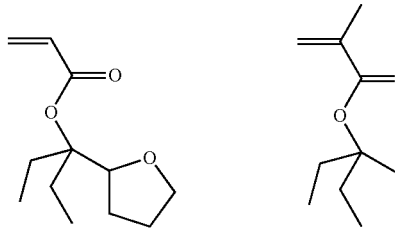

-continued
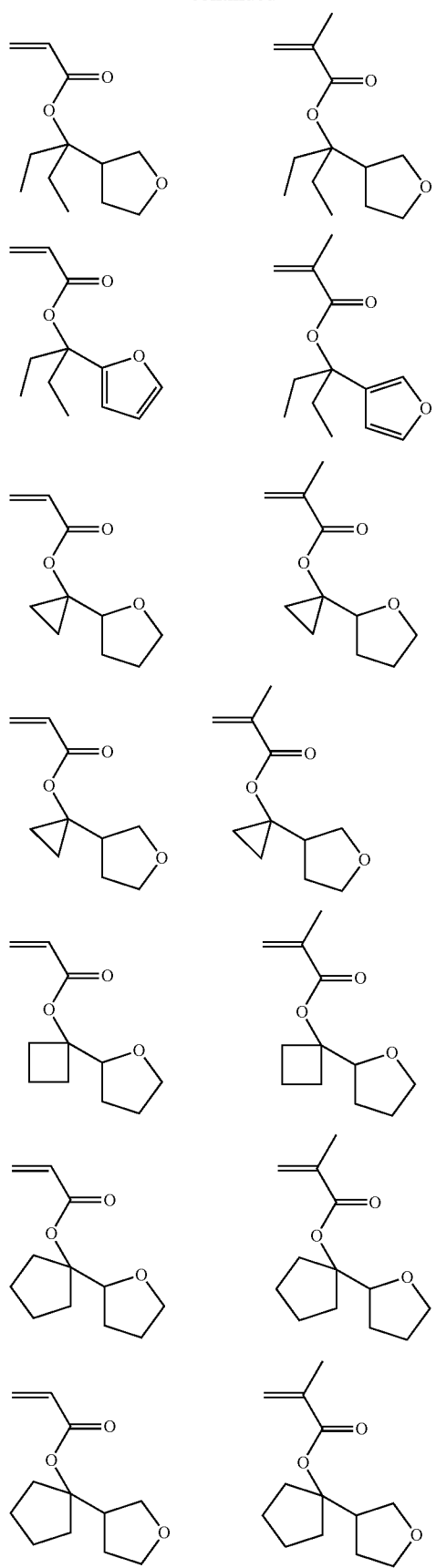
-continued
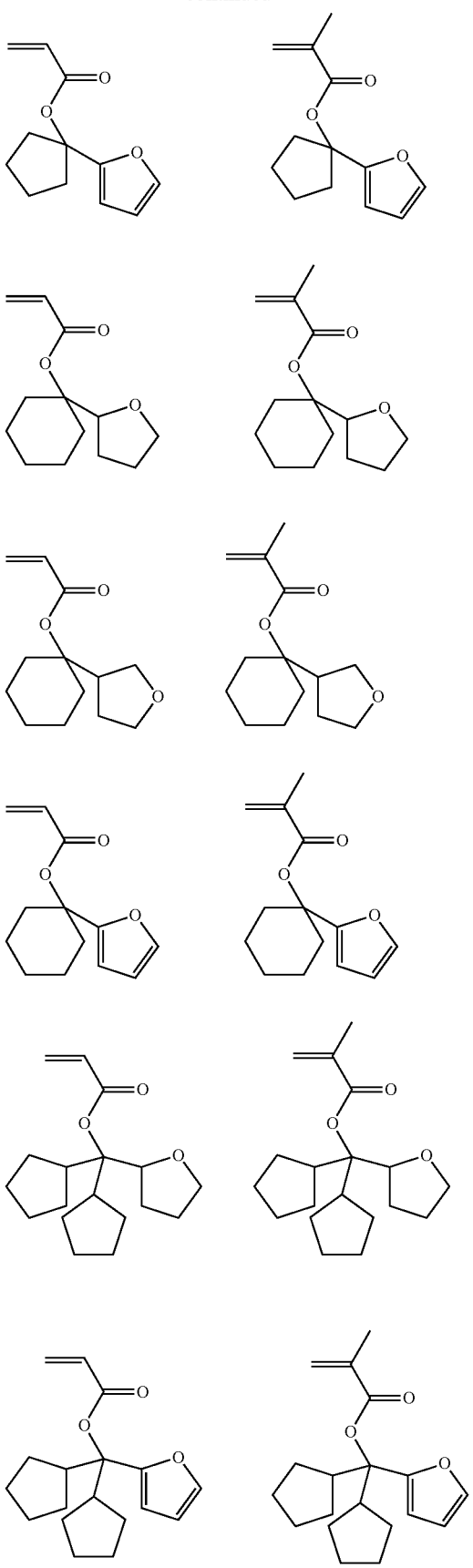

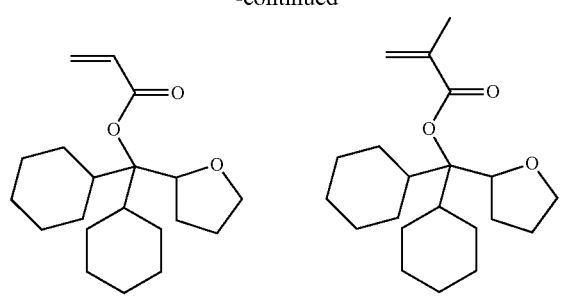
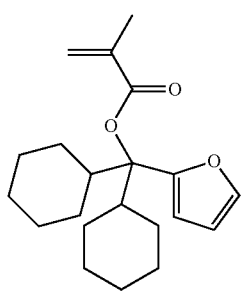
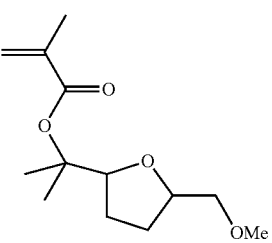
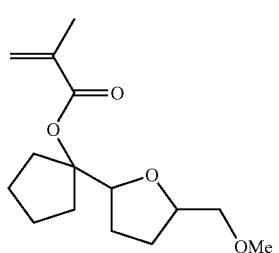
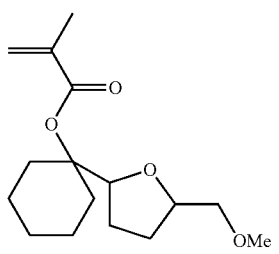
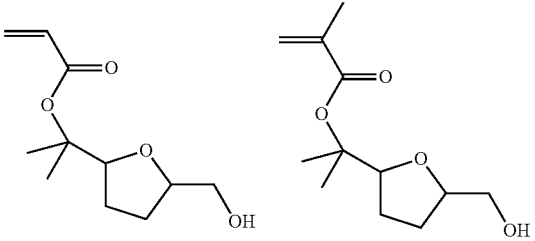
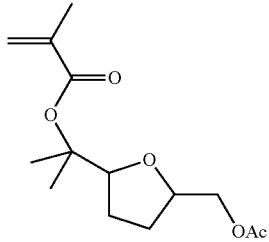
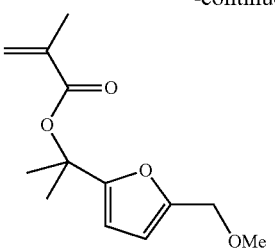
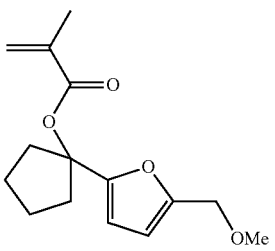
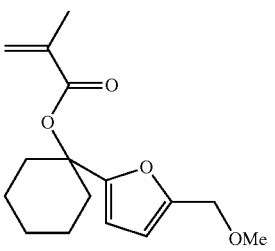
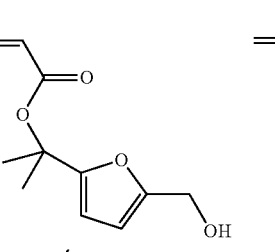
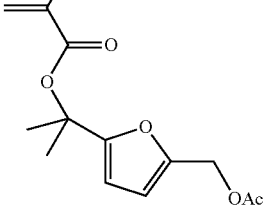
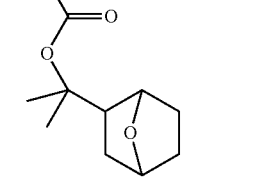
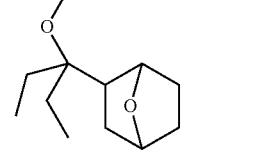

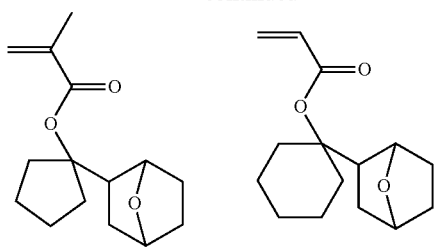
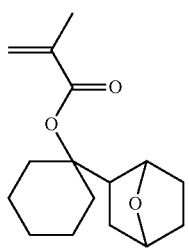 [SMILES: C=C(C)C(=O)OC1(C2CC3CCC2O3)CCCCC1]

While the polymer in the resist composition used in the patterning process of the invention preferably includes base generator-bearing recurring units (a1), (a2), (a3) or (a4) represented by the general formula (1) and recurring units (b) having an acid labile group of formula (AL), it may have further copolymerized therein recurring units (c) derived from monomers having adhesive groups such as hydroxy, cyano, carbonyl, ester, ether groups, lactone rings, carboxyl or carboxylic anhydride groups. Examples of monomers from which recurring units (c) are derived are given below.

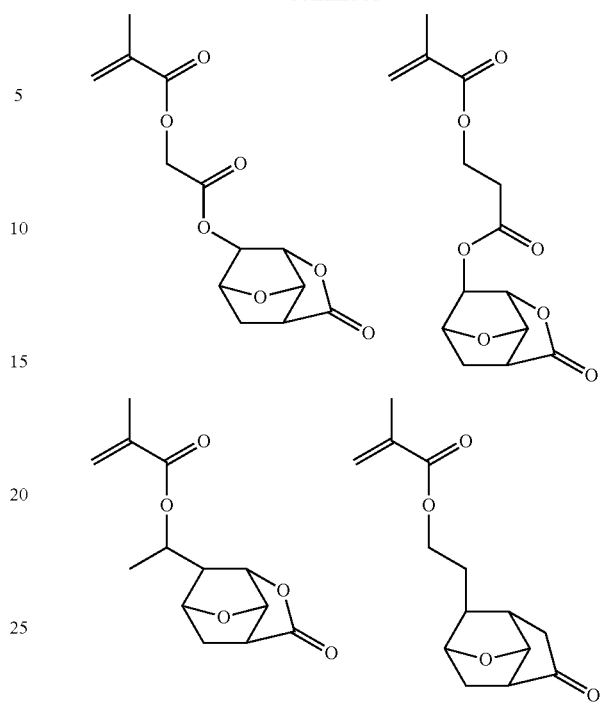
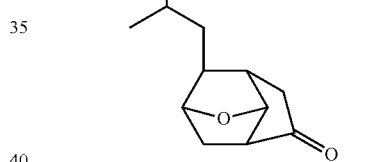
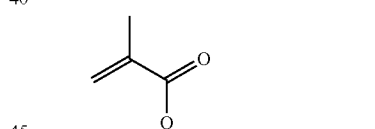
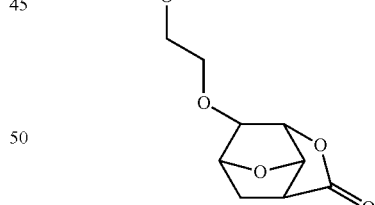
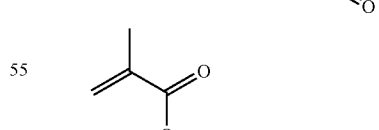
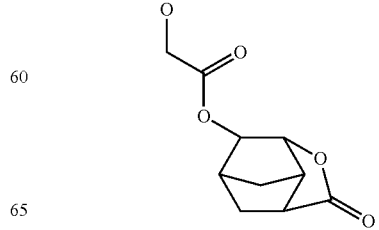

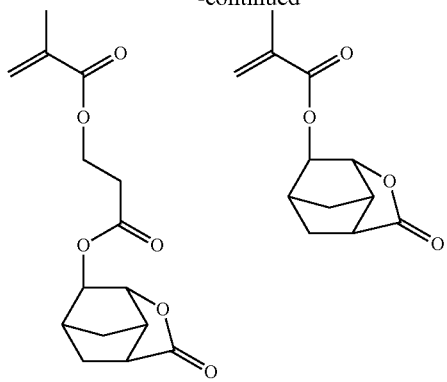
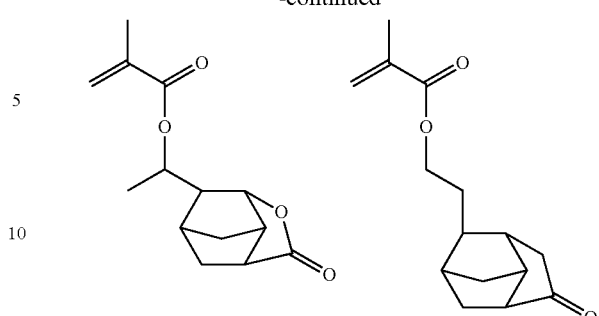
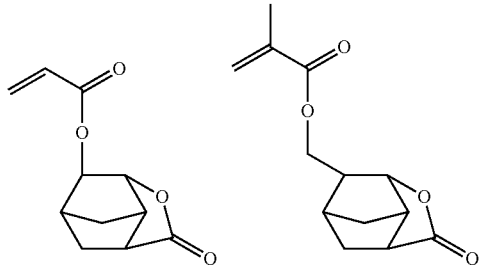
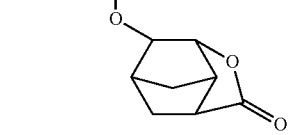
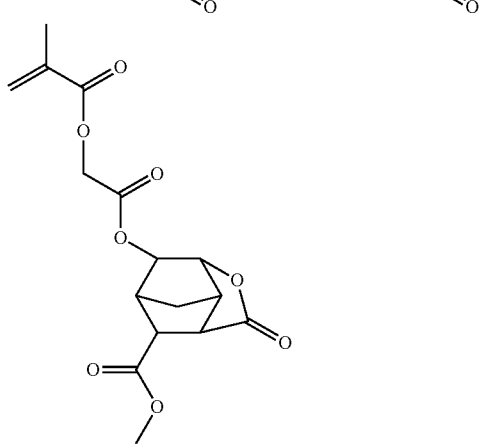
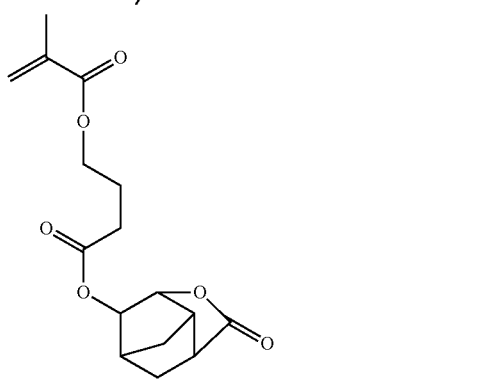

59
-continued
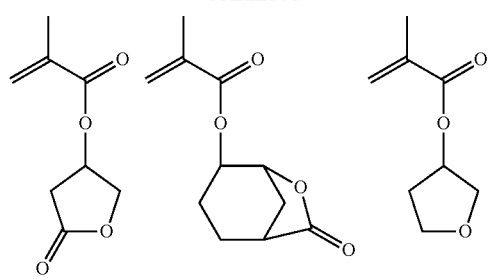
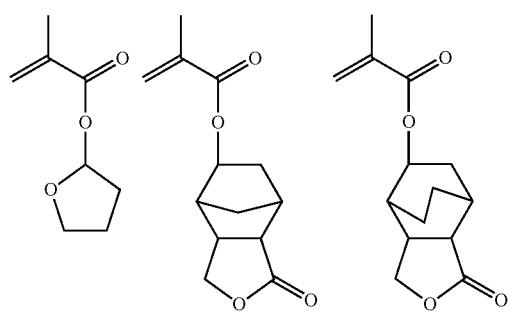
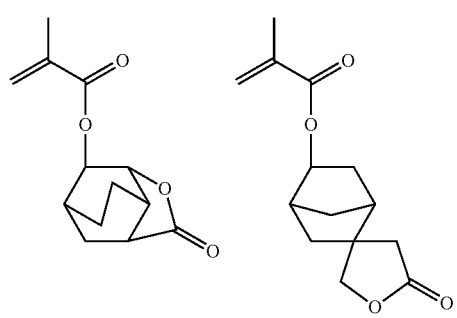
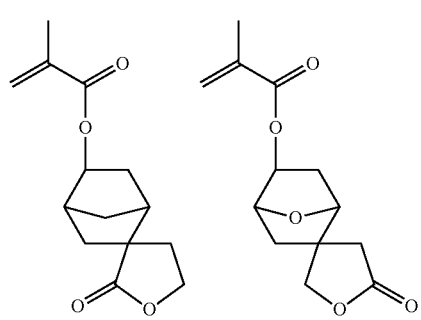
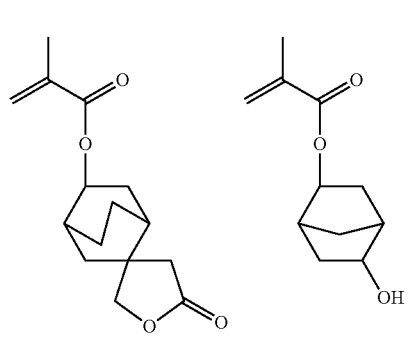
60
-continued
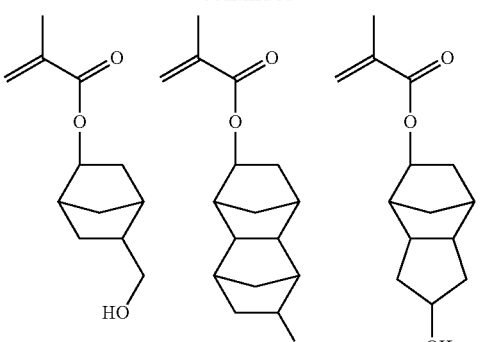
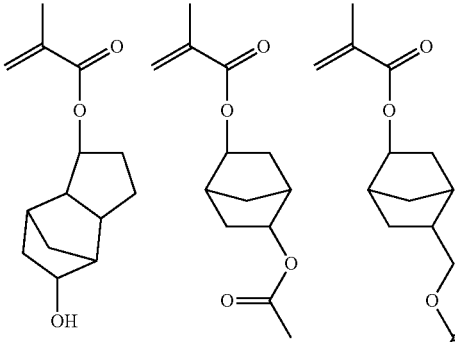
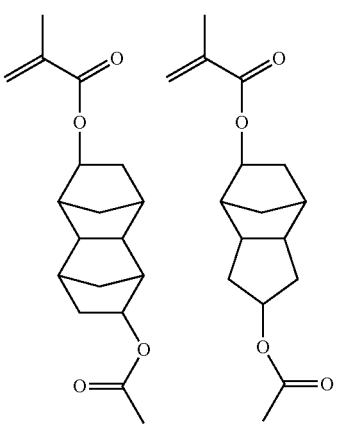
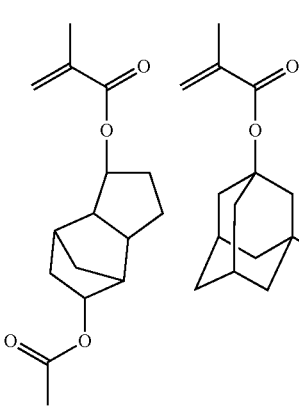

-continued
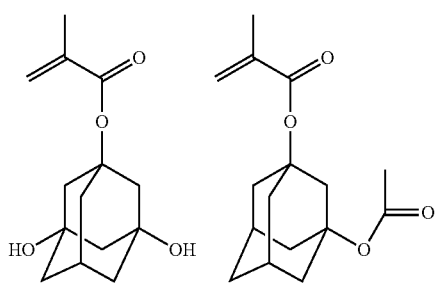
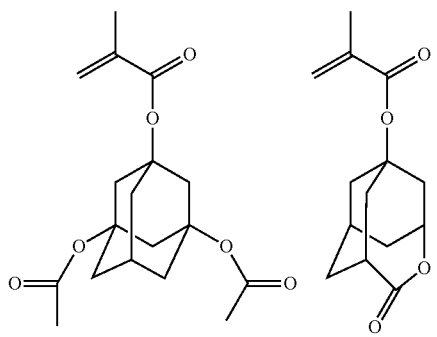
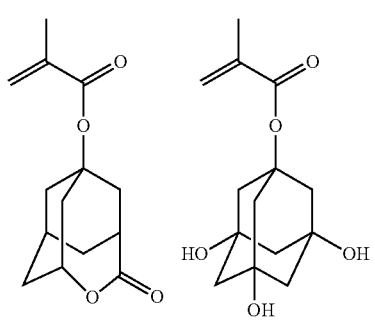
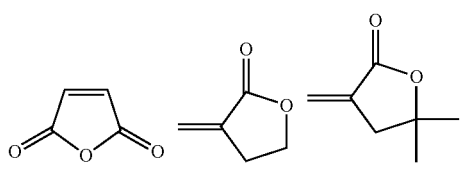
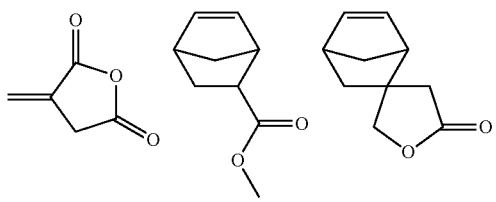
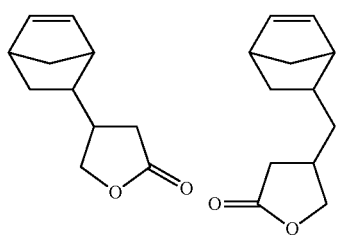
-continued
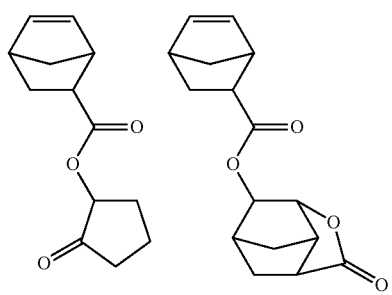
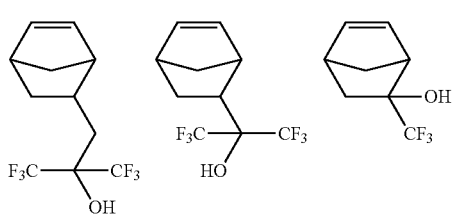
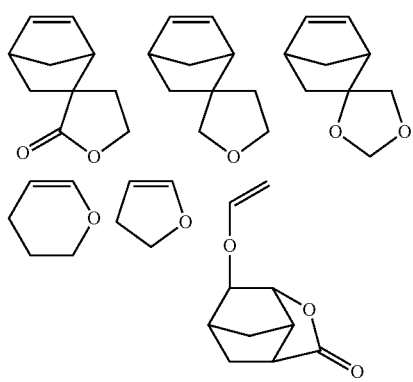
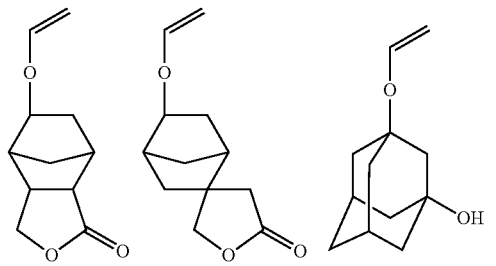
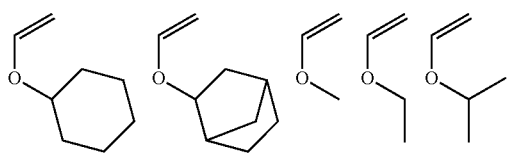
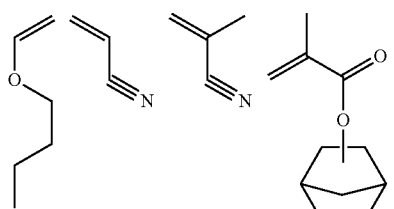
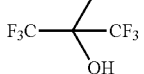

-continued
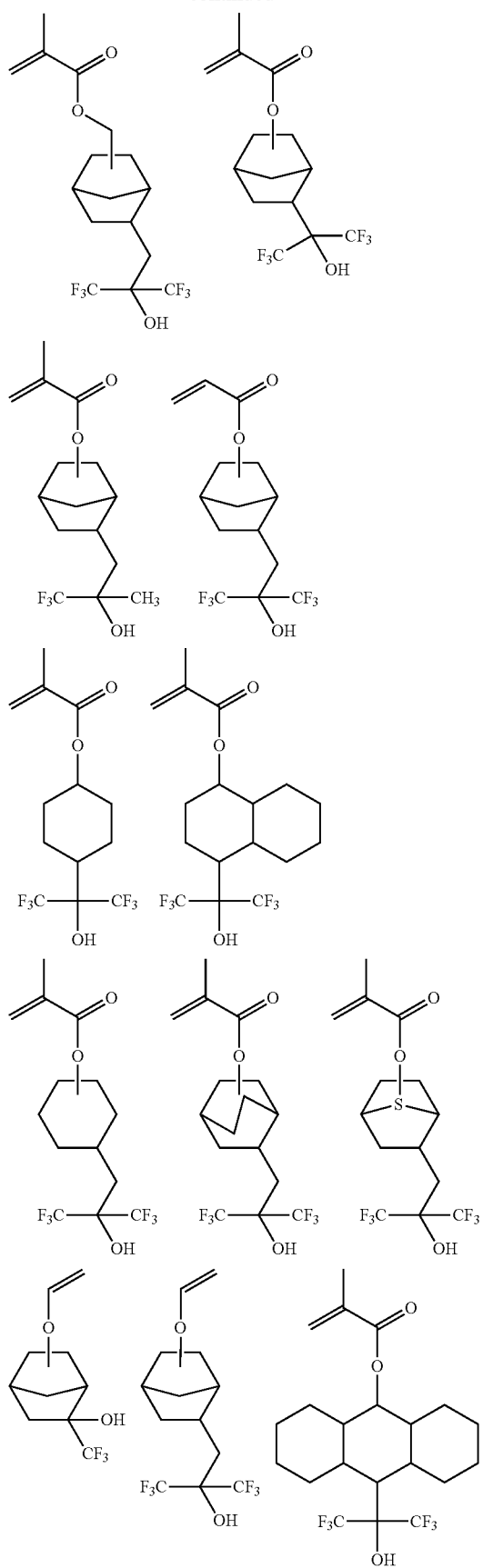
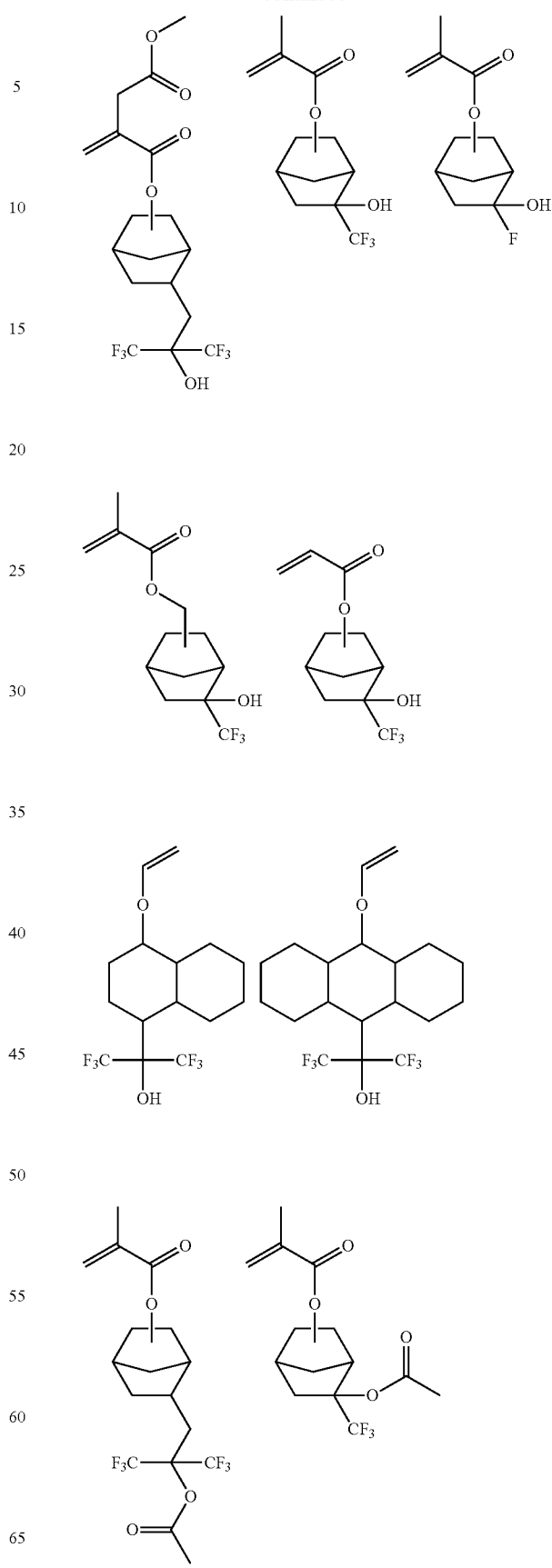

65
-continued
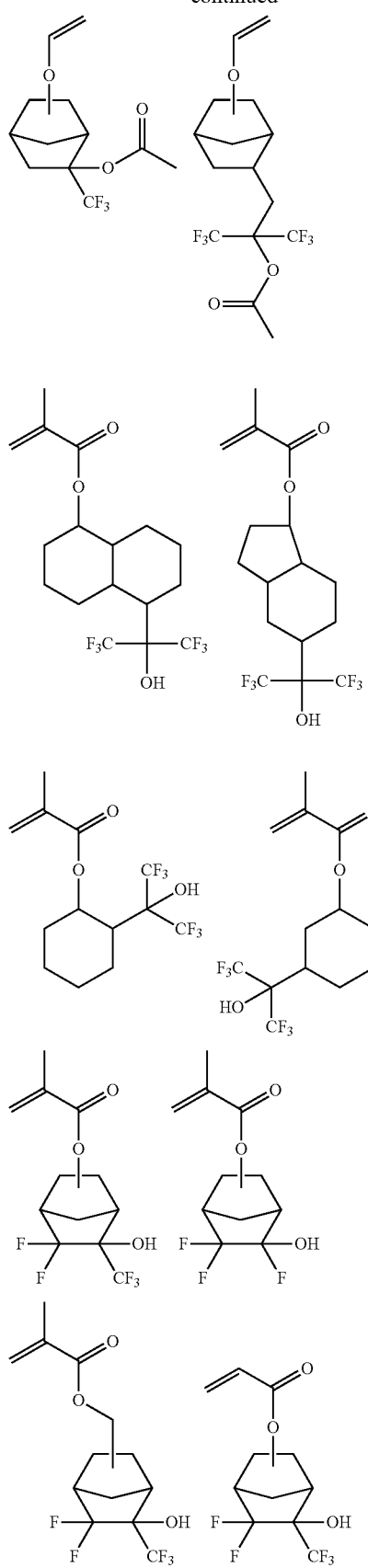
66
-continued
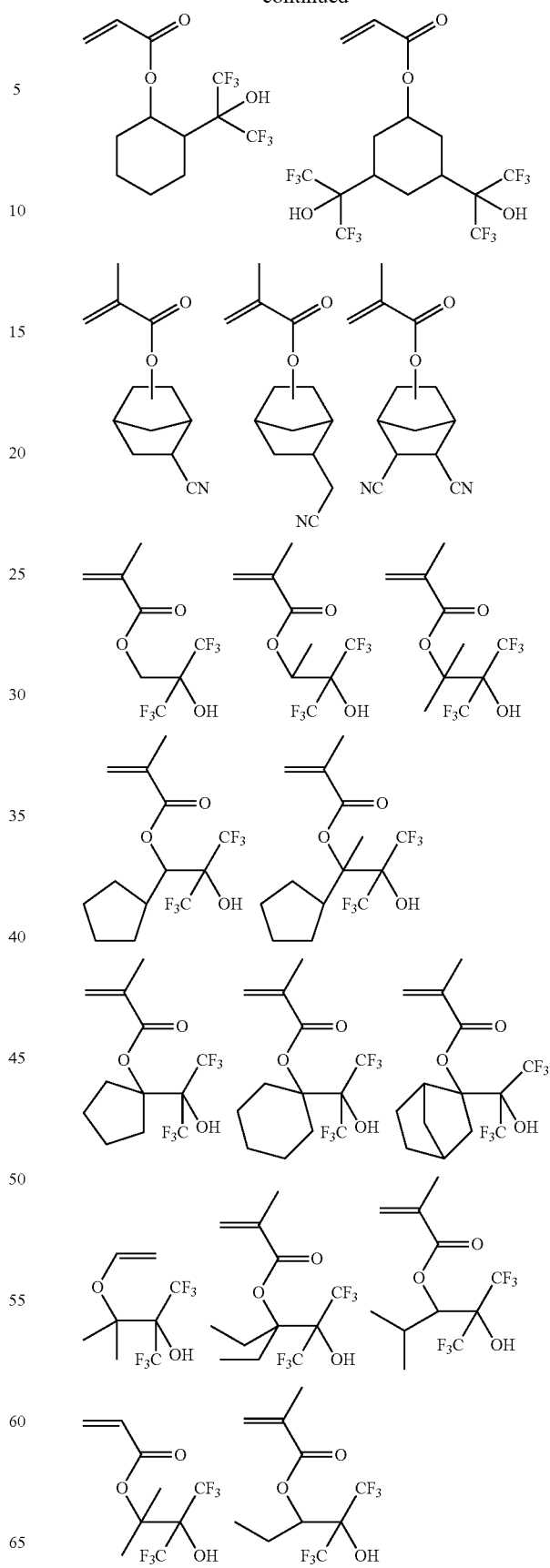

67
-continued
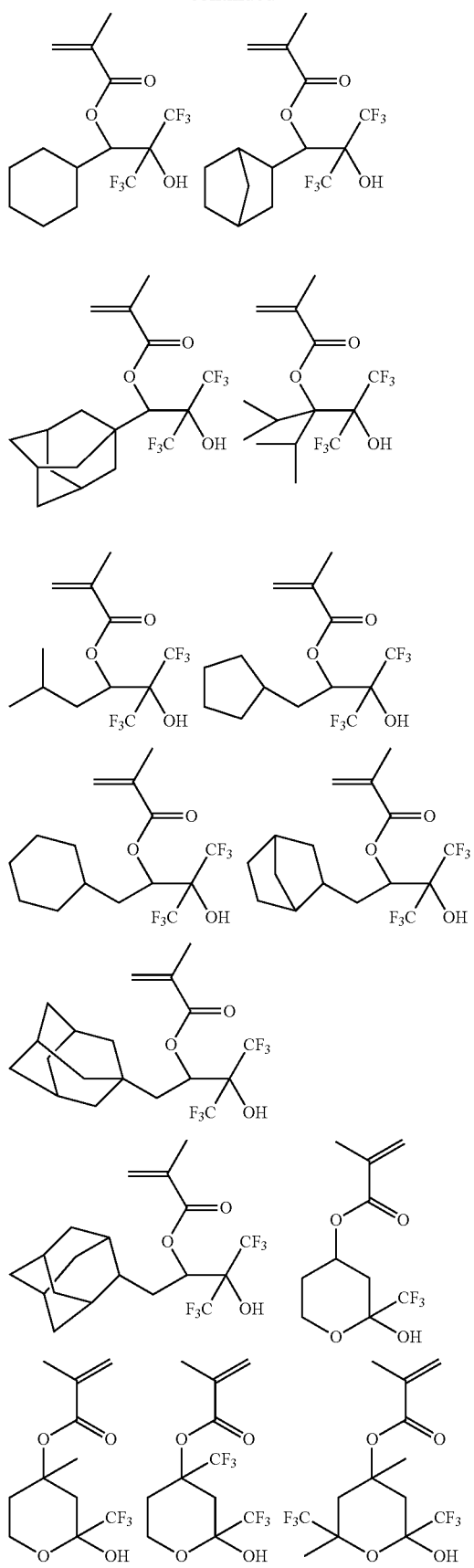
68
-continued
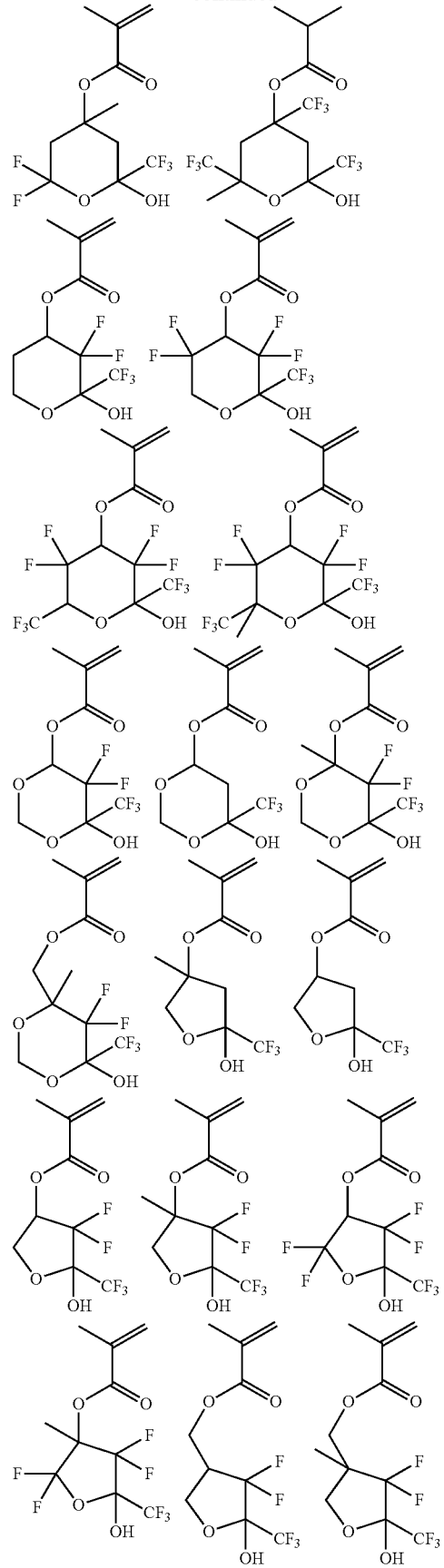

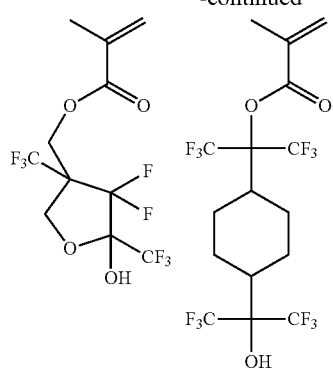
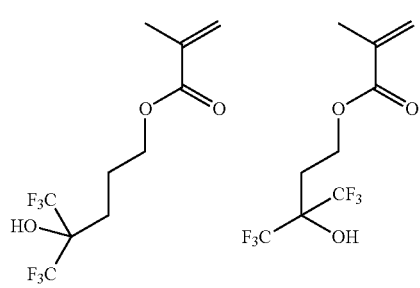
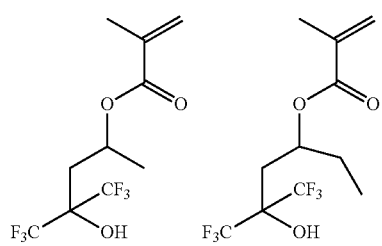
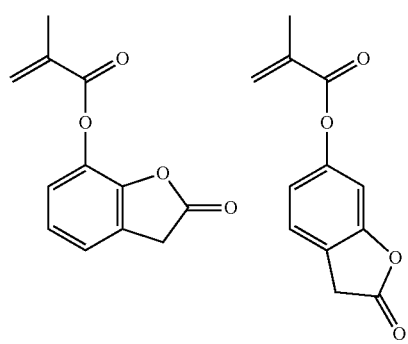
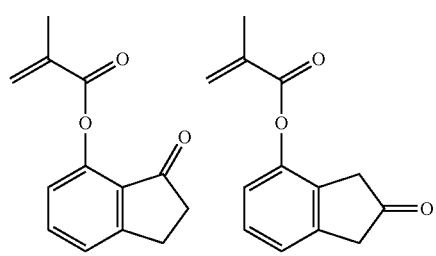
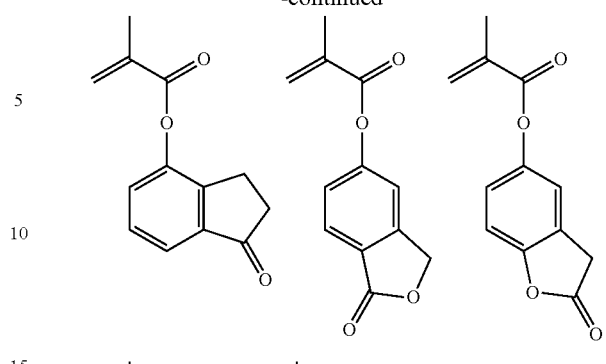
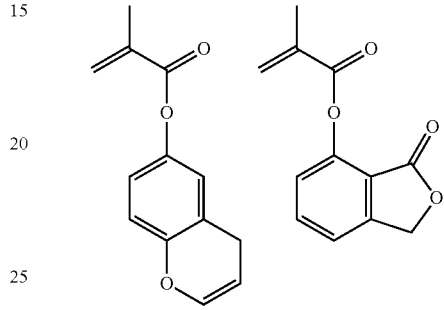
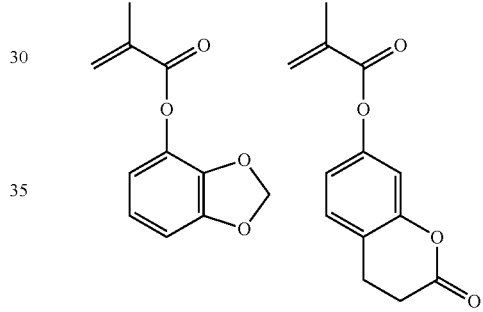
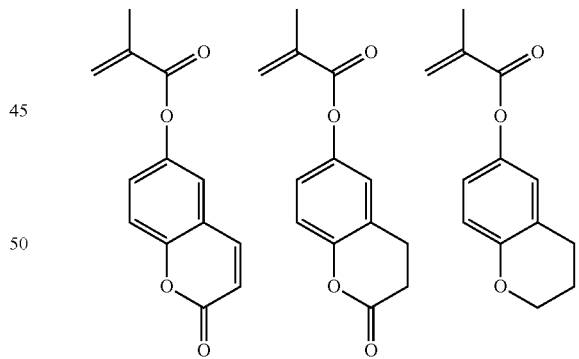
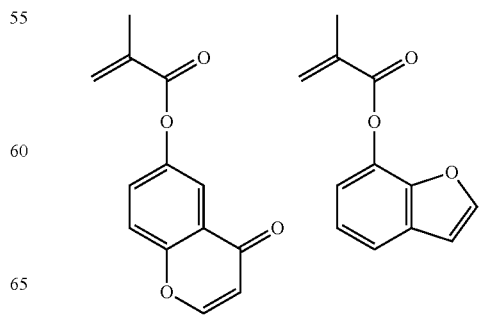

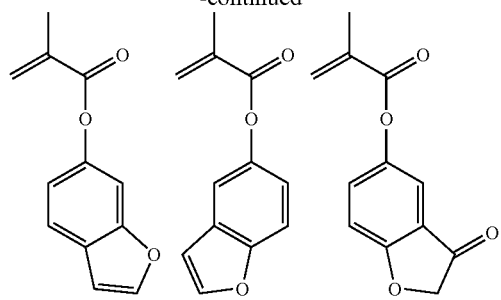
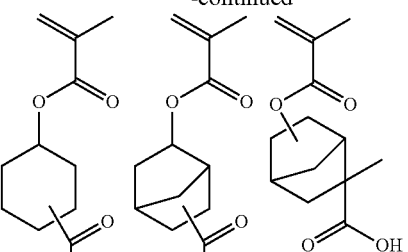
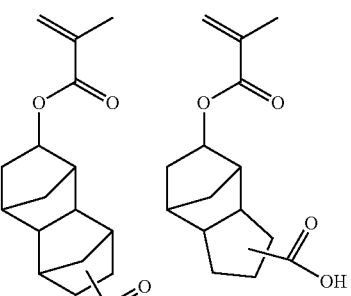
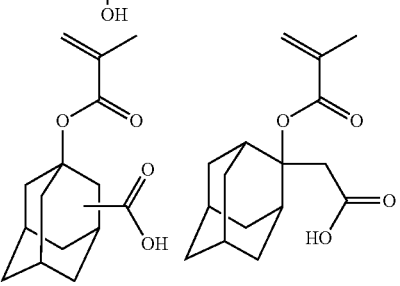
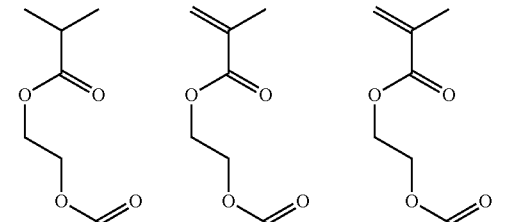
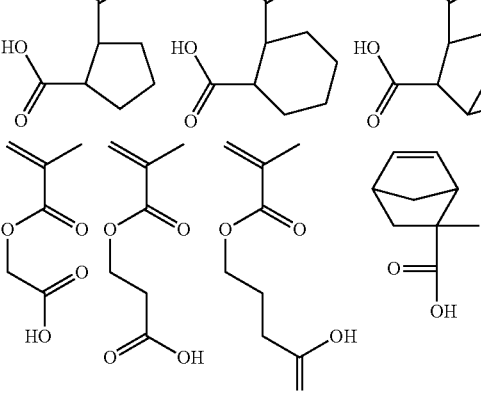
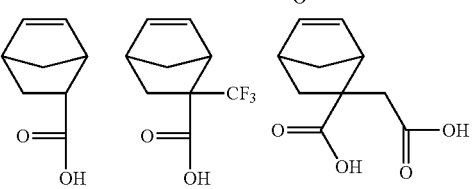

73
-continued
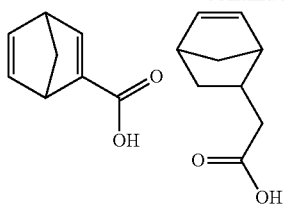
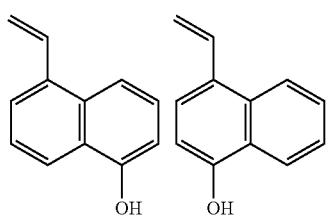
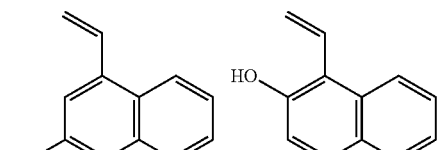
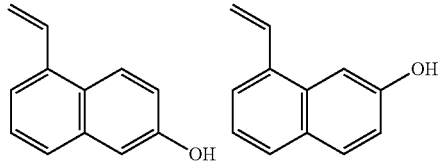
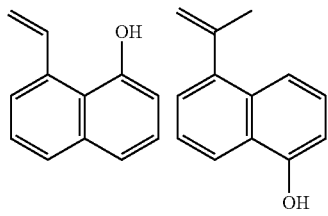
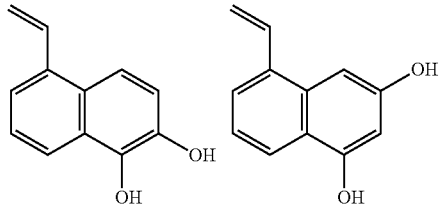
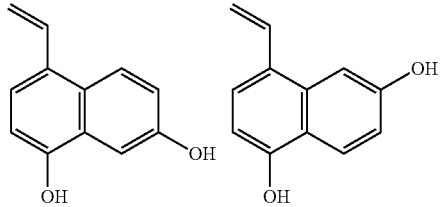
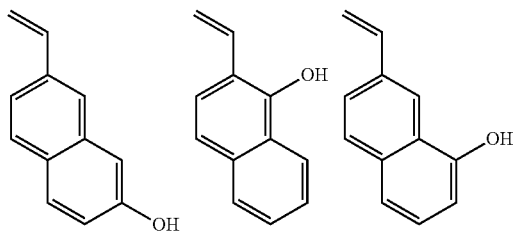
74
-continued
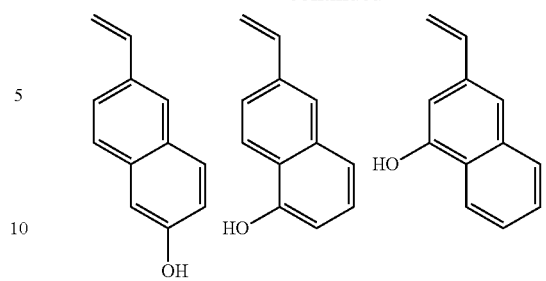
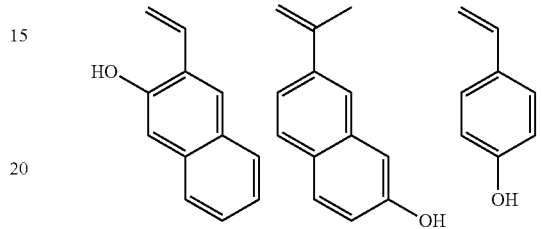
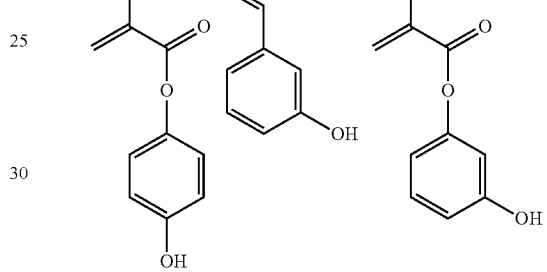
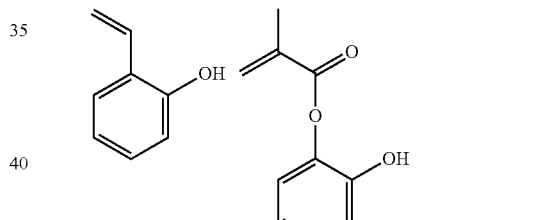
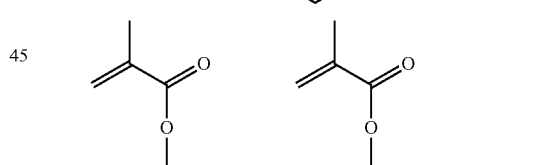
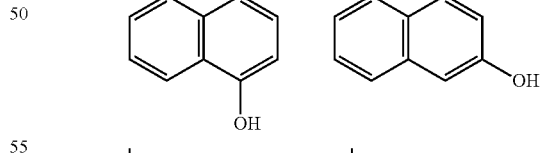
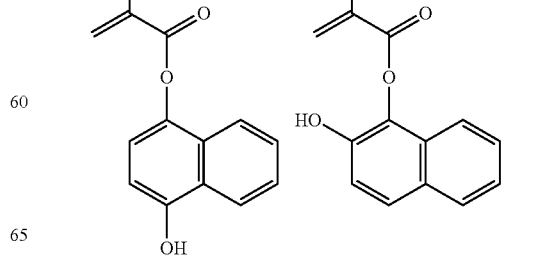

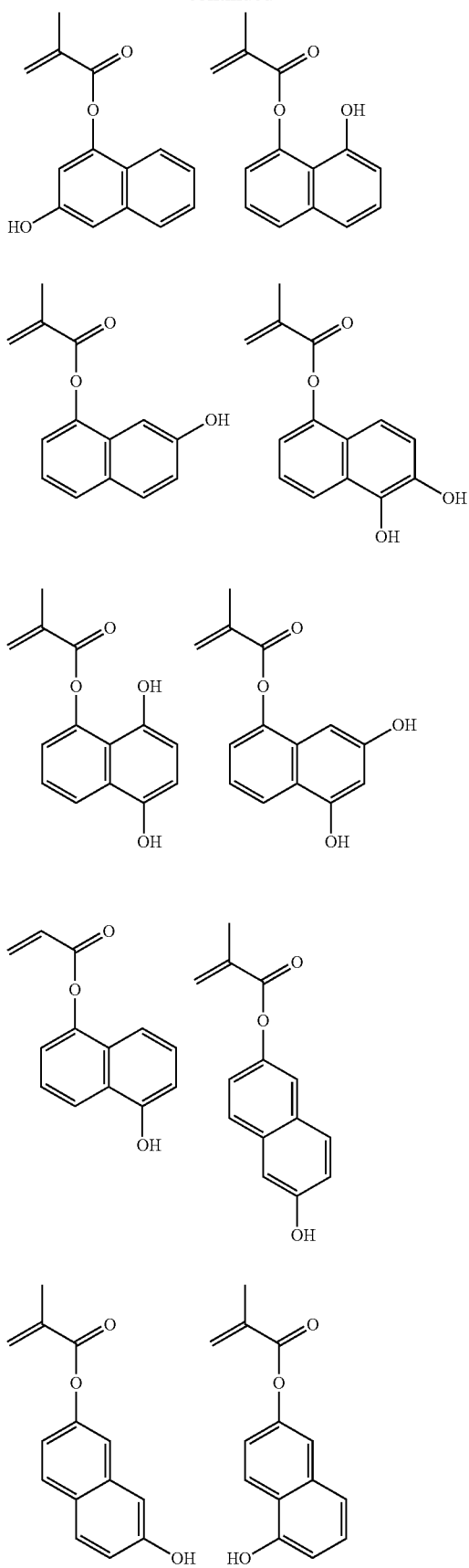
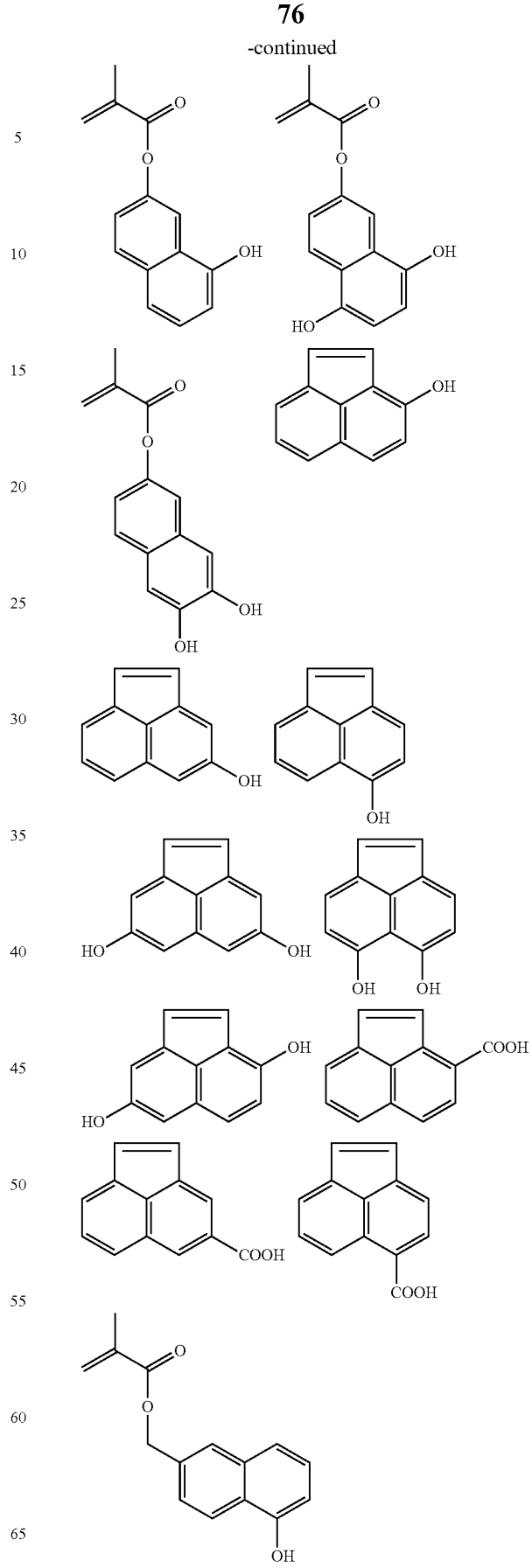

77
-continued
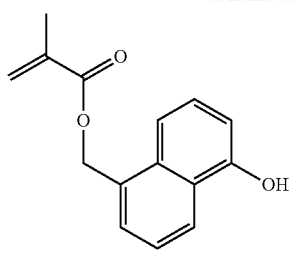
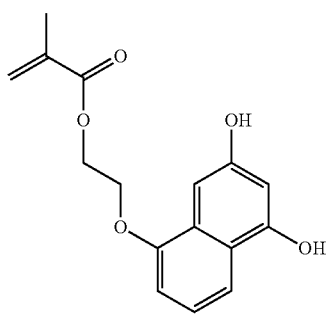
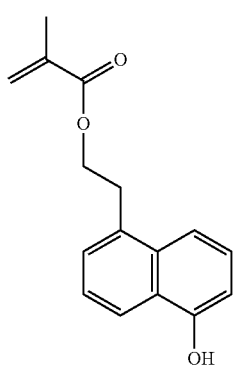
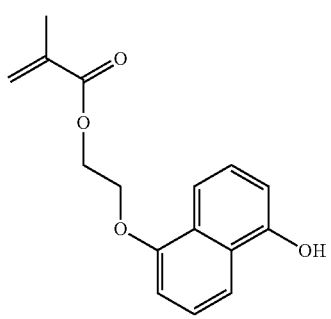
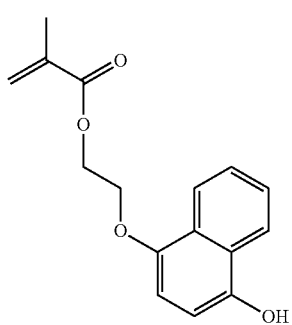
78
-continued
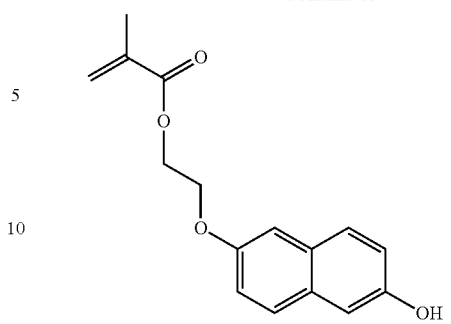
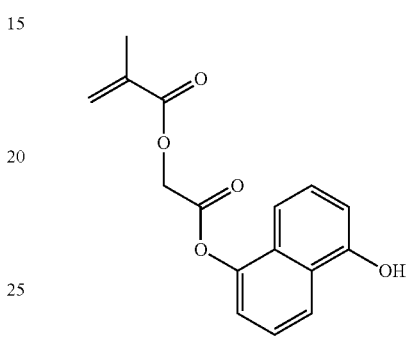
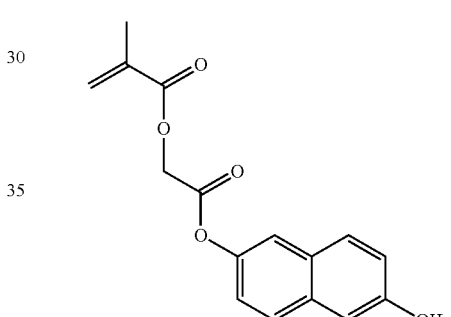
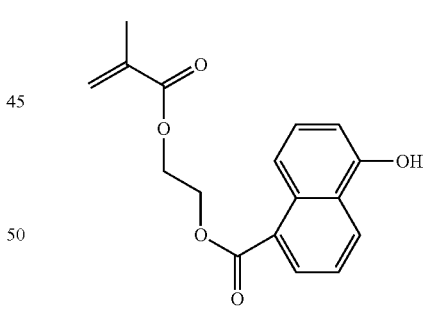
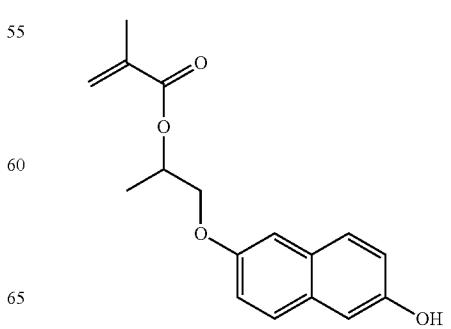

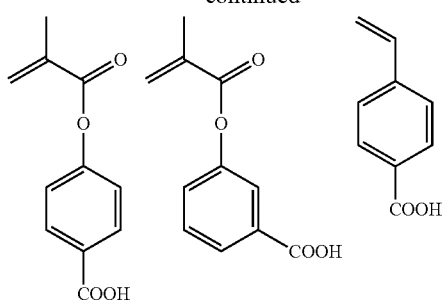
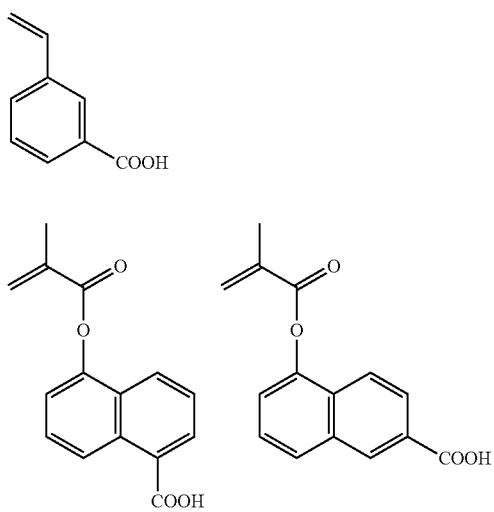
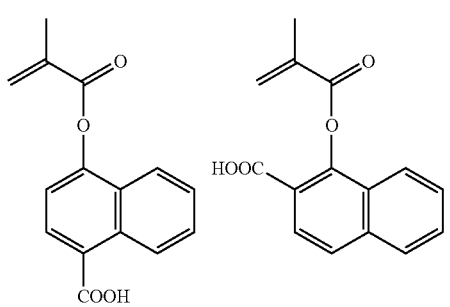
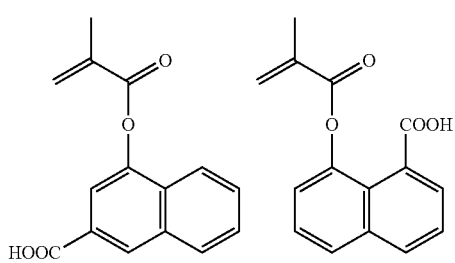
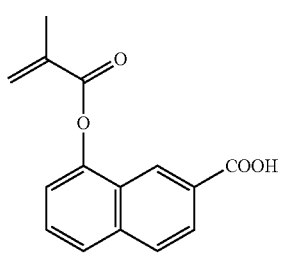
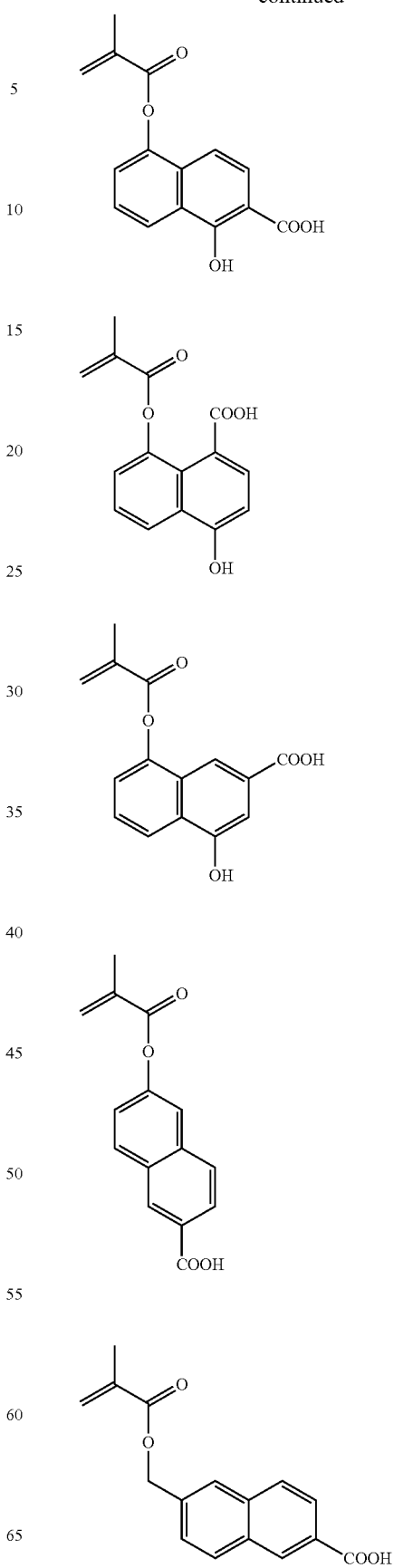

-continued
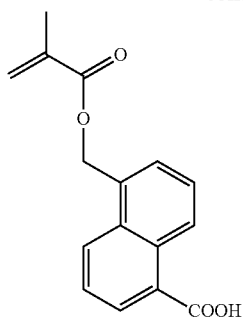
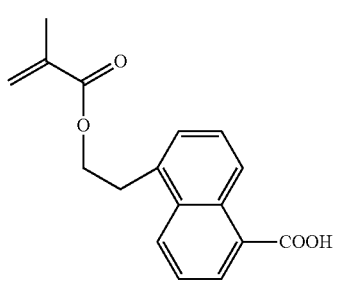
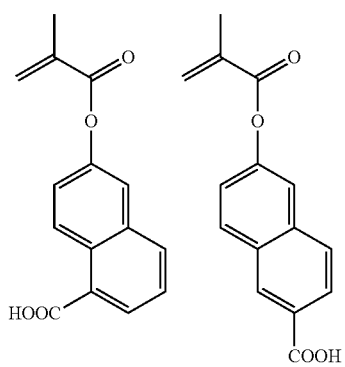
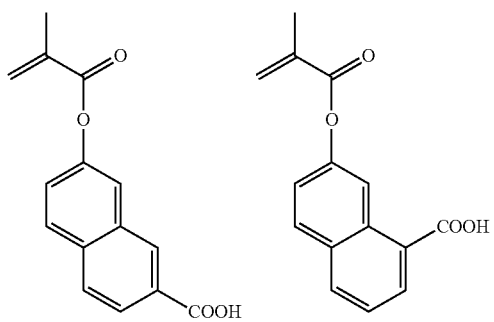
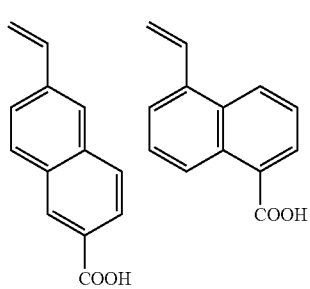
-continued
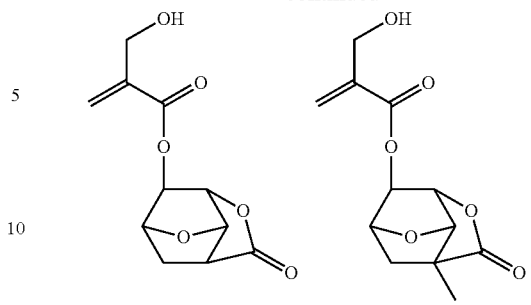
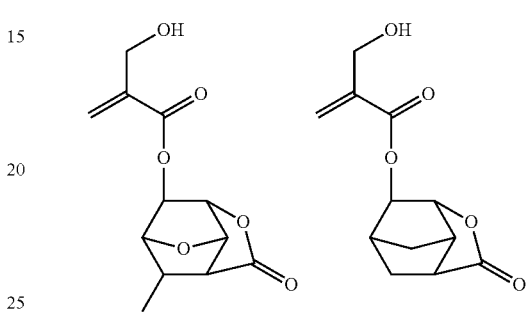
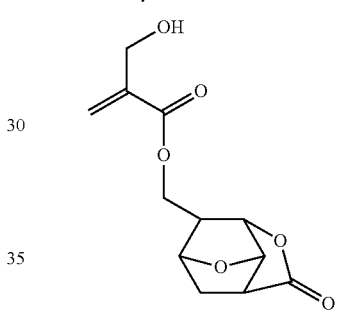
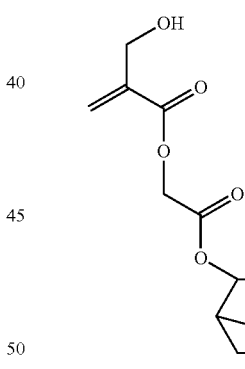
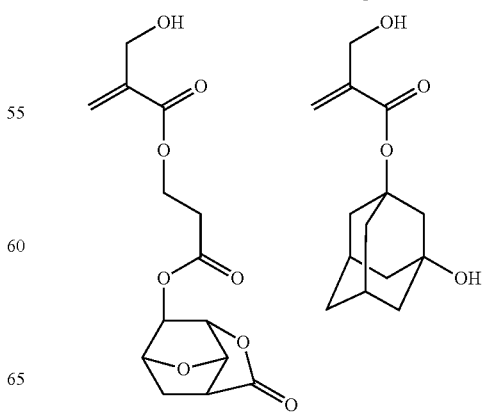

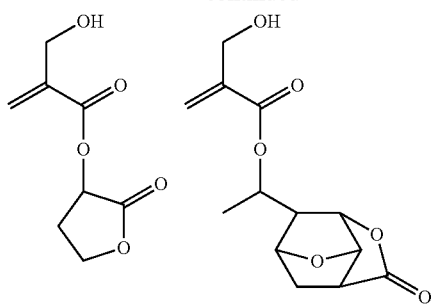
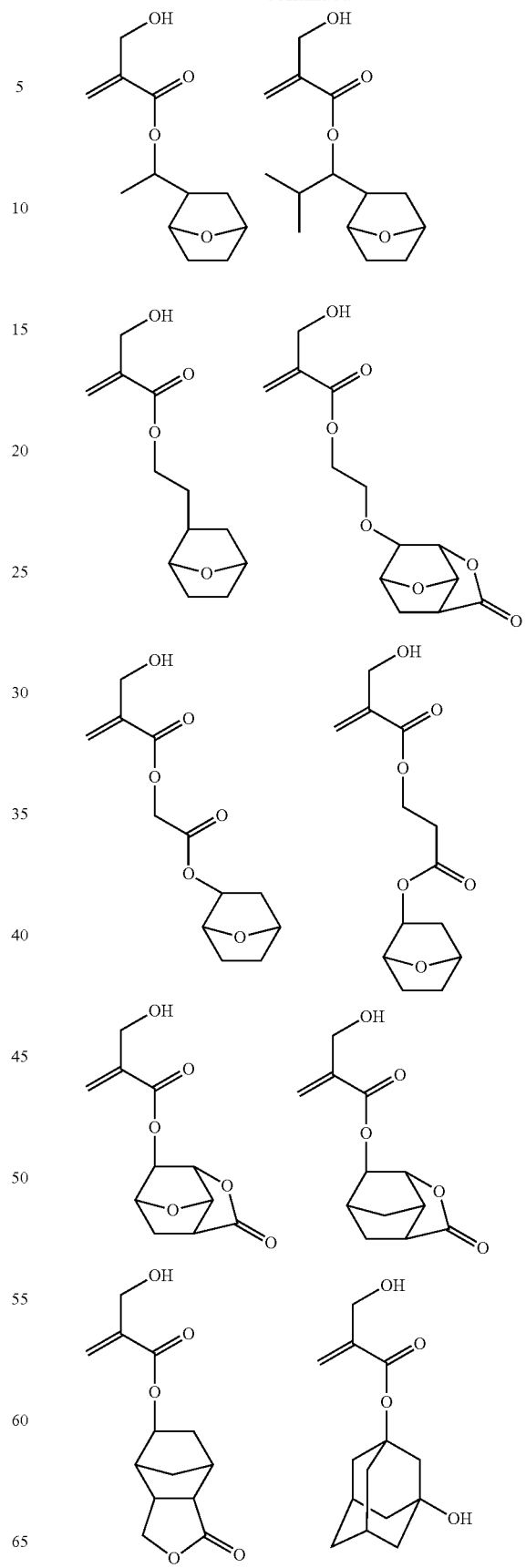

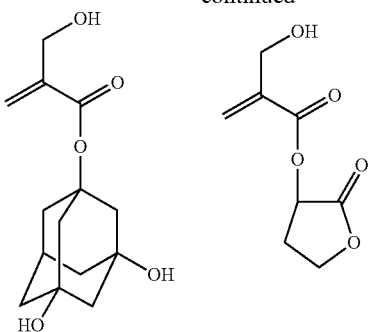

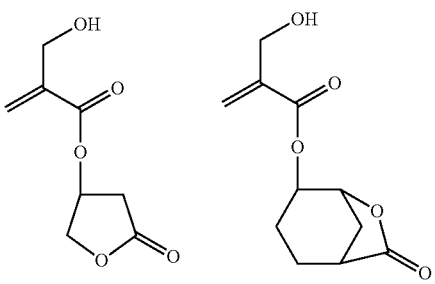

In the polymer, the recurring units (a1), (a2), (a3), (a4), (b), and (c) are present in proportions a1, a2, a3, a4, b, and c, respectively, which satisfy the range: $0 \leq a1 < 1.0$, $0 \leq a2 < 1.0$, $0 \leq a3 < 1.0$, $0 \leq a4 < 1.0$, $0 < a1+a2+a3+a4 < 1.0$, $0 < b \leq 0.9$, and $0 \leq c < 0.9$ (specifically $0 < c < 0.9$); preferably $0 \leq a1 \leq 0.5$, $0 \leq a2 \leq 0.5$, $0 \leq a3 \leq 0.5$, $0 \leq a4 \leq 0.5$, $0.01 \leq a1+a2+a3+a4 \leq 0.5$, $0.1 \leq b \leq 0.8$, and $0.1 \leq c < 0.8$; and more preferably $0 \leq a1 \leq 0.3$, $0 \leq a2 \leq 0.3$, $0 \leq a3 \leq 0.3$, $0 \leq a4 \leq 0.3$, $0.015 \leq a1+a2+a3+a4 \leq 0.3$, $0.15 \leq b \leq 0.7$, and $0.15 \leq c < 0.7$.

The polymer may have copolymerized therein additional recurring units (d) other than the foregoing recurring units (a1), (a2), (a3), (a4), (b), and (c). Suitable recurring units (d) are derived from monomers including (meth)acrylates having a straight, branched or cyclic $C_1$-$C_{20}$ alkyl group, (meth) acrylates having a $C_2$-$C_{20}$ alkenyl group, (meth)acrylates having a $C_6$-$C_{20}$ aryl group, styrene, alkyl-substituted styrene, alkoxy-substituted styrene, acetoxy-substituted styrene, vinyl naphthalene, vinyl carbazole, acenaphthylene, indene, vinyl pyridine, vinyl anthracene, and vinyl pyrrolidone. A proportion d is preferably $0 \leq d \leq 0.5$, and more preferably $0 \leq d \leq 0.3$.

Further the polymer may have copolymerized therein recurring units (e1), (e2) or (e3) having a sulfonium salt represented by the general formula (10).

(10)

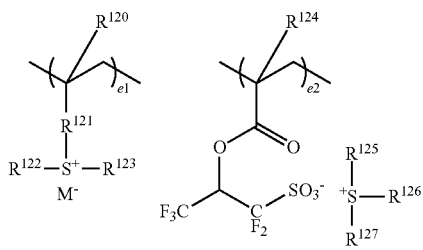

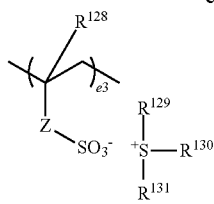

Herein $R^{120}$, $R^{124}$, and $R^{128}$ each are hydrogen or methyl. $R^{121}$ is a single bond, phenylene group, —O—R— or —C(=O)—Y—R— wherein Y is an oxygen atom or NH, and R is a straight, branched or cyclic $C_1$-$C_6$ alkylene, phenylene, or $C_3$-$C_{10}$ alkenylene group, which may contain a carbonyl (—CO—), ester (—COO—), ether (—O—) or hydroxyl radical. $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group. Z is a single bond, methylene, ethylene, phenylene, fluorinated phenylene, —O—$R^{132}$—, or —C(=O)—$Z_1$—$R^{132}$— wherein $Z_1$ is an oxygen atom or NH, and $R^{132}$ is a straight, branched or cyclic $C_1$-$C_6$ alkylene group, phenylene group or alkenylene group, which may contain a carbonyl, ester, ether or hydroxy radical. $M^-$ is a non-nucleophilic counter ion. The subscripts e1, e2 and e3 are numbers in the range: $0 \leq e1 \leq 0.3$, $0 \leq e2 \leq 0.3$, $0 \leq e3 \leq 0.3$, and $0 < e1+e2+e3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis (perfluoroethylsulfonyl)imide, and bis (perfluorobutylsulfonyl)imide; and methidates such as tris (trifluoromethylsulfonyl)methide and tris (perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

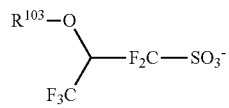

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring.

It is noted that proportions of recurring units (e1), (e2) and (e3) are $0 \leq e1+e2+e3 \leq 0.3$. When any of these recurring units are incorporated, the preferred proportions are $0.01 \leq e1+e2+$ e3≦0.25. Particularly when the resist composition is free of an acid generator, the proportions are preferably 0.02≦e1+e2+e3≦0.20 and more preferably 0.03≦e1+e2+e3≦0.18.

It is noted that a1+a2+a3+a4+b+c+d+e1+e2+e3=1. The meaning of a+b=1, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units, for example, units (c) and the like.

The polymer serving as the base resin in the resist composition used in the patterning process should preferably have a weight average molecular weight (Mw) in the range of 1,000 to 500,000, and more preferably 2,000 to 30,000, as measured by GPC using polystyrene standards. With too low a Mw, the efficiency of thermal crosslinking in the resist material after development may become low. A polymer with too high a Mw may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer used herein may be synthesized by any desired method, for example, by dissolving unsaturated bond-containing monomers corresponding to the respective recurring units (a1), (a2), (a3), (a4), (b), (c), (d), (e1), (e2), and (e3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and thereafter protected or partially protected.

As described above, the photobase generator (PBG) may be incorporated into a polymer (serving as the base resin in the resist composition) as recurring units having a PBG group. Instead of incorporating a PBG group into a polymer, or in addition to the polymer having a PBG group incorporated therein, a compound having a partial structure of formula (i), (ii) or (iii) may be added as a PBG to the resist composition. The PBG to be added to the resist composition is referred to as PBG of addition mode. Specifically, PBGs of addition mode having the following general formulae (2) to (9) may be compounded.

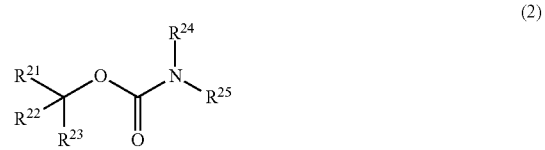

(2)

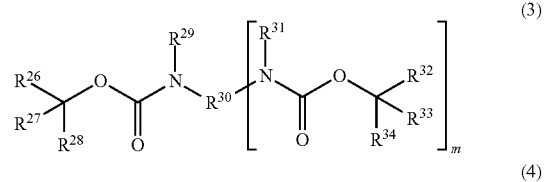

(3)

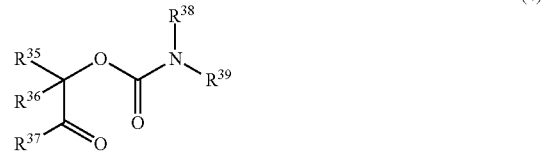

(4)

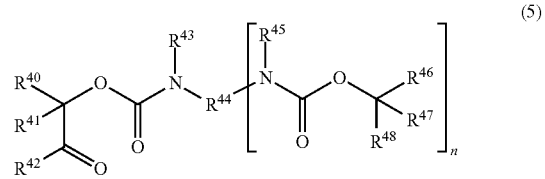

(5)

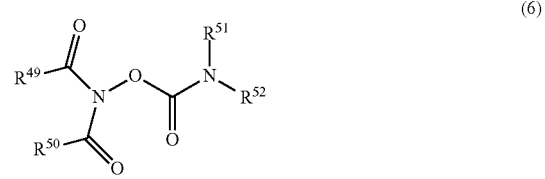

(6)

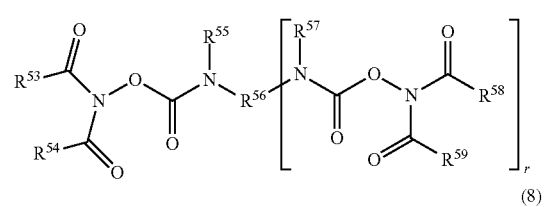

(7)

(8)

(9)

Herein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may have a straight, branched or cyclic $C_1$-$C_6$ alkyl or alkoxy, nitro, halogen, cyano or trifluoromethyl radical, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a $C_3$-$C_{10}$, preferably $C_4$-$C_8$ non-aromatic ring with the carbon atom to which they are attached. $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester radical, a pair of $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a $C_3$-$C_{10}$, preferably $C_4$-$C_8$ non-aromatic ring with the nitrogen atom to which they are attached. $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester radical. $R^{45}$, $R^{50}$, $R^{53}$, $R^{54}$, $R^{58}$, and $R^{59}$ each are a straight or branched $C_1$-$C_6$ alkyl group, a pair of $R^{49}$ and $R^{50}$, $R^{53}$ and $R^{54}$, or $R^{58}$ and $R^{59}$ may bond together to form a $C_3$-$C_{10}$, preferably $C_4$-$C_8$ ring with the carbon and nitrogen atoms to which they are attached, which ring may contain a benzene ring, naphthalene ring, double bond or ether bond. $R^{60}$ is a straight, branched or cyclic $C_1$-$C_{16}$ alkyl, $C_6$-$C_{20}$ aryl or $C_2$-$C_{20}$ alkenyl group. $R^{61}$ is a $C_6$-$C_{20}$ aryl group. $R^{62}$ is hydrogen, a straight, branched or cyclic $C_1$-$C_{16}$ alkyl group or $C_6$-$C_{20}$ aryl group. $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether radical. The subscripts m, n and r each are 1 or 2.

Examples of the PBG of formula (2) are given below wherein $R^{24}$ and $R^{25}$ are as defined above.

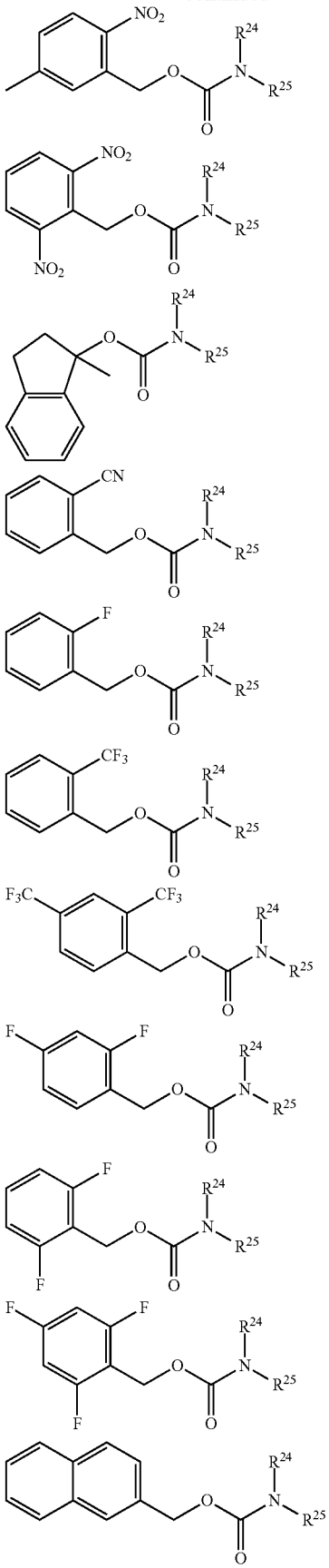

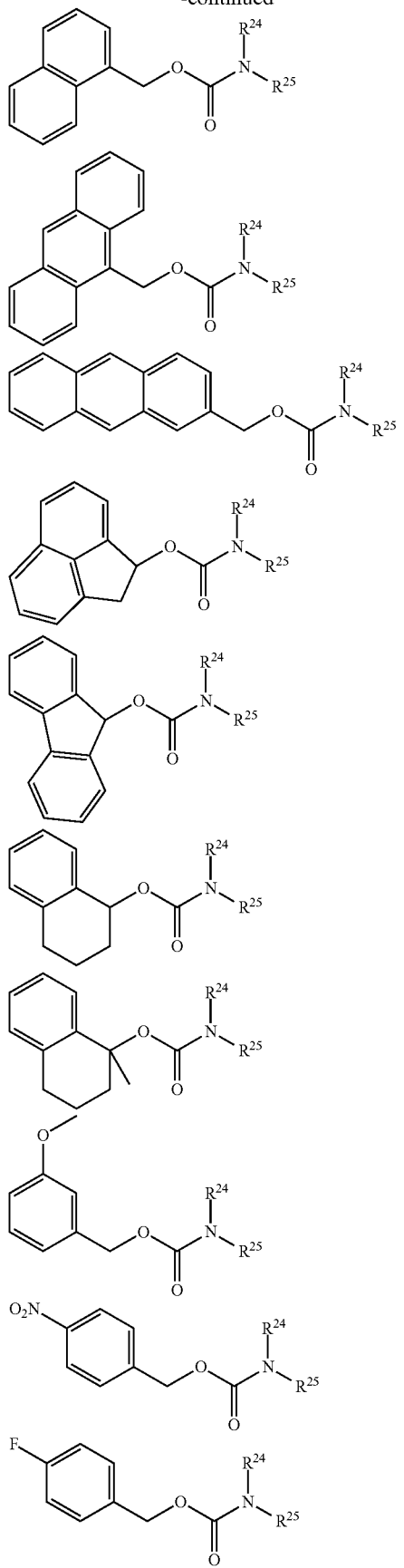
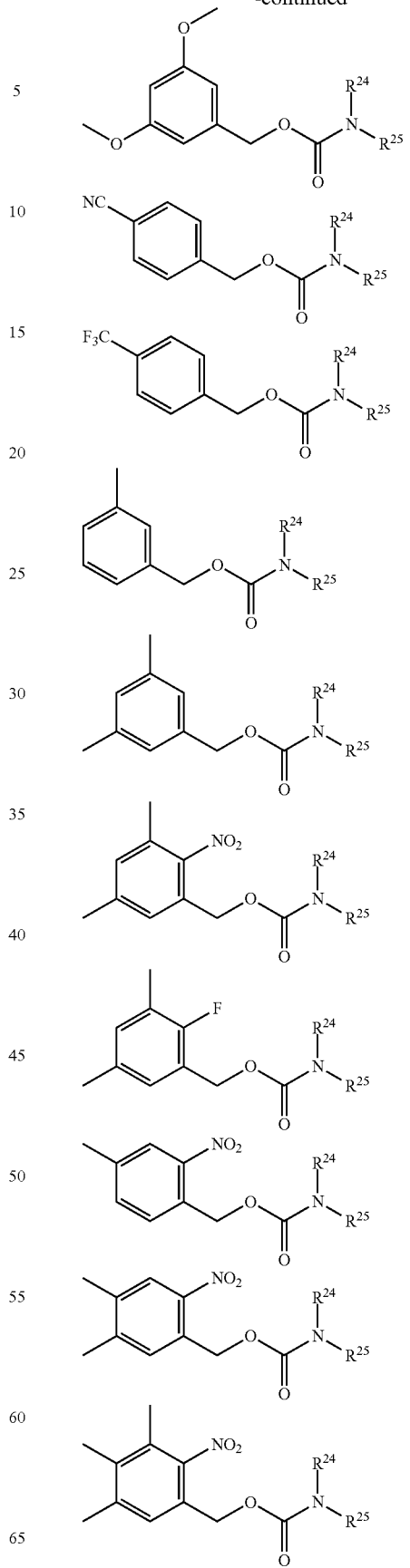

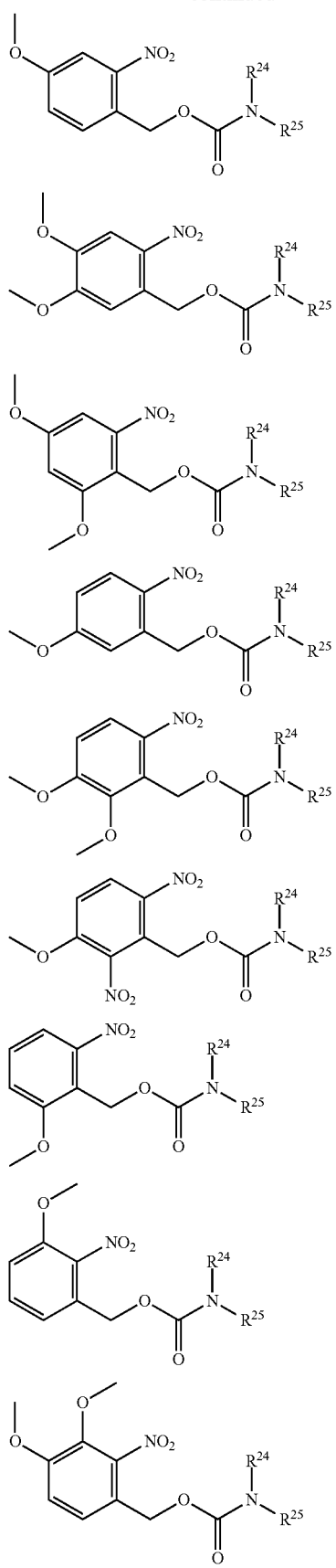
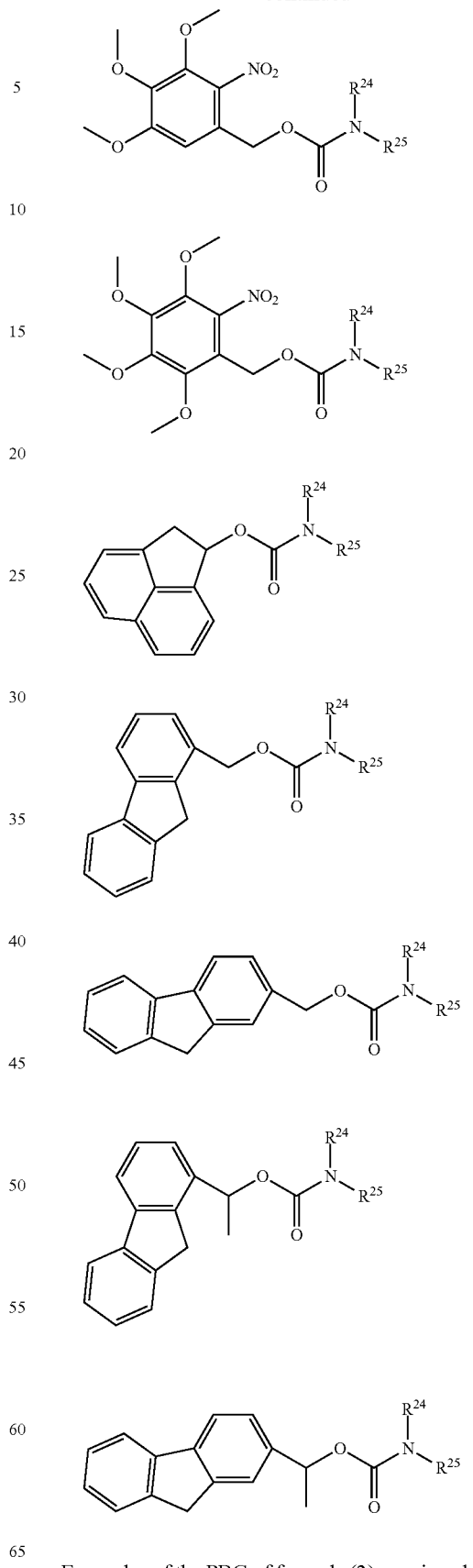
Examples of the PBG of formula (3) are given below. Note that $R^{29}$ to $R^{31}$ are as defined above, hereinafter.

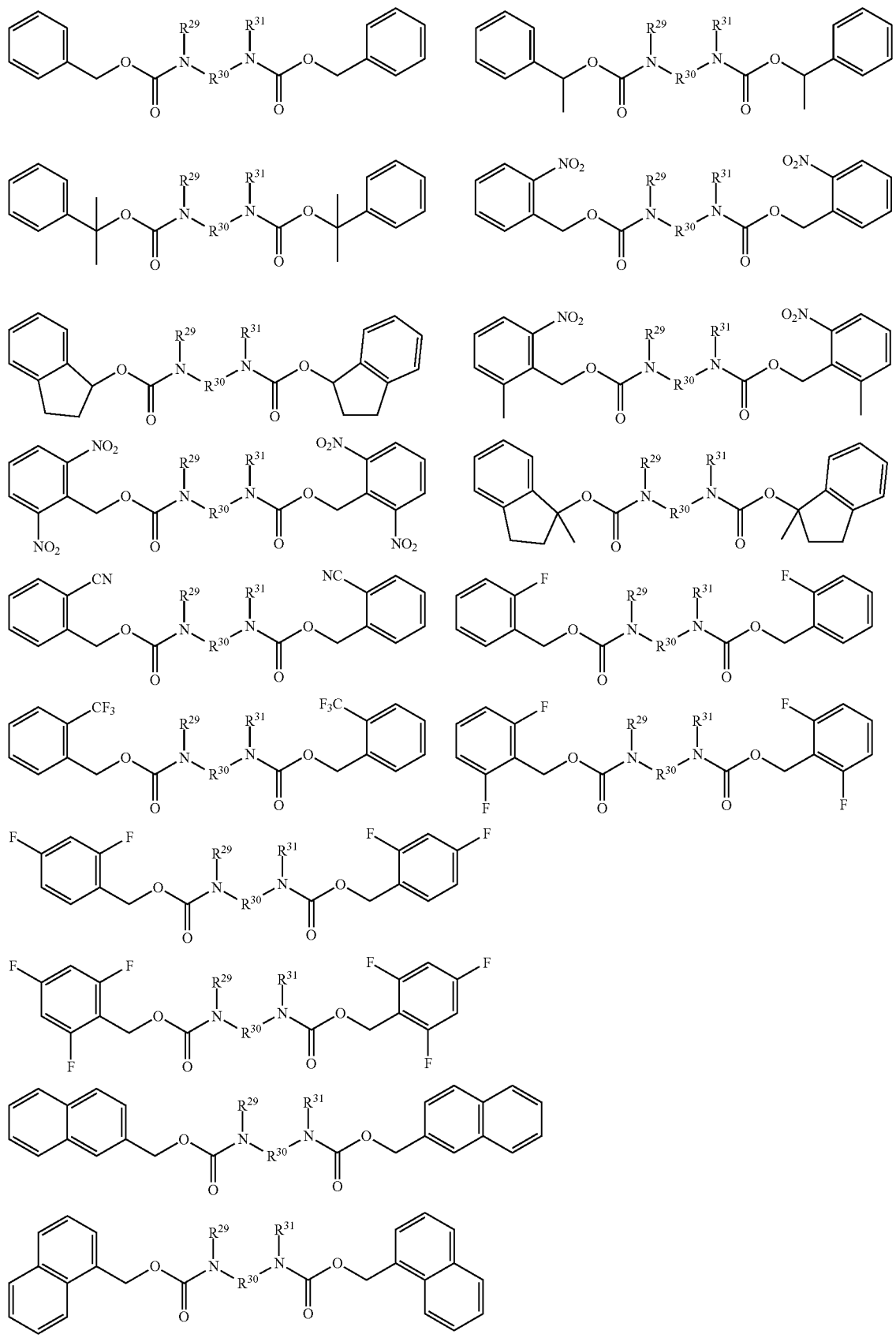

-continued
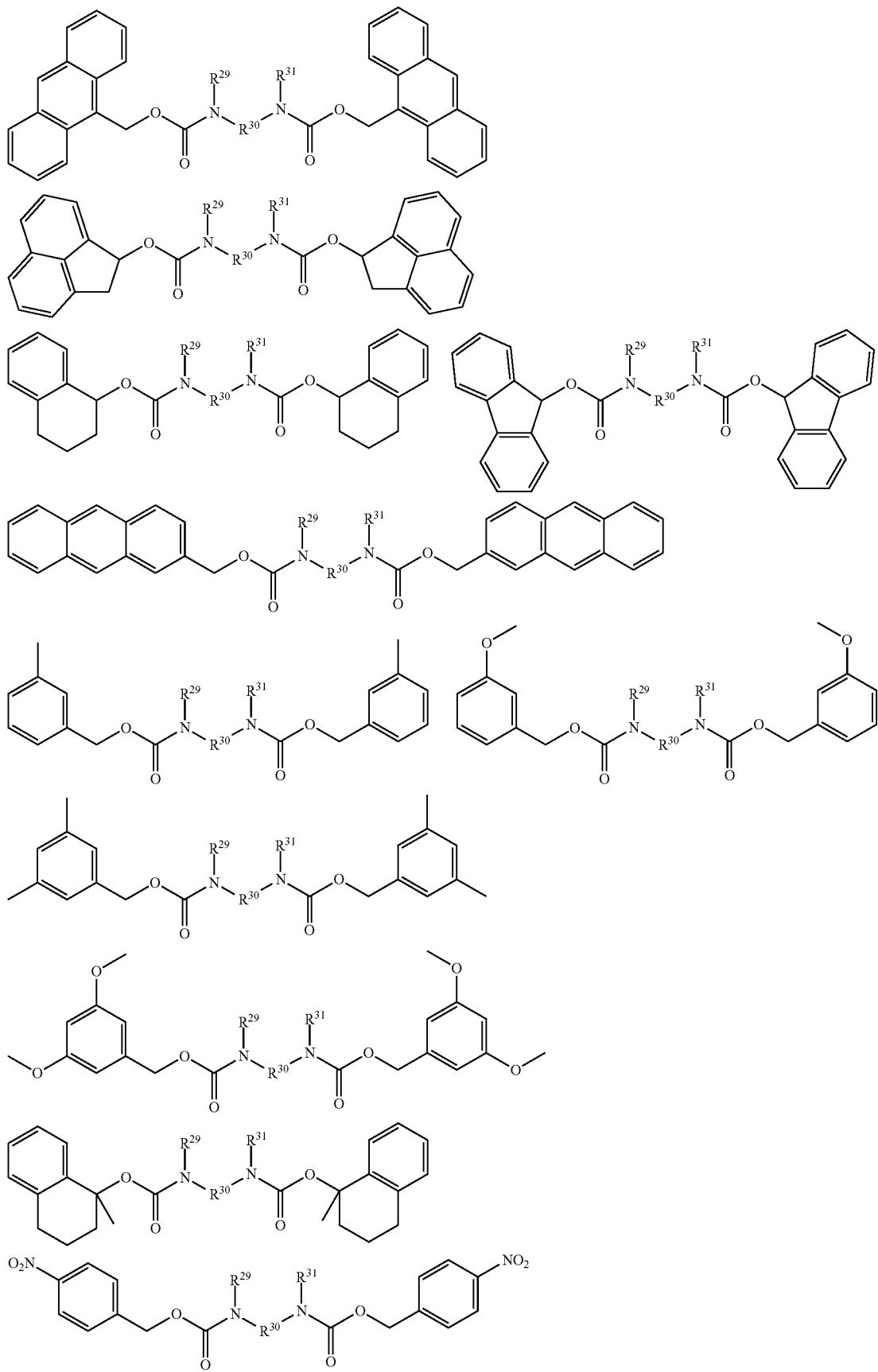

-continued
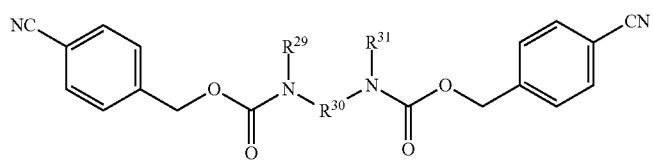
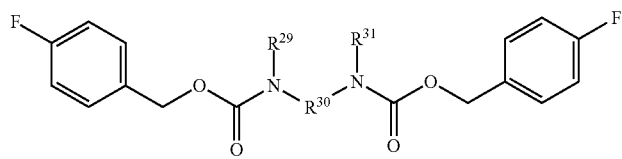
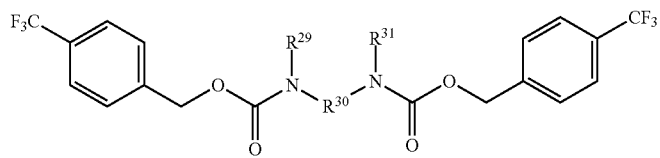
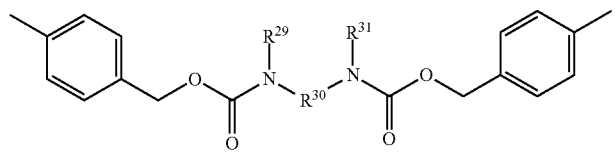
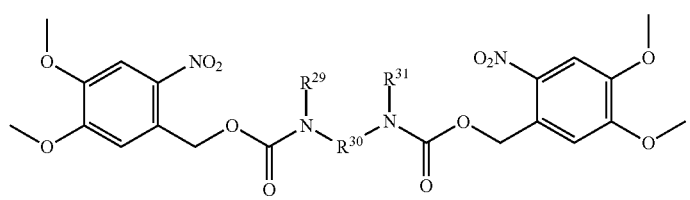
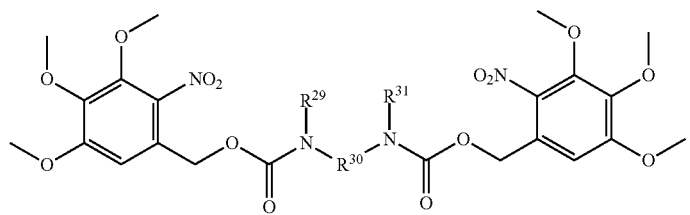
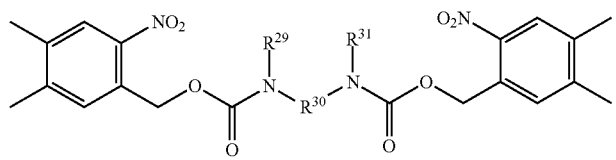
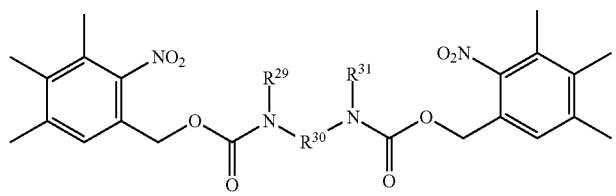
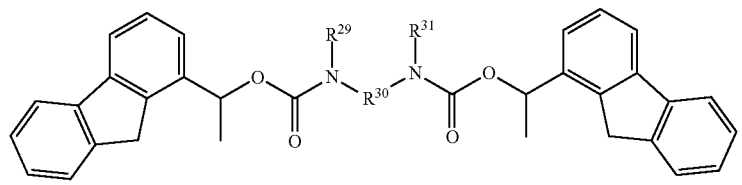

-continued
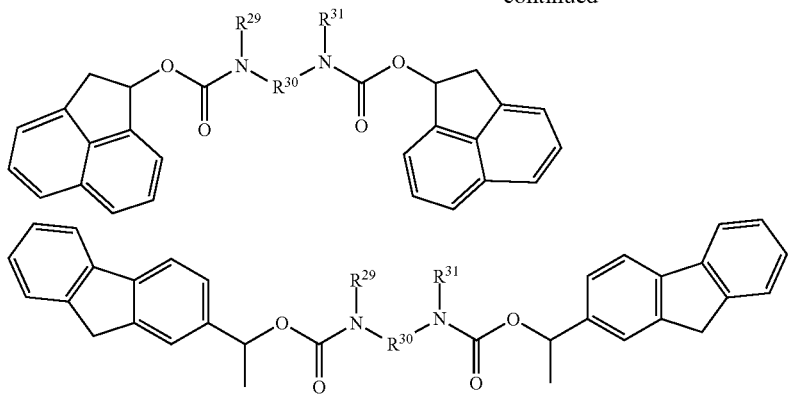
Examples of the PBGs released from the tri-branched amine compounds of formula (3) are given below.
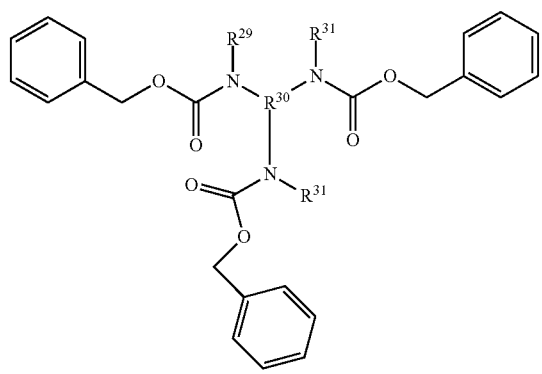
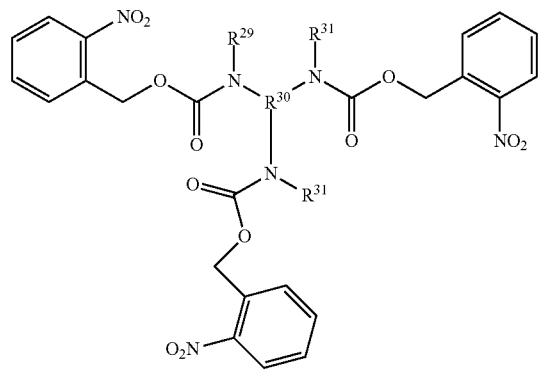
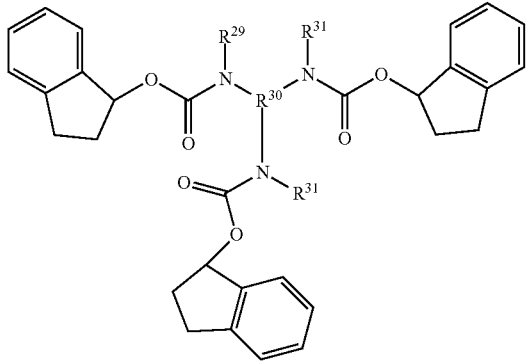
-continued
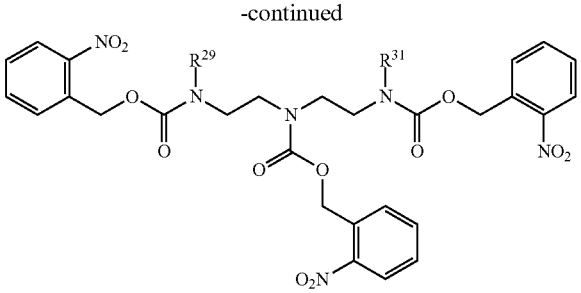
Examples of the PBG of formula (4) are given below. Note that $R^{38}$ and $R^{39}$ are as defined above, hereinafter.
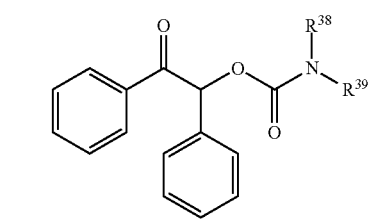
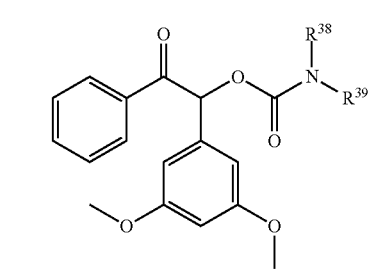
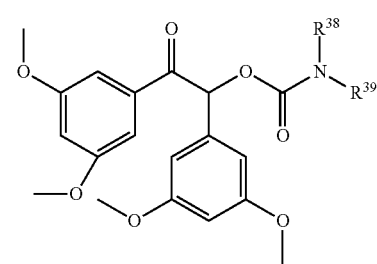

103
-continued
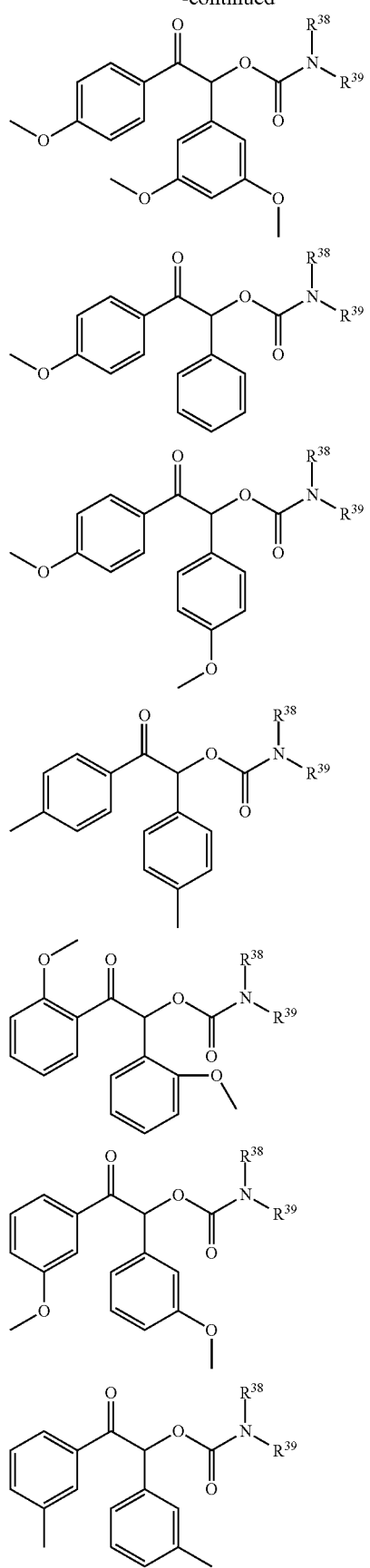
104
-continued
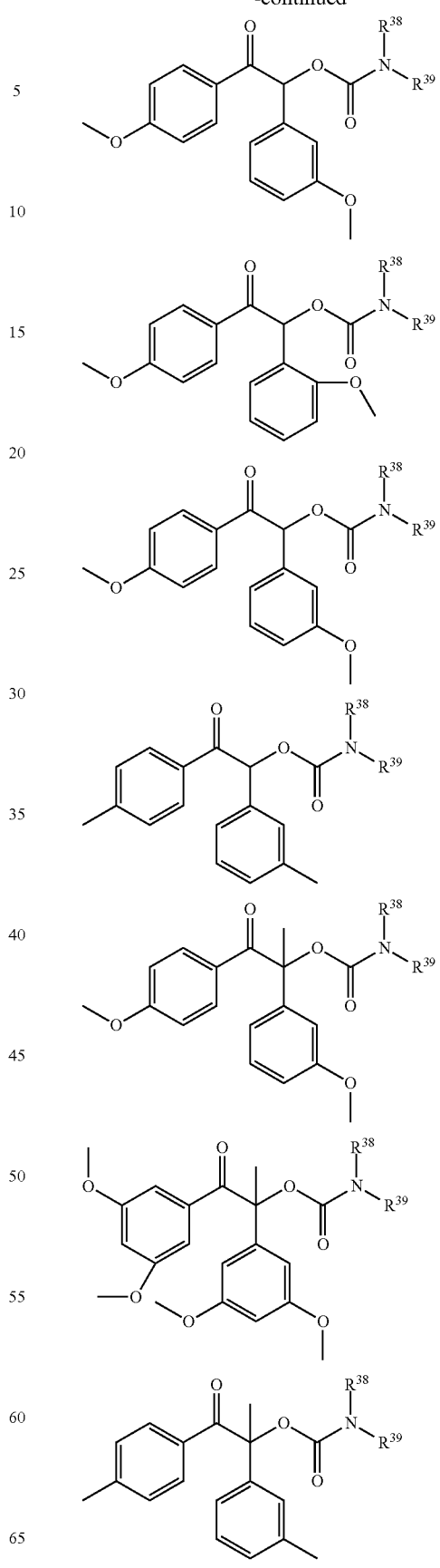

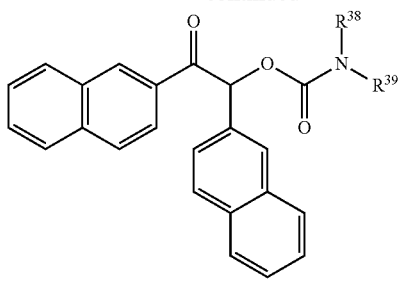
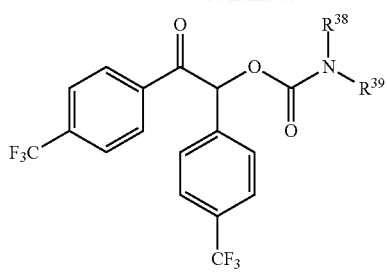
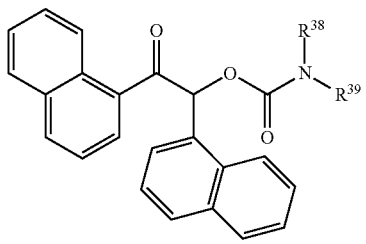
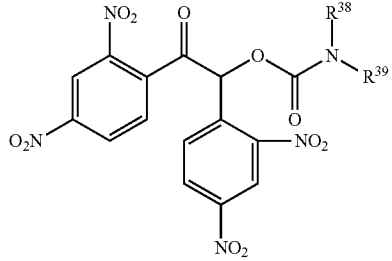
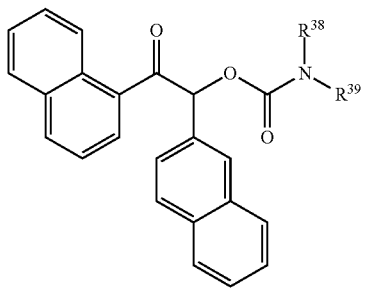
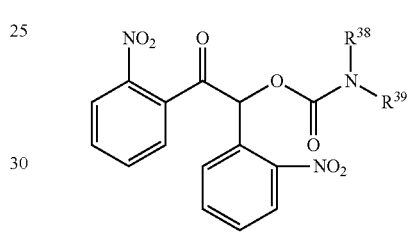
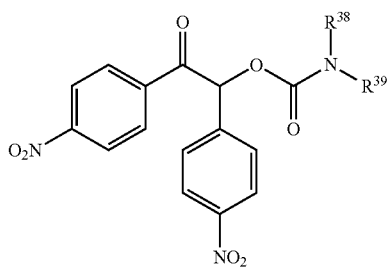
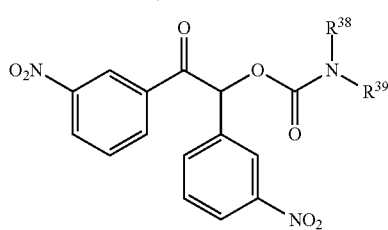
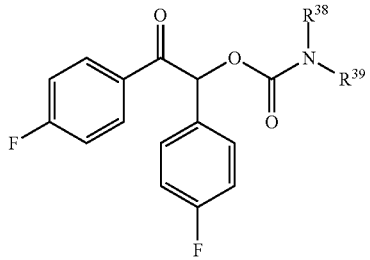
Examples of the PBG of formula (5) are given below. Note that $R^{43}$ to $R^{45}$ are as defined above, hereinafter.
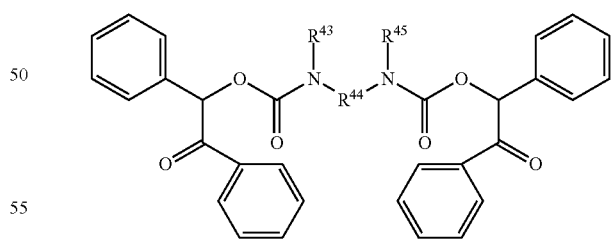
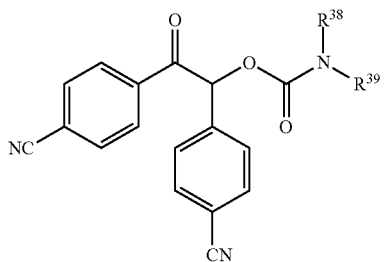
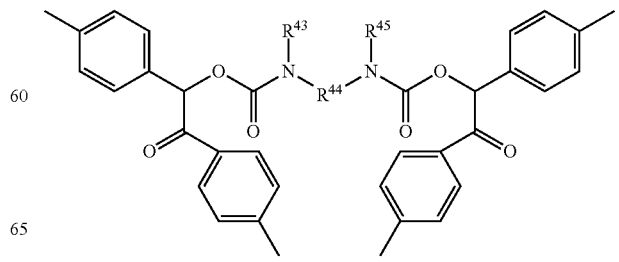

107
-continued
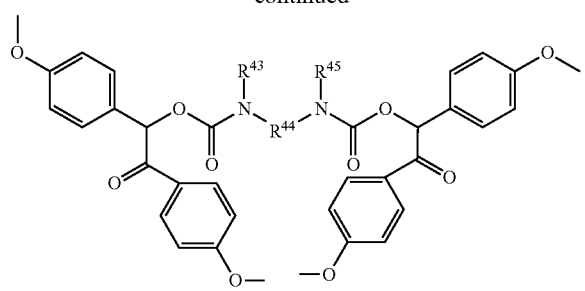
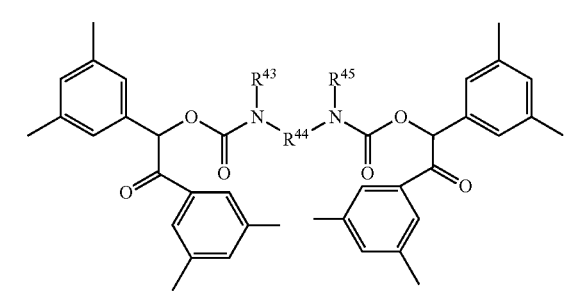
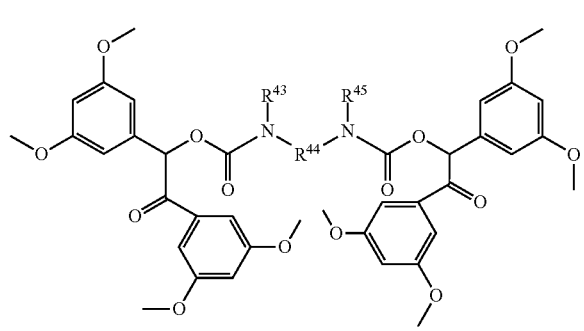
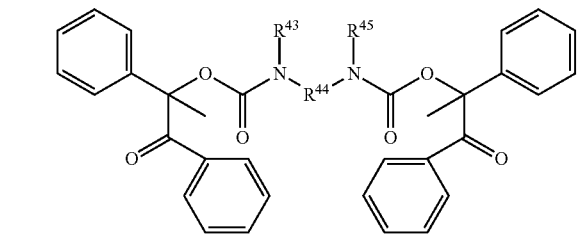
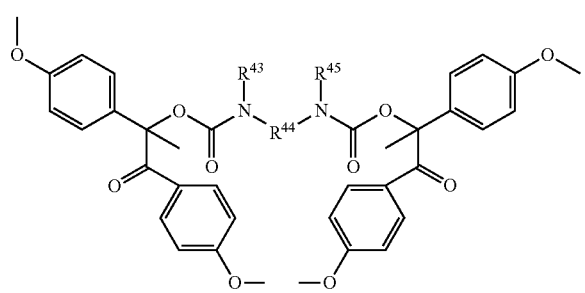
108
-continued
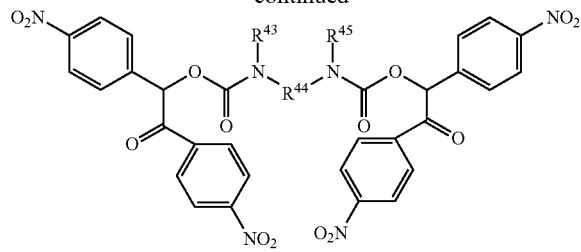
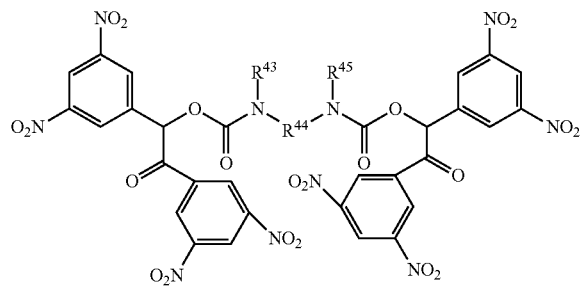
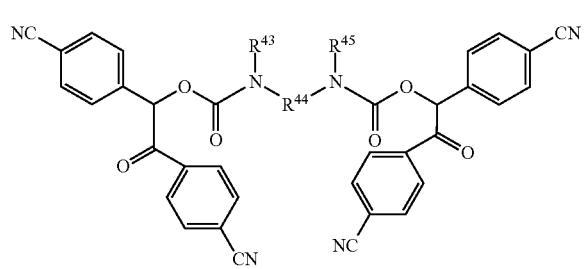
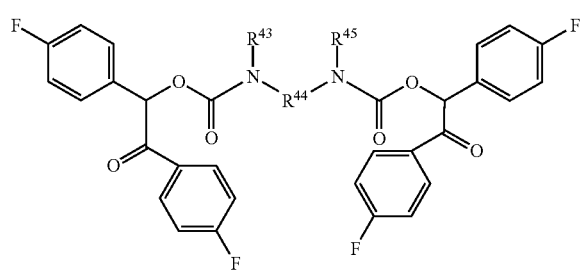
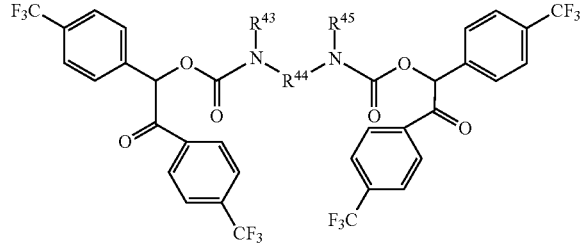
Examples of the PBGs of the tri-branched amine compounds of formula (4) are given below.

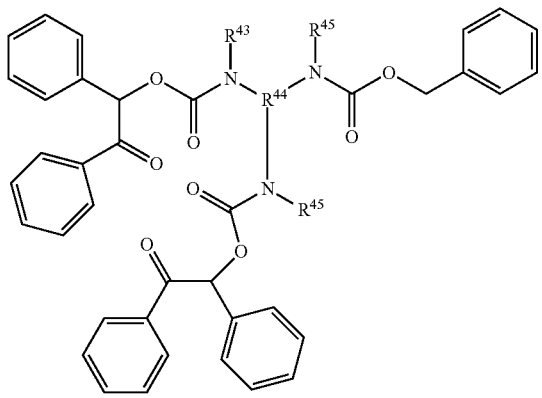
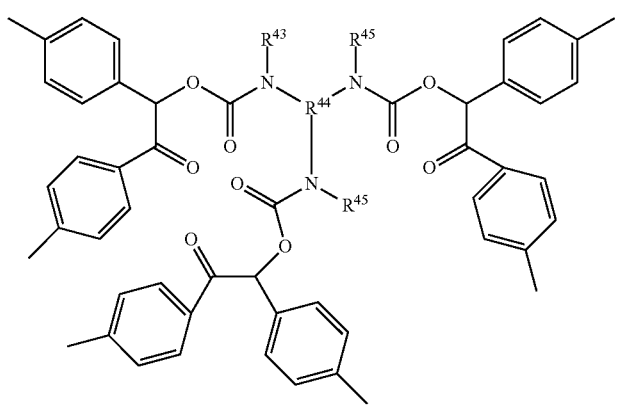
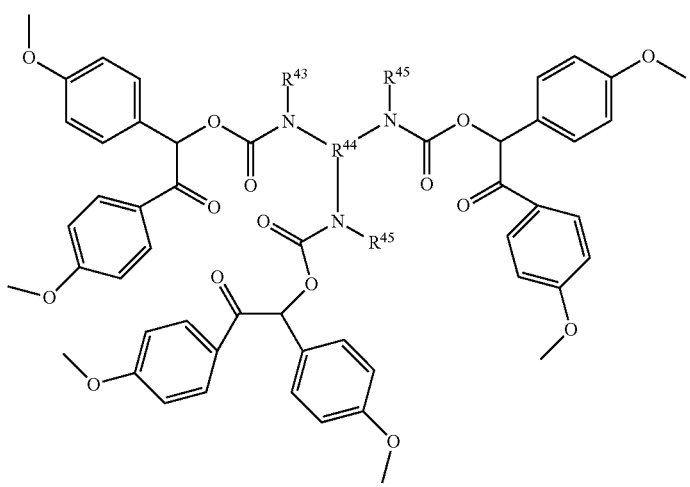
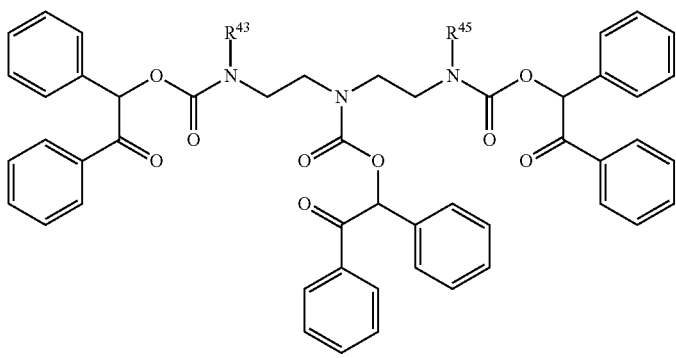

-continued
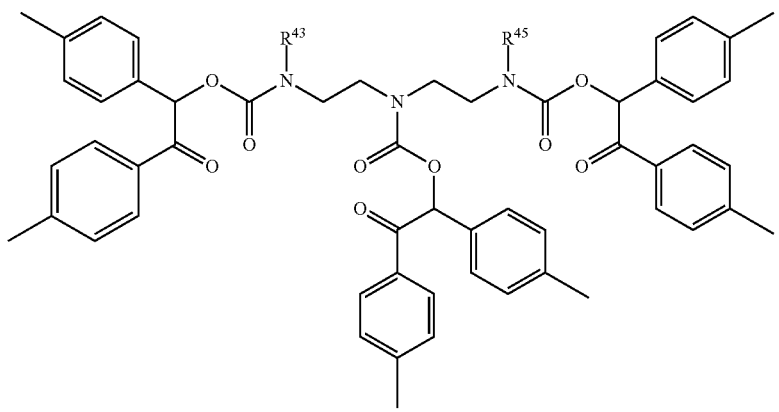
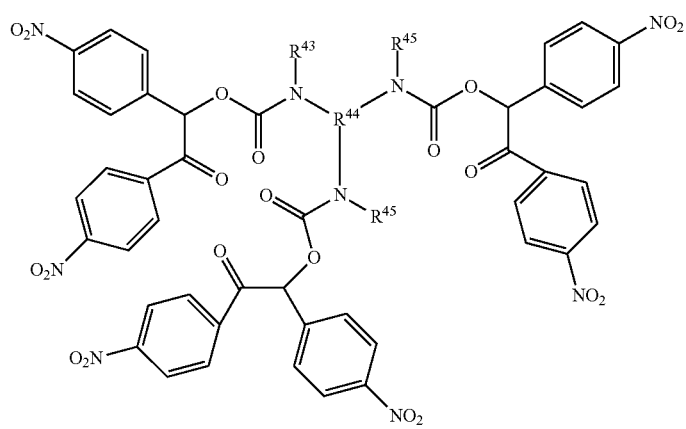
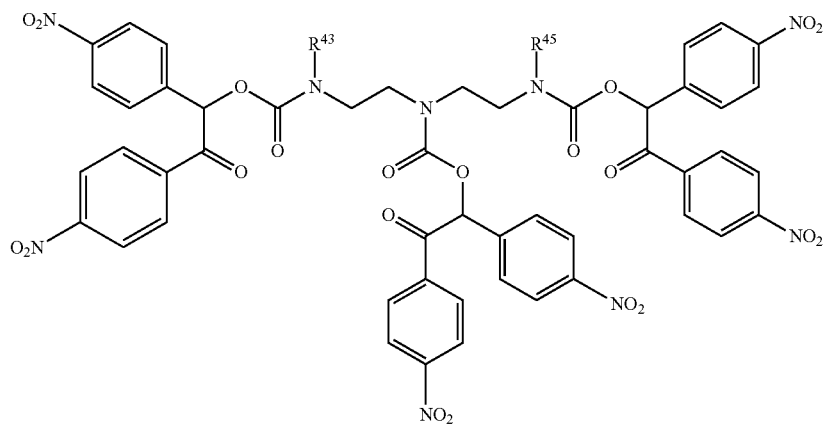

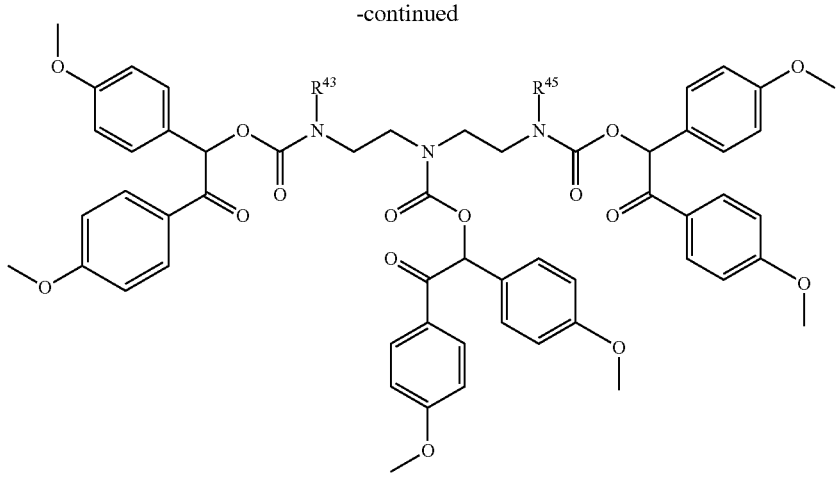
Examples of the PBG of formula (6) are given below wherein $R^{51}$ and $R^{52}$ are as defined above.
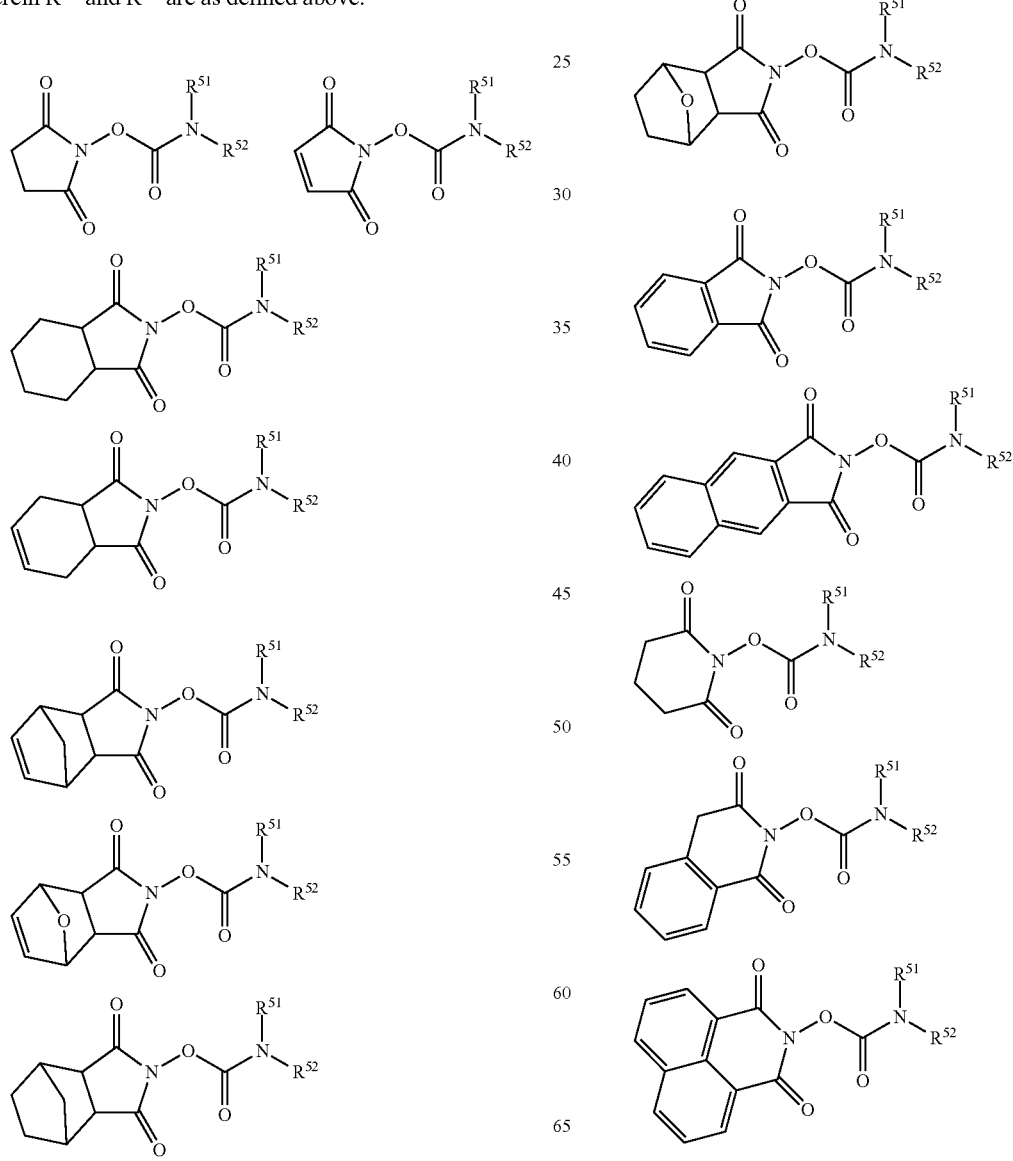

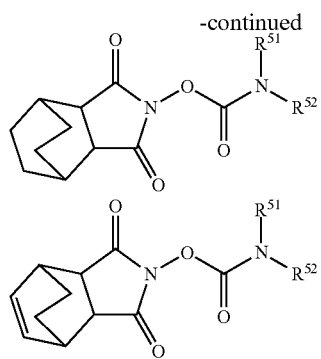
Examples of the PBG of formula (7) are given below. Note that $R^{55}$ to $R^{57}$ are as defined above, hereinafter.
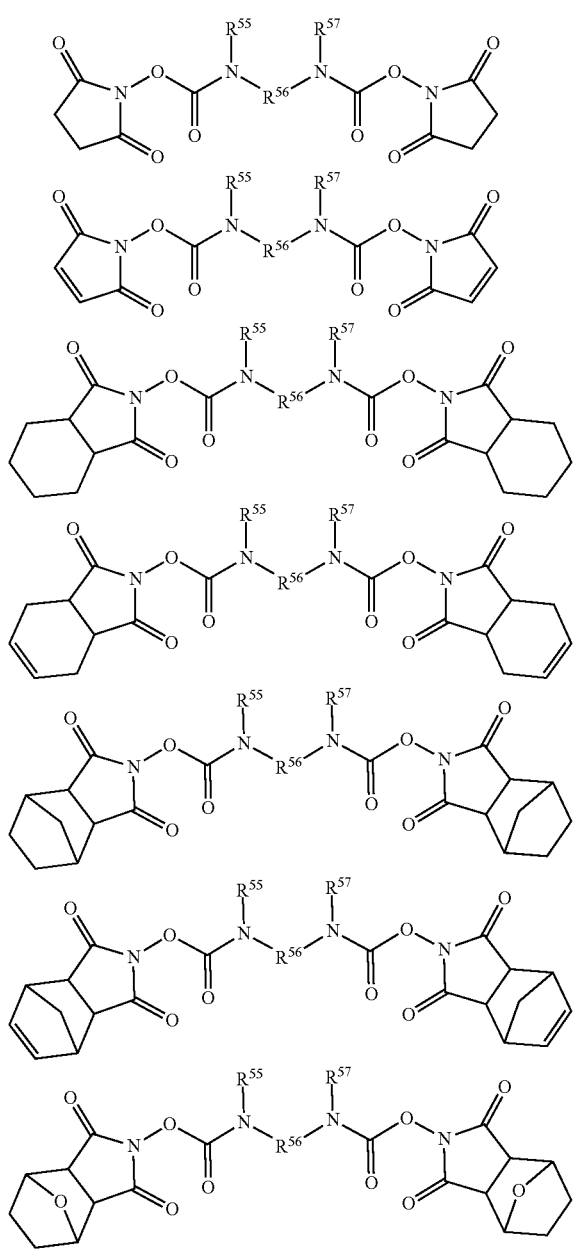
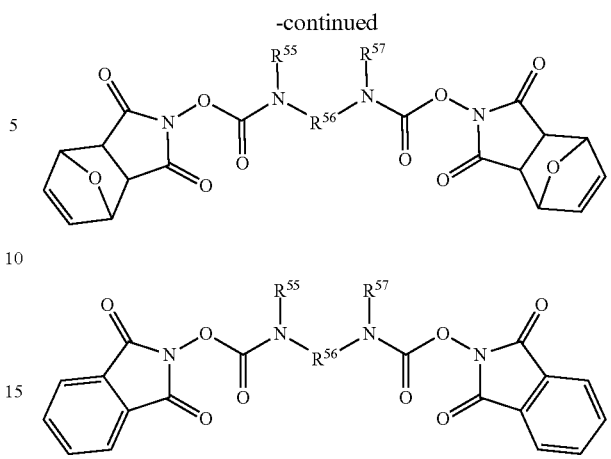
Examples of the PBGs of the tri-branched amine compounds of formula (7) are given below.

117
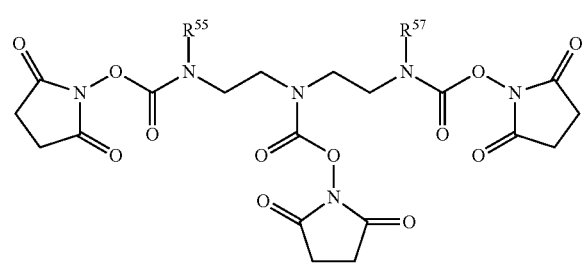
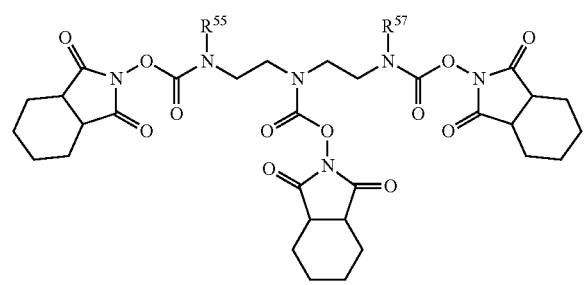
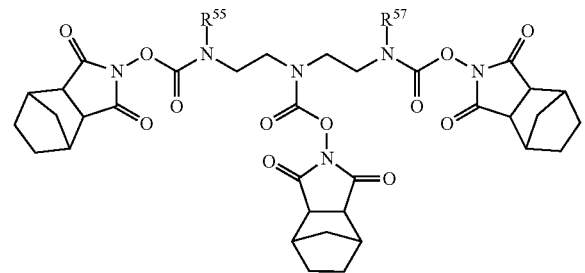
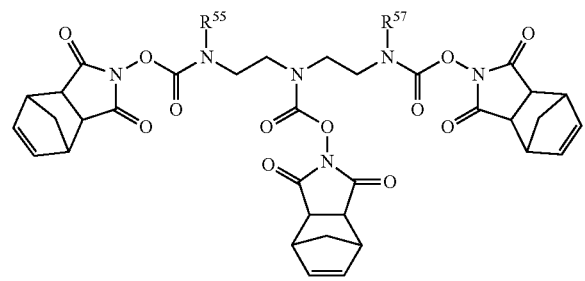
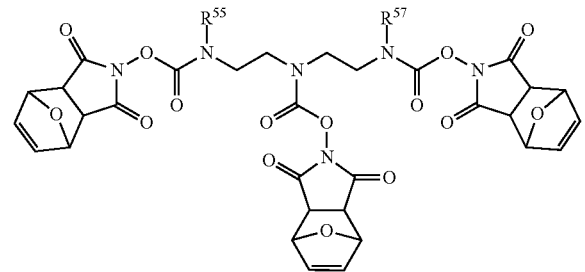
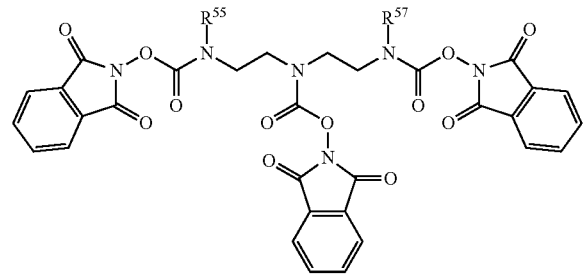
118
-continued
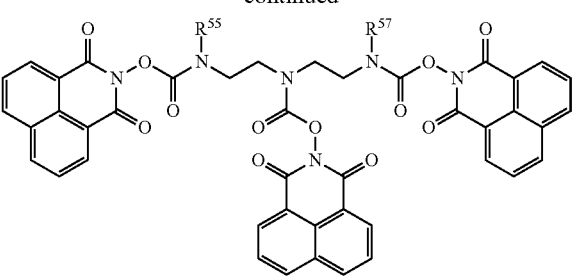
Examples of the PBG of formula (8) are given below.
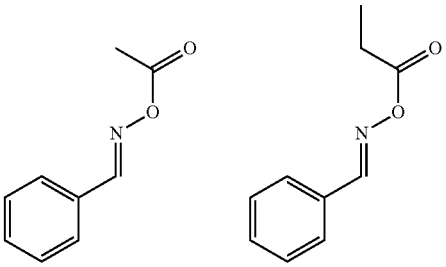
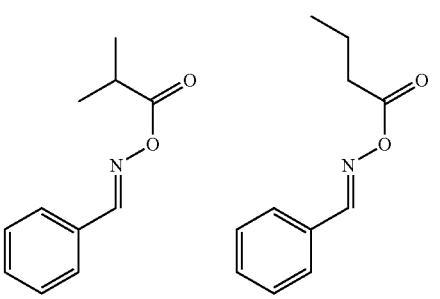
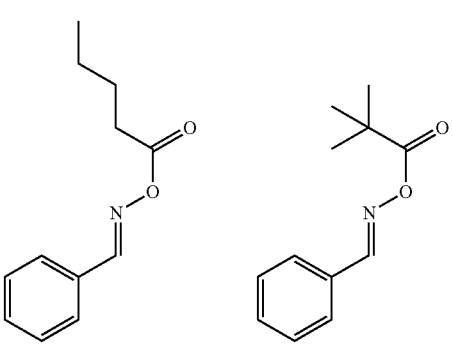
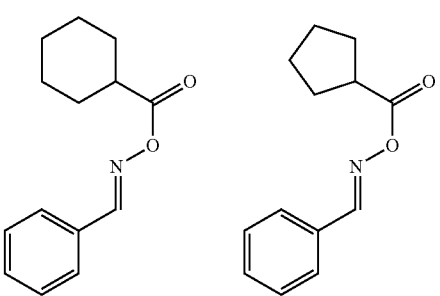

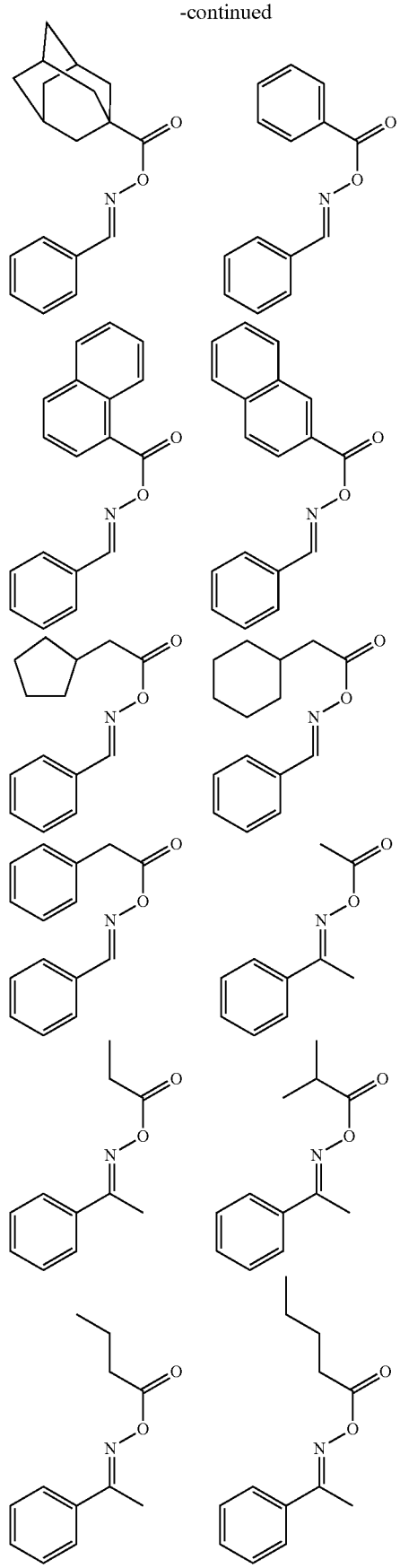
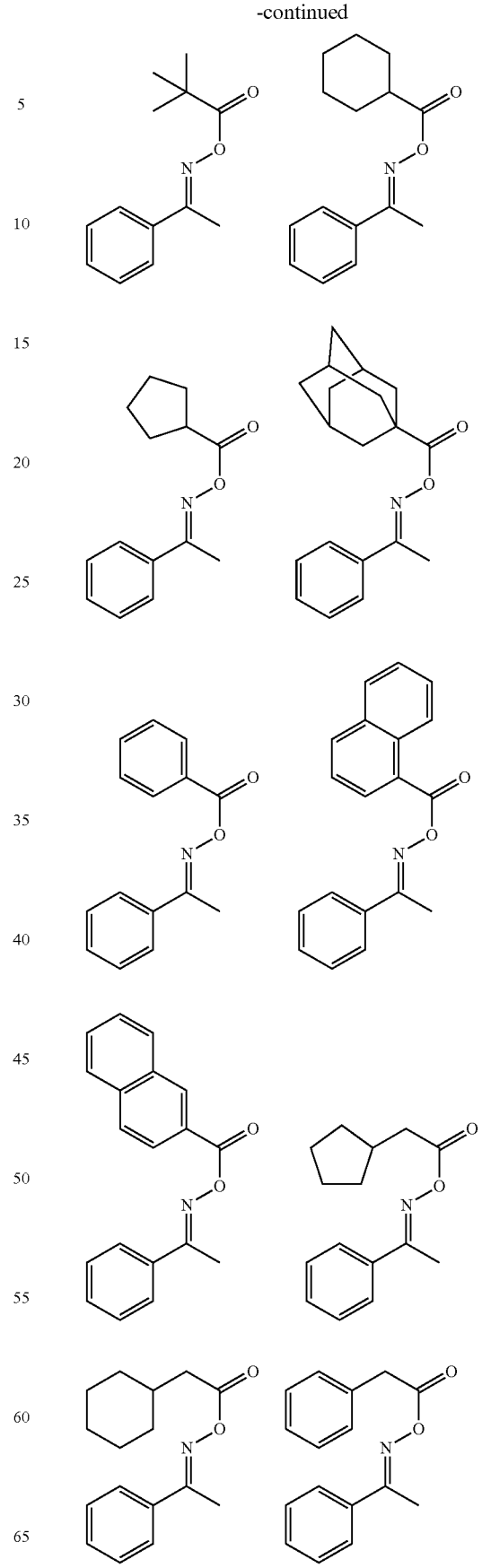

121
-continued
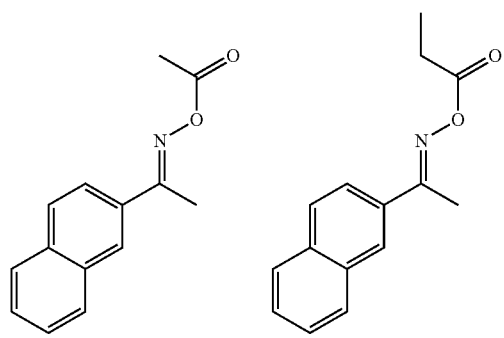
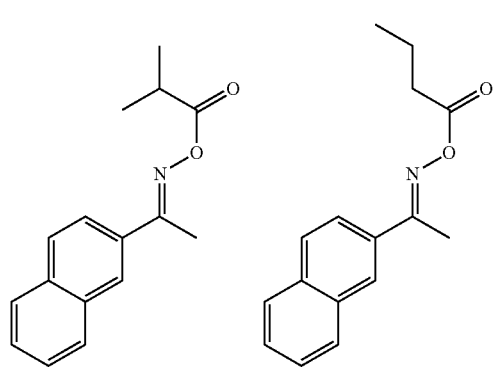
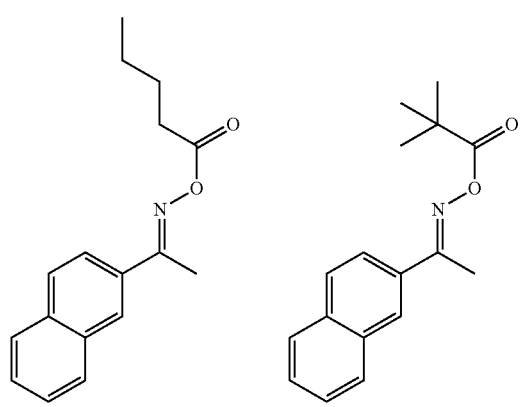
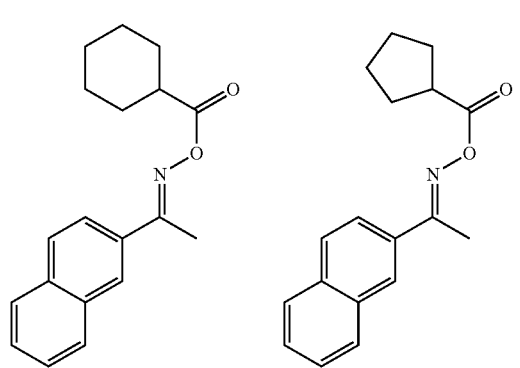
122
-continued
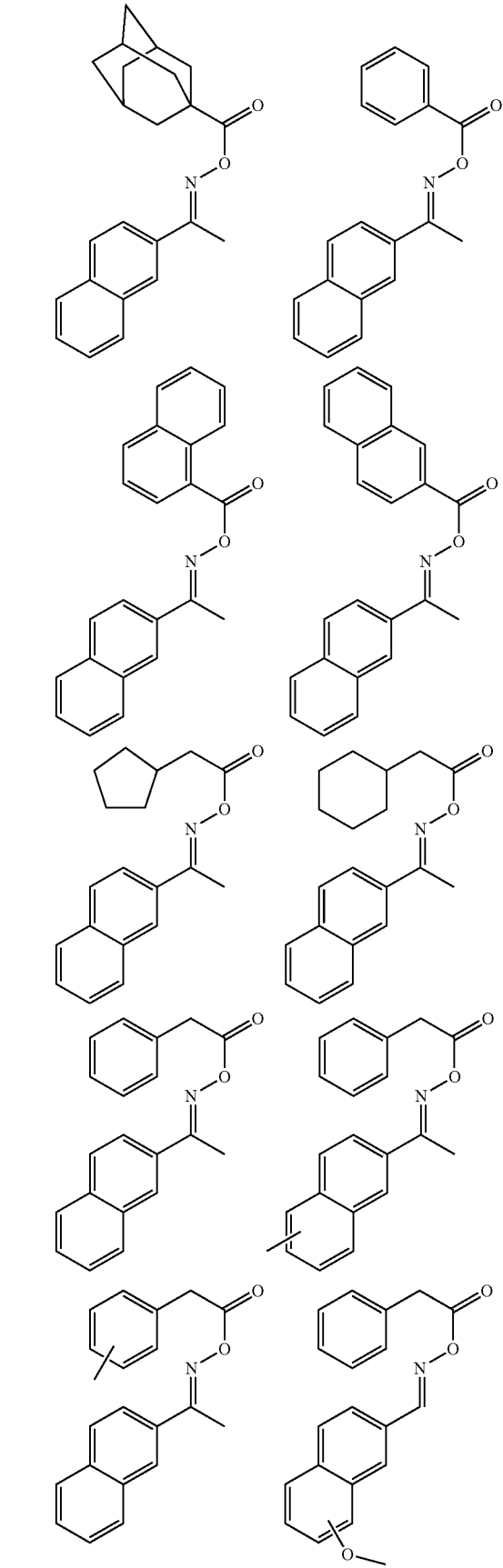

123
-continued
124
-continued
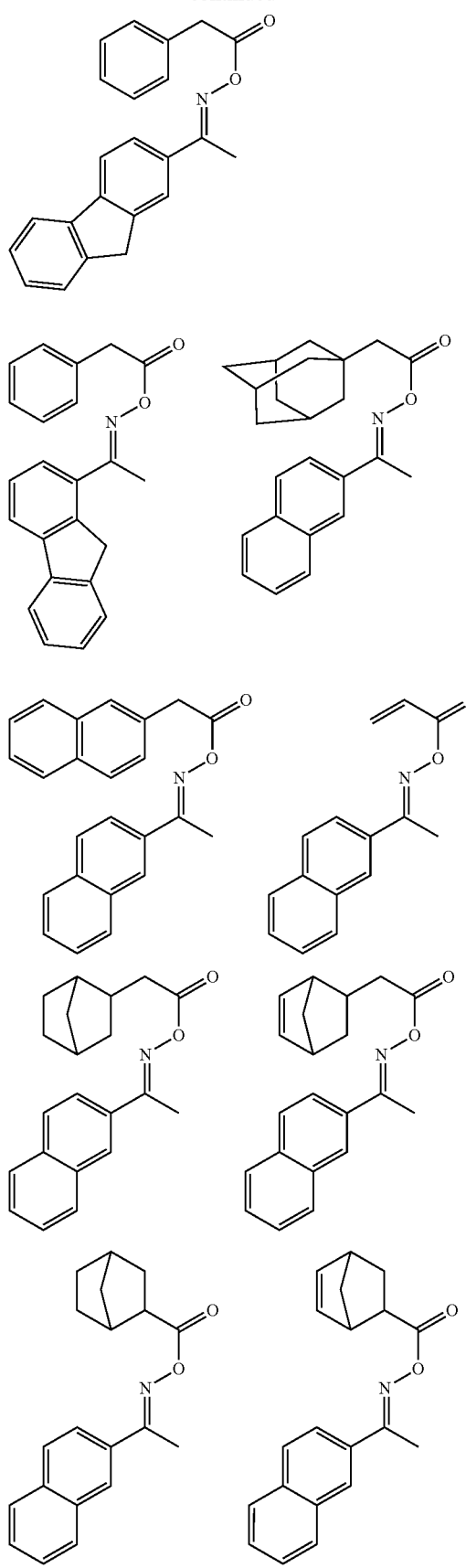
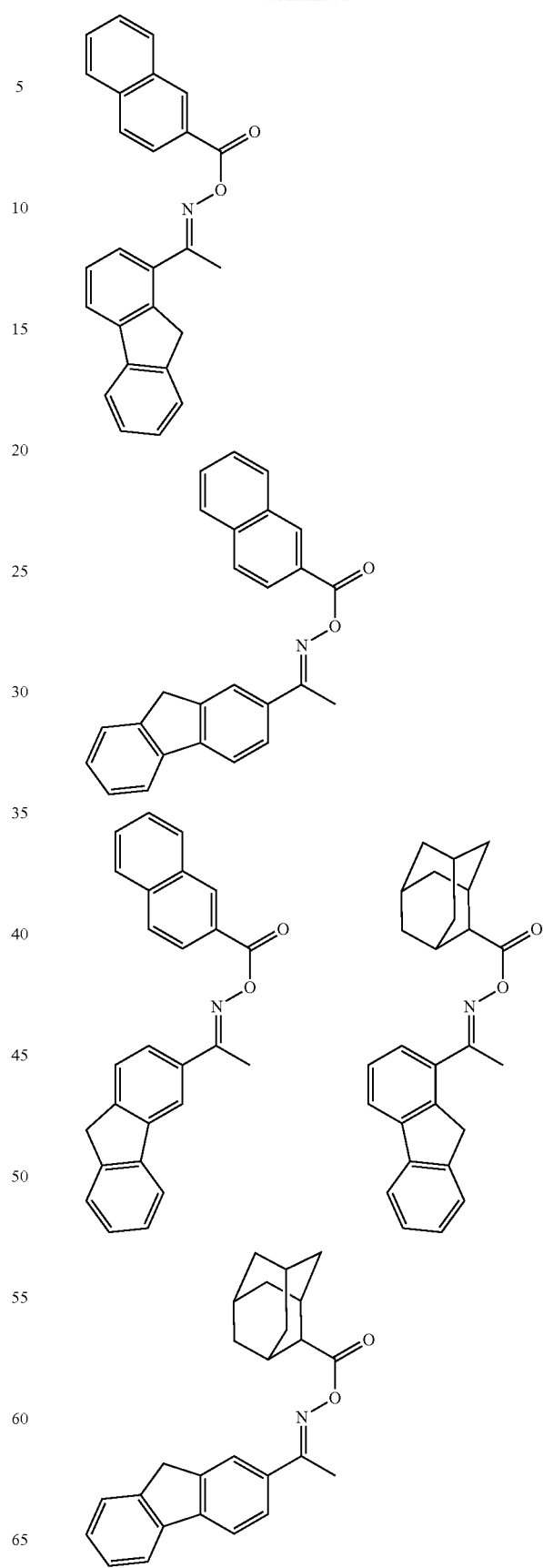

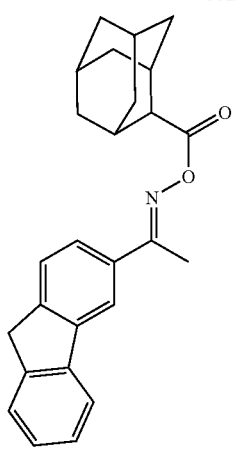
Examples of the PBG of formula (9) are given below.
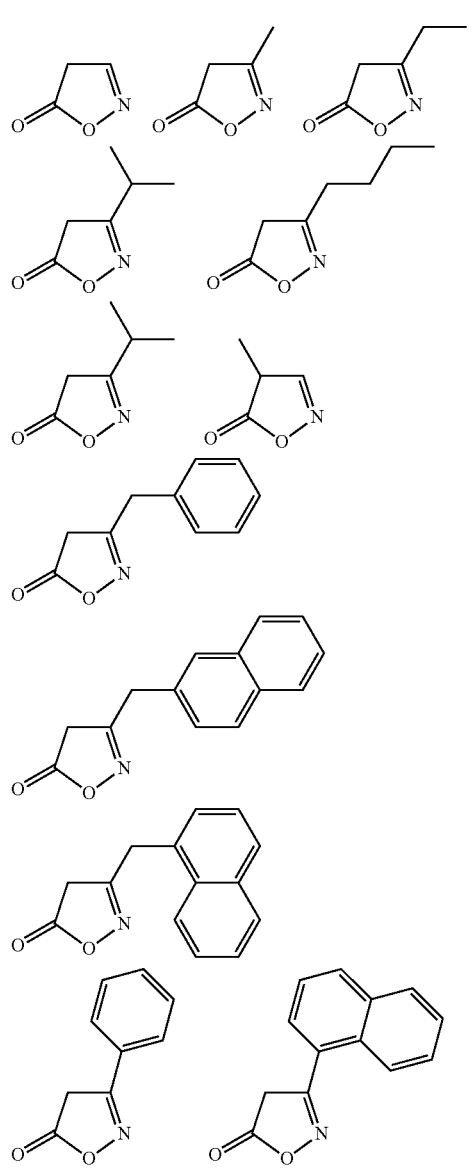
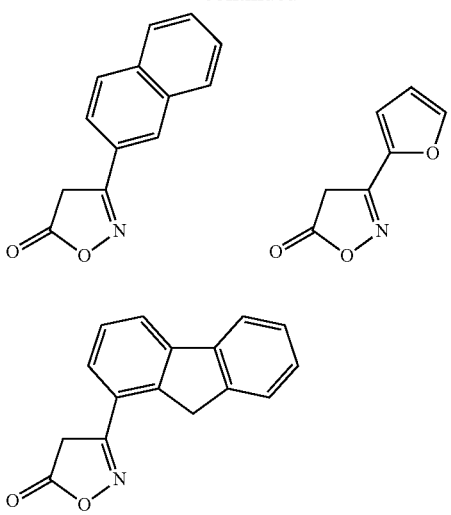
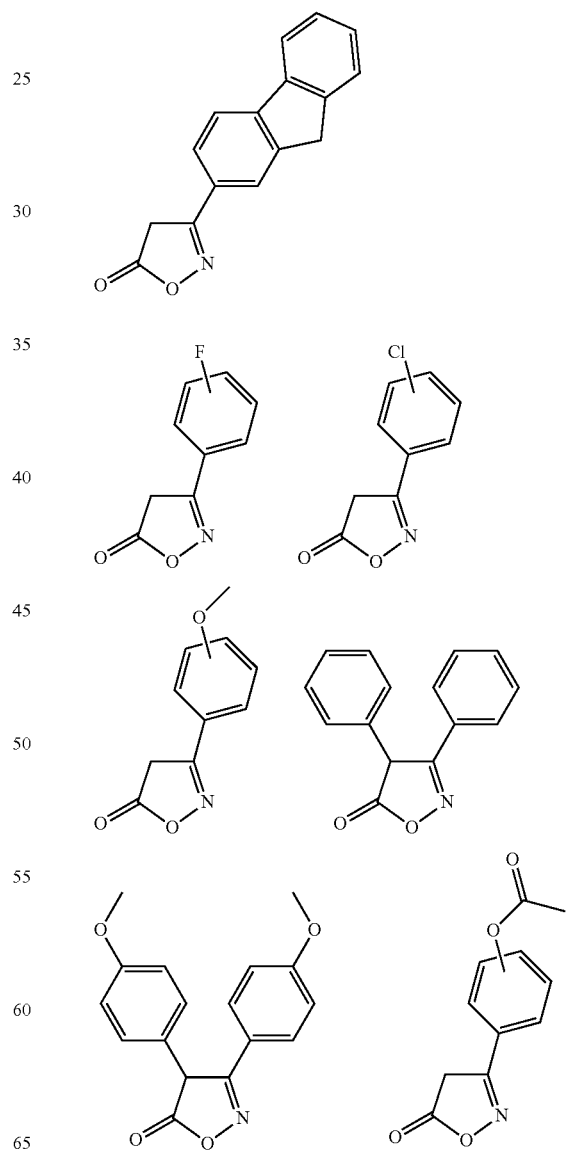

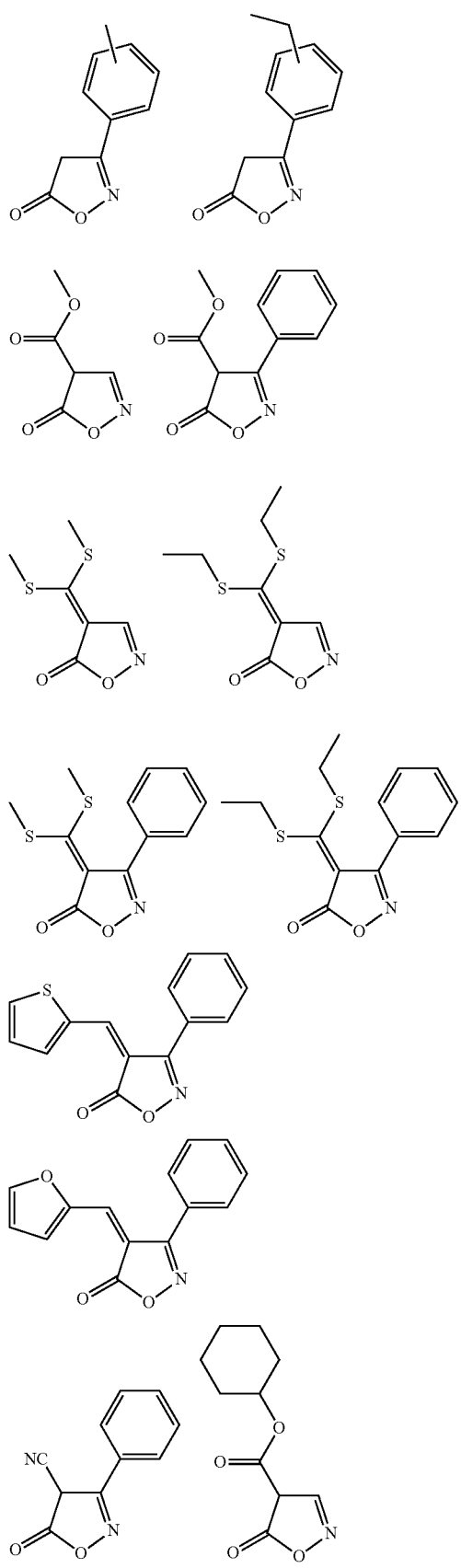
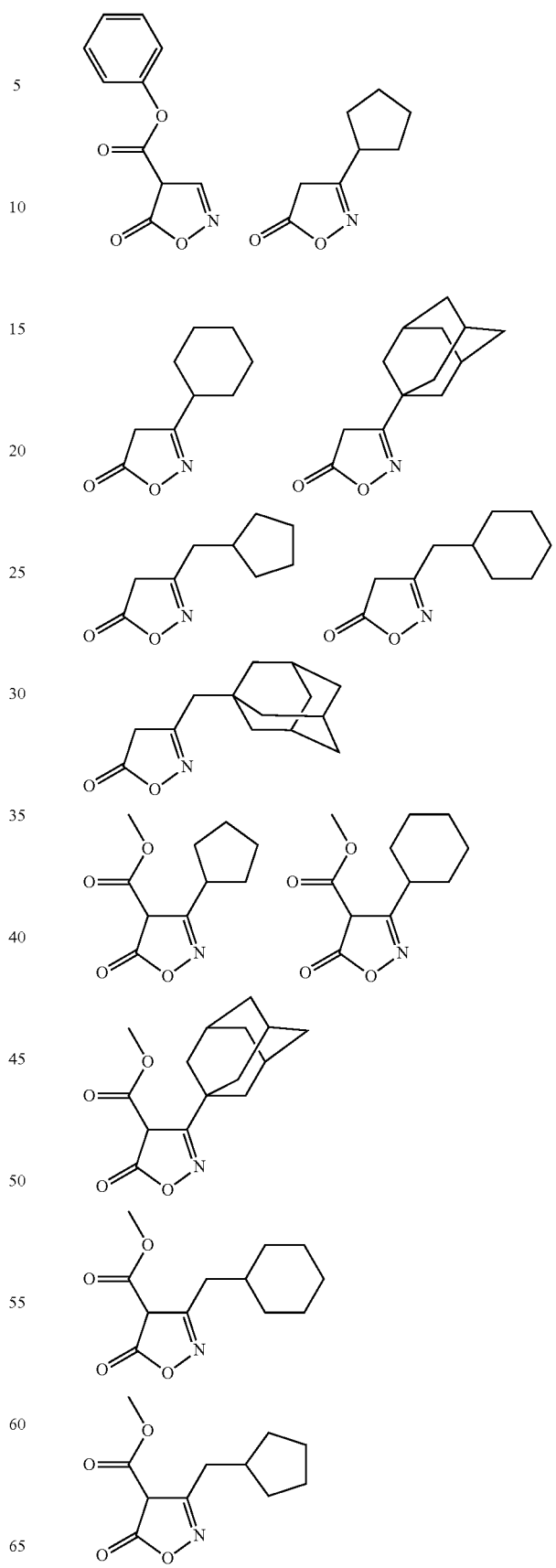

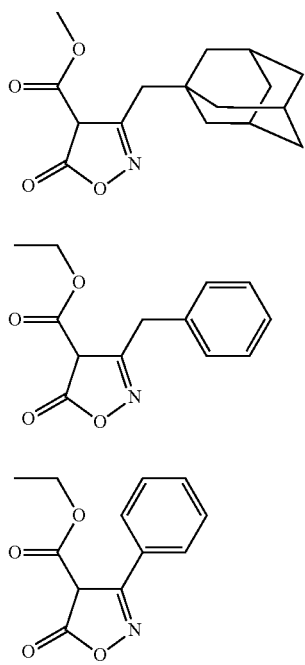

The PBG of addition mode having formulae (2) to (9) is preferably compounded in an amount of 0 to 10 parts, more preferably 0 to 8 parts by weight per 100 parts by weight of the base polymer. When used, the amount of PBG added is preferably at least 1 part, more preferably at least 1.5 parts by weight on the same basis.

It is important for the patterning process that the PBG have a lower generation efficiency than the PAG. When a sulfonium or iodonium salt is used as the PAG, the PBGs of formula (1) to (9) may advantageously be used because of their low generation efficiency. However, in an example which uses an N-sulfonyloxyimide as the PAG and a compound of formula (6) or (7) as the PBG, neither positive nor negative tone response is available because of the same generation efficiency.

In the patterning process, a base amplifier which is decomposed with a base to generate another base may be used along with the PBG. When the base amplifier is used along with the PBG, a molar amount of amino groups is controlled relative to acid. That is, the sum of a total molar amount of amino groups in the quencher, a total molar amount of amino groups released from the PBG, and a total molar amount of amino groups released from the base amplifier must be greater than a total molar amount of acid released from the PAG. The base amplifier may be attached to the polymer backbone or independently added to the resist composition.

The base amplifier attached to the polymer backbone (of backbone mode, hereinafter) corresponds to the recurring unit (a1) in formula (1) wherein one of $R^4$, $R^5$, and $R^6$ is an alkenyl group or contains a carbonyl, ester, lactone ring, carbonate, maleimide, amide or sulfo radical.

Examples of the base amplifier of backbone mode are given below wherein $R^1$ to $R^3$ are as defined above. Understandably the base amplifier of backbone mode may be copolymerized together with recurring units having an acid labile group and an adhesive group.

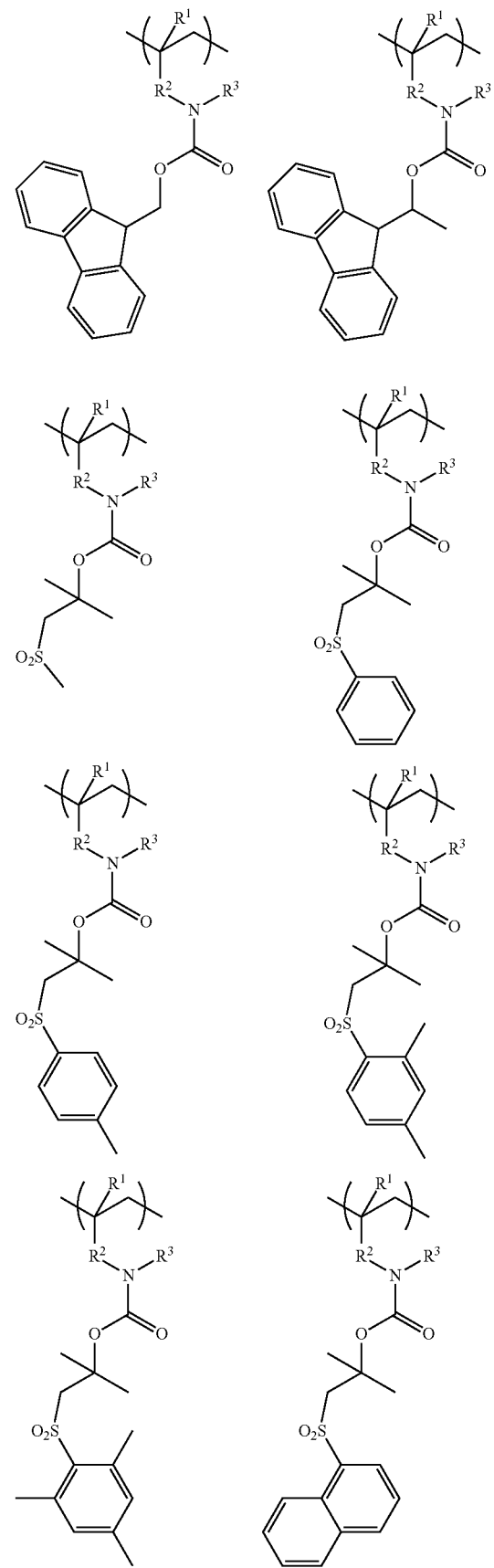

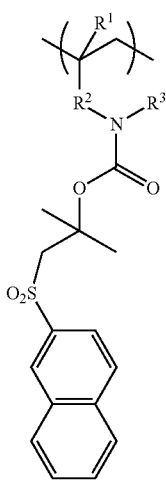
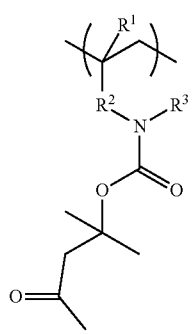
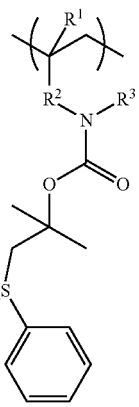
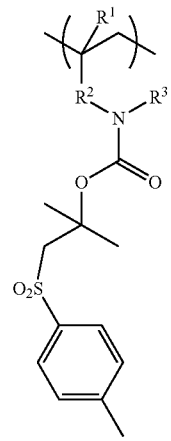
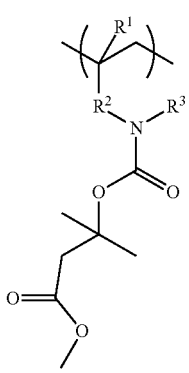
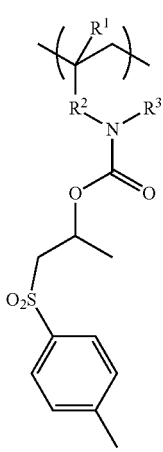
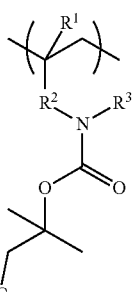
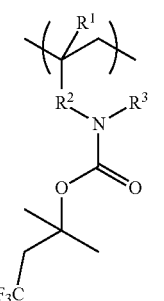
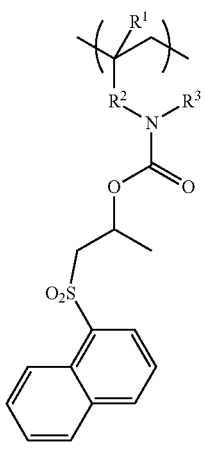
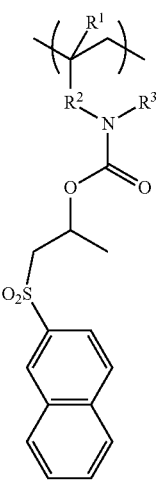

Examples of the base amplifier of addition mode include those of the following formulae (2') and (3').

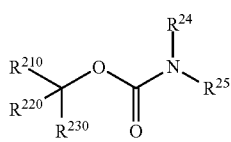

(2')

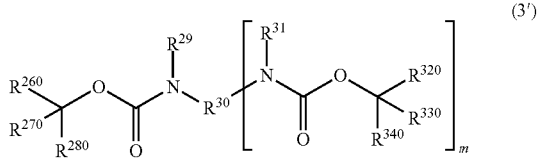

(3')

Herein $R^{210}$, $R^{220}$, $R^{230}$, $R^{260}$, $R^{270}$, $R^{280}$, $R^{320}$, $R^{330}$ and $R^{340}$ each are hydrogen, a straight, branched or cyclic $C_1$-$C_6$ alkyl, $C_6$-$C_{14}$ aryl or $C_7$-$C_{15}$ aralkyl group, at least one of $R^{210}$, $R^{220}$ and $R^{230}$, at least one of $R^{260}$, $R^{270}$ and $R^{280}$, or at least one of $R^{320}$, $R^{330}$ and $R^{340}$ is a $C_2$-$C_8$ alkenyl group, or an organic group selected from straight, branched or cyclic $C_1$-$C_6$ alkyl, $C_6$-$C_{14}$ aryl, and $C_7$-$C_{15}$ aralkyl groups each containing a carbonyl, ester, lactone, carbonate, maleimide, amide or sulfo radical. $R^{24}$, $R^{25}$, $R^{29}$, $R^{30}$, $R^{31}$, and m are as defined above.

Examples of the base amplifiers of formulae (2') and (3') are given below wherein $R^{24}$, $R^{25}$, $R^{29}$ to $R^{31}$ are as defined above.

133 134
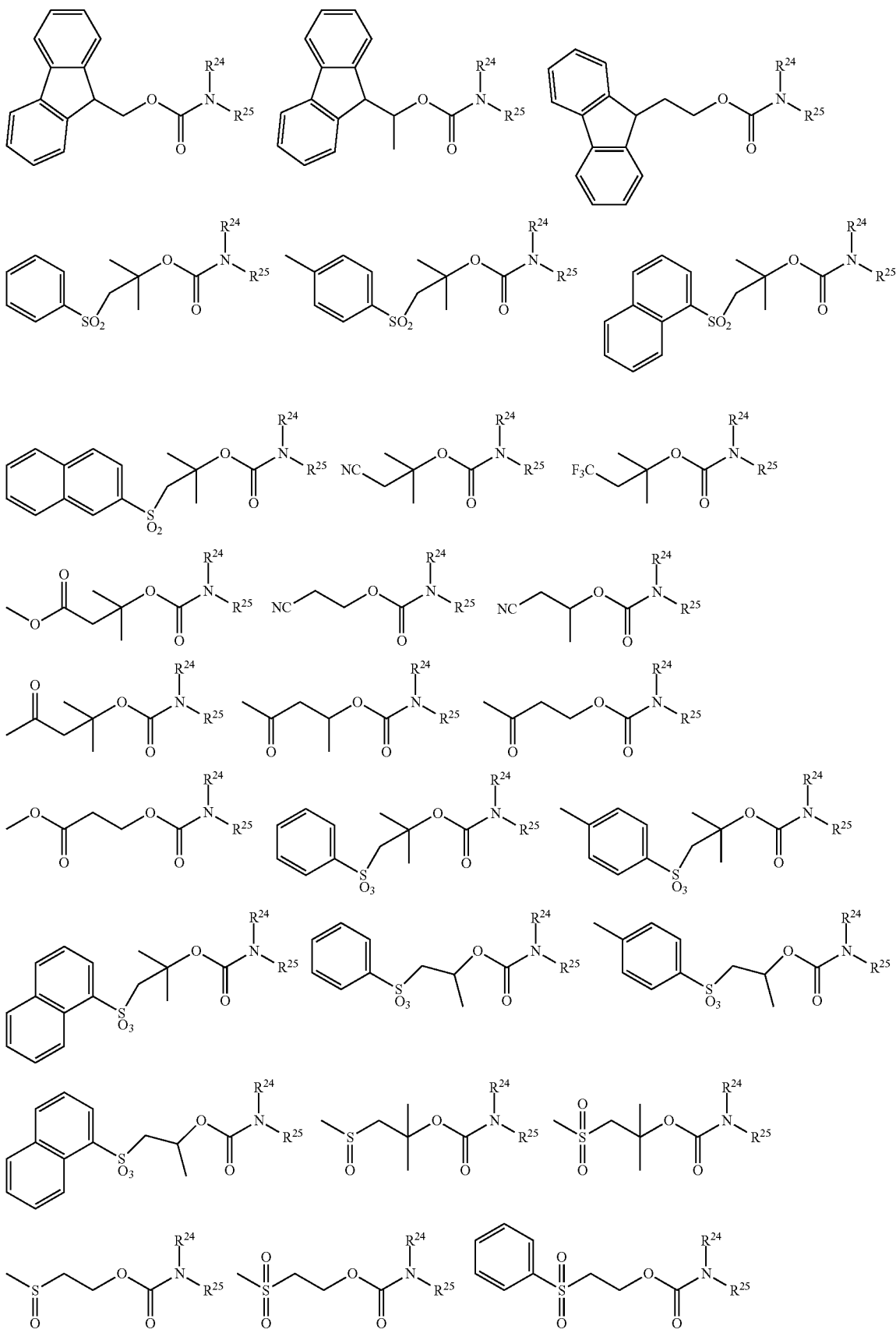

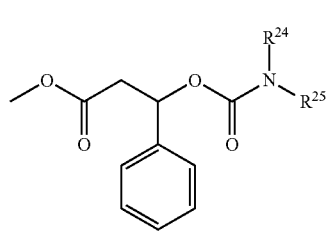
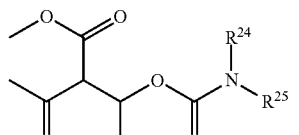
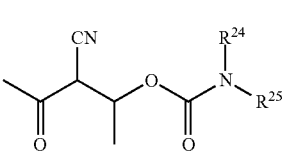
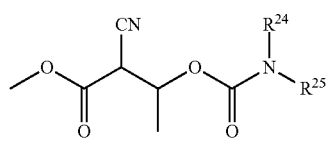
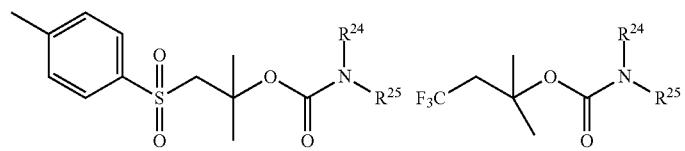
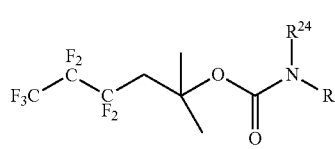
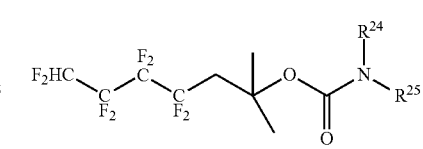
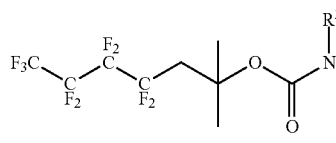
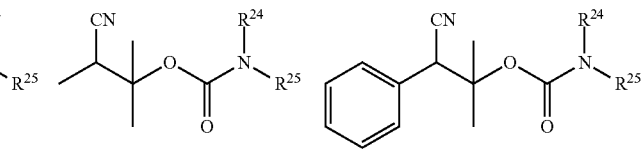
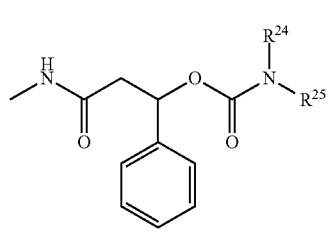
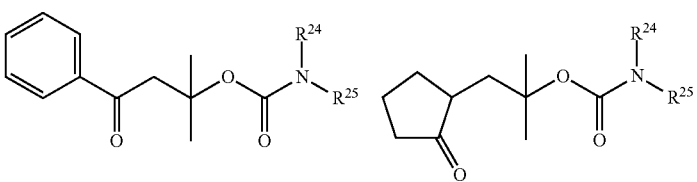
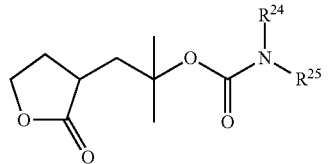
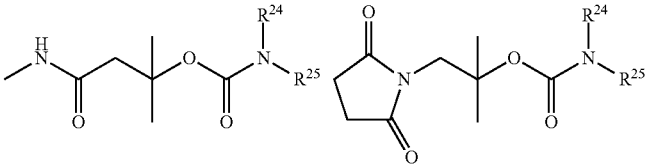
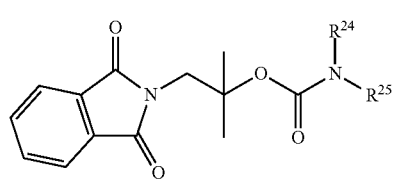
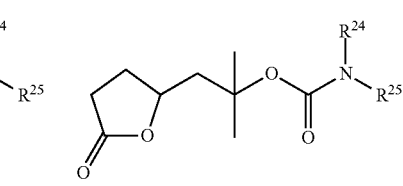
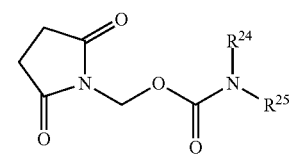
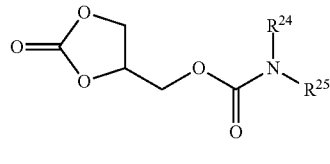
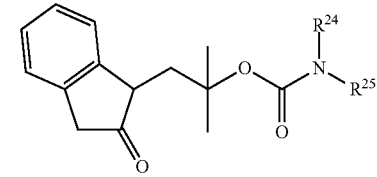
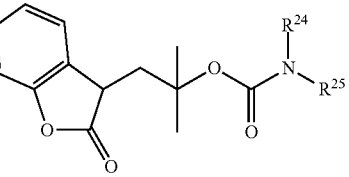
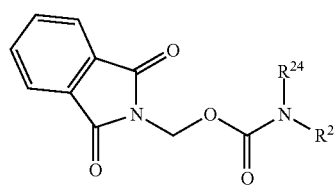
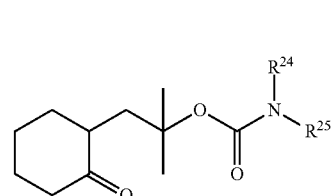
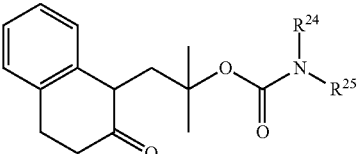

-continued
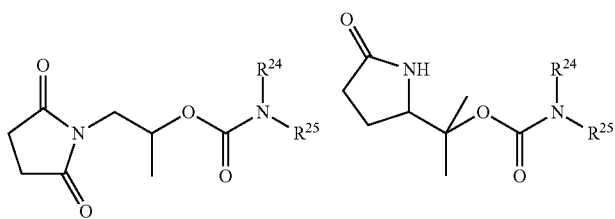
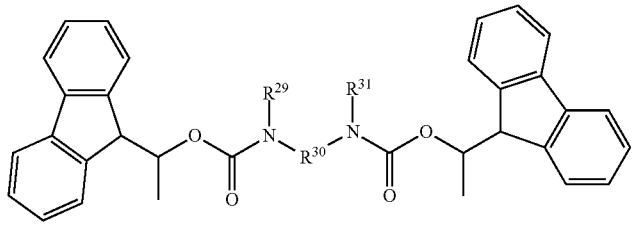
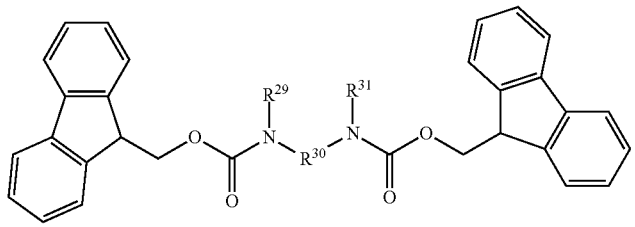
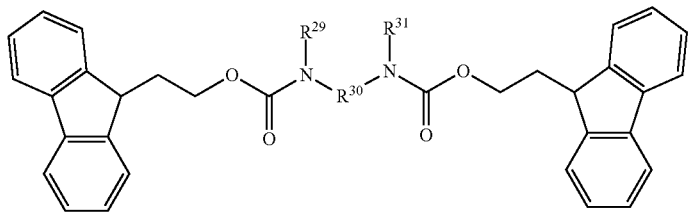
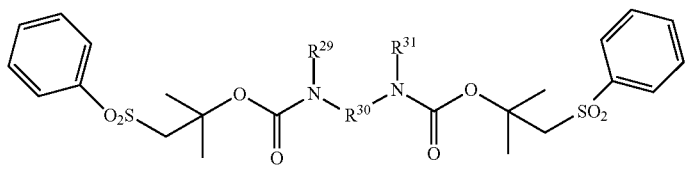
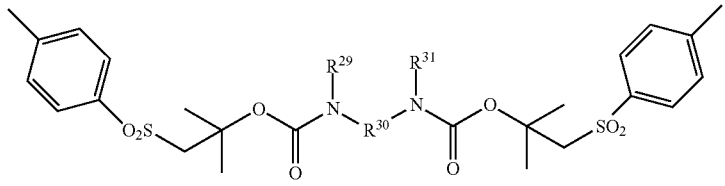
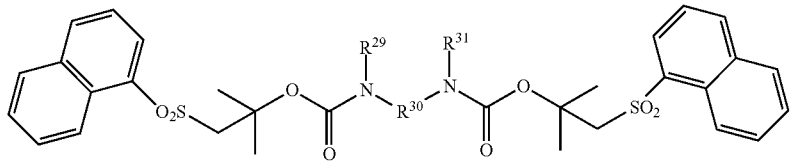
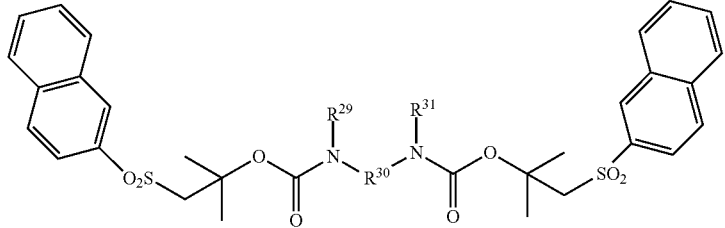

-continued
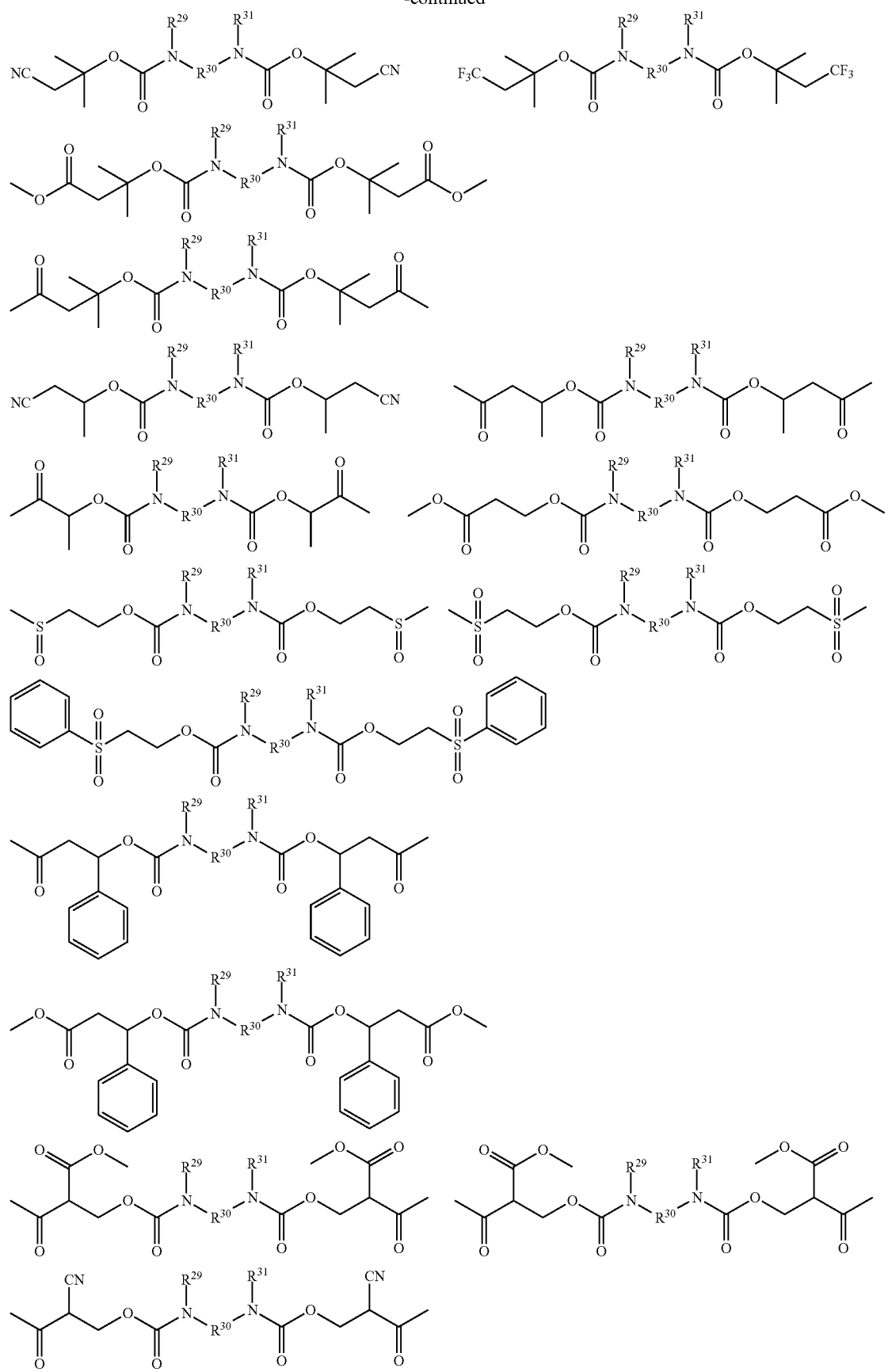

-continued
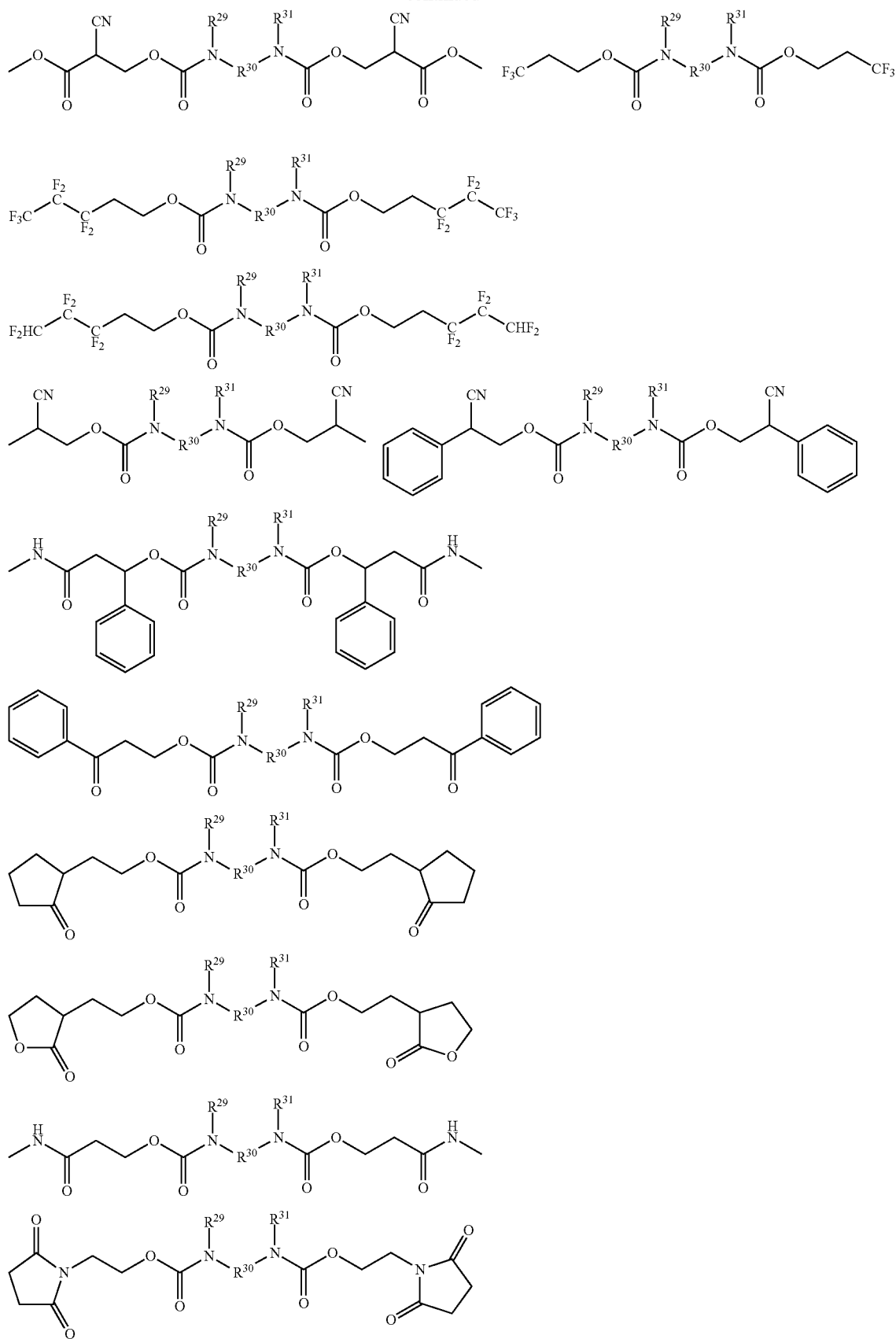

-continued
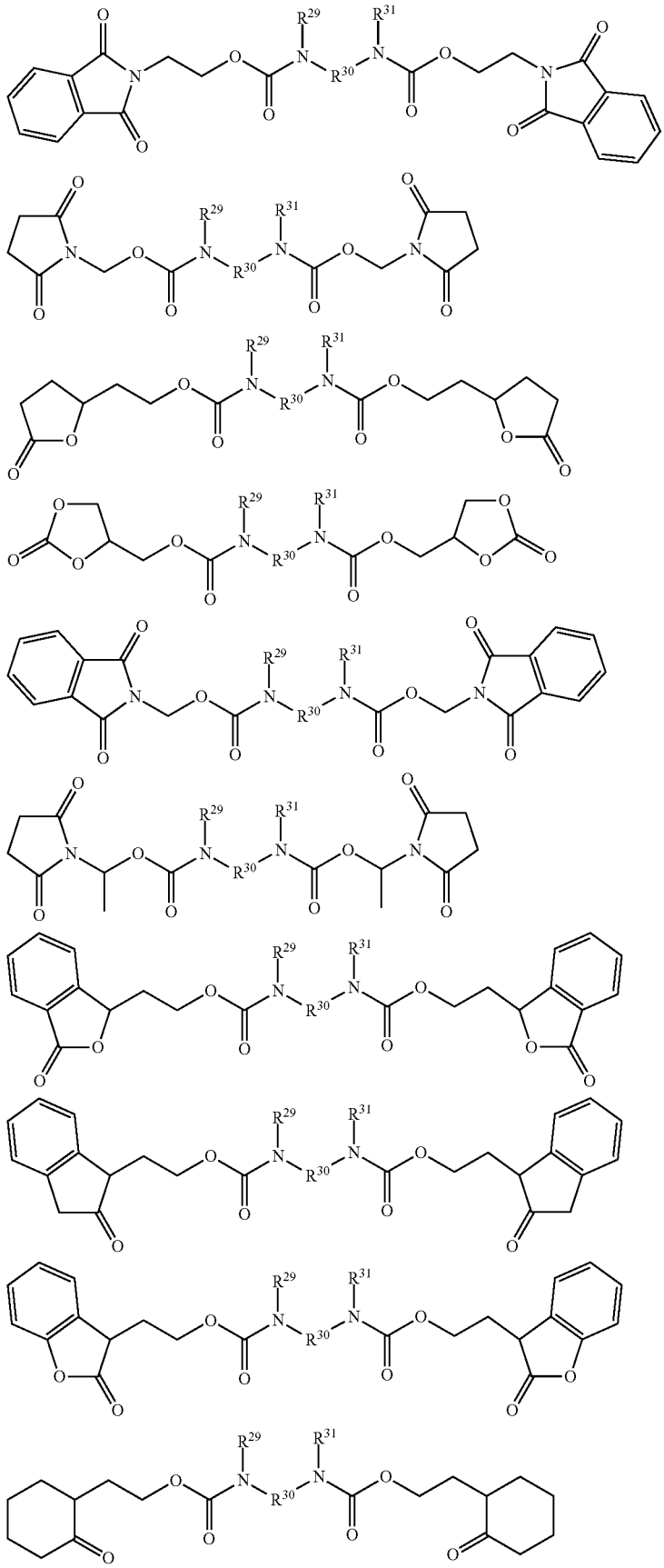

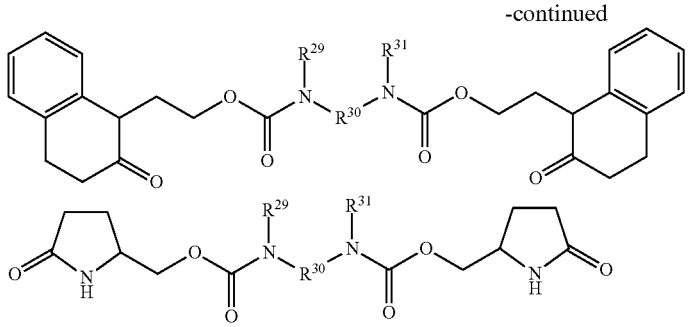

With respect to the amount of the base amplifier compounded, the base amplifier of backbone mode is preferably incorporated in an amount of 0.1 to 10 mol %, more preferably 0.3 to 8 mol %, and even more preferably 0.5 to 7 mol % based on the entire recurring units of the polymer. The base amplifier of addition mode is preferably used in an amount of 0.1 to 20 parts, more preferably 0.3 to 15 parts, and even more preferably 0.5 to 12 parts by weight per 100 parts by weight of the polymer.

Photoacid Generator

The resist composition contains a compound capable of generating an acid in response to actinic light or radiation, that is, photoacid generator (PAG). It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary PAGs are described in U.S. Pat. No. 7,537,880 (JP-A 2008-111103, paragraphs to [0142]).

In the patterning process, the positive tone response at an intermediate exposure dose is not available unless the PAG has a higher photo-induced generation efficiency than the PBG. Then the PAG is preferably selected from those compounds capable of generating a sulfonic acid, imidic acid or methide acid which is fluorinated at α-position. More preferred are sulfonium and iodonium salt base photoacid generators capable of generating such an acid at a high efficiency.

Examples of the PAG are illustrated below.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and 1,3-propylenebissulfonylimide. A typical tris(substituted alkylsulfonyl)methide is tris(trifluoromethylsulfonyl)methide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary are aryliodonium cations such as diphenyliodonium, bis(4-tert-butylphenyl)iodonium, 4-tert-butoxyphenylphenyliodonium, and 4-methoxyphenylphenyliodonium. Suitable sulfonates are as exemplified above.

The PAG is preferably used in an amount of 0.1 to 30 parts, more preferably 0.5 to 25 parts by weight per 100 parts by weight of the polymer as the base resin.

The resist composition further comprises an organic solvent and a basic compound (or quencher). It may further comprise a dissolution regulator, surfactant, and acetylene alcohol, alone or in combination.

Solvent

Examples of the organic solvent added to the resist composition are described in U.S. Pat. No. 7,537,880 (JP-A 2008-111103, paragraphs [0144] to [0145]. The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol;

ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein. An appropriate amount of the organic solvent used is 200 to 8,000 parts, especially 400 to 6,000 parts by weight per 100 parts by weight of the polymer.

For use in the resist composition, exemplary basic compounds serving as the quencher are described in JP-A 2008-111103 (U.S. Pat. No. 7,537,880), paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Quencher

As the quencher, those compounds of the structure described in JP-A 2008-111103, paragraphs [0152] to [0156] are especially preferred.

Exemplary quenchers which can be used herein include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amides, imides, and carbamates.

Organic nitrogen-containing compounds of the following general formula (B)-1 are also useful.

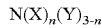     (B)-1

In the formula, n is equal to 1, 2 or 3. The side chain X may be the same or different and is selected from groups of the following general formulae (X1) to (X3). The side chain Y may be the same or different and is hydrogen or a straight, branched or cyclic $C_1$-$C_{20}$ alkyl group which may contain an ether or hydroxyl radical. Two or three X's may bond together to form a ring.

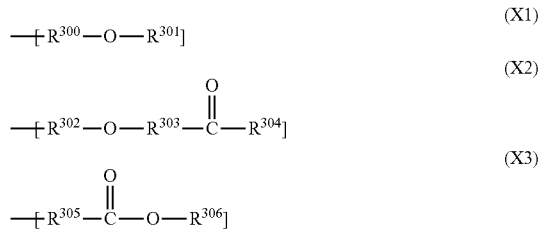

Herein $R^{300}$, $R^{302}$ and $R^{305}$ are independently straight or branched $C_1$-$C_4$ alkylene groups; $R^{301}$ and $R^{304}$ are independently hydrogen or straight, branched or cyclic $C_1$-$C_{20}$ alkyl groups which may contain one or more hydroxyl, ether, ester radicals or lactone rings; $R^{303}$ is a single bond or a straight or branched $C_1$-$C_4$ alkylene group; $R^{306}$ is a straight, branched or cyclic $C_1$-$C_{20}$ alkyl group which may contain one or more hydroxyl, ether, ester radicals or lactone rings.

Also useful are organic nitrogen-containing compounds of cyclic structure having the general formula (B)-2.

Herein X is as defined above, and $R^{307}$ is a straight or branched $C_2$-$C_{20}$ alkylene group which may contain one or more carbonyl, ether, ester or sulfide radicals.

Also useful are organic nitrogen-containing compounds having cyano represented by the general formulae (B)-3 to (B)-6.

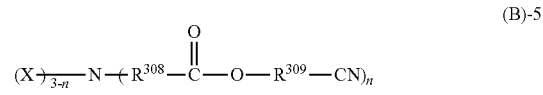

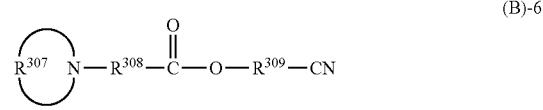

Herein, X, $R^{307}$ and n are as defined above, and $R^{308}$ and $R^{309}$ are each independently a straight or branched $C_1$-$C_4$ alkylene group.

Also included are organic nitrogen-containing compounds of imidazole structure having a polar functional group, represented by the general formula (B)-7.

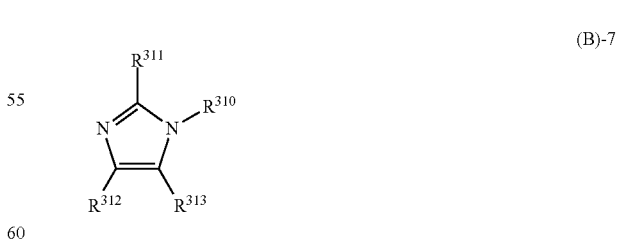

Herein, $R^{310}$ is a straight, branched or cyclic $C_2$-$C_{20}$ alkyl group having a polar functional group which is selected from among hydroxyl, carbonyl, ester, ether, sulfide, carbonate, cyano and acetal groups and mixtures thereof. $R^{311}$, $R^{312}$ and $R^{313}$ are each independently hydrogen, a straight, branched or cyclic $C_1$-$C_{10}$ alkyl group, aryl group or aralkyl group.

Also included are organic nitrogen-containing compounds of benzimidazole structure having a polar functional group, represented by the general formula (B)-8.

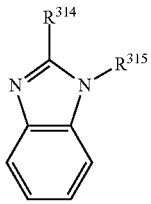
(B)-8

Herein $R^{314}$ is hydrogen, a straight, branched or cyclic $C_1$-$C_{10}$ alkyl group, aryl group or aralkyl group. $R^{315}$ is a straight, branched or cyclic $C_1$-$C_{20}$ alkyl group having a polar functional group. The alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

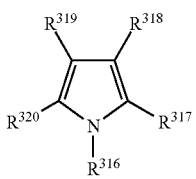
(B)-9

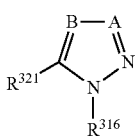
(B)-10

Herein, A is a nitrogen atom or =C—$R^{322}$. B is a nitrogen atom or =C—$R^{323}$. $R^{316}$ is a straight, branched or cyclic $C_2$-$C_{20}$ alkyl group which has one or more polar functional groups selected from among hydroxyl, carbonyl, ester, ether, sulfide, carbonate, cyano and acetal groups and mixtures thereof. $R^{317}$, $R^{318}$, $R^{319}$ and $R^{320}$ are each independently hydrogen, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring. $R^{321}$ is hydrogen, a straight, branched or cyclic $C_1$-$C_{10}$ alkyl group or aryl group. $R^{322}$ and $R^{323}$ each are hydrogen, a straight, branched or cyclic $C_1$-$C_{10}$ alkyl group or aryl group, or a pair of $R^{321}$ and $R^{323}$, taken together, may form a benzene or naphthalene ring.

Also included are organic nitrogen-containing compounds of aromatic carboxylic acid ester structure, represented by the general formulae (B)-11 to (B)-14.

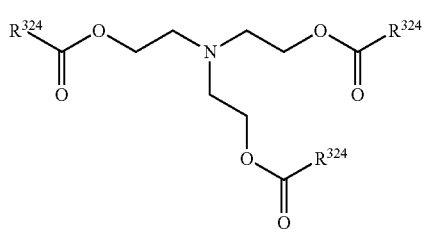
(B)-11

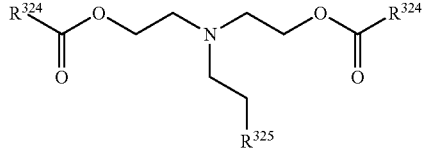
(B)-12

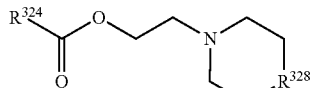
(B)-13

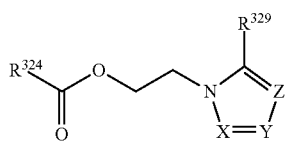
(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group in which some methylene groups may be replaced by oxygen atoms. $R^{327}$ is a $C_1$-$C_{10}$ alkyl or acyl group in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are nitrogen-containing compounds of 7-oxanorbornane-2-carboxylic ester structure, represented by the general formula (B)-15.

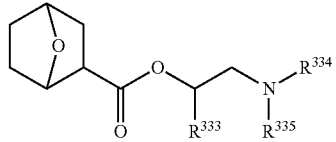
(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a $C_2$-$C_{20}$ heterocyclic or hetero-aromatic ring.

Furthermore, those compounds having a carbamate group described in JP 3790649 may be used as the quencher. Although the compound having a carbamate group is free of an amino group, it functions as the quencher in that the carbamate group is decomposed with an acid to produce an amino group.

The quencher or basic compound is preferably compounded in an amount of 0.01 to 15 parts, more preferably 0.1 to 12 parts by weight per 100 parts by weight of the polymer as the base resin.

It is an advantageous amine amplifying mechanism that an amine is generated under the catalysis of the amine compound released from the PBG group represented by formulae (1) to (9). Utilization of this mechanism gives the advantages of an increased amine generation efficiency and non-linear generation of amine versus exposure dose. The non-linear amine generation leads to improvements in the contrast of inactivation and the contrast of negative conversion.

The resist composition used in the patterning process of the invention should meet that the sum of a total molar amount of amino groups in the quencher, a total molar amount of amino groups released from the PBG (a total molar amount of amino groups released from the PBG-bearing recurring units of the polymer plus a total molar amount of amino groups released from the PBG of addition mode), and a total molar amount of amino groups released from the base amplifier is greater than the sum of a total molar amount of acid released from the PAG and a total molar amount of acid released from the sulfonium salt-bearing recurring units of the polymer. This ensures that the acid released from the PAG in the over-exposed region is inactivated.

Preferably the sum of total molar amounts of amino groups is at least 20%, more preferably at least 40% greater than the sum of total molar amounts of acid. If the sum of total molar amounts of amino groups is greater than the sum of total molar amounts of acid by more than 100%, then the amount of amine compound generated is always greater than the amount of acid generated, with a possible loss of a positive response region, that is, an exposure dose range at which alkaline dissolution once occurs as the exposure dose is increased. Therefore the amount of amino groups must be optimized relative to the amount of acid generated. It is desired from this standpoint that the molar difference between amine and acid be up to 100%, more desirably 25 to 80%, and even more desirably 30 to 70%.

If a total molar amount of amino groups only in the quencher is greater than a total molar amount of acid released from the PAG, the acid released from the PAG is neutralized independent of whether the exposure dose is high or low, so that deprotection reaction does not occur, exhibiting no positive tone dissolution behavior. Therefore, the total molar amount of amino groups in the quencher must be less than the total molar amount of acid released from the PAG. When the PBG and the base amplifier are used together, the total molar amount of amino groups is preferably controlled such that the sum of a total molar amount of amino groups in the quencher, a total molar amount of amino groups released from the PBG, and a total molar amount of amino groups released from the base amplifier is at least 20% greater than a total molar amount of acid.

When only the base amplifier is used without the PBG, an increase of amine generation in proportion to an exposure dose does not occur, exhibiting no negative tone response. Therefore, when the base amplifier is used, it must be used together with the PBG.

Figure 5:
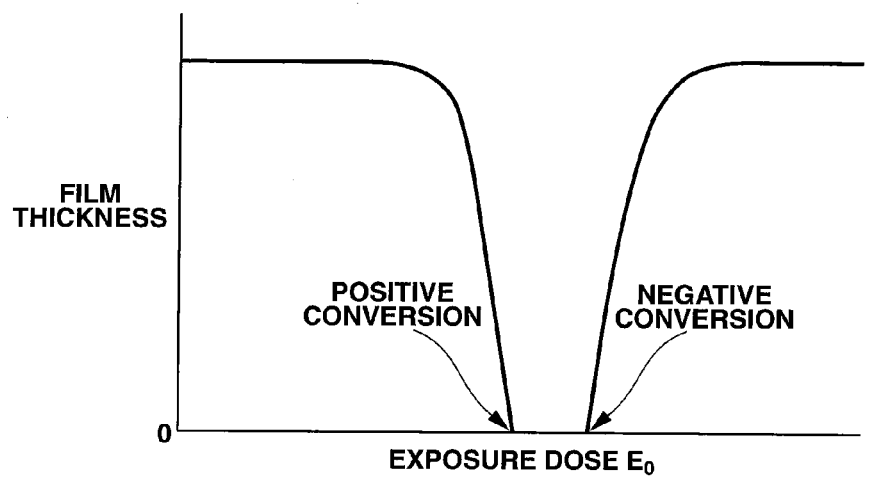
FIG. 5 is a diagram showing thickness versus exposure dose of a resist film of a dual-tone resist material according to the invention.

As the total molar amount of amino groups increases, the sensitivity of positive tone conversion as shown in FIG. 5 decreases and the sensitivity of negative tone conversion improves. If the total molar amount of amino groups is too much, the sensitivities of positive and negative tone conversions cross each other, leaving no region where the film thickness becomes zero (0). When the amounts of the quencher and PBG added are controlled such that the exposure dose of negative conversion divided by the exposure dose of positive conversion may fall in a range from 3 to 8, line split is achieved in an actual pattern.

The sensitivity of positive and negative conversion may be adjusted in terms of PEB temperature. As the PEB temperature becomes higher, the sensitivity of positive conversion becomes higher and the sensitivity of negative conversion becomes lower, and hence, the exposure dose of negative conversion divided by the exposure dose of positive conversion becomes greater. Inversely, as the PEB temperature becomes lower, an inverse phenomenon occurs. If the PEB temperature becomes extremely lower, the sensitivities of positive and negative conversions cross each other. Namely, as the PEB temperature changes, not only the sensitivities of positive and negative conversions, but also the diffusion distances of acid and amine change. An attempt to elevate the PEB temperature beyond the necessity in order to make the sensitivity of positive conversion higher and the sensitivity of negative conversion lower undesirably results in an extension of the diffusion distance of acid and amine, inviting degradation of resolution. Rather than changing the PEB temperature to adjust the sensitivities of positive and negative conversions, it is preferred to adjust the sensitivities of positive and negative conversions by changing the amounts of the quencher and PBG added.

In the steps of coating and exposing the resist composition, if the exposure dose is low, the PAG and sulfonium salt-bearing recurring units do not generate sufficient acid to eliminate the acid labile group from the acid labile group-containing recurring units of the polymer, the overall polymer including the exposed area remains insoluble or substantially insoluble in the developer. As the exposure dose is increased from that level, the amount of acid released from the onium salt (sulfonium or iodonium salt) PAG featuring a high acid generation efficiency increases so that the acid labile group is eliminated from the acid labile group-containing recurring units of the polymer in the exposed area during PEB (deprotection takes place), and consequently the exposed area becomes dissolvable in alkaline developer. As the exposure dose is further increased, acid inactivation occurs when the total molar amount of amino groups released from the PBG-bearing recurring units of the polymer, amino groups in the basic compound previously added as the quencher, and amino groups released from the base amplifier, if any, exceeds the total molar amount of the acid released from the PAG and the acid released from the sulfonium salt-bearing recurring units of the polymer, if any. As a consequence, deprotection reaction during PEB is inhibited, and negative tone conversion occurs.

Figure 3:
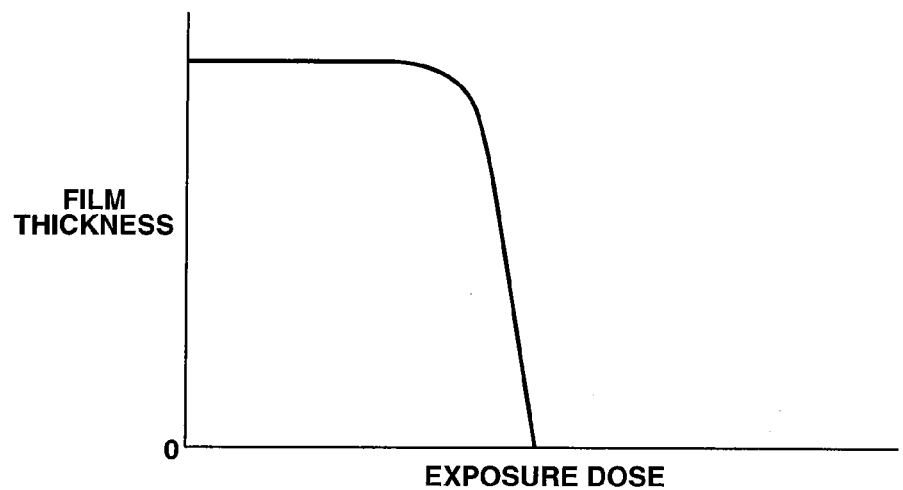
FIG. 3 is a diagram showing thickness versus exposure dose of a resist film of a prior art positive resist material.
Figure 4:
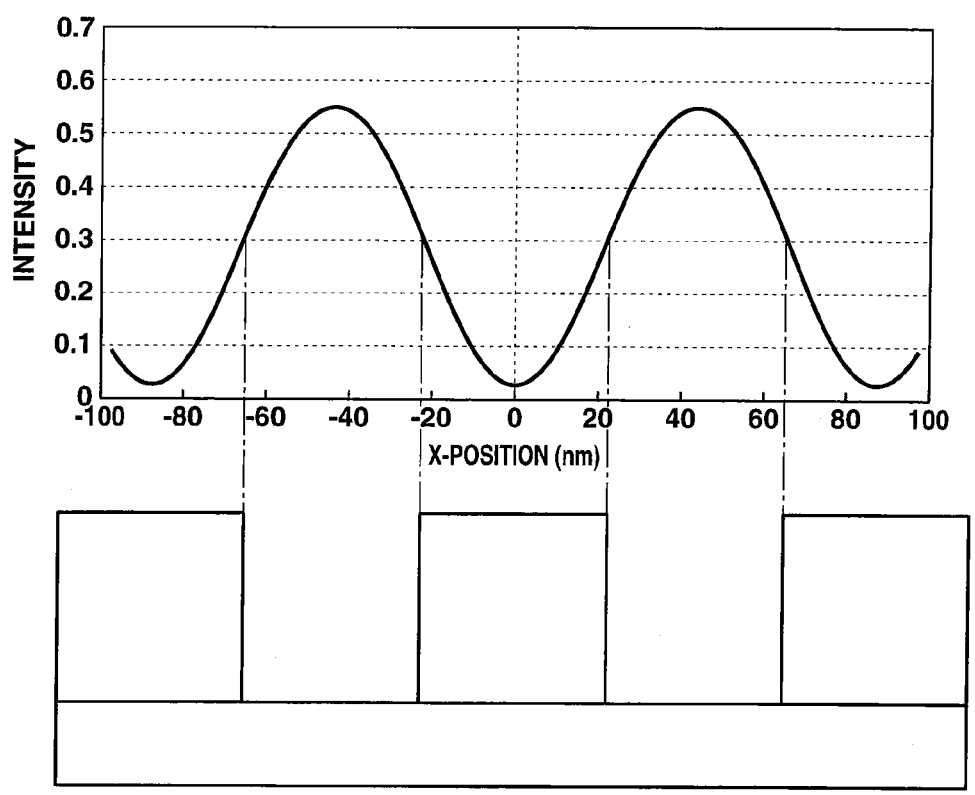
FIG. 4 shows a contrast curve and a cross-sectional profile of a prior art positive resist pattern.

FIG. 3 shows a contrast curve of a prior art positive resist composition. The diagram plots an exposure dose on the abscissa and a film thickness on the ordinate, the right side on the abscissa indicates a high exposure dose, and the upper side on the ordinate indicates an increased thickness. It is seen that as the exposure dose is increased, the film thickness starts decreasing at a certain threshold. When this resist composition is exposed to an optical image as shown in the upper section of FIG. 4, a pattern as shown in the lower section of FIG. 4 is obtained.

Figure 6:
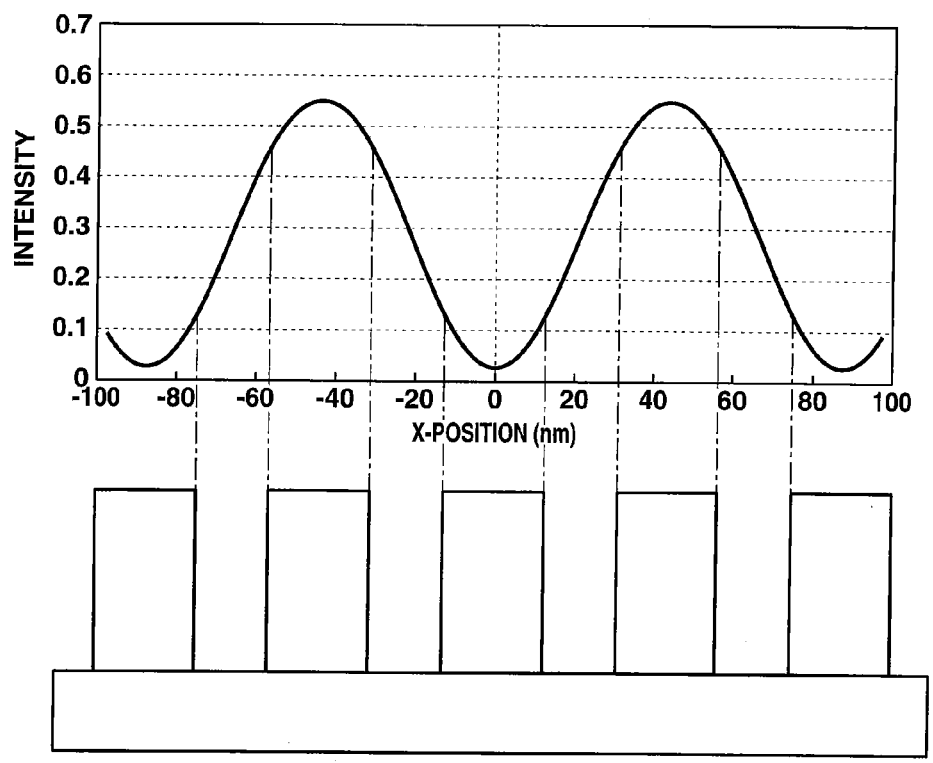
FIG. 6 shows a contrast curve and a cross-sectional profile of a dual-tone resist pattern according to the invention.

FIG. 5 shows a contrast curve of a dual-tone resist composition of the invention. As the exposure dose is increased, dissolution proceeds like a positive resist material until the film thickness reaches zero (0). As the exposure dose is further increased, the film thickness increases like a negative resist material. When the dual-tone resist composition is exposed to an optical image as shown in the upper section of FIG. 6, a pattern as shown in the lower section of FIG. 6 is obtained. As compared with the pattern of FIG. 4, the pattern of FIG. 6 has a half line width. The pattern includes a double number of lines formed at the same pitch.

The PBG used in the patterning process may take the form of a PBG group which is decomposed to generate an amino group on the backbone, as represented by (a1) to (a4) in formula (1), or a PBG of addition mode as represented by formulae (2) to (9). Either form can provide the dual-tone response. A possible phenomenon is that amine may evaporate from an excess amine zone during PEB and re-deposit on an excess acid zone, whereby no pattern is formed in the zone where a space pattern is originally to be formed, or the top of a space pattern becomes overhung, leading to a top-bulged profile. Then a configurative or dimensional difference may arise between a dark pattern and a bright pattern, or a dark-bright (DB) difference due to a so-called chemical flare may arise. In that event, to prevent any DB difference by amine evaporation, it is preferred to use a PBG capable of generating an amino group attached to the backbone or a PBG capable of generating a high boiling amine or to apply a protective film on top of the resist film.

Process

Now, the double patterning process is described. FIG. 2 illustrate a prior art double patterning process.

Referring to FIG. 2, one exemplary double patterning process is illustrated. A photoresist film 30 is coated and formed on a processable layer 20 on a substrate 10. To prevent the photoresist pattern from collapsing, the technology intends to reduce the thickness of photoresist film. One approach taken to compensate for a lowering of etch resistance of thinner film is to process the processable layer using a hard mask. The double patterning process illustrated in FIG. 2 uses a multi-layer coating in which a hard mask 40 is laid between the photoresist film 30 and the processable layer 20 as shown in FIG. 2A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON, p-Si or TiN, for example. The resist material used in this double patterning process is a positive resist composition. In the process, the resist film 30 is exposed and developed (FIG. 2B), the hard mask 40 is then dry etched (FIG. 2C), the resist film is stripped, and a second resist film 50 is coated, formed, exposed, and developed (FIG. 2D). Then the processable layer 20 is dry etched (FIG. 2E). Since this etching is performed using the hard mask pattern and the second resist pattern as a mask, variations occur in the pattern size after etching of the processable layer due to a difference in etch resistance between hard mask 40 and resist film 50.

In the double patterning process illustrated in FIG. 2, exposure and hard mask etching are performed two times, leaving the drawbacks of a prolonged process and misregistration upon alignment of the exposure tool.

FIG. 1 illustrates the patterning process of the invention. FIG. 1A shows a structure wherein a resist film 30 of the inventive resist composition is formed on a processable layer 20 on a substrate 10 via a hard mask 40 as in FIG. 2. A selected area 31 of the resist film 30 is exposed to radiation in a certain exposure dose E (FIG. 1B). In the exposed area 31, the exposure dose is maximum at the center 32 and gradually decreases toward opposite lateral sides 33, 34 of the exposed area 31. The exposure dose E is an average exposure dose throughout the exposed area 31. Exposure is performed in a exposure dose which has been previously studied and confirmed with respect to the resist composition to ensure that the center and adjoining lateral portions receiving a more exposure dose are over-exposed so that these portions are left as a line (width), followed by development. As a result, not only the unexposed area is left as an undissolved portion, but also the center 32 and adjoining lateral portions (over-exposed) are left as an undissolved portion as shown in FIG. 1C. It is noted that after an exposure dose E0 corresponding to a film thickness of zero (0) is determined on the curve of FIG. 5, an exposure dose which is 2 or 3 times the exposure dose E0 is selected for this exposure. Resolution doubling patterning by splitting a single line into two is possible when the sensitivity of negative conversion at which the film thickness starts increasing divided by the sensitivity of positive conversion at which the film thickness becomes zero (0), both determined from the contrast curve of FIG. 5, is in a range from 3 to 8. Accordingly through the single exposure, a resolution equivalent to that of patterning involving two exposures is achievable. Also in this case, the hard mask 40 may be etched only once (FIG. 1D) and the processable layer 20 may be processed or etched only once (FIG. 1E). Additionally, a double resolution over the conventional resolution is available.

Figure 7:
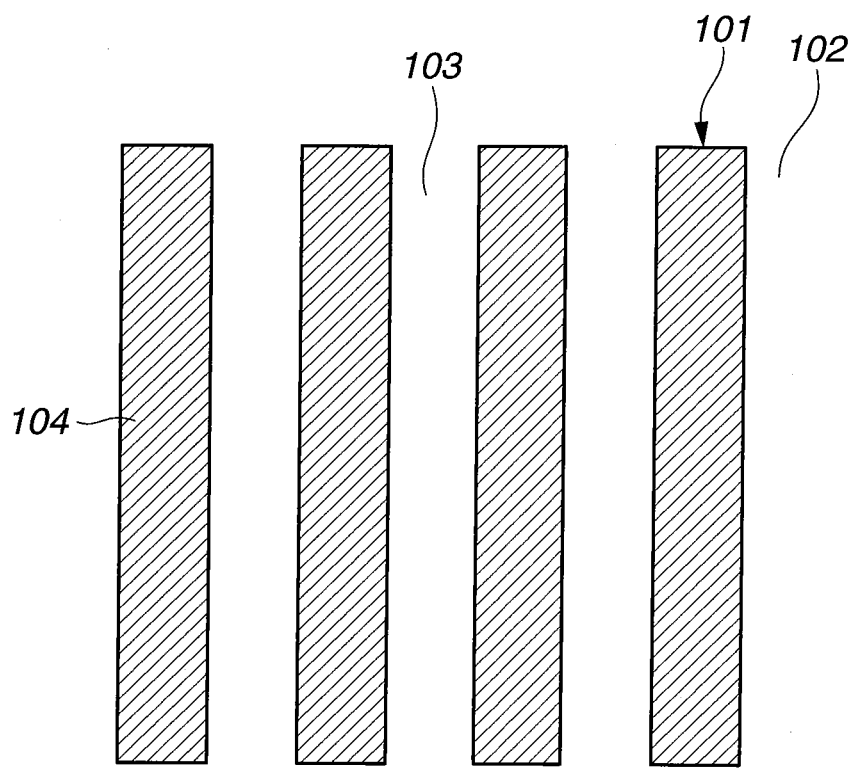
FIG. 7 schematically illustrates a bright line mask pattern.
Figure 8:
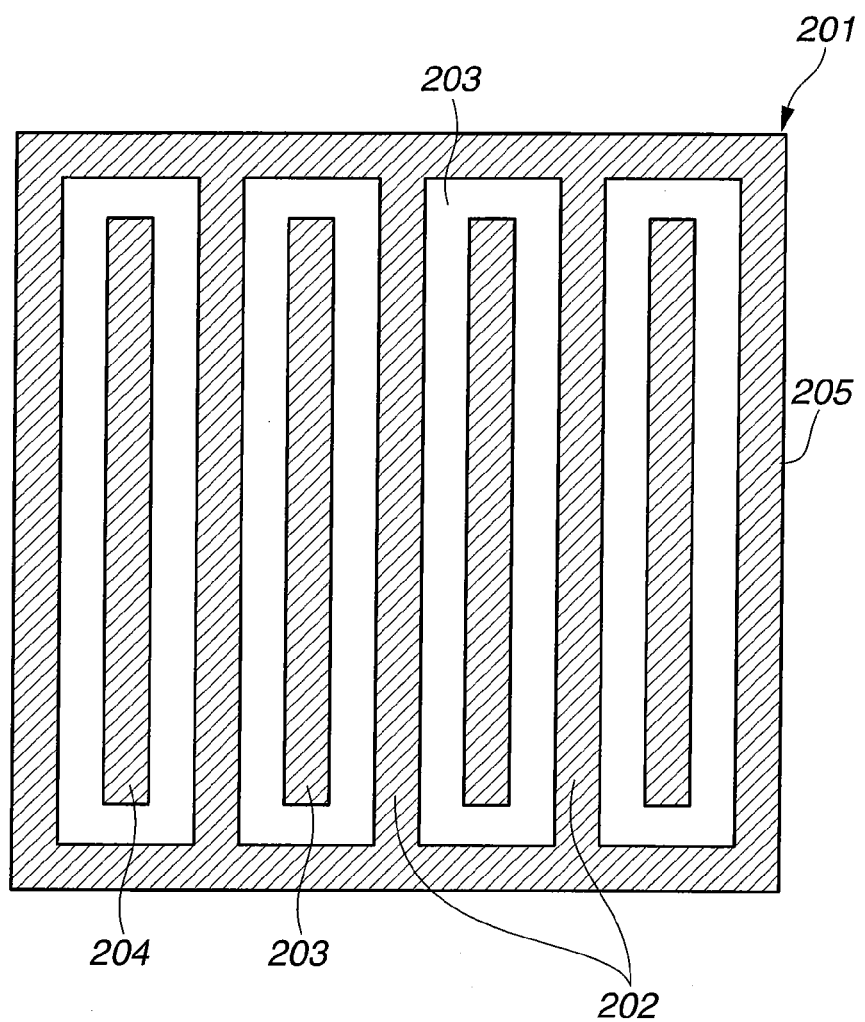
FIG. 8 is a plan view of a pattern as developed, using the bright line mask and a dual-tone resist according to the invention.

FIG. 7 illustrates a mask pattern of bright lines. FIG. 8 illustrates a pattern formed after exposure and development steps using the inventive resist composition and the mask of FIG. 7. A resist film 201 is exposed through light-transmissive areas 102 of the mask 101. At this point, a center 103 of a space and adjoining lateral portions are over-exposed and these portions become negative and insoluble in alkaline developer, forming a line 202; and exposed lateral portions adjoining the line 202 become soluble in alkaline developer, forming spaces 203. Portions of the resist film corresponding to non-transmissive areas 104 of the mask 101 are not exposed and remain insoluble in alkaline developer. In this regard, since radiation invades under opposite sides of the non-transmissive area 104 of the mask 101 whereby the radiation-penetrating portion of the resist film becomes soluble in alkaline developer, a line 204 is formed which is somewhat narrower than the width of the non-transmissive area 104. Furthermore, since the four sides of the mask 101 allow over-exposure, a line 205 configured as a rectangular frame is formed. It is noted that if the rectangular frame-configured line 205 is unnecessary and to be cut, patterning to this end is necessary. For this patterning, once the pattern of FIG. 8 is transferred to the hard mask by etching, a resist composition is coated again thereon, followed by exposure and processing for cutoff purpose. Since the exposure for cutting does not need a pattern resolution, it may be carried out by either ArF dry lithography or KrF lithography rather than the expensive ArF immersion lithography.

Accordingly a single line pattern on the mask can be split into and formed as a single line and two spaces through single exposure, PEB and development.

Figure 9:
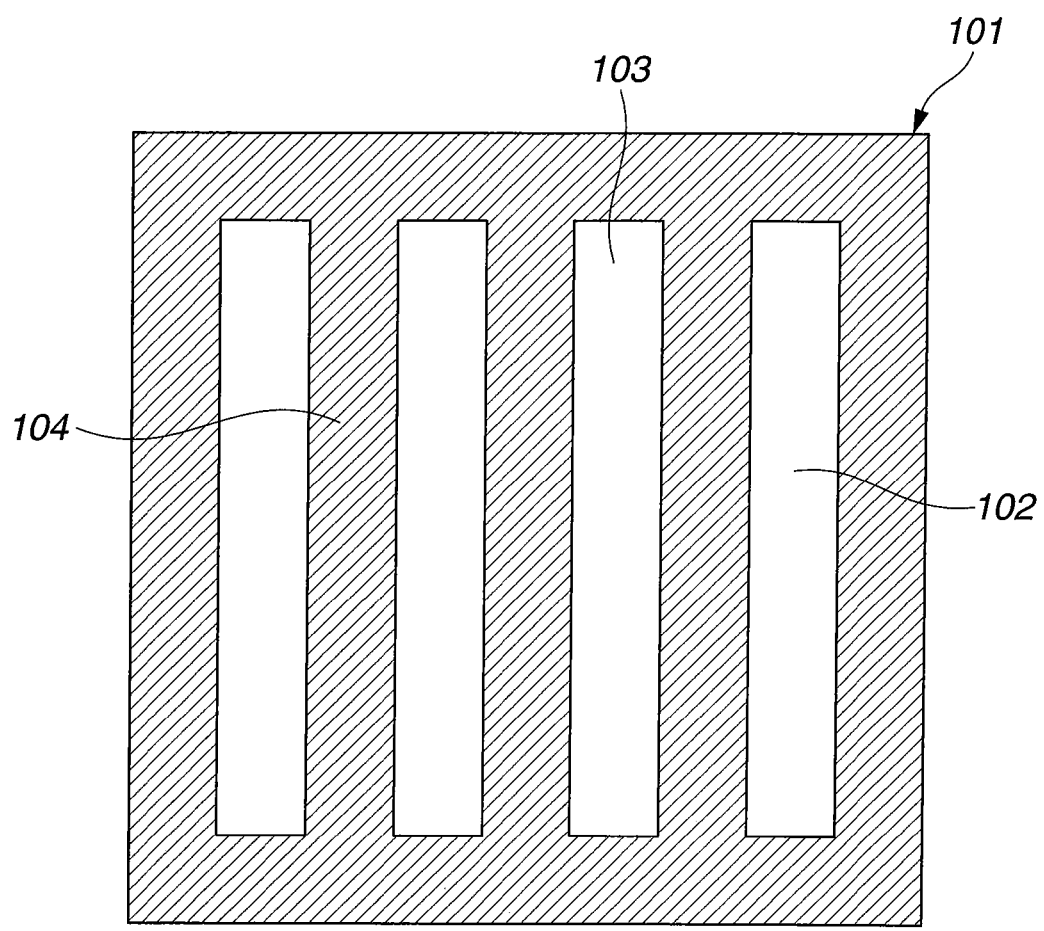
FIG. 9 schematically illustrates a dark trench mask pattern.
Figure 10:
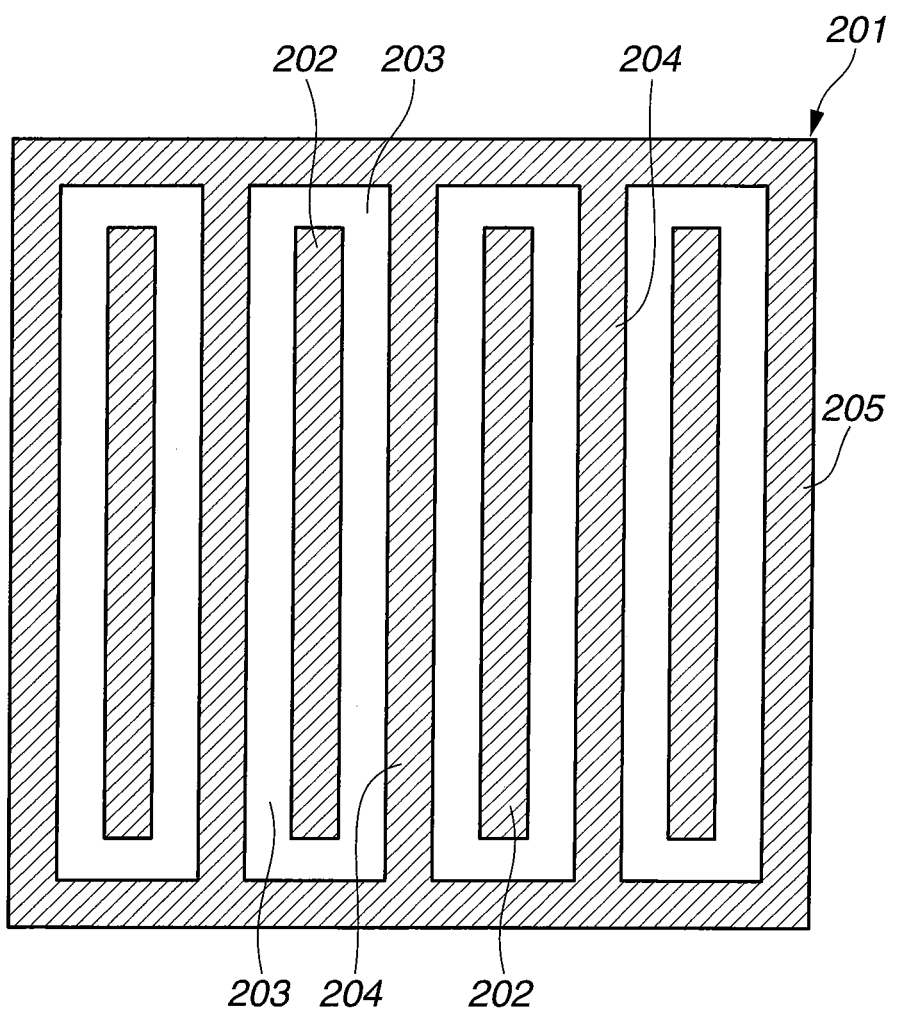
FIG. 10 is a plan view of a pattern as developed, using the dark trench mask and a dual-tone resist according to the invention.

FIG. 9 illustrates a mask pattern of dark trenches. FIG. 10 illustrates a pattern formed after exposure and development steps using the inventive resist composition and the mask of FIG. 9. Also in this case, a pattern similar to FIG. 8 is similarly formed.

Accordingly a single space pattern on the mask can be split into and formed as a single line and two spaces through single exposure, PEB and development.

A one-pair line-and-space pattern on the mask can be split into and formed as a two-pair line-and-space pattern through single exposure, PEB and development, when the process is carried out using a nearly infinite arrangement of line-and-space patterns independent of whether the mask is dark or bright.

When the dark mask shown in FIG. 9 is used, the pattern shown in FIG. 10 is formed. The patterns of FIGS. 8 and 10 are the same. That is, the same pattern is obtained independent of whether the bright mask or dark mask is used.

Figure 11:
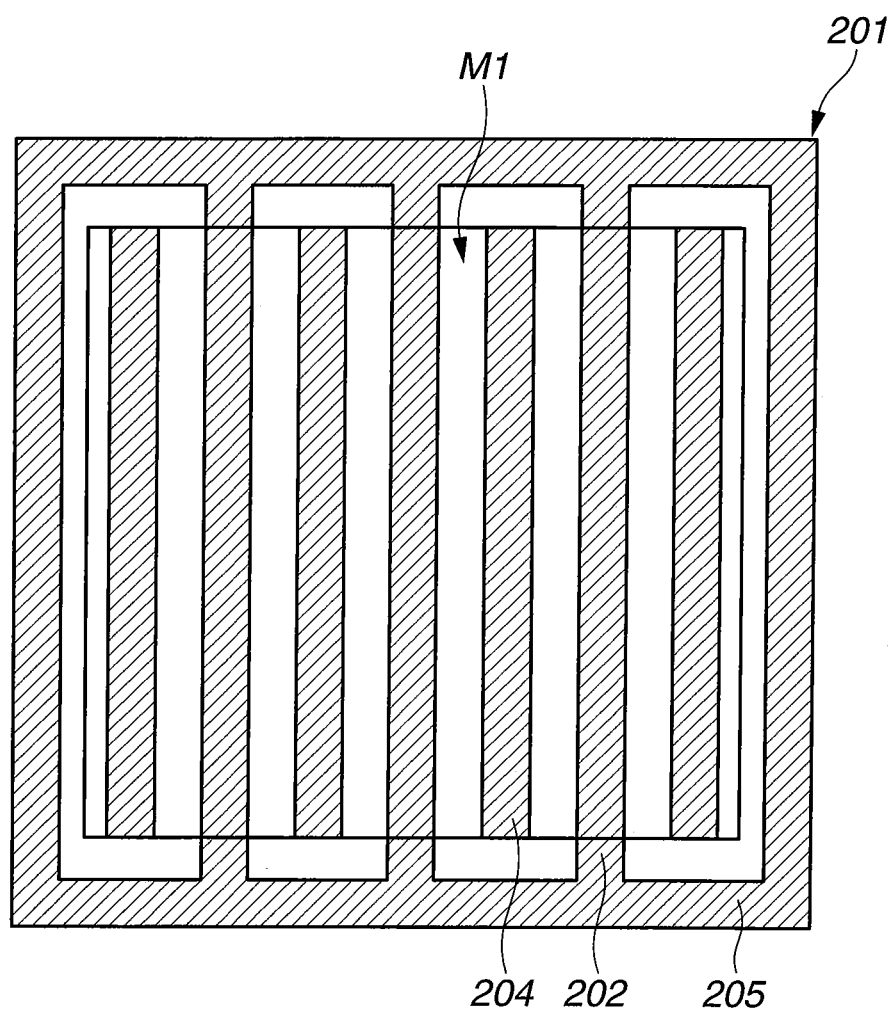
FIG. 11 is a plan view of a light-shielding mask pattern which is used, after formation of the pattern of FIG. 10, in second exposure for cutting off a peripheral region of the pattern.
Figure 12:
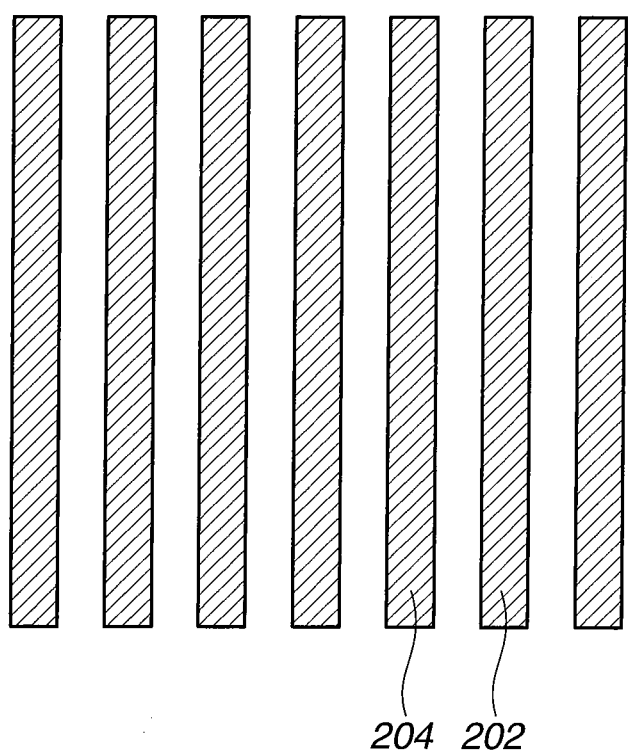
FIG. 12 is a plan view of a pattern after exposure through the light-shielding mask of FIG. 11 and development.

Exposure through the dark mask of FIG. 9 may be followed by exposure through a mask having a light-shielding portion shown by an inside area M1 in FIG. 11, PEB, and development. The process results in a pattern as shown in FIG. 12.

The process of this embodiment uses only one etching and is thus simplified, in contrast to FIG. 2 illustrating the process involving once transferring the pattern of FIG. 8 to the hard mask, coating an ordinary positive resist material again, exposure through a mask having a light-shielding portion shown by an inside area M1 in FIG. 11, PEB, development, and etching the hard mask for achieving the desired cutting.

Exposure through the dark mask of FIG. 9 and exposure through the mask of FIG. 11 may be continuous. Alternatively, once a pattern is formed by exposure through the dark mask of FIG. 9, PEB and development, this may be followed by exposure through the mask of FIG. 11, PEB and development. The continuous exposure is advantageous for process simplification. With respect to the order of exposure through the dark mask of FIG. 9 and exposure through the mask of FIG. 11, either one may come ahead. For resolution of a finer pattern, exposure through the dark mask of FIG. 9 is preferably performed by the immersion lithography. However, the immersion lithography is not always necessary since the pattern of FIG. 11 has a large area and does not need a resolution. It is acceptable that exposure of the pattern of FIG. 11 be by dry lithography.

Figure 13:
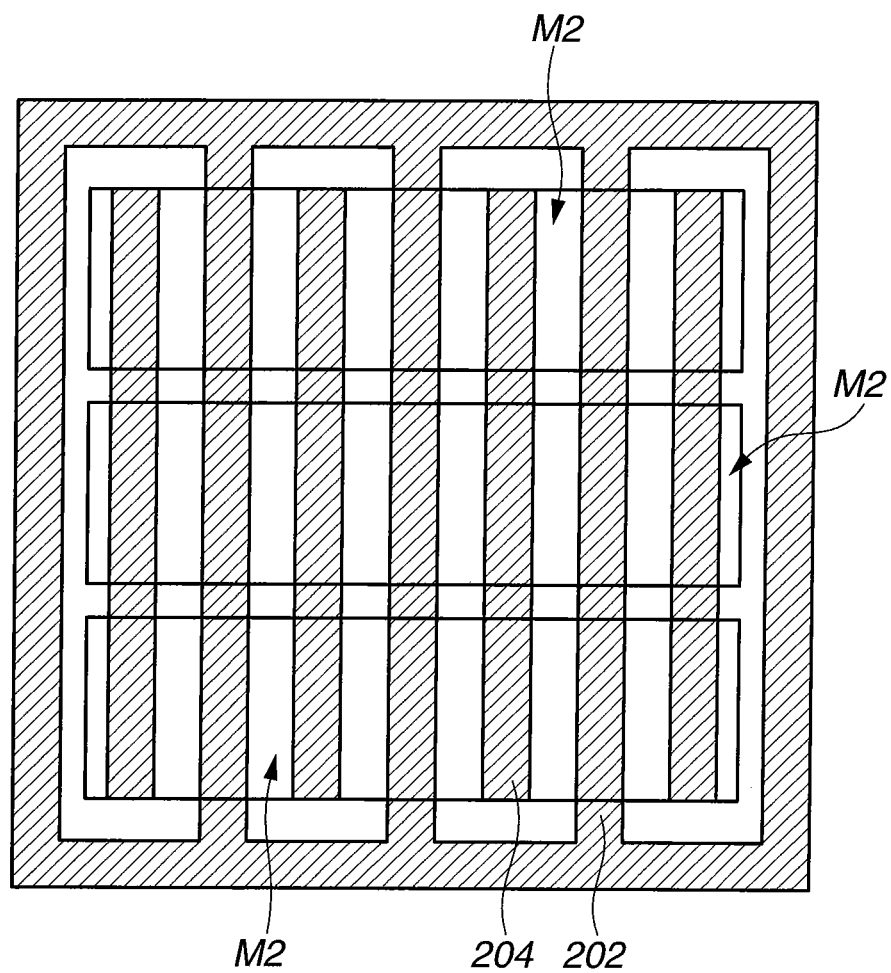
FIG. 13 is a plan view of a light-shielding mask pattern which is used, after formation of the pattern of FIG. 10, in second exposure for cutting off a peripheral region and intermediate line portions of the pattern.
Figure 14:
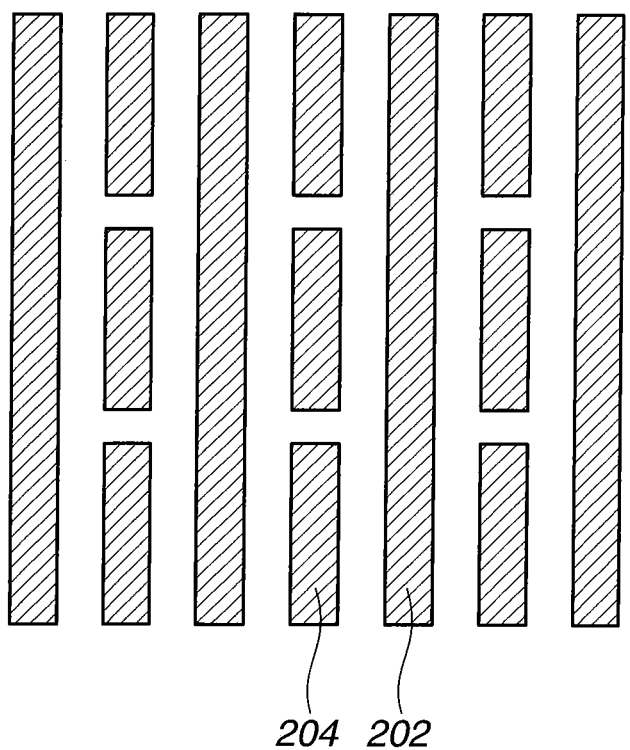
FIG. 14 is a plan view of a pattern after exposure through the light-shielding mask of FIG. 13 and development.
Figure 15:
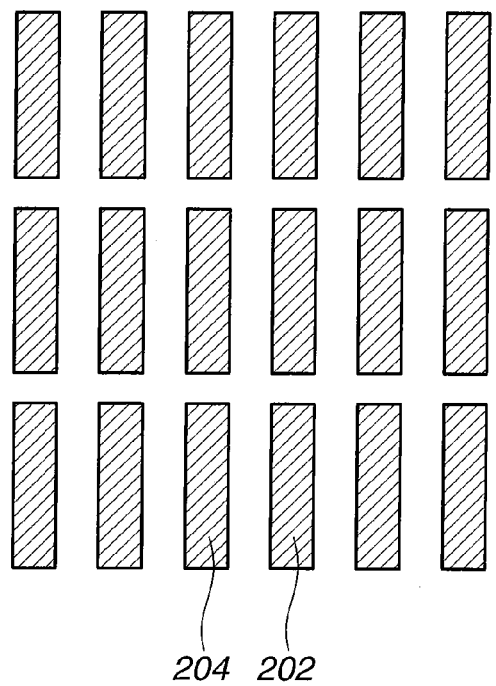
FIG. 15 is a plan view of a pattern which is obtained by etching the substrate through the pattern of FIG. 10, coating an ordinary resist thereon, exposure, development and etching to cut off a peripheral region and intermediate line portions of the pattern.

When exposure through the dark mask of FIG. 9 is followed by exposure through a mask having light-shielding portions shown by inside areas M2 in FIG. 13, PEB, and development, a pattern is formed in which some lines are interrupted as shown in FIG. 14. It is only a positive pattern that permits a line to be interrupted midway. In a negative pattern, the amine release amount exceeds the acid release amount at the time of exposure through the dark mask of FIG. 9, and thus even if a further more exposure dose is given, it never occurs that positive conversion takes place until dissolution.

For interruption of all lines, once the pattern of FIG. 8 is transferred to the hard mask by etching, a resist material is coated again, exposed through a mask having light-shielding portions shown by inside areas M2 in FIG. 13, PEB, and developed. Then cutting is done by etching of the hard mask.

As used in the patterning process of FIG. 1, the substrate 10 is generally a silicon substrate. The processable layer 20 used herein includes $SiO_2$, SiN, SiON, SiOC, p-Si, $\alpha$-Si, TiN, WSi, BPSG, SOG, Cr, CrO, CrON, MoSi, low dielectric film, and etch stopper film. The hard mask 40 is as described above. Understandably, an undercoat film in the form of a carbon film and an intermediate intervening layer in the form of a silicon-containing intermediate film or organic antireflective coating may be formed instead of the hard mask.

In the process of the invention, a resist film of the inventive resist composition is formed on the processable layer directly or via an intermediate intervening layer such as the hard mask. The resist film preferably has a thickness of 10 to 1,000 nm, and more preferably 20 to 500 nm. The resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in a dry atmosphere such as air or nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with deionized water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

Sometimes the amine released from the PBG may evaporate during baking and re-deposit on the surface of resist in an excess acid region, giving rise to a phenomenon that the region which is originally designed to allow for progress of acid-catalyzed deprotection reaction and to open a space after development is not opened. To prevent such a phenomenon, it is desirable to use a PBG capable of generating a high-boiling amine, and ideally an amine having an amino group attached to the polymer backbone. However, the high-boiling bulky amines and polymer-incorporated amines have a low acid trapping ability and hence, a low inactivation ability. The low inactivation ability may lead to a low contrast of negative conversion, resulting in a negative pattern having an inversely tapered profile and degraded edge roughness. The amine released from a PBG of addition mode has a high inactivation ability, but can evaporate to induce chemical flare during baking. For preventing chemical flare, it is effective to apply a protective film on top of the resist film.

Suitable materials of which the protective film is made include those described in JP-A 2006-91798, JP-A 2007-316581, JP-A 2008-81716, JP-A 2008-111089, and JP-A 2009-205132.

To the resist composition, an additive for rendering the resist surface water repellent may be added. A typical additive is a polymer having a fluoroalcohol group. After spin coating, the polymer segregates toward the resist surface to reduce the surface energy, thereby improving water slip. Such additives are described in JP-A 2007-297590 and JP-A 2008-122932.

Exposure is preferably carried out so as to provide an exposure dose of about 1 to 200 mJ/cm$^2$, more preferably about 10 to 100 mJ/cm$^2$. This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle or spray techniques. In this way, a desired resist pattern is formed on the substrate.

Next, using the resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the resist film is removed. Removal of resist film may be carried out after etching of the intermediate intervening layer of hard mask or the like. It is noted that removal of the resist film may be achieved by dry etching with oxygen or radicals, or using strippers such as amines, sulfuric acid/aqueous hydrogen peroxide or organic solvents.

EXAMPLE

Examples of the invention are given below by way of illustration and not by way of limitation. For all polymers, Mw and Mn are determined by GPC versus polystyrene standards.

Synthesis Examples

Polymers to be added to resist compositions were prepared by combining various monomers, effecting copolymerization reaction in tetrahydrofuran medium, crystallization in methanol, repeatedly washing with hexane, isolation, and drying. The resulting polymers (Polymers 1 to 15) had the composition shown below. The composition of each polymer was analyzed by $^1$H-NMR, and the Mw and Mw/Mn determined by GPC.

Polymer 1

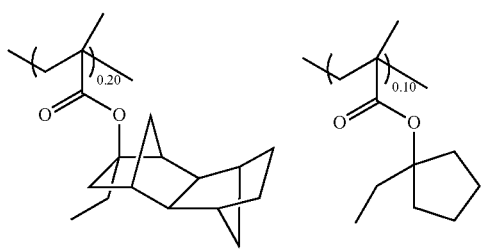
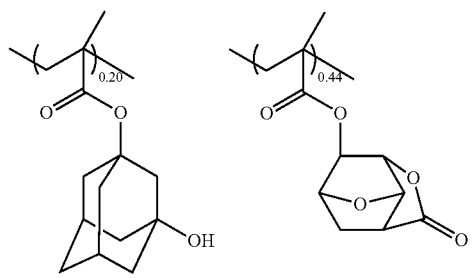
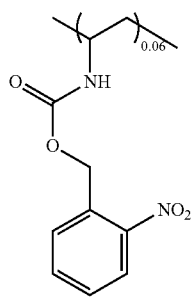

Mw = 8,300
Mw/Mn = 1.76

Polymer 2

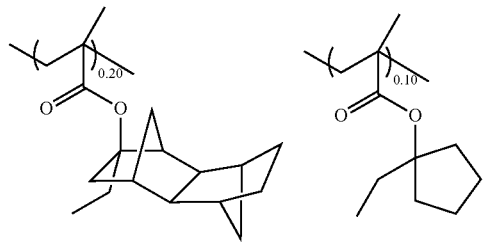
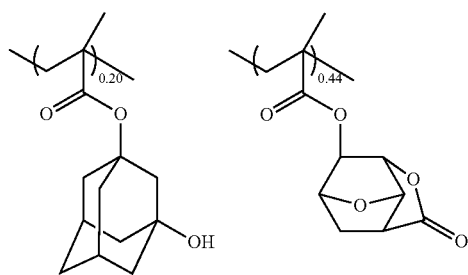
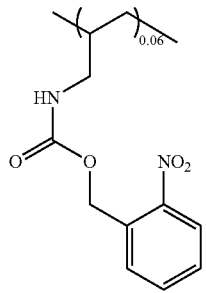

Mw = 8,800
Mw/Mn = 1.77

Polymer 3
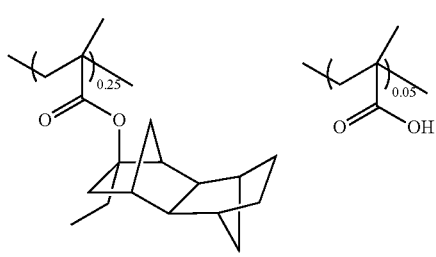
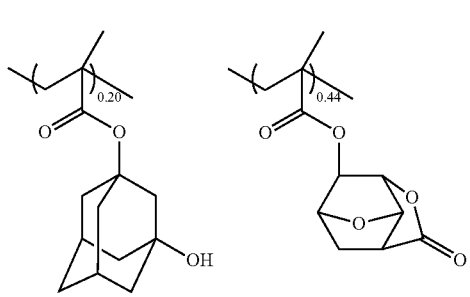
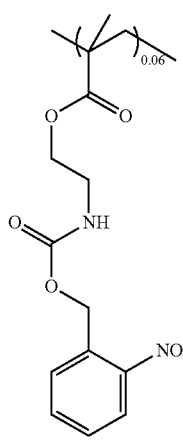
Mw = 7,600
Mw/Mn = 1.79
Polymer 4
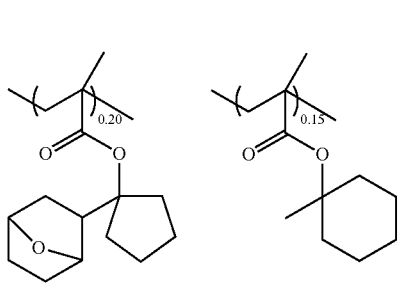
-continued
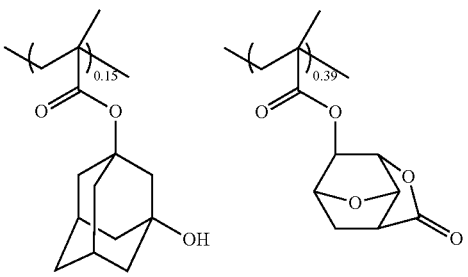
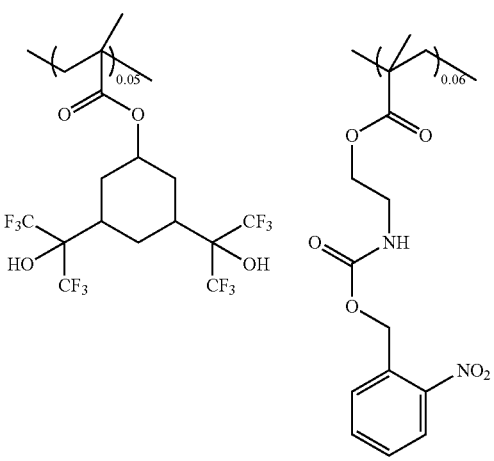
Mw = 8,600
Mw/Mn = 1.93
Polymer 5
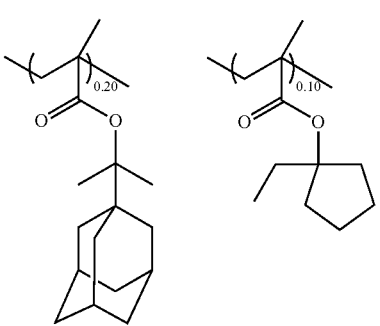
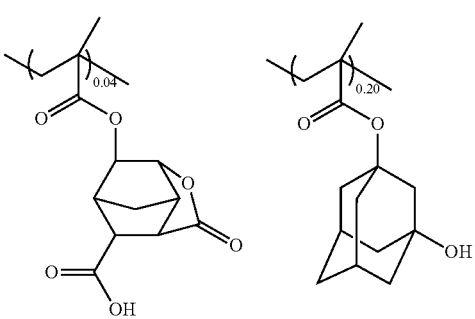

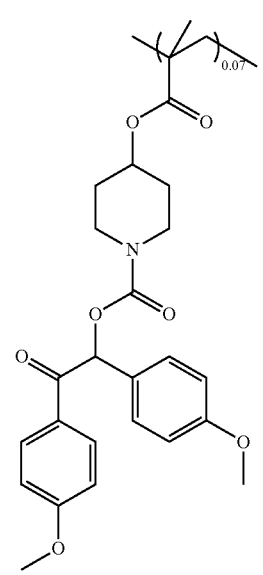
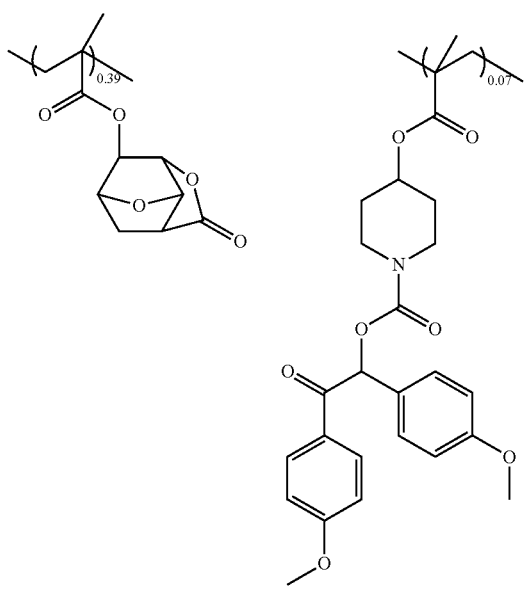
Mw = 8,300
Mw/Mn = 1.92
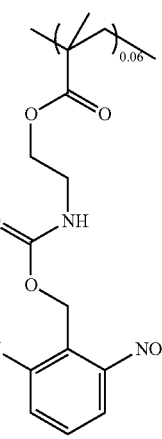
Mw = 8,900
Mw/Mn = 1.83
Polymer 6
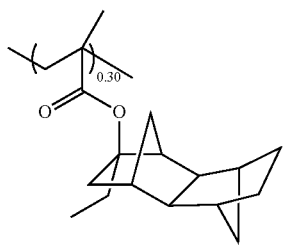
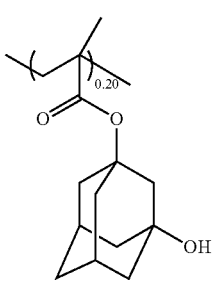
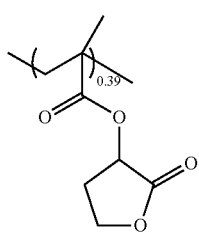
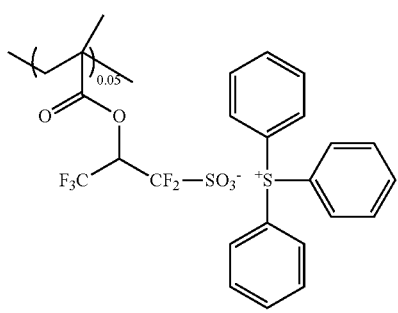
Polymer 7
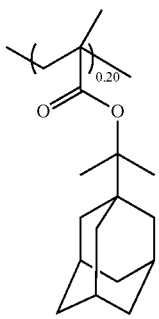
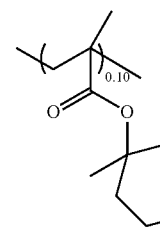
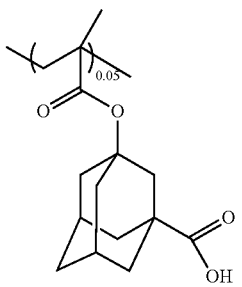
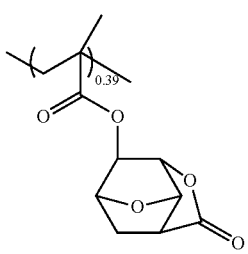

163
-continued
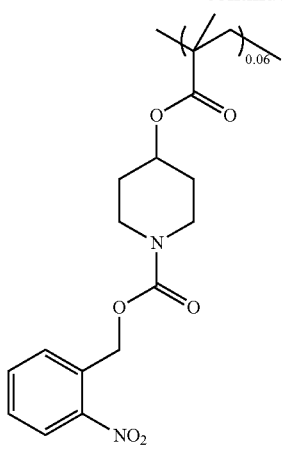
Mw = 7,800
Mw/Mn = 1.85
164
-continued
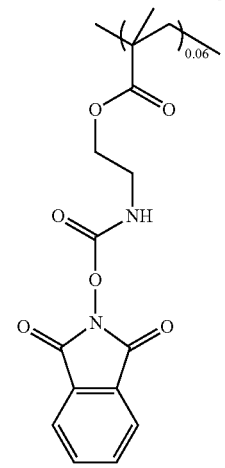
Mw = 7,300
Mw/Mn = 1.81
Polymer 8
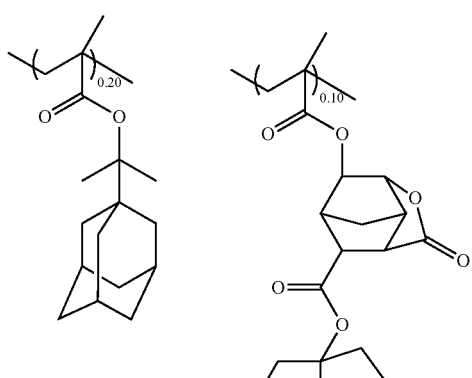
Polymer 9
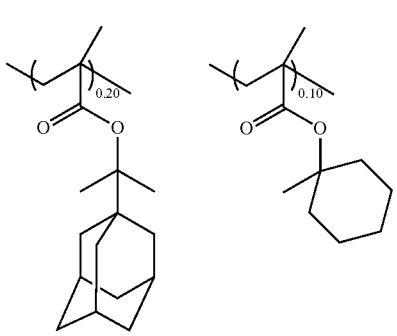
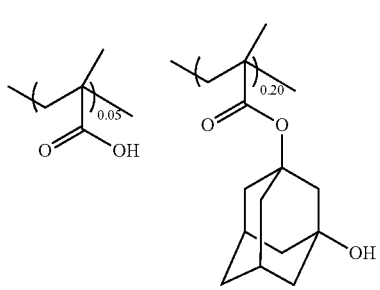
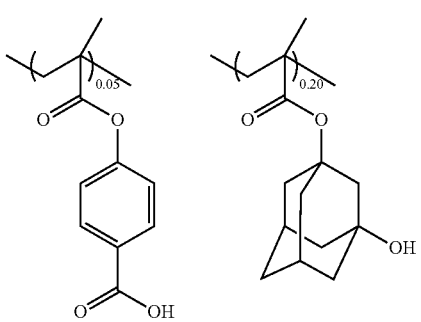
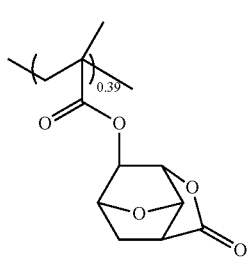
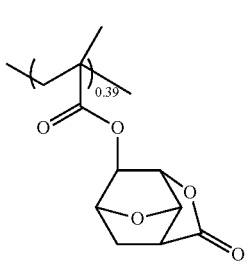

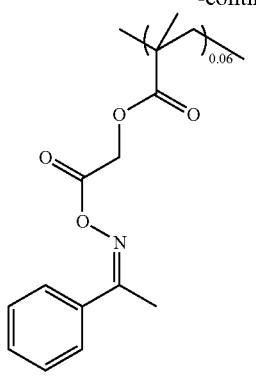
Mw = 8,300
Mw/Mn = 1.79
Polymer 10
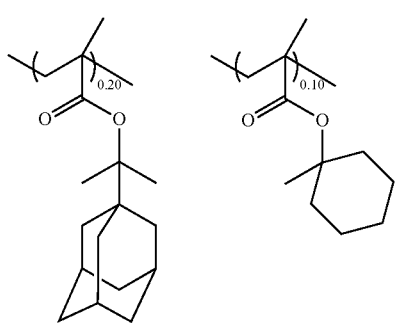
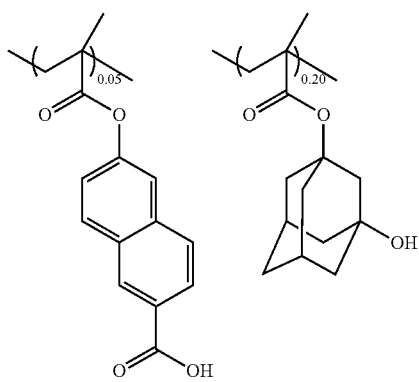
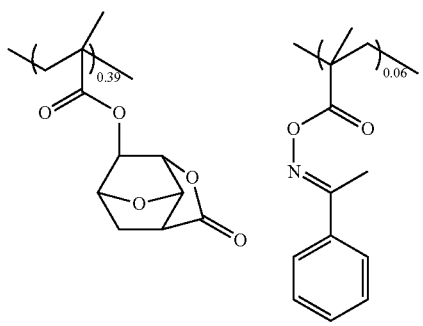
Mw = 8,400
Mw/Mn = 1.73
Polymer 11
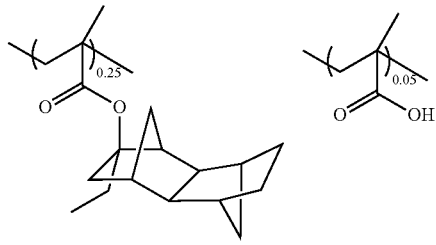
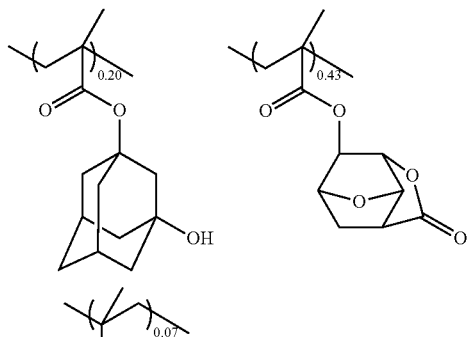
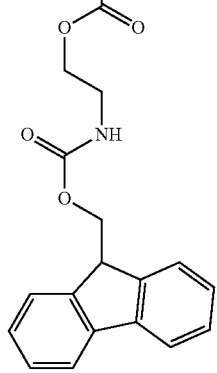
Mw = 7,900
Mw/Mn = 1.73
Polymer 12
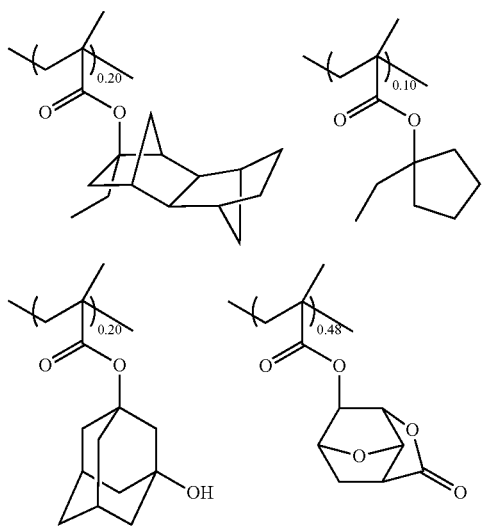

-continued

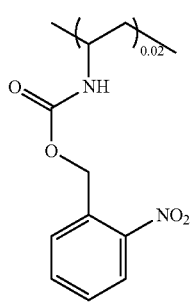

Mw = 8,300
Mw/Mn = 1.76

Polymer 13

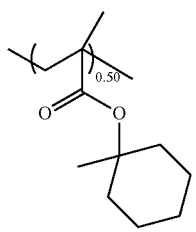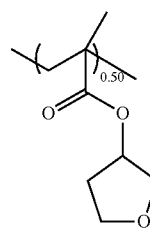

Mw = 9,300
Mw/Mn = 1.93

Polymer 14

-continued

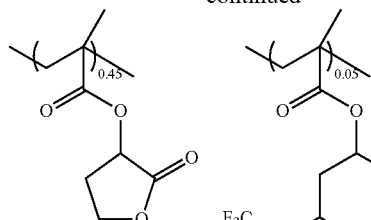

Mw = 9,100
Mw/Mn = 1.83

Polymer 15

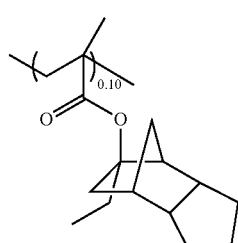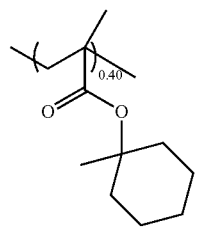

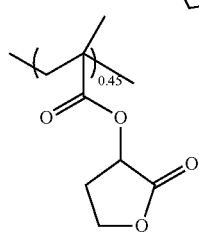

Mw = 8,300
Mw/Mn = 1.88

Preparation of Resist Composition

A resist solution was prepared by dissolving each polymer (Polymers 1 to 15), an acid generator (PAG1), a photobase generator and base amplifier (BG1 to 12), a basic compound (amine quencher: Quenchers 1 to 3), and a repellent (for rendering the resist film surface water repellent) in a solvent in accordance with the recipe shown in Tables 1 and 2, and filtering through a Teflon® filter with a pore size of 0.2 μm. The solvent contained 50 ppm of surfactant FC-4430 (3M-Sumitomo Co., Ltd.).

The components in Tables 1 and 2 are identified below.

PAG 1                                                          Quencher 1

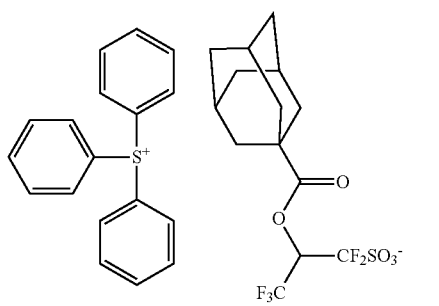

-continued
Quencher 2
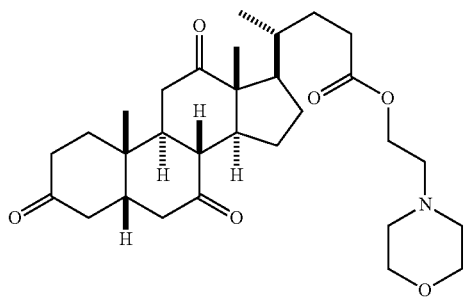
Quencher 3
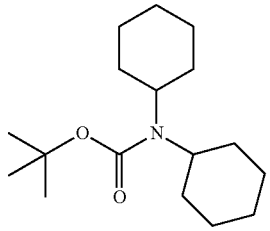
Repellent Polymer 1
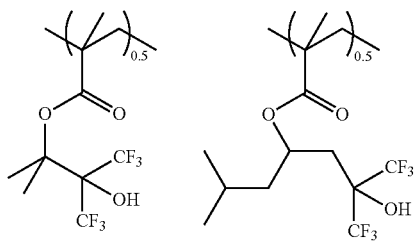
Mw = 8,900
Mw/Mn = 1.96
BG1
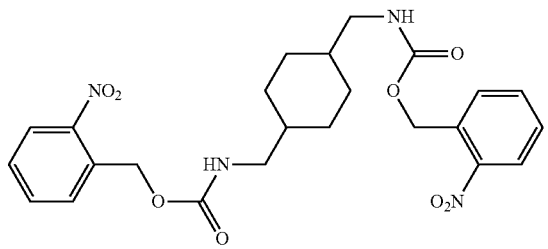
BG2
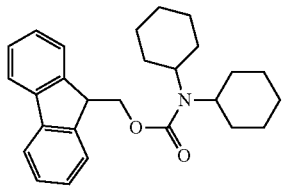
BG3
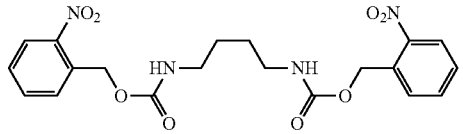
BG4
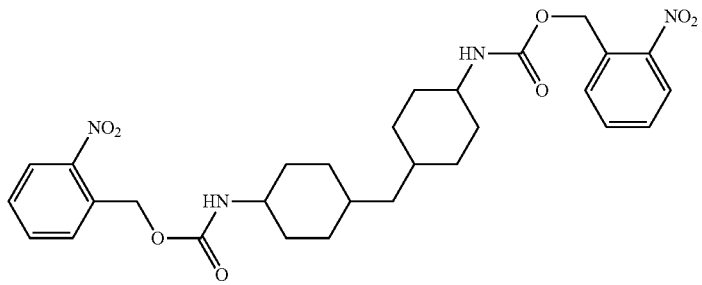
BG5
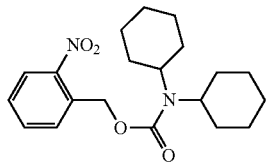
BG6
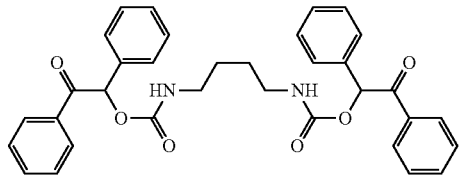
BG7
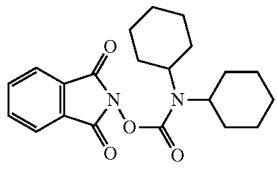
BG8
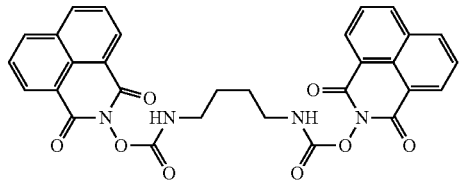

-continued

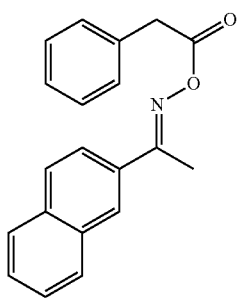 BG9

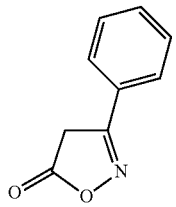 BG10

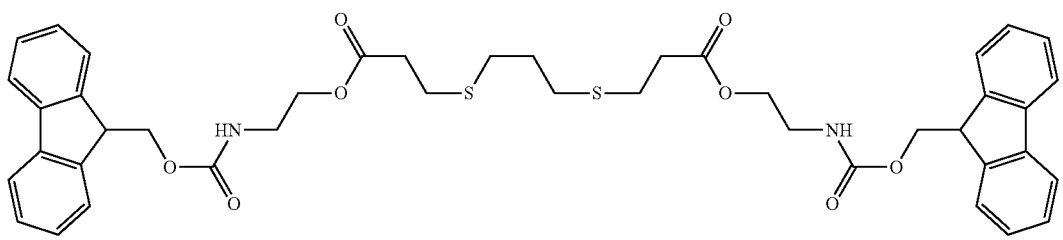 BG11

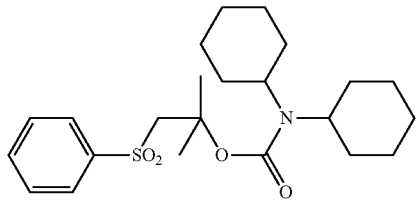 BG12

Organic Solvent:
propylene glycol monomethyl ether acetate (PGMEA)
cyclohexanone (CyH)
propylene glycol monomethyl ether (PGME)

TABLE 1

|  |  | Polymer (pbw) | PBG (pbw) | Base amplifier (pbw) | PAG (pbw) | Basic compound (pbw) | Repellent (pbw) | Organic solvent (pbw) |
|---|---|---|---|---|---|---|---|---|
| Resist | 1 | Polymer 1 (100) | — | — | PAG1 (14.0) | Quencher1 (2.70) | Repellent Polymer 1 (4.0) | PGMEA (1,500) CyH (500) |
|  | 2 | Polymer 2 (100) | — | — | PAG1 (14.0) | Quencher1 (3.00) | Repellent Polymer 1 (4.0) | PGMEA (1,500) CyH (500) |
|  | 3 | Polymer 3 (100) | — | — | PAG1 (14.0) | Quencher1 (3.00) | Repellent Polymer 1 (4.0) | PGMEA (1,500) CyH (500) |
|  | 4 | Polymer 4 (100) | — | — | PAG1 (14.0) | Quencher1 (3.20) | Repellent Polymer 1 (4.0) | PGMEA (1,500) CyH (500) |
|  | 5 | Polymer 5 (100) | — | — | PAG1 (14.0) | Quencher1 (2.00) | Repellent Polymer 1 (4.0) | PGMEA (1,500) CyH (500) |
|  | 6 | Polymer 6 (100) | — | — | — | Quencher1 (2.30) | Repellent Polymer 1 (4.0) | PGMEA (1,800) PGME (200) |
|  | 7 | Polymer 7 (100) | — | — | PAG1 (14.0) | Quencher1 (3.00) | Repellent Polymer 1 (4.0) | PGMEA (1,500) CyH (500) |
|  | 8 | Polymer 8 (100) | — | — | PAG1 (14.0) | Quencher1 (3.20) | Repellent Polymer 1 (4.0) | PGMEA (1,500) CyH (500) |
|  | 9 | Polymer 9 (100) | — | — | PAG1 (14.0) | Quencher1 (2.60) | Repellent Polymer 1 (4.0) | PGMEA (1,500) CyH (500) |

TABLE 1-continued

| | Polymer (pbw) | PBG (pbw) | Base amplifier (pbw) | PAG (pbw) | Basic compound (pbw) | Repellent (pbw) | Organic solvent (pbw) |
|---|---|---|---|---|---|---|---|
| 10 | Polymer 10 (100) | — | — | PAG1 (14.0) | Quencher1 (2.70) | Repellent Polymer 1 (4.0) | PGMEA (1,500) CyH (500) |
| 11 | Polymer 10 (60) Polymer 12 (40) | — | — | PAG1 (14.0) | Quencher1 (3.00) | Repellent Polymer 1 (4.0) | PGMEA (1,500) CyH (500) |
| 12 | Polymer 12 (100) | — | BG2 (6.0) | PAG1 (14.0) | Quencher1 (3.00) | — | PGMEA (1,500) CyH (500) |
| 13 | Polymer 12 (100) | BG3 (3.7) | — | PAG1 (14.0) | Quencher1 (3.00) | — | PGMEA (1,500) CyH (500) |
| 14 | Polymer 13 (100) | BG1 (7.3) | — | PAG1 (14.0) | Quencher2 (2.88) | — | PGMEA (1,500) CyH (500) |
| 15 | Polymer 13 (100) | BG1 (5.0) BG2 (3.7) | — | PAG1 (14.0) | Quencher2 (2.88) | — | PGMEA (1,500) CyH (500) |
| 16 | Polymer 13 (100) | BG3 (6.5) | — | PAG1 (14.0) | Quencher2 (2.88) | — | PGMEA (1,500) CyH (500) |
| 17 | Polymer 13 (100) | BG4 (8.3) | — | PAG1 (14.0) | Quencher2 (2.88) | — | PGMEA (1,500) CyH (500) |
| 18 | Polymer 13 (100) | BG5 (9.0) | — | PAG1 (14.0) | Quencher2 (5.00) | — | PGMEA (1,500) CyH (500) |
| 19 | Polymer 13 (100) | BG6 (8.2) | — | PAG1 (14.0) | Quencher2 (2.88) | — | PGMEA (1,500) CyH (500) |
| 20 | Polymer 13 (100) | BG7 (9.0) | — | PAG1 (14.0) | Quencher2 (2.88) | — | PGMEA (1,500) CyH (500) |
| 21 | Polymer 13 (100) | BG8 (7.0) | — | PAG1 (14.0) | Quencher2 (2.88) | — | PGMEA (1,500) CyH (500) |

TABLE 2

| | | Polymer (pbw) | PBG (pbw) | Base amplifier (pbw) | PAG (pbw) | Basic compound (pbw) | Repellent (pbw) | Organic solvent (pbw) |
|---|---|---|---|---|---|---|---|---|
| Resist | 22 | Polymer 13 (100) | BG9 (6.5) | — | PAG1 (14.0) | Quencher2 (2.88) | — | PGMEA (1,500) CyH (500) |
| | 23 | Polymer 13 (100) | BG10 (4.5) | — | PAG1 (14.0) | Quencher2 (2.88) | — | PGMEA (1,500) CyH (500) |
| | 24 | Polymer 13 (100) | BG1 (5.0) | BG11 (3.4) | PAG1 (14.0) | Quencher2 (2.88) | — | PGMEA (1,500) CyH (500) |
| | 25 | Polymer 13 (100) | BG1 (5.0) | BG12 (3.7) | PAG1 (14.0) | Quencher2 (2.88) | — | PGMEA (1,500) CyH (500) |
| | 26 | Polymer 14 (100) | BG1 (5.0) | BG2 (3.7) | PAG1 (14.0) | Quencher2 (2.88) | — | PGMEA (1,500) CyH (500) |
| | 27 | Polymer 15 (100) | BG1 (5.0) | BG2 (3.7) | PAG1 (14.0) | Quencher2 (2.88) | — | PGMEA (1,500) CyH (500) |
| | 28 | Polymer 13 (100) | BG1 (5.0) | BG12 (3.7) | PAG1 (14.0) | Quencher3 (1.57) | — | PGMEA (1,500) CyH (500) |
| | 29 | Polymer 11 (100) | BG1 (2.0) | — | PAG1 (14.0) | Quencher1 (2.00) | — | PGMEA (1,500) CyH (500) |
| Comparative Resist | 1 | Polymer 12 (100) | — | — | PAG1 (14.0) | Quencher1 (3.00) | Repellent Polymer 1 (4.0) | PGMEA (1,500) CyH (500) |
| | 2 | Polymer 13 (100) | — | — | PAG1 (14.0) | Quencher1 (3.00) | — | PGMEA (1,500) CyH (500) |
| | 3 | Polymer 13 (100) | BG1 (3.0) | — | PAG1 (14.0) | Quencher2 (2.88) | — | PGMEA (1,500) CyH (500) |

Table 3 shows values of a, b, c, d, and e provided that "e" is the sum of a molar amount "a" of amino groups released from PBG groups in the polymer, a molar amount "b" of amino groups released from the base generator added, and a molar amount "c" of amino groups in the quencher, divided by a total molar amount "d" of acid released from PAG and acid released from sulfonium salt-bearing recurring units.

TABLE 3

| | | a | b | c | d | e |
|---|---|---|---|---|---|---|
| Resist | 1 | 0.0257 | 0 | 0.00862 | 0.0214 | 1.604 |
| | 2 | 0.0256 | 0 | 0.00958 | 0.0214 | 1.644 |
| | 3 | 0.0253 | 0 | 0.00958 | 0.0214 | 1.630 |

TABLE 3-continued

|  |  | a | b | c | d | e |
|---|---|---|---|---|---|---|
|  | 4 | 0.0246 | 0 | 0.01022 | 0.0214 | 1.627 |
|  | 5 | 0.0281 | 0 | 0.00639 | 0.0214 | 1.612 |
|  | 6 | 0.0245 | 0 | 0.00734 | 0.0198 | 1.608 |
|  | 7 | 0.0250 | 0 | 0.00958 | 0.0214 | 1.616 |
|  | 8 | 0.0243 | 0 | 0.01022 | 0.0214 | 1.613 |
|  | 9 | 0.0259 | 0 | 0.00830 | 0.0214 | 1.598 |
|  | 10 | 0.0256 | 0 | 0.00862 | 0.0214 | 1.599 |
|  | 11 | 0.0209 | 0 | 0.00958 | 0.0214 | 1.424 |
|  | 12 | 0.0086 | 0.0149 | 0.00958 | 0.0214 | 1.546 |
|  | 13 | 0.0086 | 0.0167 | 0.00958 | 0.0214 | 1.630 |
|  | 14 | 0 | 0.0292 | 0.00592 | 0.0214 | 1.641 |
|  | 15 | 0 | 0.0292 | 0.00559 | 0.0214 | 1.625 |
|  | 16 | 0 | 0.0292 | 0.00559 | 0.0214 | 1.625 |
|  | 17 | 0 | 0.0292 | 0.00559 | 0.0214 | 1.625 |
|  | 18 | 0 | 0.0250 | 0.00970 | 0.0214 | 1.621 |
|  | 19 | 0 | 0.0291 | 0.00559 | 0.0214 | 1.621 |
|  | 20 | 0 | 0.0243 | 0.00559 | 0.0214 | 1.397 |
|  | 21 | 0 | 0.0247 | 0.00559 | 0.0214 | 1.415 |
|  | 22 | 0 | 0.0214 | 0.00559 | 0.0214 | 1.261 |
|  | 23 | 0 | 0.0280 | 0.00559 | 0.0214 | 1.570 |
|  | 24 | 0 | 0.0287 | 0.00559 | 0.0214 | 1.602 |
|  | 25 | 0 | 0.0288 | 0.00559 | 0.0214 | 1.607 |
|  | 26 | 0 | 0.0280 | 0.00559 | 0.0214 | 1.570 |
|  | 27 | 0 | 0.0280 | 0.00559 | 0.0214 | 1.570 |
|  | 28 | 0 | 0.0280 | 0.00559 | 0.0214 | 1.570 |
|  | 29 | 0.0365 | 0.0080 | 0.00639 | 0.0214 | 2.003 |
| Comparative Resist | 1 | 0.0086 | 0 | 0.00958 | 0.0214 | 0.850 |
|  | 2 | 0 | 0 | 0.00958 | 0.0214 | 0.448 |
|  | 3 | 0 | 0.012 | 0.00559 | 0.0214 | 0.836 |

Patterning Evaluation (1) Contrast Curve Data

Figure 16:
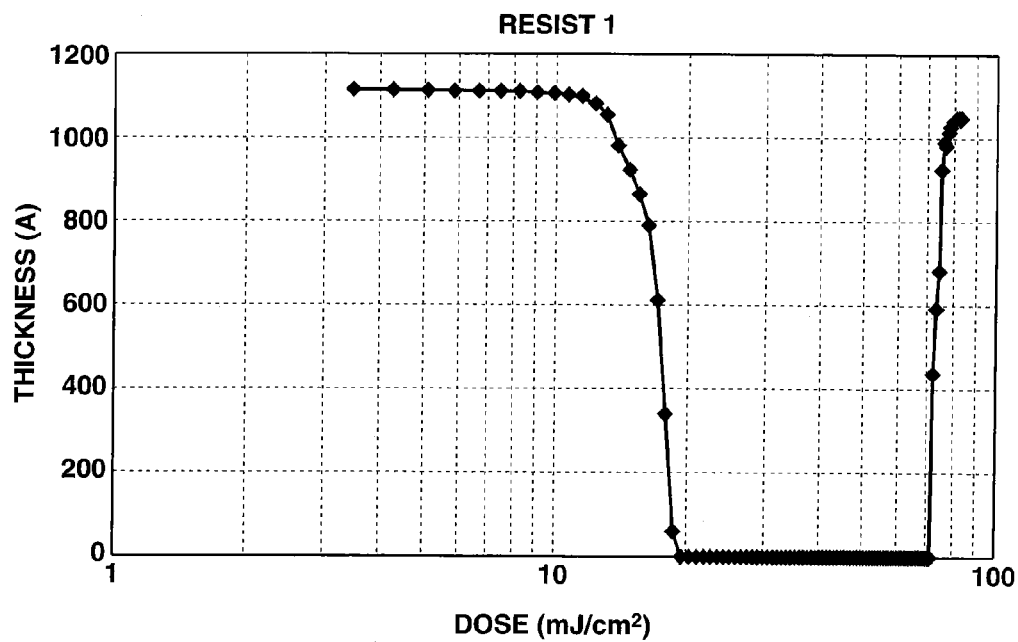
FIG. 16 is a diagram showing thickness versus exposure dose of a resist film of Resist 1 in Example.
Figure 17:
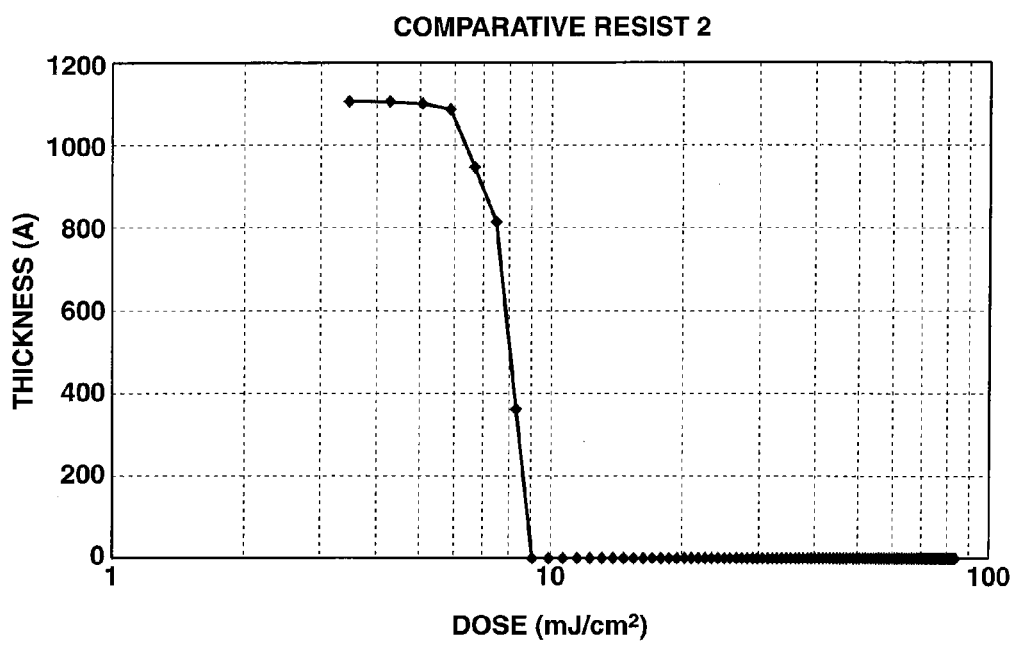
FIG. 17 is a diagram showing thickness versus exposure dose of a resist film of Comparative Resist 2 in Comparative Example.
Figure 18:
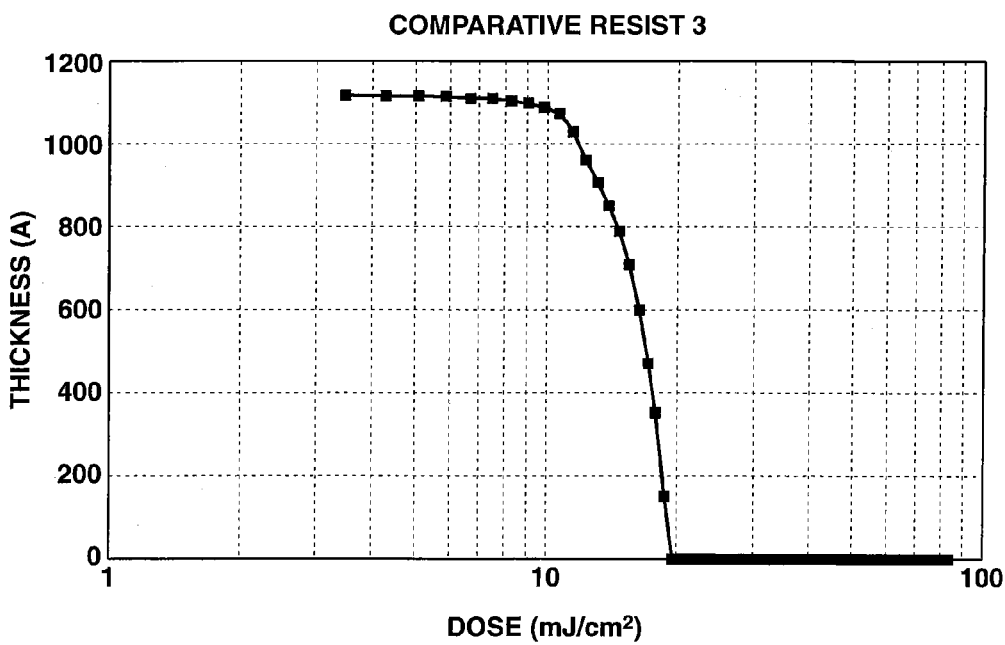
FIG. 18 is a diagram showing thickness versus exposure dose of a resist film of Comparative Resist 3 in Comparative Example.

On a substrate (silicon wafer) having an antireflective coating (ARC-29A, Nissan Chemical Industries Ltd.) of 80 nm thick, the resist solution (Resist 1, Comparative Resist 2, or Comparative Resist 3 shown in Tables 1 and 2) was spin coated, then baked on a hot plate at 100° C. for 60 seconds to form a resist film of 110 nm thick. Using an ArF excimer laser scanner model NSR-S307E (Nikon Corp., NA 0.85, σ 0.93, standard illumination), open-frame exposure was carried out with a varying exposure dose. After exposure, the resist film was baked (PEB) at 100° C. for 60 seconds and then developed for 30 seconds with a 2.38 wt % TMAH aqueous solution. The thickness of the resist film as developed was measured by an optical film thickness gauge. The results (thickness versus exposure dose) of Resist 1 are plotted in FIG. 16, the results of Comparative Resist 2 plotted in FIG. 17, and the results of Comparative Resist 3 plotted in FIG. 18. It is seen from FIG. 16 that the sensitivity of positive conversion when the film thickness reaches 0 is 18 mJ/cm$^2$, and the sensitivity of negative conversion when the film thickness starts increasing is 72 mJ/cm$^2$.

Comparative Resist 2 which contained neither photobase generator nor base generator was a conventional positive composition. It showed a contrast curve that as the exposure dose was increased, film slimming occurred at and above a certain exposure dose. In contrast, the resist composition within the scope of the invention was found to display dual-tone resist dissolution characteristics including a positive tone response that the film thickness decreases as the exposure dose is increased, and a negative tone response when the exposure dose is further increased. Comparative Resist 3, in which the total molar amount of amine was less than the total molar amount of acid, did not display a negative tone response when the exposure dose was further increased.

(2) Patterning Test

On a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, the resist solution (Resists 1 to 29, Comparative Resists 1 to 3 shown in Tables 1 and 2) was spin coated, then baked on a hot plate at 100° C. for 60 seconds to form a resist film of 80 nm thick. On the resist films of Resists 12 to 29 and Comparative Resists 2 and 3, a protective coating solution #1 shown in Table 4 was coated and baked at 90° C. for 60 seconds to form a protective film of 50 nm thick.

TABLE 4

|  | Polymer (pbw) | Organic solvent (pbw) |
|---|---|---|
| Protective coating solution #1 | TC Polymer 1 (75) TC Polymer 2 (25) | diisoamyl ether (2500) 2-methyl-1-butanol (250) |

TC Polymer 1

TC Polymer 2

Using an ArF excimer laser scanner model NSR-S610C (Nikon Corp., NA 1.05, σ 0.98/0.78, dipole illumination, 6% halftone phase shift mask) with azimuthally polarized illumination, the coated substrate was exposed to a mask pattern of 100 nm line and 200 nm pitch (expressed as on-wafer size). After exposure, the resist film was baked (PEB) at the temperature shown in Table 5 for 60 seconds and then developed for 30 seconds with a 2.38 wt % TMAH aqueous solution. The mask layout used was a dark mask in which a peripheral region outside the line-and-space pattern is light-shielded (mask of the pattern of FIG. 9).

Using a measuring SEM S-9380 (Hitachi Hitechnologies, Ltd.), it was observed whether or not a single 100-nm line-and-space was split into two. If split, the size of two split lines was measured and the relevant exposure dose was recorded.

At this point, the size of both a positive response line 204 in FIG. 10 (Line 1 size) and a negative response line 202 in FIG. 10 (Line 2 size) was measured.

The results are shown in Table 5.

TABLE 5

|  |  | PEB temp. (° C.) | Exposure dose (mJ/cm$^2$) | Pattern split | Line 1 size (nm) | Line 2 size (nm) |
|---|---|---|---|---|---|---|
| Resist | 1 | 100 | 82 | Yes | 50 | 59 |
|  | 2 | 100 | 80 | Yes | 51 | 60 |
|  | 3 | 100 | 86 | Yes | 52 | 68 |
|  | 4 | 100 | 84 | Yes | 48 | 65 |
|  | 5 | 100 | 92 | Yes | 51 | 64 |

TABLE 5-continued

| | PEB temp. (° C.) | Exposure dose (mJ/cm$^2$) | Pattern split | Line 1 size (nm) | Line 2 size (nm) |
|---|---|---|---|---|---|
| 6 | 100 | 70 | Yes | 48 | 63 |
| 7 | 110 | 84 | Yes | 49 | 66 |
| 8 | 105 | 78 | Yes | 48 | 67 |
| 9 | 110 | 63 | Yes | 47 | 65 |
| 10 | 110 | 56 | Yes | 46 | 64 |
| 11 | 110 | 43 | Yes | 50 | 56 |
| 12 | 100 | 58 | Yes | 49 | 55 |
| 13 | 100 | 68 | Yes | 49 | 58 |
| 14 | 95 | 83 | Yes | 50 | 57 |
| 15 | 95 | 59 | Yes | 51 | 57 |
| 16 | 95 | 82 | Yes | 49 | 56 |
| 17 | 95 | 86 | Yes | 49 | 57 |
| 18 | 95 | 85 | Yes | 48 | 59 |
| 19 | 95 | 83 | Yes | 48 | 56 |

TABLE 5-continued

| | PEB temp. (° C.) | Exposure dose (mJ/cm$^2$) | Pattern split | Line 1 size (nm) | Line 2 size (nm) |
|---|---|---|---|---|---|
| 20 | 95 | 63 | Yes | 49 | 57 |
| 21 | 95 | 73 | Yes | 50 | 55 |
| 22 | 95 | 52 | Yes | 51 | 65 |
| 23 | 95 | 79 | Yes | 50 | 68 |
| 24 | 95 | 47 | Yes | 51 | 63 |
| 25 | 95 | 50 | Yes | 52 | 70 |
| 26 | 95 | 46 | Yes | 50 | 58 |
| 27 | 95 | 45 | Yes | 49 | 56 |
| 28 | 95 | 52 | Yes | 50 | 58 |
| 29 | 100 | 48 | Yes | 50 | 56 |
| Comparative Resist 1 | 100 | — | No | 50 | — |
| 2 | 95 | — | No | 51 | — |
| 3 | 95 | — | No | 52 | — |

(3) Patterning Test

In Example 3-1, on a substrate (silicon wafer) having a spin-on carbon film (ODL-102 by Shin-Etsu Chemical Co., Ltd.) of 200 nm thick and a spin-on silicon-containing film (SHB-A940 by Shin-Etsu Chemical Co., Ltd.) of 35 nm thick deposited thereon, Resist 1 was spin coated, then baked on a hot plate at 100° C. for 60 seconds to form a resist film of 80 nm thick.

Using an ArF excimer laser scanner model NSR-S610C (Nikon Corp., NA 1.05, σ 0.98/0.78, dipole illumination, 6% halftone phase shift mask) with azimuthally polarized illumination, the coated substrate was exposed to a line-and-space pattern through a dark pattern mask of 6% half-tone phase shift which defines 100 nm line and 200 nm pitch (expressed as on-wafer size) and in which a peripheral region outside the line-and-space pattern is light-shielded as shown in FIG. 9. Next, using a binary mask for light shielding the line-and-space pattern as shown in FIG. 11, the peripheral region outside the line-and-space pattern was exposed. After these exposures, the resist film was baked (PEB) at 100° C. for 60 seconds and then developed for 30 seconds with a 2.38 wt % TMAH aqueous solution.

In Comparative Example 3-1 using Resist 1, the peripheral exposure was omitted. In Comparative Example 3-2 using Comparative Resist 1, peripheral exposure was performed at an exposure dose less than the dose which makes the resist film dissolvable in FIG. 16. In Comparative Example 3-3 using Comparative Resist 1, peripheral exposure was performed at an exposure dose which makes the resist film undissolvable in FIG. 16.

Using a measuring SEM S-9380 (Hitachi Hitechnologies, Ltd.), it was observed whether or not a single line was split into two. If split, the size of two split lines was measured and the relevant exposure dose was recorded. It was also observed whether or not the peripheral pattern outside the line-and-space pattern was removed.

The results are shown in Table 6.

TABLE 6

| | | | LS exposure dose (mJ/cm$^2$) | Peripheral exposure dose (mJ/cm$^2$) | Peripheral pattern | Line 1 size (nm) | Line 2 size (nm) |
|---|---|---|---|---|---|---|---|
| Example | 3-1 | Resist 1 | 82 | 30 | removed | 50 | 59 |
| Comparative Example | 3-1 | Resist 1 | 82 | no | left | 51 | 59 |
| | 3-2 | Comparative Resist 1 | 82 | 10 | left | 49 | 58 |
| | 3-3 | Comparative Resist 1 | 82 | 90 | left | 47 | 57 |

In Resists 1 to 29 within the scope of the invention, the total molar amount of amino groups exceeds the total molar amount of acid released. As a result of the pattern transfer experiment, a single line was split into two. Using a mask of 100-nm line pattern, a ~50 nm line pattern was formed via single exposure and single development.

Comparative Resists 1 and 3 in which the total molar amount of amino groups was less than the total molar amount of acid released and Comparative Resist 2 to which no base generator was added failed in pattern splitting.

By effecting exposure through a dark pattern mask in which a peripheral region outside a line-and-space pattern is light-shielded, exposure of the peripheral region outside the line-and-space pattern, PEB, and development, the peripheral pattern outside the line-and-space pattern could be dissolved.

Japanese Patent Application No. 2009-239019 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern comprising the steps of applying a resist composition onto a substrate to form a resist film, baking, exposure to radiation at a dose, post-exposure baking, and developing with an alkaline developer,
    said resist composition comprising a polymer comprising recurring units having an acid labile group and recurring units (a1), (a2), (a3) or (a4) in the general formula (1) as a photobase generator capable of generating an amino group and substantially insoluble in the alkaline developer, a photoacid generator capable of generating an acid, a quencher having an amino group for neutralizing the acid released from the photoacid generator for inactivation, and an organic solvent, the sum of a total molar amount of amino groups in the quencher and a total molar amount of amino groups released from the photobase generator is greater than a total molar amount of the acid released from the photoacid generator, whereby a pattern of the resist film is formed including an unexposed region at a low exposure dose and an overexposed region at an excess exposure dose which are not dissolved in the developer, and an exposed region at an intermediate exposure dose which is dissolved in the developer,

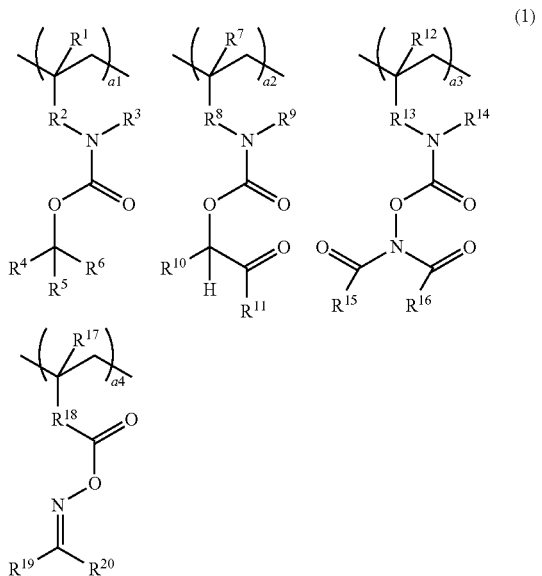

wherein $R^1$, $R^7$, $R^{12}$, and $R^{17}$ each are hydrogen or methyl, $R^2$, $R^8$, $R^{13}$, and $R^{18}$ each are a single bond, methylene, ethylene, phenylene, phenylmethylene, phenylethylene, phenylpropylene, or —C(=O)—O—$R^{21}$— wherein $R^{21}$ is a straight, branched or cyclic $C_1$-$C_{10}$ alkylene, $C_6$-$C_{10}$ arylene, or $C_2$-$C_{12}$ alkenylene group, $R^3$, $R^9$, and $R^{14}$ each are hydrogen, a straight, branched or cyclic $C_1$-$C_{10}$ alkyl or $C_6$-$C_{10}$ aryl group, or may bond with $R^{21}$ to form a ring with the nitrogen atom to which they are attached, $R^4$, $R^5$, and $R^6$ each are hydrogen, a straight, branched or cyclic $C_1$-$C_{10}$ alkyl group, or a $C_6$-$C_{14}$ aryl group which may have a straight, branched or cyclic $C_1$-$C_6$ alkyl, $C_1$-$C_6$ alkoxy, nitro, halogen, cyano or trifluoromethyl group, $R^4$ and $R^5$, $R^5$ and $R^6$, or $R^4$ and $R^6$ may bond together to form a ring with the carbon atom to which they are attached, with the proviso that not all $R^4$, $R^5$, and $R^6$ are hydrogen, or not all $R^4$, $R^5$, and $R^6$ are alkyl, $R^{10}$ and $R^{11}$ each are a $C_6$-$C_{14}$ aryl group which may have a straight, branched or cyclic $C_1$-$C_6$ alkyl, $C_1$-$C_6$ alkoxy, nitro, halogen, cyano, trifluoromethyl or carbonyl group, $R^{15}$ and $R^{16}$ each are a straight or branched $C_1$-$C_6$ alkyl group, $R^{15}$ and $R^{16}$ may bond together to form a ring with the carbon and nitrogen atoms to which they are attached, the ring optionally containing a benzene ring, naphthalene ring, double bond or ether bond, $R^{19}$ and $R^{20}$ each are hydrogen, a straight, branched or cyclic $C_1$-$C_8$ alkyl group of a $C_6$-$C_{14}$ aryl group which may have a substituent group as described for $R^4$, $R^5$ and $R^6$, at least one or both of $R^{19}$ and $R^{20}$ are aryl groups, or $R^{19}$ and $R^{20}$ may bond together to form a ring with the carbon atom to which they are attached, a1, a2, a3, a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

2. A process for forming a pattern comprising the steps of applying a resist composition onto a substrate to form a resist film, baking, exposure to radiation at a dose, post-exposure baking, and developing with an alkaline developer, said resist composition comprising a polymer comprising recurring units having an acid labile group, recurring units (e1), (e2) or (e3) having a sulfonium salt represented by the general formula (10) and recurring units (a1), (a2), (a3) or (a4) in the general formula (1) as a photobase generator capable of generating an amino group and substantially insoluble in an alkaline developer, a quencher having an amino group for neutralizing an acid released from the sulfonium salt-bearing units in the polymer and the acid released from the photoacid generator for inactivation, and an organic solvent, the sum of a total molar amount of amino groups in the quencher and a total molar amount of amino groups released from the photobase generator is greater than the sum of a total molar amount of the acid released from the sulfonium salt-bearing units and a total molar amount of the acid released from the photoacid generator, whereby a pattern of the resist film is formed including an unexposed region at a low exposure dose and an overexposed region at an excess exposure dose which are not dissolved in the developer, and an exposed region at an intermediate exposure dose which is dissolved in the developer,

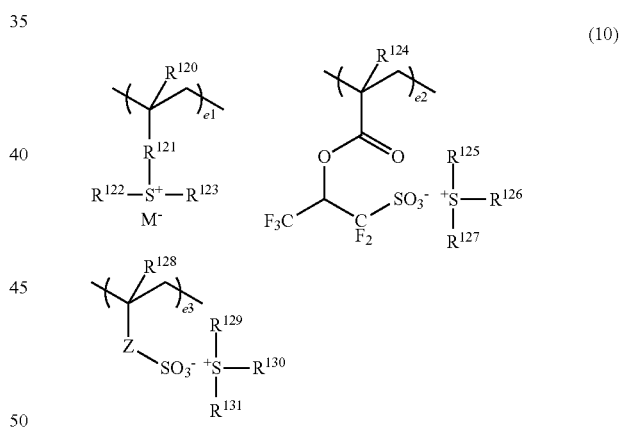

wherein $R^{120}$, $R^{124}$, and $R^{128}$ each are hydrogen or methyl, $R^{121}$ is a single bond, phenylene group, —O—R— or —C(=O)—Y—R— wherein Y is an oxygen atom or NH, and R is a straight, branched or cyclic $C_1$-$C_6$ alkylene, phenylene, or $C_3$-$C_{10}$ alkenylene group, which may contain a carbonyl (—CO—), ester (—COO—), ether (—O—) or hydroxyl radical, $R^{122}$, $R^{123}$, $R^{125}$, $R^{126}$, $R^{127}$, $R^{129}$, $R^{130}$ and $R^{131}$ are each independently a straight, branched or cyclic $C_1$-$C_{12}$ alkyl group which may contain a carbonyl, ester or ether radical, or a $C_6$-$C_{12}$ alkyl group which may contain a carbonyl, ester, or ether radical, or a $C_6$-$C_{12}$ aryl group, $C_7$-$C_{20}$ aralkyl group or thiophenyl group, Z is a single bond, methylene, ethylene, phenylene, fluorinated phenylene, —O—$R^{132}$, or —C(=O)—$Z_1$—$R^{132}$— wherein $Z_1$ is an oxygen atom or NH, and $R^{132}$ is a straight, branched or cyclic $C_1$-$C_6$ alkylene group, phenylene group or alkenylene group, which may contain a carbonyl, ester, ether or hydroxy radical, M⁻ is a non-nucleophilic counter ion, and the subscripts e1, e2, and e3 are numbers in the range: $0 \leq e1 \leq 0.3$, $0 \leq e2 \leq 0.3$, $0 \leq e3 \leq 0.3$, and $0 < e1+e2+e3 \leq 0.3$,

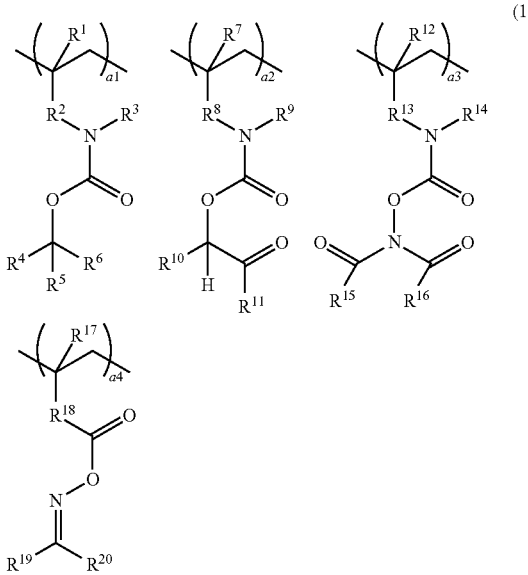

wherein $R^1$, $R^7$, $R^{12}$, and $R^{17}$ each are hydrogen or methyl,
$R^2$, $R^8$, $R^{13}$, and $R^{18}$ each are a single bond, methylene, ethylene, phenylene, phenylmethylene, phenylethylene, phenylpropylene, or —C(=O)—O—$R^{21}$— wherein $R^{21}$ is a straight, branched or cyclic $C_1$-$C_{10}$ alkylene, $C_6$-$C_{10}$ arylene, or $C_7$-$C_{12}$ alkenylene group,
$R^3$, $R^9$, and $R^{14}$ each are hydrogen, a straight, branched or cyclic $C_1$-$C_{10}$ alkyl or $C_6$-$C_{10}$ aryl group, or may bond with $R^{21}$ to form a ring with the nitrogen atom to which they are attached,
$R^4$, $R^5$, and $R^6$ each are hydrogen, a straight, branched or cyclic $C_1$-$C_{10}$ alkyl group, or a $C_6$-$C_{14}$ aryl group which may have a straight, branched or cyclic $C_1$-$C_6$ alkyl, $C_1$-$C_6$ alkoxy, nitro, halogen, cyano or trifluoromethyl group, $R^4$ and $R^5$, $R^5$ and $R^6$, or $R^4$ and $R^6$ may bond together to form a ring with the carbon atom to which they are attached, with the proviso that not all $R^4$, $R^5$, and $R^6$ are hydrogen, or not all $R^4$, $R^5$, and $R^6$ are alkyl,
$R^{10}$ and $R^{11}$ each are a $C_6$-$C_{14}$ aryl group which may have a straight, branched or cyclic $C_1$-$C_6$ alkyl, $C_1$-$C_6$ alkoxy, nitro, halogen, cyano, trifluoromethyl or carbonyl group,
$R^{15}$ and $R^{16}$ each are a straight or branched $C_1$-$C_6$ alkyl group, $R^{15}$ and $R^{16}$ may bond together to form a ring with the carbon and nitrogen atoms to which they are attached, the ring optionally containing a benzene ring, naphthalene ring, double bond or ether bond,
$R^{19}$ and $R^{20}$ each are hydrogen, a straight, branched or cyclic $C_1$-$C_8$ alkyl group or a $C_6$-$C_{14}$ aryl group which may have a substituent group as described for $R^4$, $R^5$ and $R^6$, at least one or both of $R^{19}$ and $R^{20}$ are aryl groups, or $R^{19}$ and $R^{20}$ may bond together to form a ring with the carbon atom to which they are attached,
a1, a2, a3, a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

3. The process of claim 1 wherein the photoacid generator is adapted to generate a sulfonic acid, imidic acid or methide acid which is fluorinated at α-position upon light exposure.

4. The process of claim 3 wherein the photoacid generator is a sulfonium or iodonium salt acid generator.

5. The process of claim 1 wherein the resist composition further comprises a base amplifier which is decomposed with the base to generate an amino group, and
the sum of a total molar amount of amino groups in the quencher, a total molar amount of amino groups released from the photobase generator and a total molar amount of amino groups released from the base amplifier is greater than the sum of a total molar amount of the acid released from the photoacid generator and a total molar amount of the acid released from the sulfonium salt-bearing units if the polymer comprises recurring units having a sulfonium salt.

6. The process of claim 5 wherein the base amplifier is a compound of addition mode having the formula (2') or (3'):

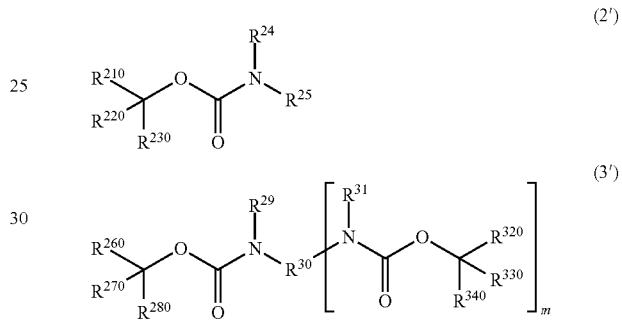

wherein $R^{210}$, $R^{220}$, $R^{230}$, $R^{260}$, $R^{270}$, $R^{280}$, $R^{320}$, $R^{330}$, and $R^{340}$ each are hydrogen, a straight, branched or cyclic $C_1$-$C_6$ alkyl, $C_6$-$C_{14}$ aryl or $C_7$-$C_{15}$ aralkyl group, at least one of $R^{210}$, $R^{220}$ and $R^{230}$, at least one of $R^{260}$, $R^{270}$ and $R^{280}$, or at least one of $R^{320}$, $R^{330}$ and $R^{340}$ is a $C_2$-$C_8$ alkenyl group or an organic group selected from straight, branched or cyclic $C_1$-$C_6$ alkyl, $C_6$-$C_{14}$ aryl, and $C_7$-$C_{15}$ aralkyl groups each containing a carbonyl, ester, lactone, carbonate, maleimide, amide or sulfo group,
$R^{24}$, $R^{25}$, $R^{29}$, $R^{30}$, $R^{31}$, and m are as defined above.

7. The process of claim 1 wherein
the exposure step is a single exposure through a mask having a one-pair line-and-space pattern,
the subsequent PEB and development steps result in a two-pair line-and-space pattern being split from the mask pattern in a resolution doubling manner.

8. The process of claim 1 wherein
the exposure step is a single exposure through a mask having a single-line pattern,
the subsequent PEB and development steps result in a single-line and two-space pattern being split from the mask pattern in a resolution doubling manner.

9. The process of claim 1 wherein
the exposure step is a single exposure through a mask having a single-space pattern,
the subsequent PEB and development steps result in a single-line and two-space pattern being split from the mask pattern in a resolution doubling manner.

10. A resist composition comprising
a sulfonium or iodonium salt photoacid generator adapted to generate a sulfonic acid, imidic acid or methide acid which is fluorinated at α-position upon light exposure, a quencher having an amino group, and
a polymer comprising at least recurring units having a photobase generator group of the general formula (1) and recurring units having an acid labile group,
wherein the sum of a total molar amount of amino groups in the quencher and a total molar amount of amino groups released from the photobase generator-bearing units is greater than a total molar amount of the acid released from the photoacid generator,

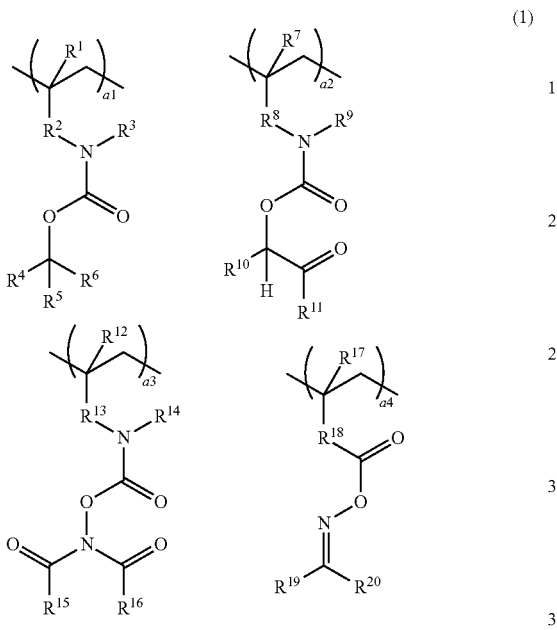

(1)

wherein $R^1$, $R^7$, $R^{12}$, and $R^{17}$ each are hydrogen or methyl,
$R^2$, $R^8$, $R^{13}$, and $R^{18}$ each are a single bond, methylene, ethylene, phenylene, phenylmethylene, phenylethylene, phenylpropylene, or —C(=O)—O—$R^{21}$— wherein $R^{21}$ is a straight, branched or cyclic $C_1$-$C_{10}$ alkylene, $C_6$-$C_{10}$ arylene, or $C_2$-$C_{12}$ alkenylene group,
$R^3$, $R^9$, and $R^{14}$ each are hydrogen, a straight, branched or cyclic $C_1$-$C_{10}$ alkyl or $C_6$-$C_{10}$ aryl group, or may bond with $R^{21}$ to form a ring with the nitrogen atom to which they are attached,
$R^4$, $R^5$, and $R^6$ each are hydrogen, a straight, branched or cyclic $C_1$-$C_{10}$ alkyl group, or a $C_6$-$C_{14}$ aryl group which may have a straight, branched or cyclic $C_1$-$C_6$ alkyl, $C_1$-$C_6$ alkoxy, nitro, halogen, cyano or trifluoromethyl group, $R^4$ and $R^5$, $R^5$ and $R^6$, or $R^4$ and $R^6$ may bond together to form a ring with the carbon atom to which they are attached, with the proviso that not all $R^4$, $R^5$, and $R^6$ are hydrogen, or not all $R^4$, $R^5$, and $R^6$ are alkyl,
$R^{10}$ and $R^{11}$ each are a $C_6$-$C_{14}$ aryl group which may have a straight, branched or cyclic $C_1$-$C_6$ alkyl, $C_1$-$C_6$ alkoxy, nitro, halogen, cyano, trifluoromethyl or carbonyl group,
$R^{15}$ and $R^{16}$ each are a straight or branched $C_1$-$C_6$ alkyl group, $R^{15}$ and $R^{16}$ may bond together to form a ring with the carbon and nitrogen atoms to which they are attached, the ring optionally containing a benzene ring, naphthalene ring, double bond or ether bond,
$R^{19}$ and $R^{20}$ each are hydrogen, a straight, branched or cyclic $C_1$-$C_8$ alkyl group or a $C_6$-$C_{14}$ aryl group which may have a substituent group as described for $R^4$, $R^5$ and $R^6$, at least one or both of $R^{19}$ and $R^{20}$ are aryl groups, or $R^{19}$ and $R^{20}$ may bond together to form a ring with the carbon atom to which they are attached,
a1, a2, a3, a4 are numbers in the range: 0≦a1<1.0, 0≦a2<1.0, 0≦a3<1.0, 0≦a4<1.0, and 0<a1+a2+a3+a4<1.0.

11. A resist composition comprising a polymer comprising recurring units having an acid labile group and recurring units having an adhesive group selected from the class consisting of hydroxyl-containing groups derived from the following monomers:

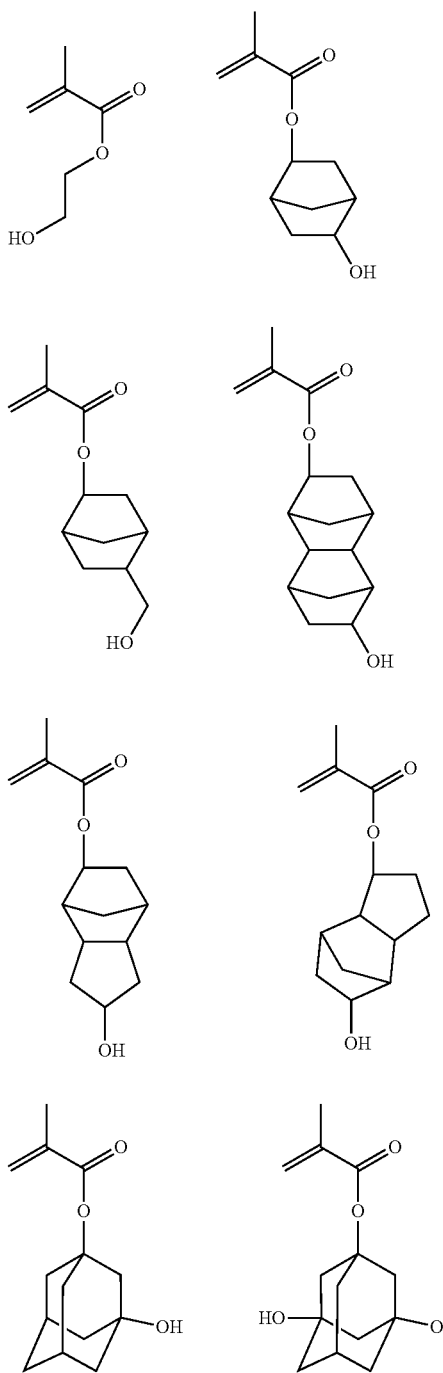

-continued
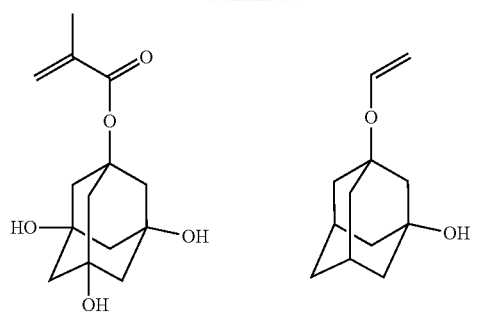
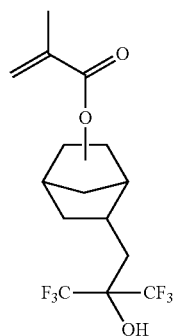
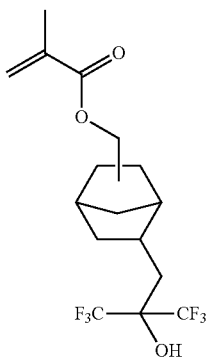
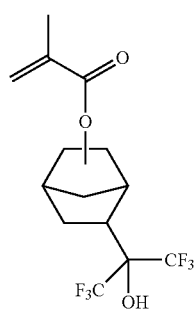
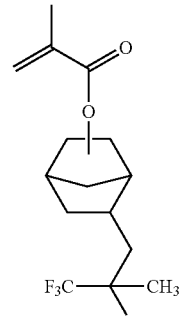
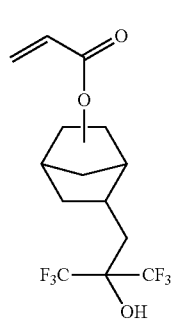
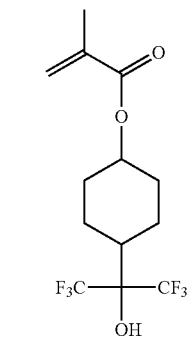
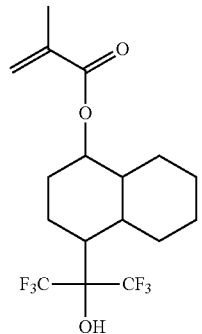
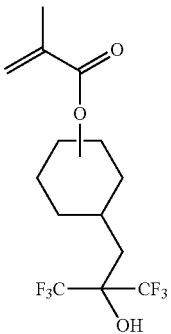
-continued
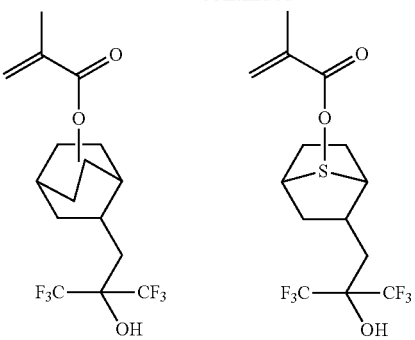
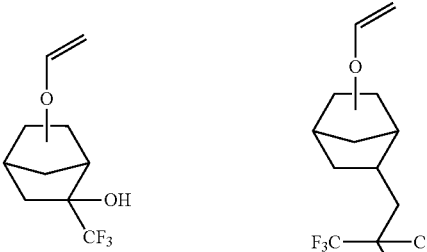
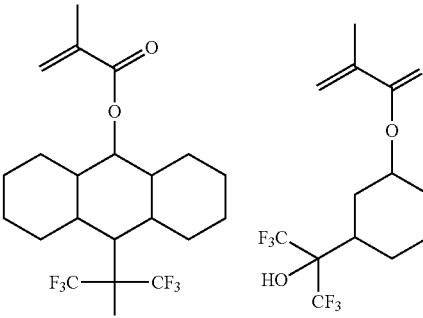
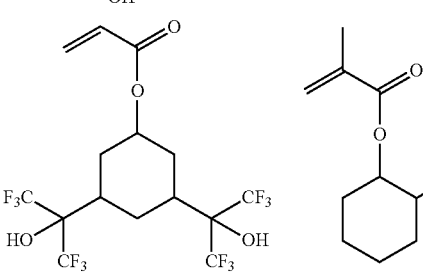
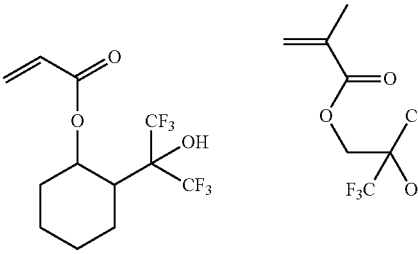
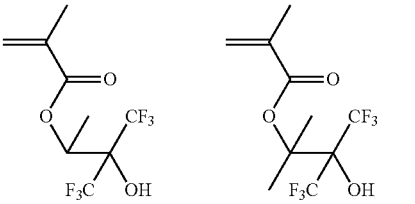

187
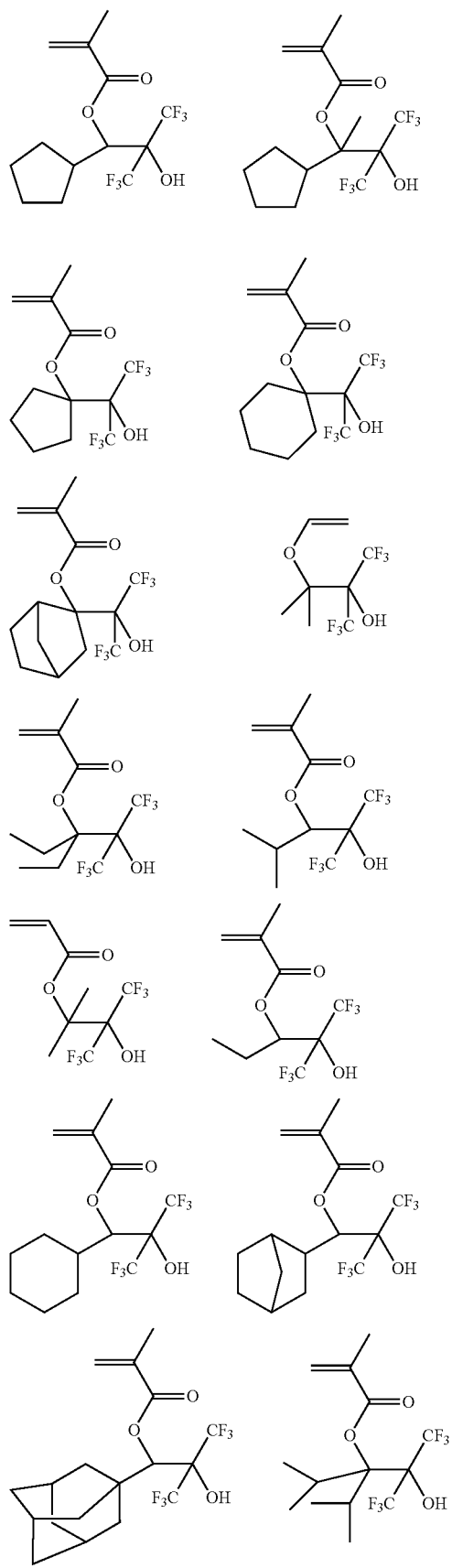
188
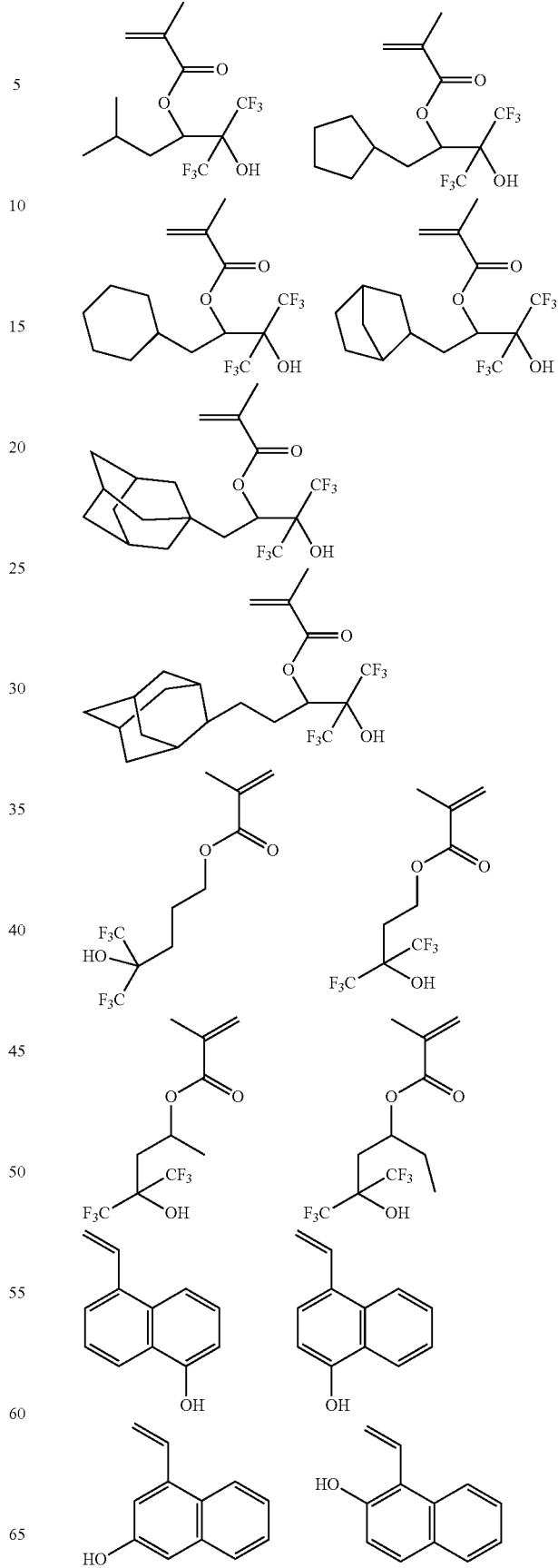

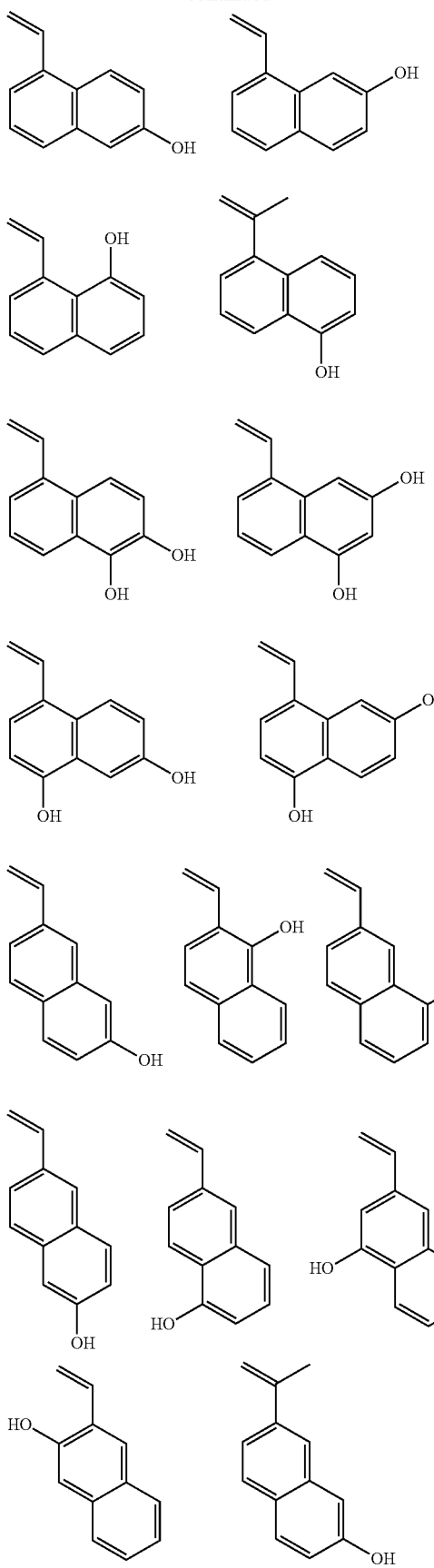

-continued

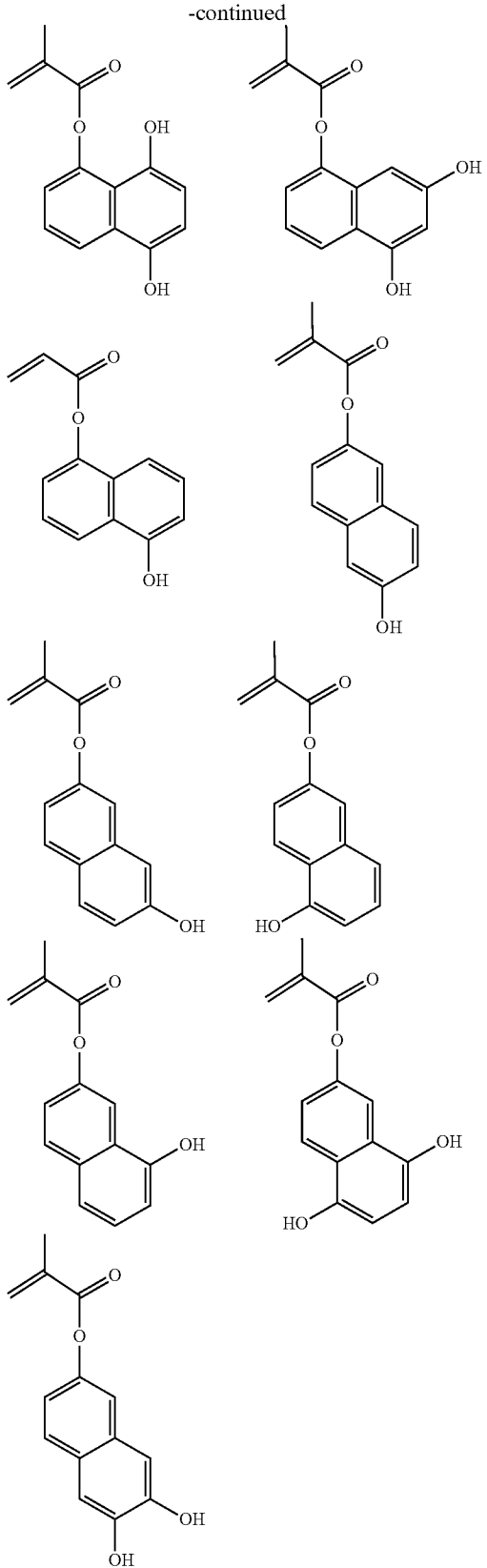

a sulfonium or iodonium salt photoacid generator adapted to generate a sulfonic acid, imidic acid or methide acid which is fluorinated at α-position upon light exposure, a quencher having an amino group, and at least one photobase generator selected from compounds of the general formulae (2) to (9), wherein the sum of a total molar amount of amino groups in the quencher and a total molar amount of amino groups released from the photobase generator is greater than a total molar amount of the acid released from the photoacid generator,

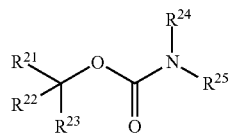

(2)

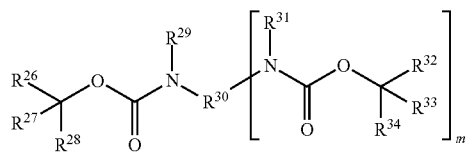

(3)

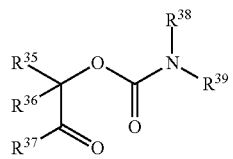

(4)

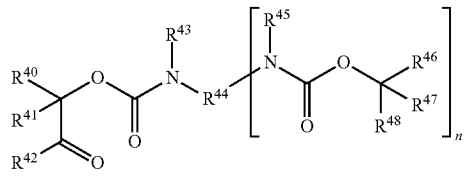

(5)

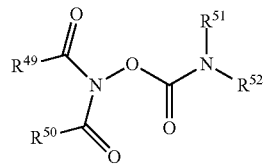

(6)

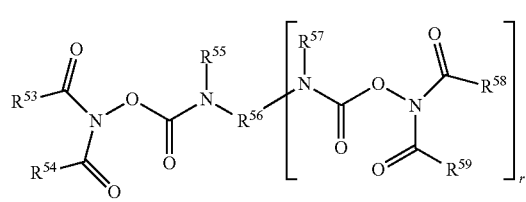

(7)

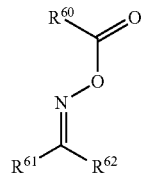

(8)

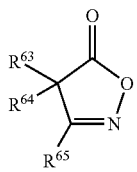

wherein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may have a straight, branched or cyclic $C_1$-$C_6$ alkyl or alkoxy, nitro, halogen, cyano or trifluoromethyl group, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring, $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester group, $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a ring, $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester group, $R^{49}$, $R^{50}$, $R^{53}$, $R^{54}$, $R^{58}$, and $R^{59}$ each are a straight or branched $C_1$-$C_6$ alkyl group, $R^{49}$ and $R^{50}$, $R^{53}$ and $R^{54}$, or $R^{58}$ and $R^{59}$ may bond together to form a ring, the ring optionally containing a benzene ring, naphthalene ring, double bond or ether bond, $R^{60}$ is a straight, branched or cyclic $C_1$-$C_{16}$ alkyl, $C_6$-$C_{20}$ aryl or $C_2$-$C_{20}$ alkenyl group, $R^{61}$ is a $C_6$-$C_{20}$ aryl group, $R^{62}$ is hydrogen, a straight, branched or cyclic $C_1$-$C_{16}$ alkyl group or $C_6$-$C_{20}$ aryl group, $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether group, m, n and r each are 1 or 2.

12. The resist composition of claim 10 wherein the polymer further comprises recurring units having an adhesive group selected from the class consisting of hydroxyl, cyano, carbonyl, ester, ether, lactone, carboxyl and carboxylic anhydride groups.

13. The resist composition of claim 10 wherein the polymer further comprises recurring units having a sulfonium salt such that the sum of a total molar amount of amino groups in the quencher and a total molar amount of amino groups released from the photobase generator-bearing units is greater than the sum of a total molar amount of the acid released from the photoacid generator and a total molar amount of the acid released from the sulfonium salt-bearing recurring units.

14. The resist composition of claim 10, further comprising a base amplifier adapted to generate an amino group such that the sum of a total molar amount of amino groups in the quencher, a total molar amount of amino groups released from the photobase generator-bearing units and a total molar amount of amino groups released from the base amplifier is greater than the sum of a total molar amount of the acid released from the photoacid generator and a total molar amount of the acid released from the sulfonium salt-bearing units if the polymer comprises recurring units having a sulfonium salt.

15. A process for forming a pattern comprising the steps of:

exposing a resist film through a mask having a one-pair line-and-space pattern, the pattern being a dark pattern in which a peripheral region outside the line pattern is light-shielded, PEB and development to form a two-pair line-and-space pattern as being split from the mask pattern, exchanging the mask with a second mask, exposing the peripheral region outside the line pattern through the second mask, PEB and development to dissolve away the peripheral region.

16. The process of claim 1 wherein the polymer further comprises recurring units having an adhesive group selected from the class consisting of hydroxyl-containing groups derived from the following monomers:

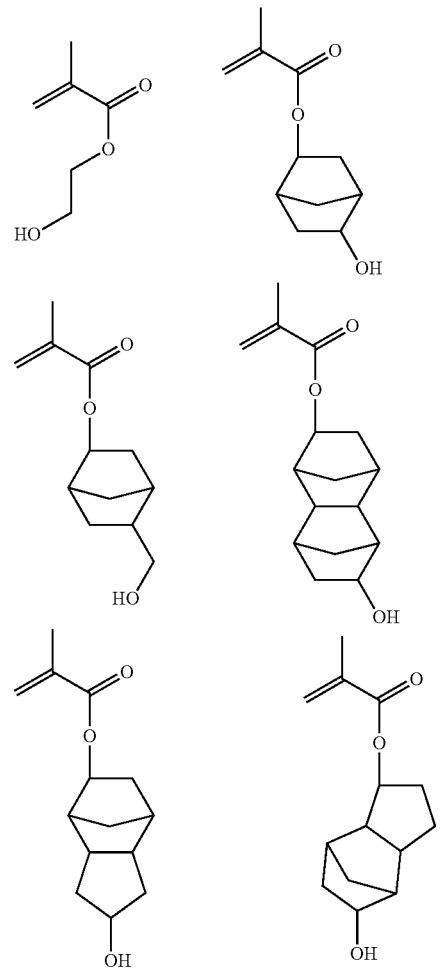

195
-continued
196
-continued
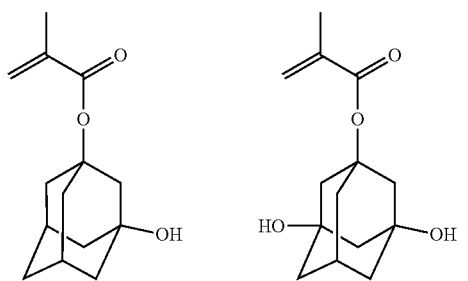
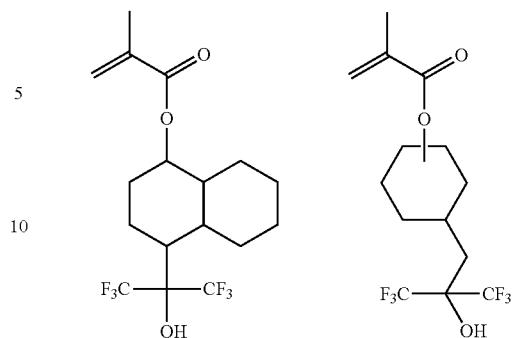
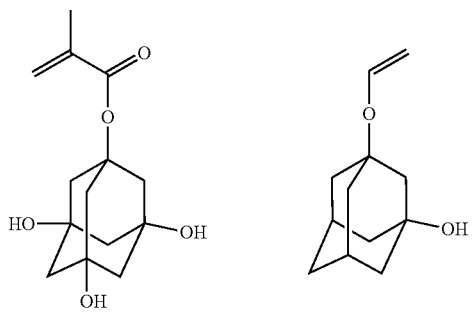
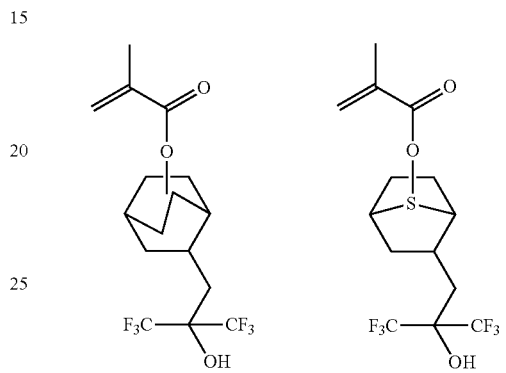
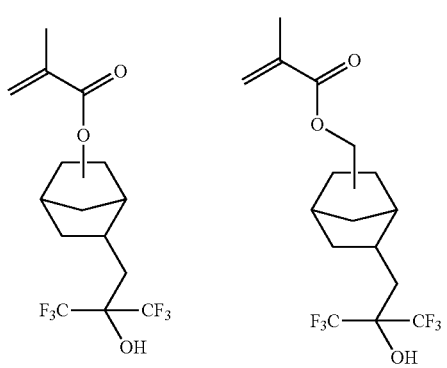
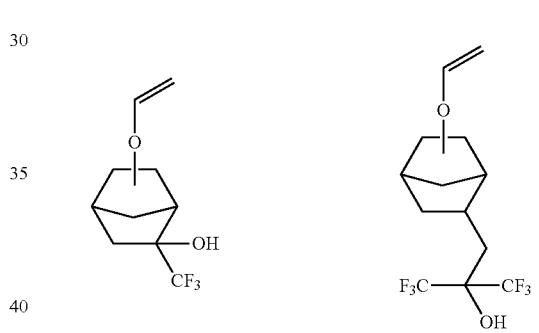
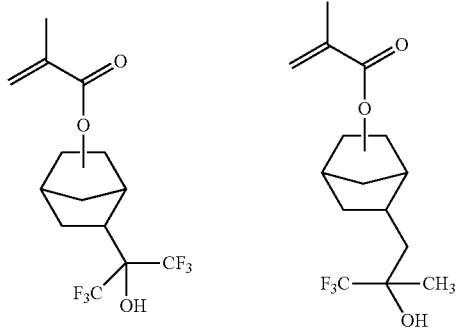
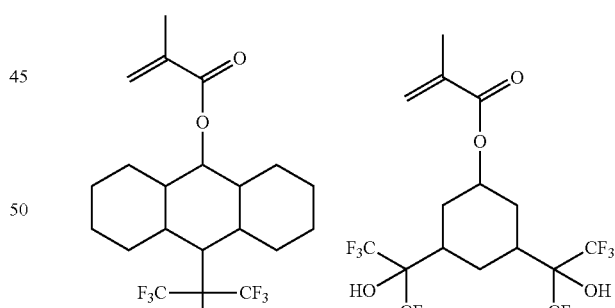
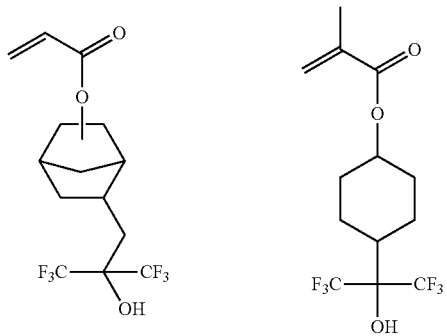
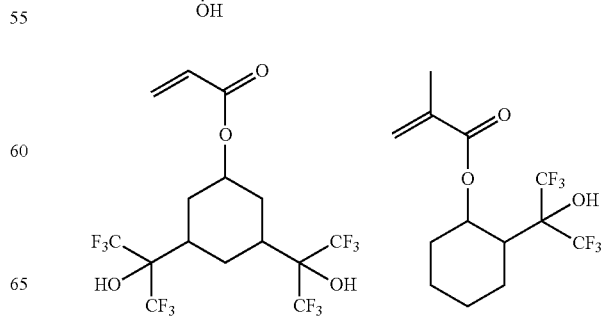

197
-continued
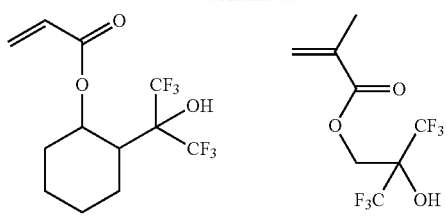
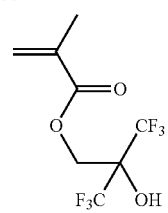
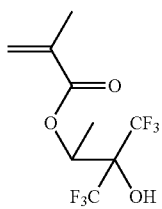
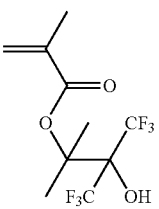
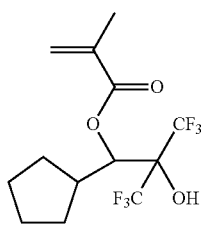
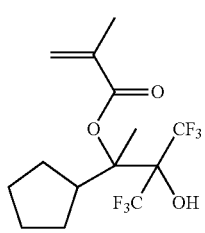
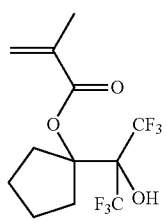
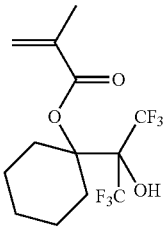
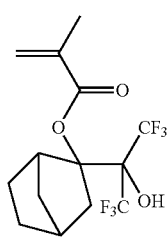
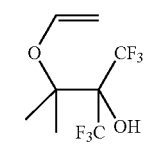
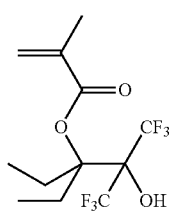
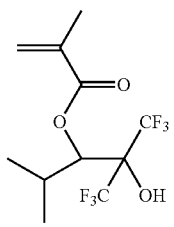
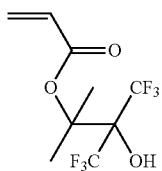
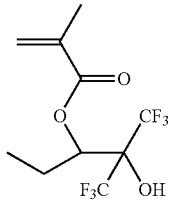
198
-continued
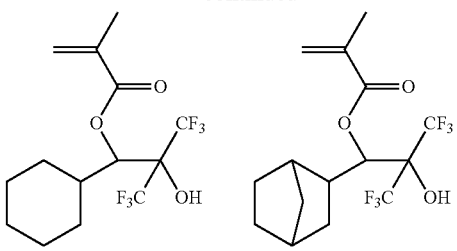
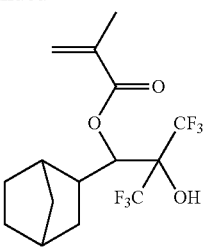
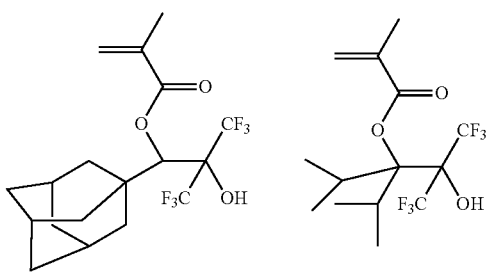
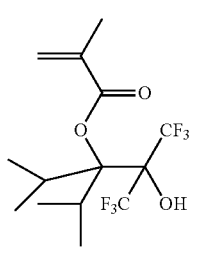
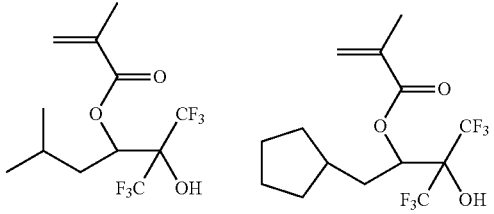
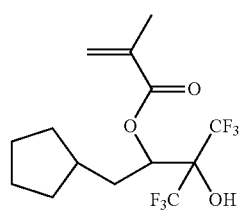
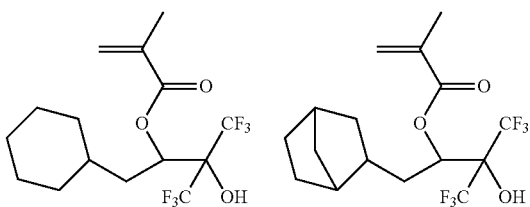
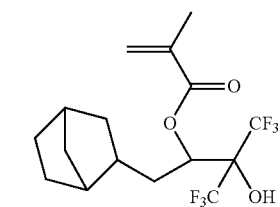
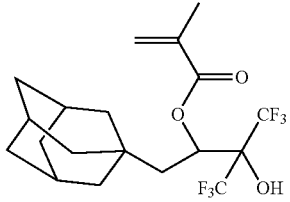
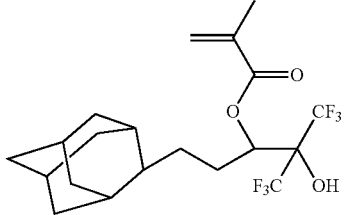
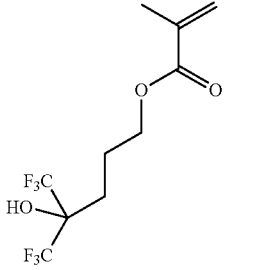
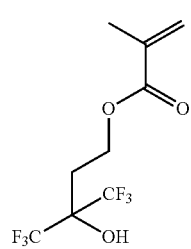

199
-continued
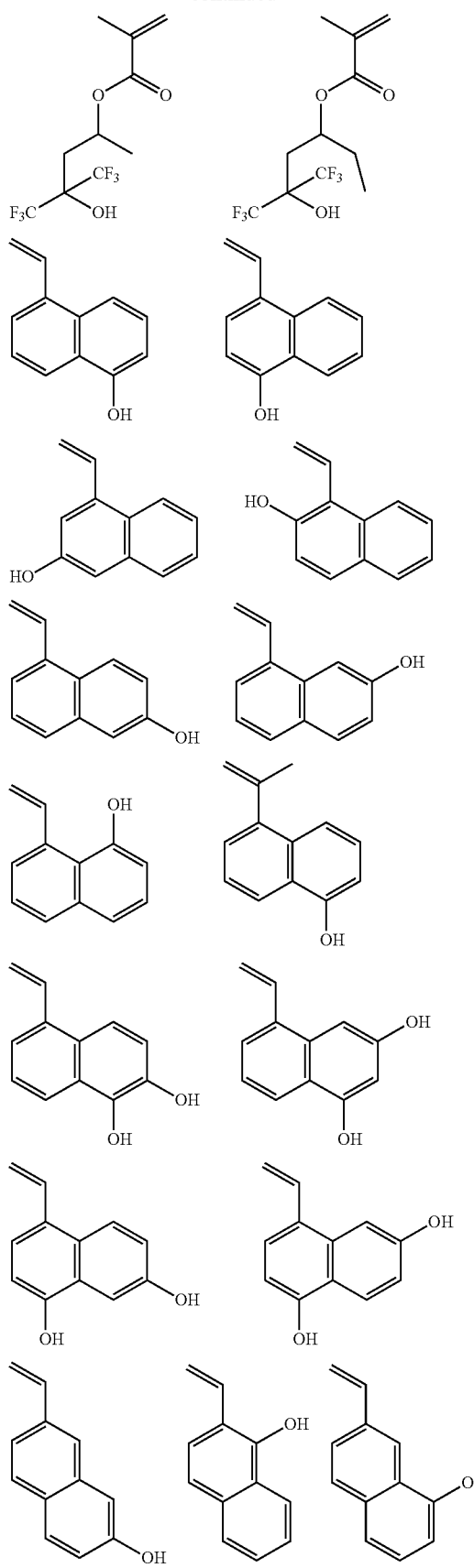
200
-continued
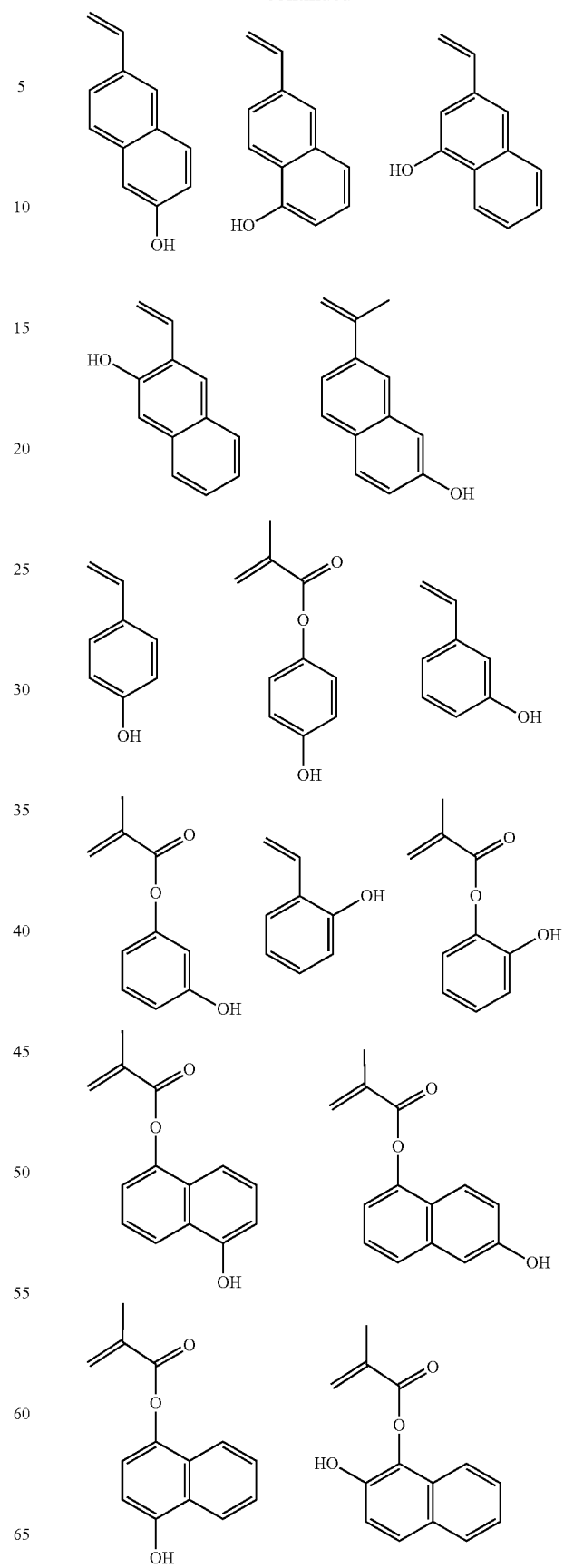

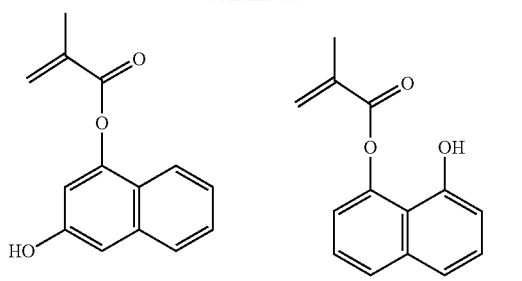
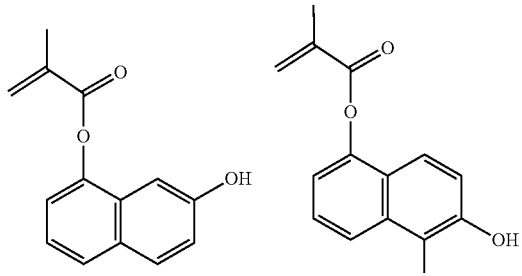
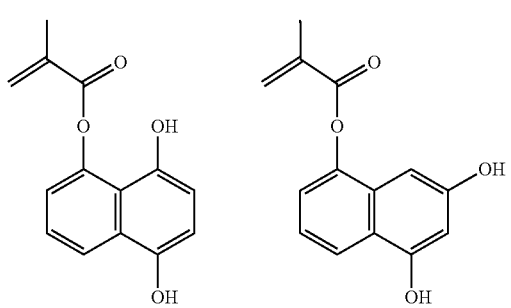
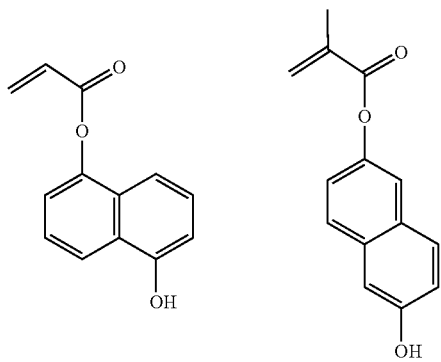
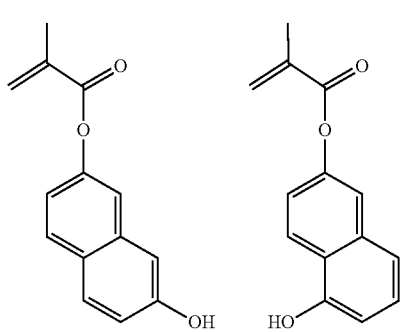
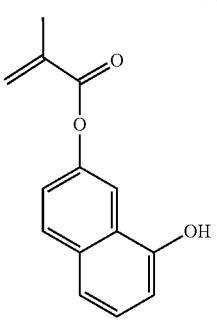
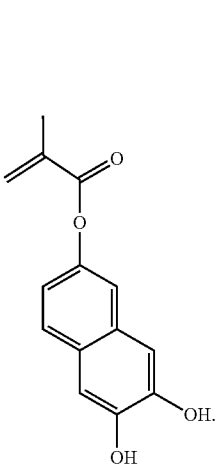
17. The process of claim 2 wherein the polymer further comprises recurring units having an adhesive group selected from the class consisting of hydroxyl-containing groups derived from the following monomers:
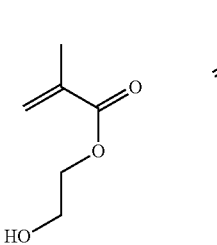

203
-continued
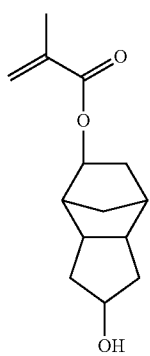 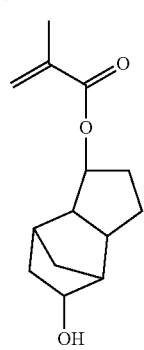
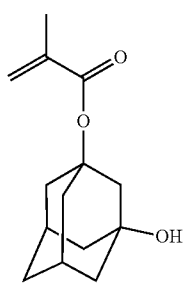 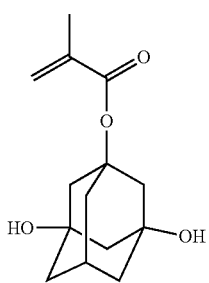
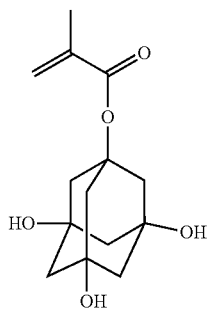 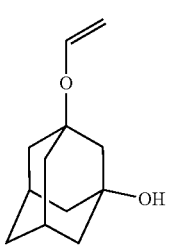
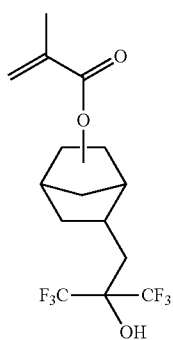 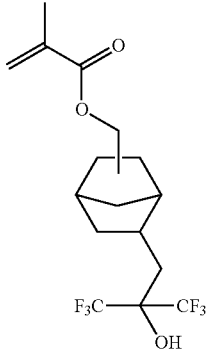
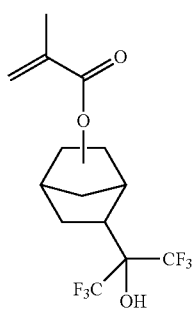 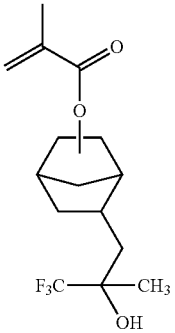
204
-continued
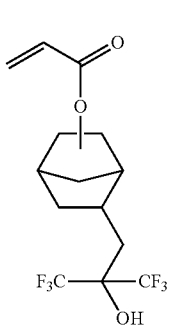 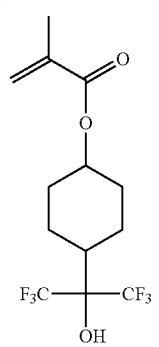
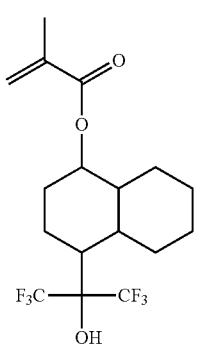 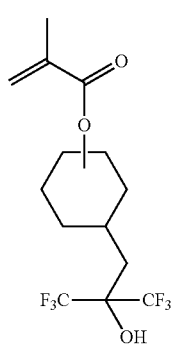
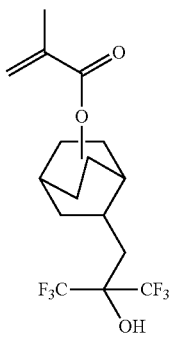 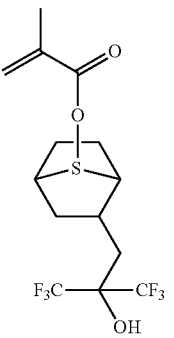
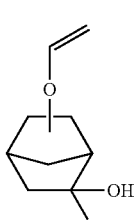 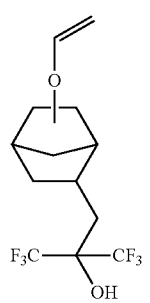
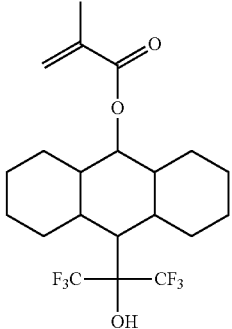 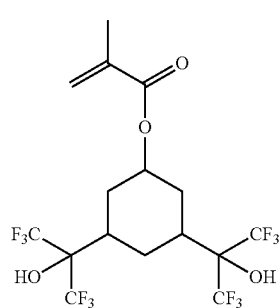

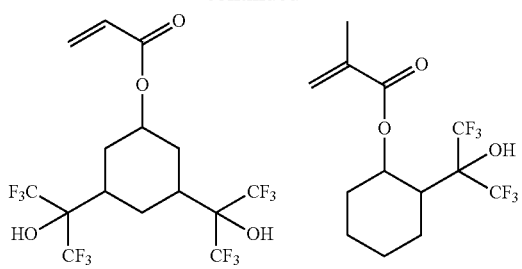
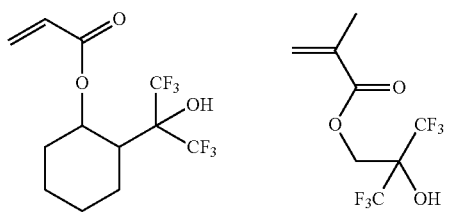
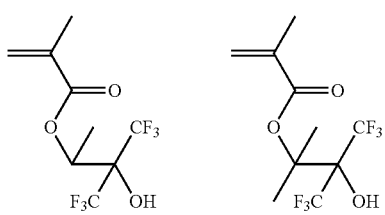
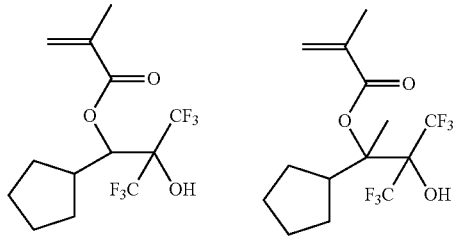
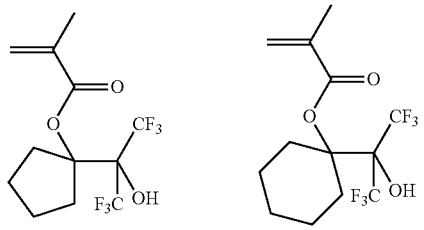
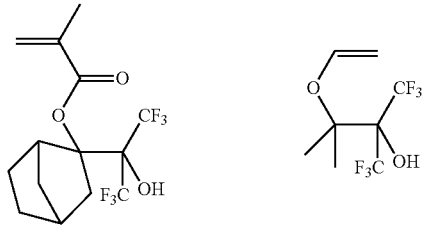
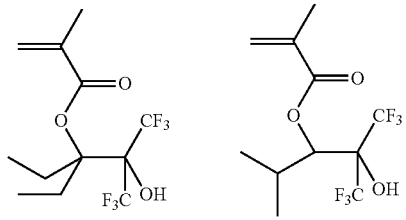
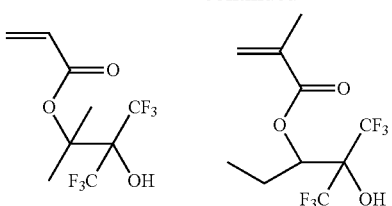
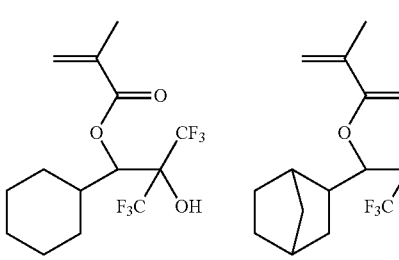
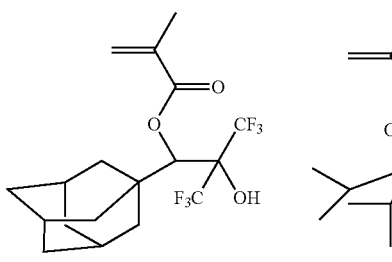
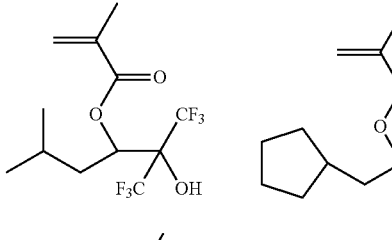
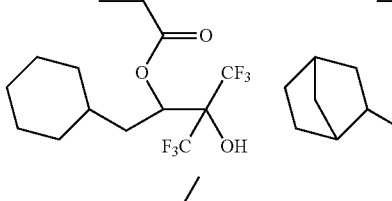
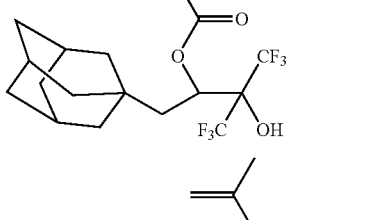
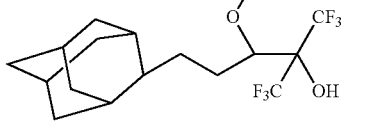

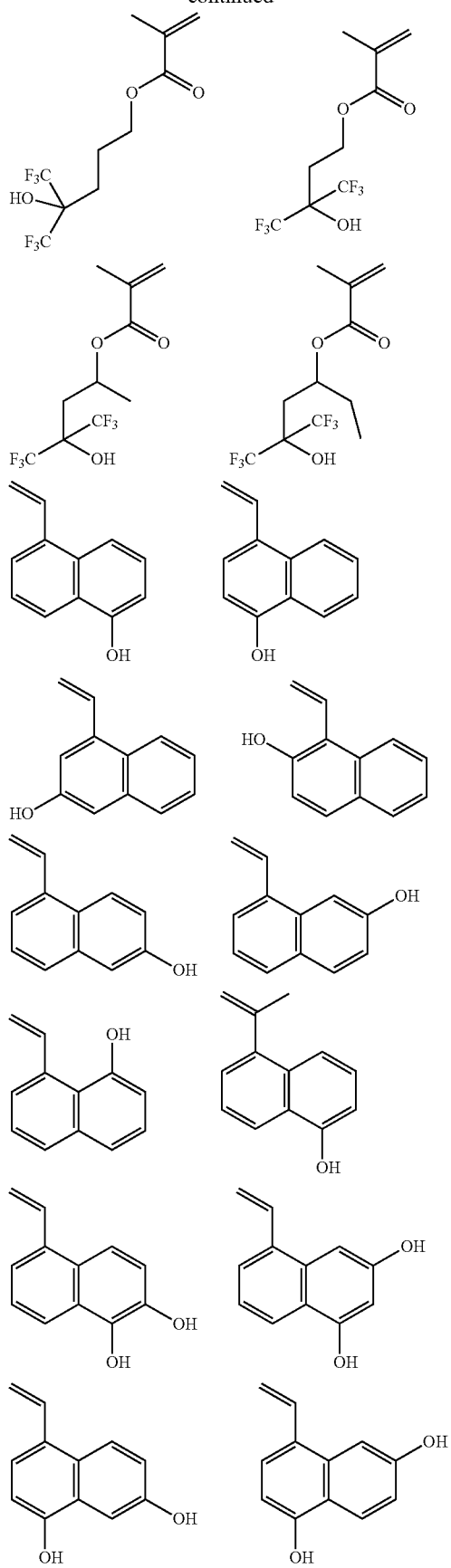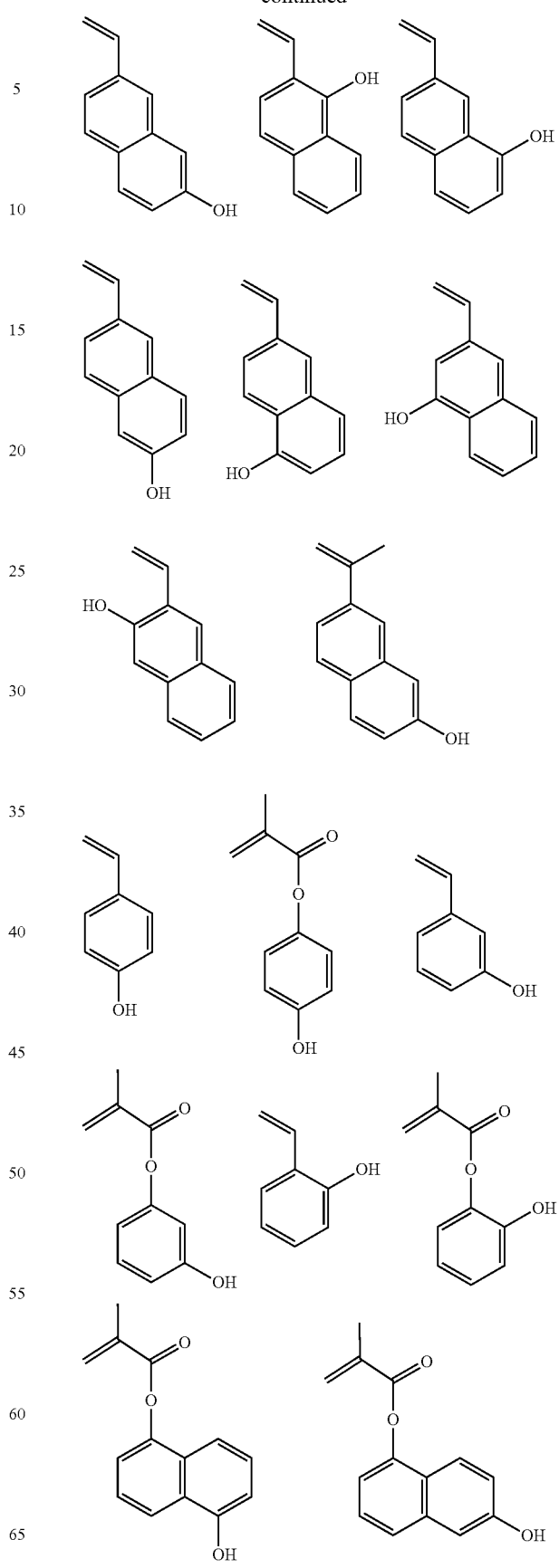

-continued

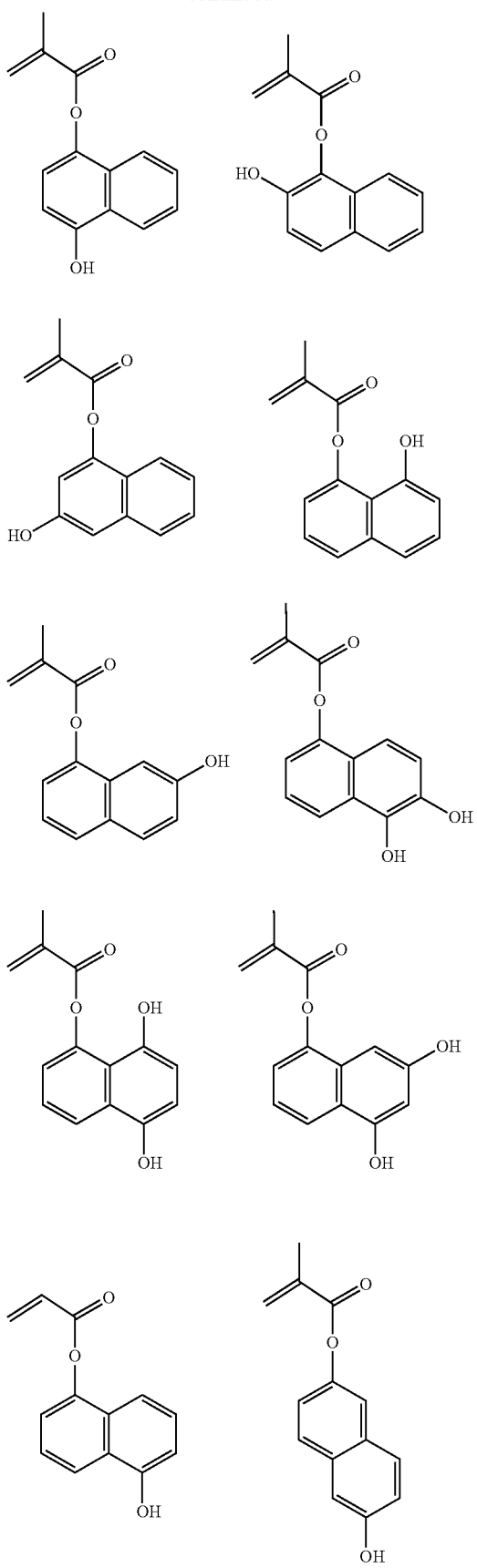

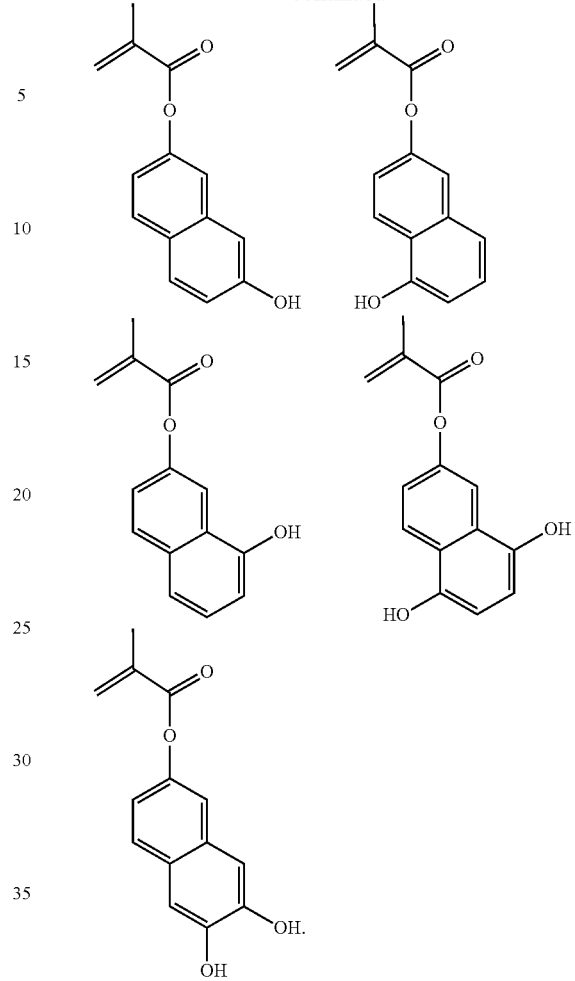

18. A process for forming a pattern comprising the steps of applying a resist composition onto a substrate to form a resist film, baking exposure to radiation at a dose, post-exposure baking, and developing with an alkaline developer, said resist composition comprising a polymer comprising recurring units having an acid labile group and recurring units having an adhesive group selected from the class consisting of hydroxyl-containing groups derived from monomers shown below and substantially insoluble in the alkaline developer, a photoacid generator capable of generating an acid, a photobase generator capable of generating an amino group selected from compounds having the general formulae (2) to (9), a quencher having an amino group for neutralizing the acid released from the photoacid generator for inactivation, and an organic solvent, the sum of a total molar amount of amino groups in the quencher and a total molar amount of amino groups released from the photobase generator is greater than a total molar amount of the acid released from the photoacid generator, whereby a pattern of the resist film is formed including an unexposed region at a low exposure dose and an over-exposed region at an excess exposure dose which are not dissolved in the developer, and an exposed region at an intermediate exposure dose which is dissolved in the developer, -continued
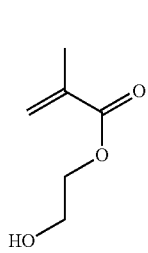 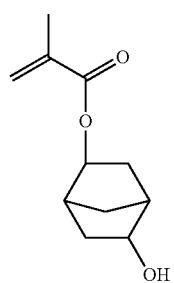 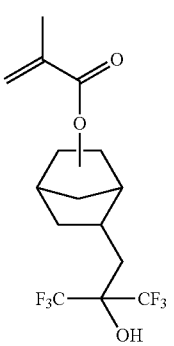 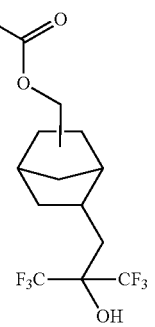
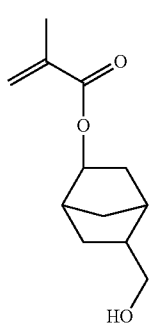 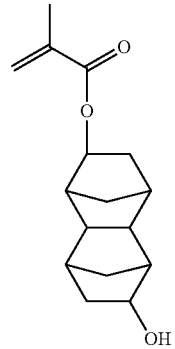 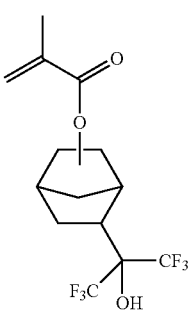 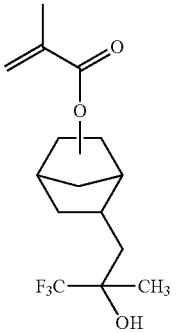
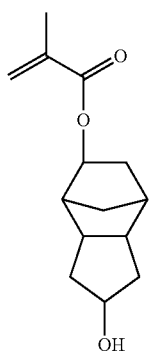 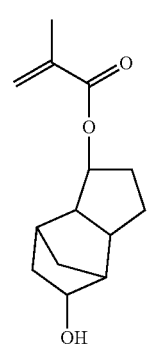 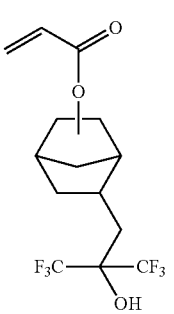 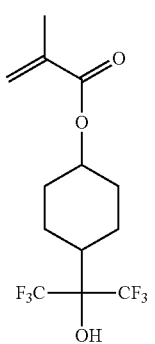
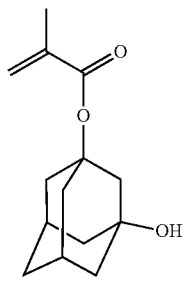 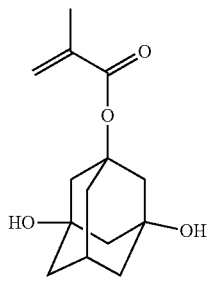 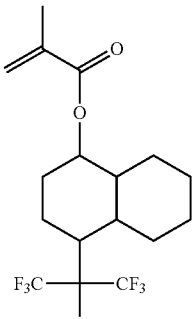 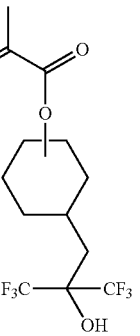
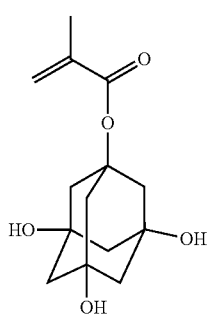 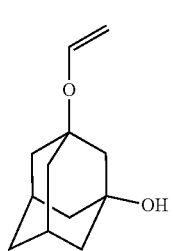 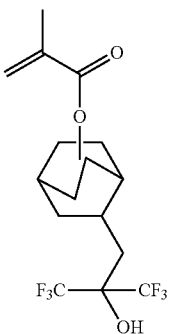 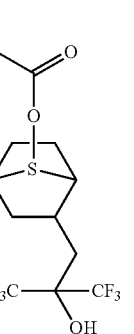

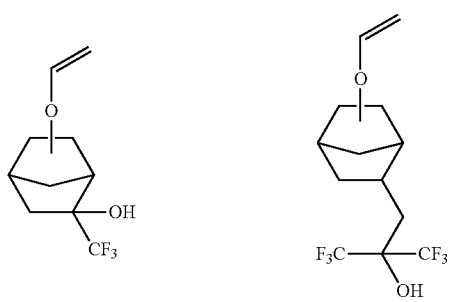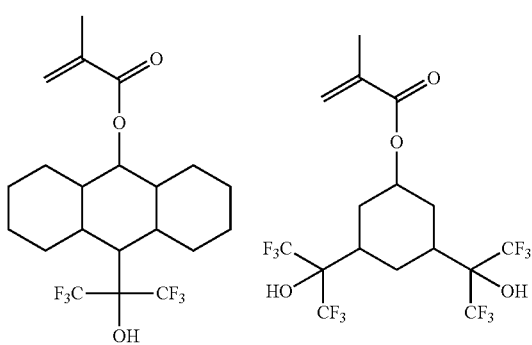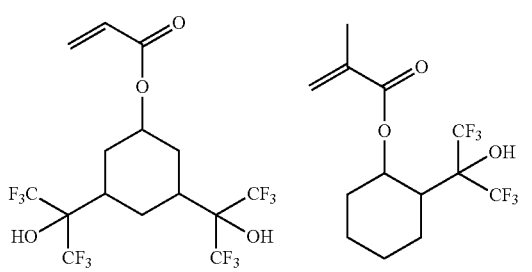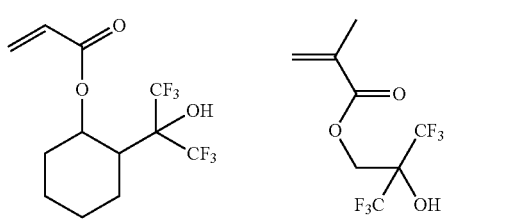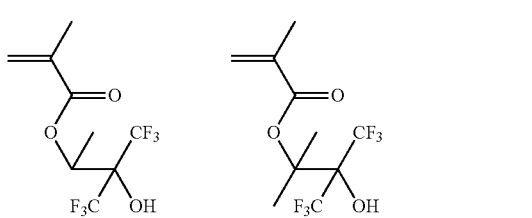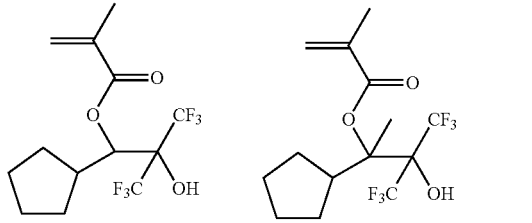

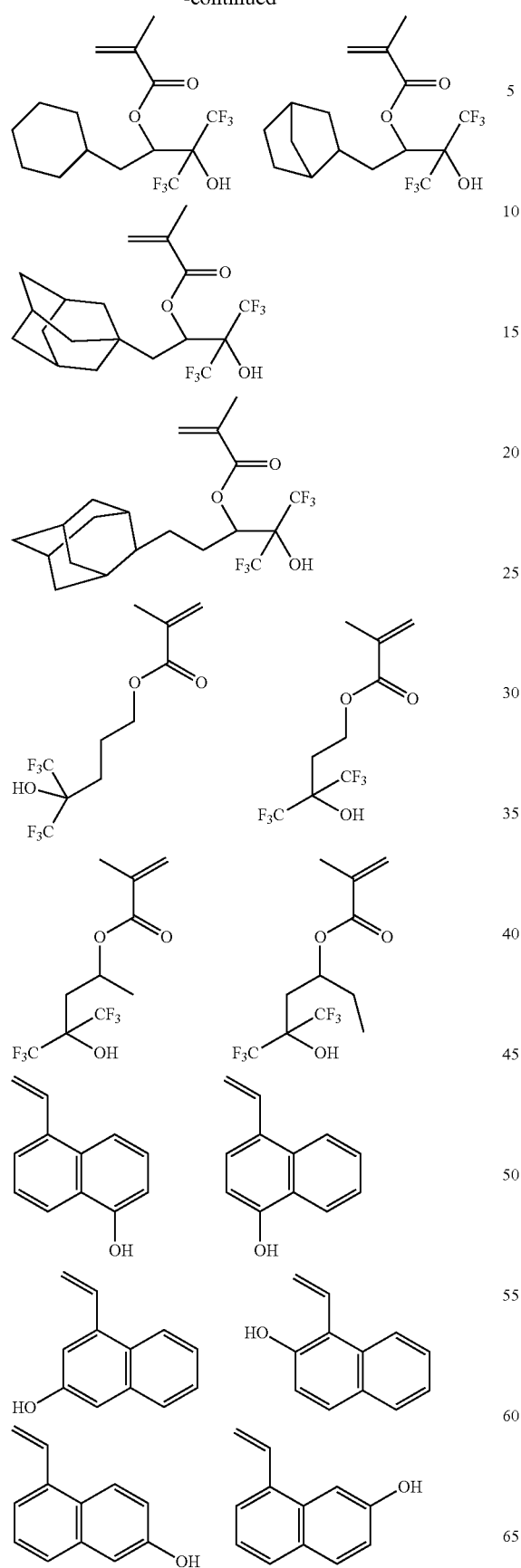
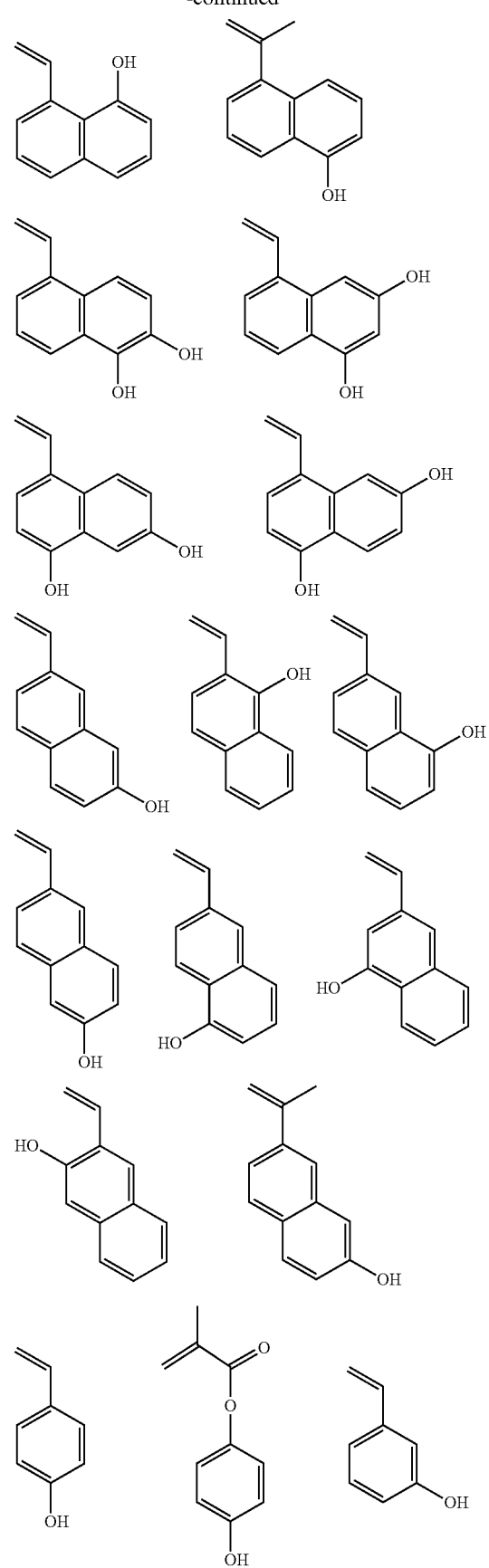

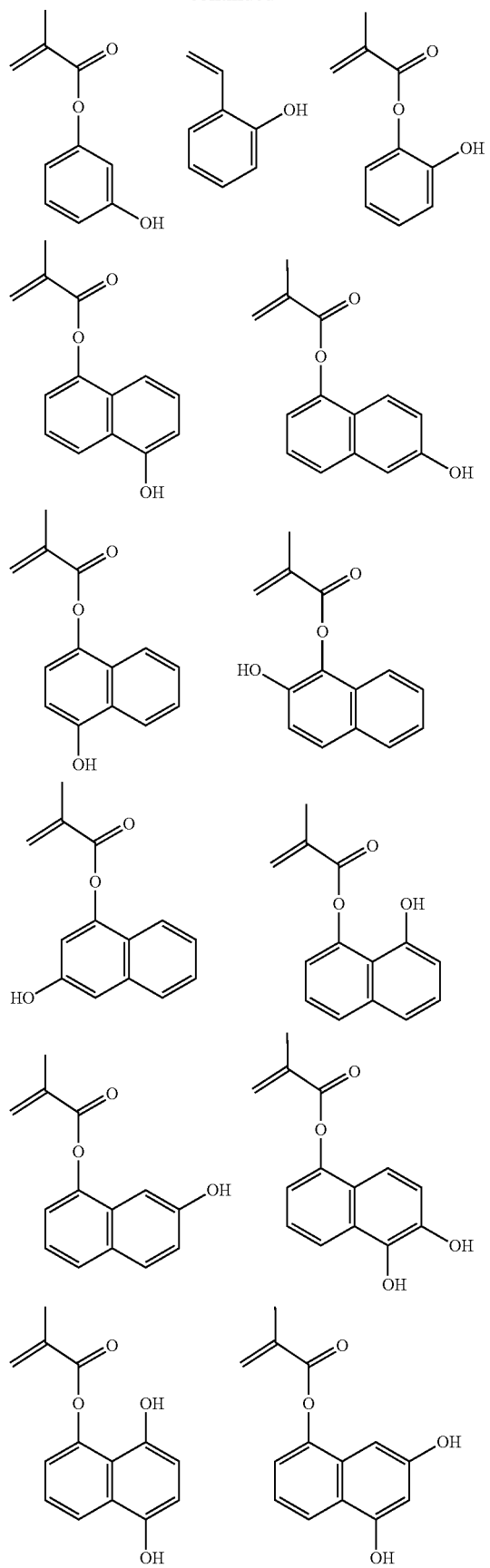
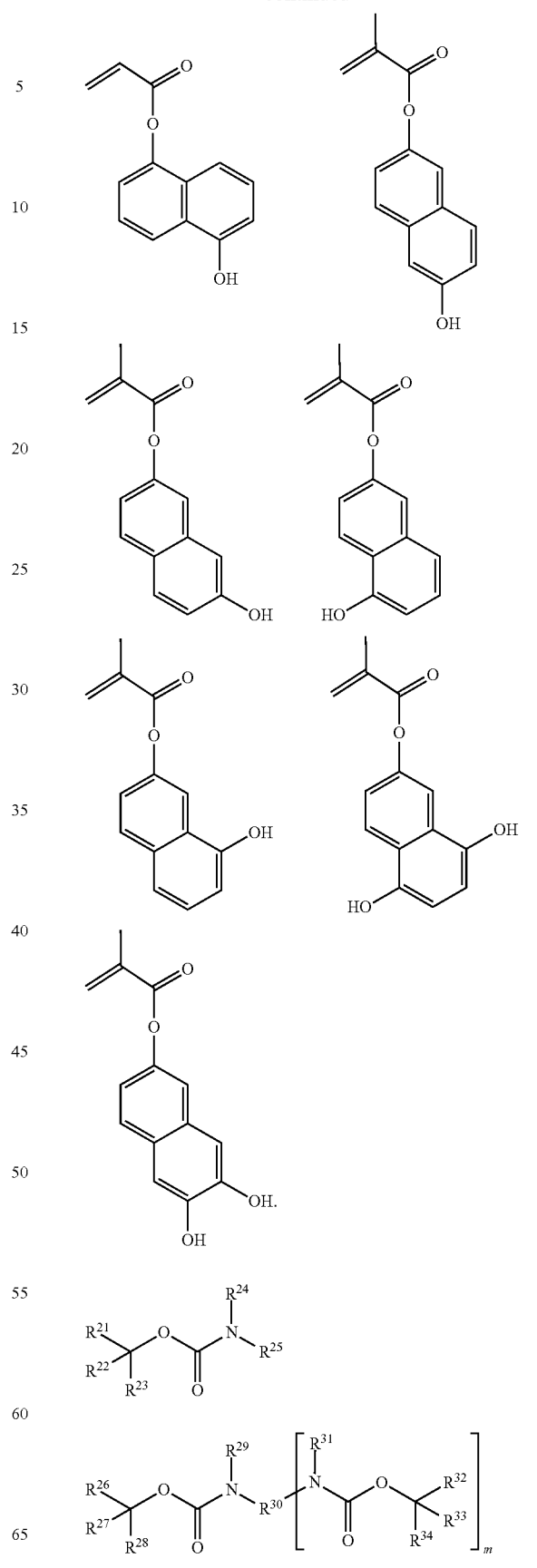

-continued

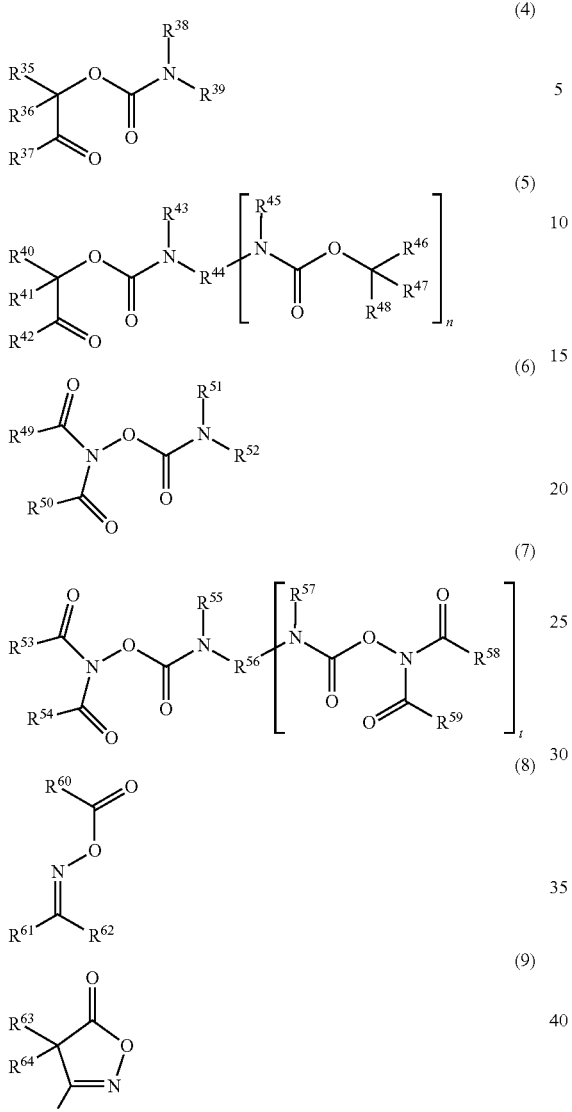

wherein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may have a straight, branched or cyclic $C_1$-$C_6$ alkyl or alkoxy, nitro, halogen, cyano or trifluoromethyl group, at least one of $R^{21}$ or $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring, $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester group, $R^{24}$ and $R^{25}$, $R^{29}$ and $R^{31}$, $R^{29}$ and $R^{30}$, $R^{31}$ and $R^{30}$, $R^{35}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a ring, $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester group, $R^{49}$, $R^{50}$, $R^{53}$, $R^{54}$, $R^{58}$, and $R^{59}$ each are a straight or branched $C_1$-$C_6$ alkyl group, $R^{49}$ and $R^{50}$, $R^{53}$ and $R^{54}$, or $R^{58}$ and $R^{59}$ may bond together to form a ring, the ring optionally containing a benzene ring, naphthalene ring, double bond or ether bond, $R^{60}$ is a straight, branched or cyclic $C_1$-$C_{16}$ alkyl, $C_6$-$C_{20}$ aryl or $C_2$-$C_{20}$ alkenyl group, $R^{61}$ is a $C_6$-$C_{20}$ aryl group, $R^{62}$ is hydrogen, a straight, branched or cyclic $C_1$-$C_{16}$ alkyl group of $C_6$-$C_{20}$ aryl group, $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether group, m, n and r each are 1 or 2.

19. A process for forming a pattern comprising the steps of applying a resist composition onto a substrate to form a resist film, baking, exposure to radiation at a dose, post-exposure baking, and developing with an alkaline developer, said resist composition comprising a polymer comprising recurring units having an acid labile group and recurring units (e1), (e2) or (e3) having a sulfonium salt represented by the general formula (10) and substantially insoluble in an alkaline developer, a photobase generator capable of generating an amino group selected from compounds having the general formulae (2) to (9), a quencher having an amino group for neutralizing an acid released from the sulfonium salt-bearing units in the polymer and the acid released from the photoacid generator for inactivation, and an organic solvent, the sum of a total molar amount of amino groups in the quencher and a total molar amount of amino groups released from the photobase generator is greater than the sum of a total molar amount of the acid released from the sulfonium salt-bearing units and a total molar amount of the acid released from the photoacid generator, whereby a pattern of the resist film is formed including an unexposed region at a low exposure dose and an overexposed region at an excess exposure dose which are not dissolved in the developer, and an exposed region at an intermediate exposure dose which is dissolved in the developer,

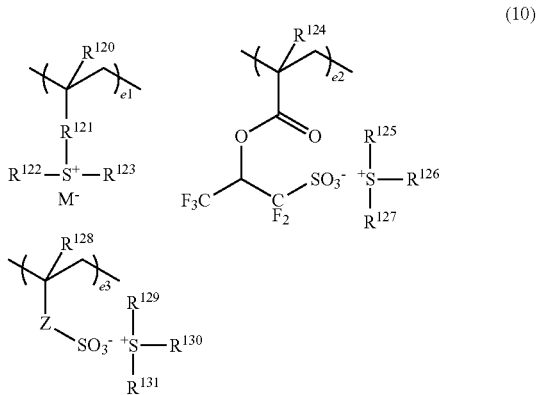

wherein $R^{120}$, $R^{124}$, and $R^{128}$ each are hydrogen or methyl, $R^{121}$ is a single bond, phenylene group, —O—R— or —C(=O)—Y—R— wherein Y is an oxygen atom or NH, and R is a straight, branched or cyclic $C_1$-$C_6$ alkylene, phenylene, or $C_3$-$C_{10}$ alkenylene group which may contain a carbonyl (—CO—), ester (—COO—), ether (—O—) or hydroxyl radical, $R^{122}$, $R^{123}$, $R^{125}$, $R^{126}$, $R^{127}$, $R^{129}$, $R^{130}$, and $R^{131}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group, Z is a single bond, methylene, ethylene, phenylene, fluorinated phenylene, —O—$R^{132}$—, or —C(=O)—$Z_1$—$R^{132}$— wherein $Z_1$ is an oxygen atom or NH, and $R^{132}$ is a straight, branched or cyclic $C_1$-$C_6$ alkylene group, phenylene group or alkenylene group, which may contain a carbonyl, ester, ether or hydroxy radical, $M^-$ is a non-nucleophilic counter ion, and the subscripts e1, e2 and e3 are numbers in the range: $0 \leq e1 \leq 0.3$, $0 \leq e2 \leq 0.3$, $0 \leq e3 \leq 0.3$, and $0 < e1+e2+e3 \leq 0.3$,

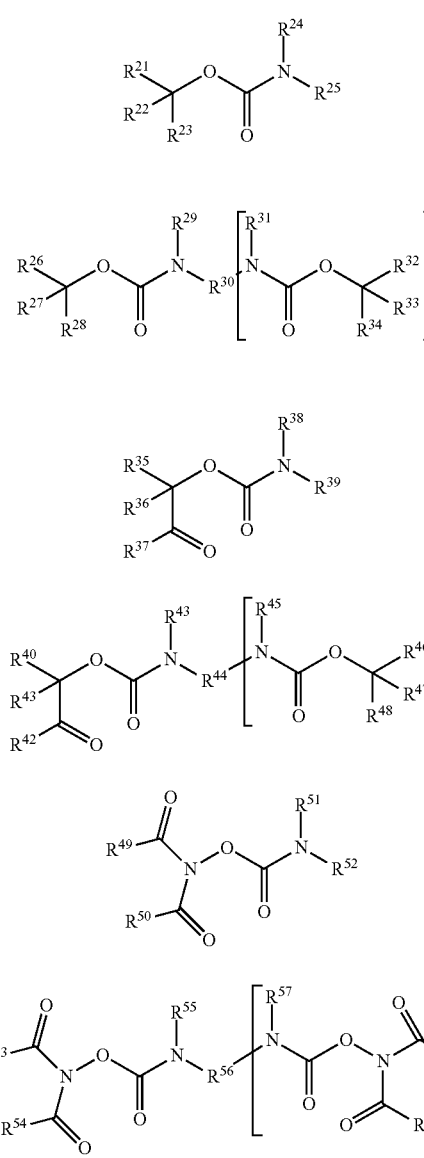

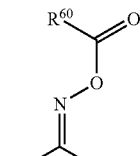

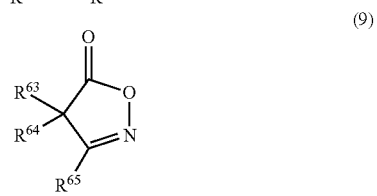

wherein $R^{21}$, $R^{22}$, $R^{23}$, $R^{26}$, $R^{27}$, $R^{28}$, $R^{32}$, $R^{33}$, $R^{34}$, $R^{35}$, $R^{36}$, $R^{37}$, $R^{40}$, $R^{41}$, $R^{42}$, $R^{46}$, $R^{47}$, and $R^{48}$ each are hydrogen, a straight, branched or cyclic $C_1$-$C_6$ alkyl group, or a $C_6$-$C_{14}$ aryl group which may have a straight, branched or cyclic $C_1$-$C_6$ alkyl or alkoxy, nitro, halogen, cyano or trifluoromethyl group, at least one of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ is an aryl group and at least one is hydrogen, or at least two of $R^{21}$ to $R^{23}$, $R^{26}$ to $R^{28}$, $R^{32}$ to $R^{34}$, $R^{35}$ to $R^{37}$, $R^{40}$ to $R^{42}$, and $R^{46}$ to $R^{48}$ may bond together to form a ring, $R^{24}$, $R^{25}$, $R^{29}$, $R^{31}$, $R^{38}$, $R^{39}$, $R^{43}$, $R^{45}$, $R^{51}$, $R^{52}$, $R^{55}$, and $R^{57}$ each are hydrogen or a straight, branched or cyclic $C_1$-$C_{12}$ alkyl group which may have a double bond, ether, amino, carbonyl, hydroxyl or ester group, $R^{24}$ and $R^{25}$, $R^{29}$ and $R^{31}$, $R^{29}$ and $R^{30}$, $R^{31}$ and $R^{30}$, $R^{38}$ and $R^{39}$, $R^{43}$ and $R^{44}$, $R^{44}$ and $R^{45}$, $R^{43}$ and $R^{45}$, $R^{51}$ and $R^{52}$, $R^{55}$ and $R^{56}$, $R^{55}$ and $R^{57}$, or $R^{56}$ and $R^{57}$ may bond together to form a ring, $R^{30}$, $R^{44}$, and $R^{56}$ each are a single bond, straight, branched or cyclic $C_1$-$C_{20}$ alkylene group, alkyne group, $C_6$-$C_{20}$ arylene group, $C_2$-$C_{12}$ alkenylene group, or $C_2$-$C_{12}$ alkynylene group, which groups may have a double bond, ether, amino, carbonyl, hydroxyl or ester group, $R^{49}$, $R^{50}$, $R^{53}$, $R^{54}$, $R^{58}$, and $R^{59}$ each are a straight or branched $C_1$-$C_6$ alkyl group, $R^{49}$ and $R^{50}$, $R^{53}$ and $R^{54}$, or $R^{58}$ and $R^{59}$ may bond together to form a ring, the ring optionally containing a benzene ring, naphthalene ring, double bond or ether bond, $R^{60}$ is a straight, branched or cyclic $C_1$-$C_{16}$ alkyl, $C_6$-$C_{20}$ aryl or $C_2$-$C_{20}$ alkenyl group, $R^{61}$ is a $C_6$-$C_{20}$ aryl group, $R^{62}$ is hydrogen, a straight, branched or cyclic $C_1$-$C_{16}$ alkyl group or $C_6$-$C_{20}$ aryl group, $R^{63}$, $R^{64}$, and $R^{65}$ each are hydrogen, a straight, branched or cyclic $C_1$-$C_6$ alkyl group, $C_6$-$C_{14}$ aryl group, $C_2$-$C_{10}$ alkenyl or alkoxycarbonyl group, or cyano group, the alkyl, aryl and alkenyl groups optionally having a straight, branched or cyclic $C_1$-$C_6$ alkyl or alkoxy, alkoxycarbonyl, nitro, halogen, cyano, trifluoromethyl, sulfide, amino or ether group, m, n and r each are 1 or 2.

20. The process of claim 19 wherein the polymer further comprises recurring units having an adhesive group selected from the class consisting of hydroxyl-containing groups derived from the following monomers:

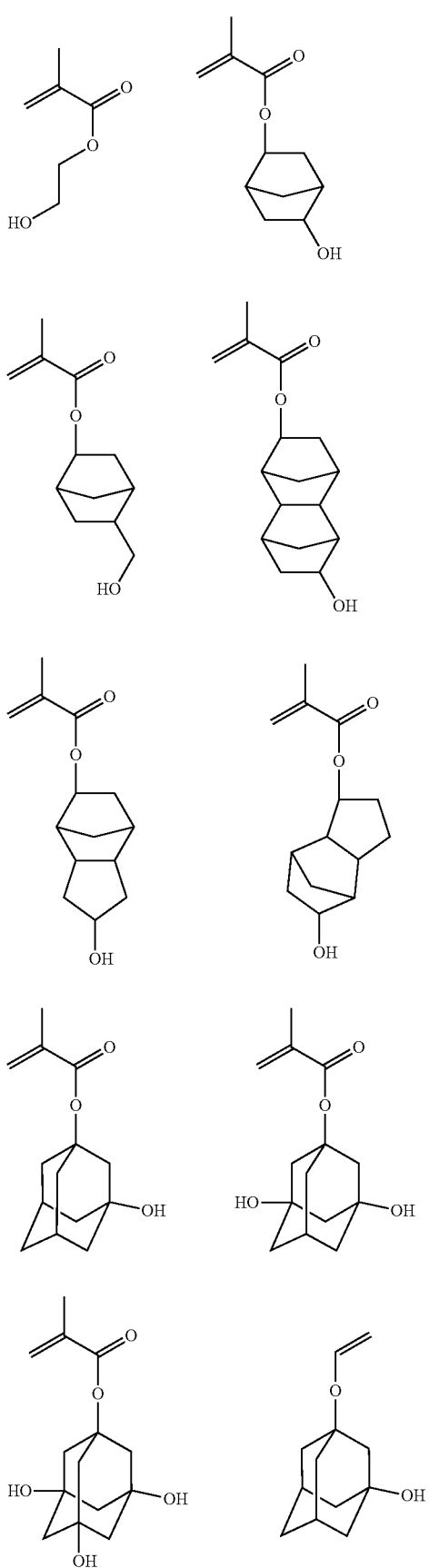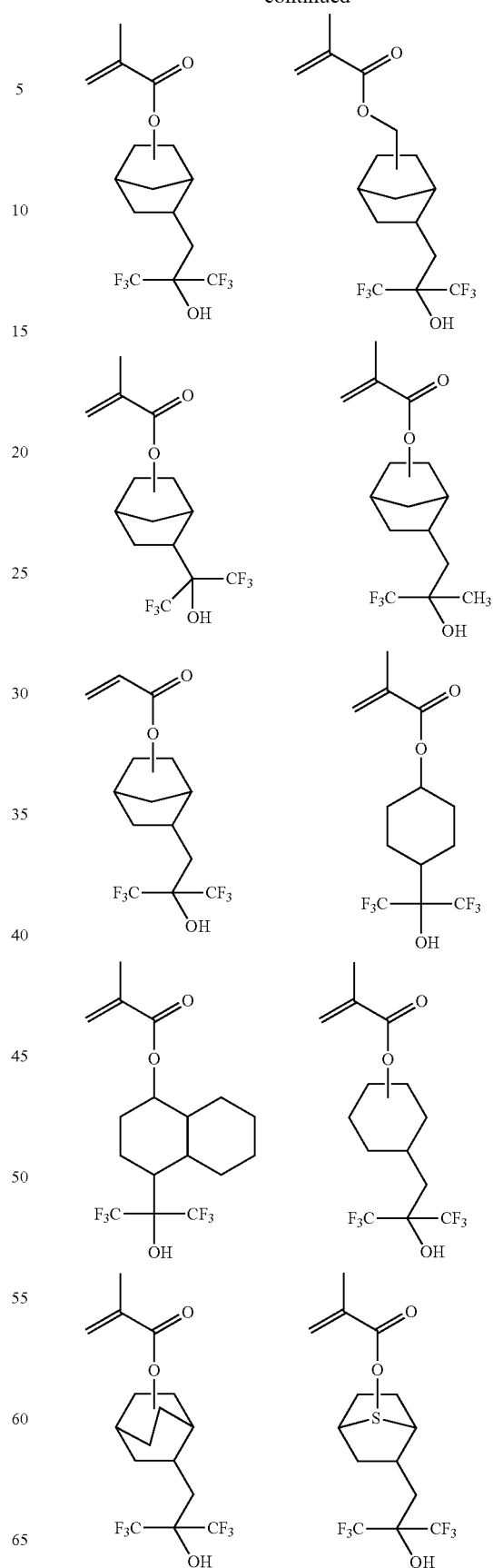

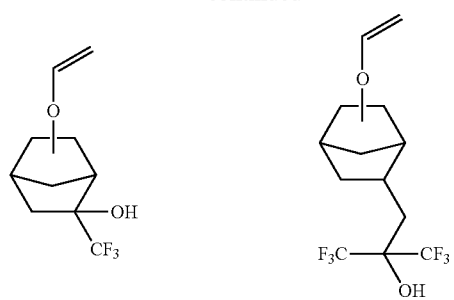
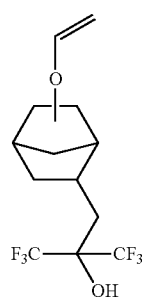
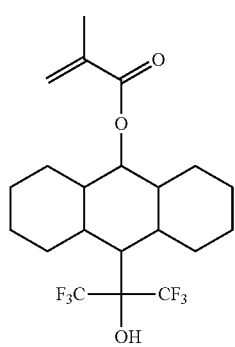
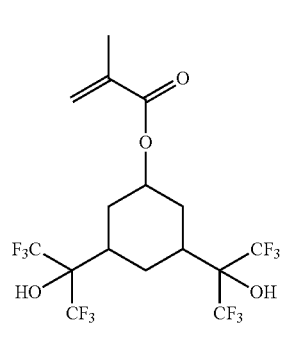
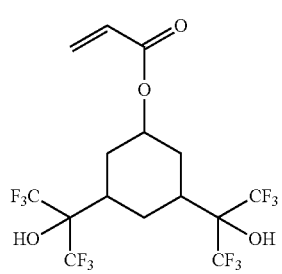
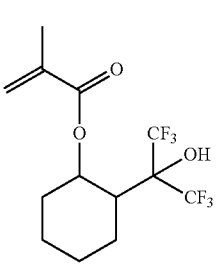
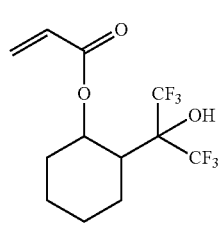
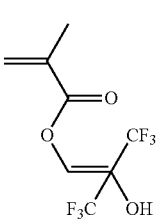
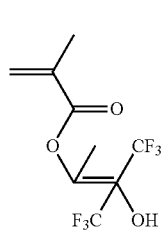
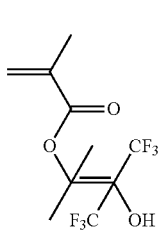
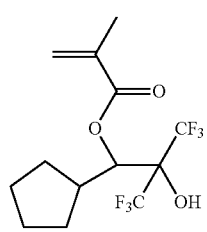
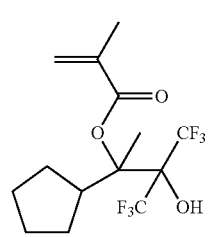
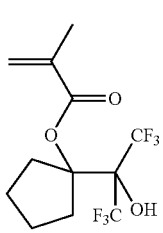
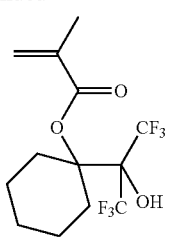
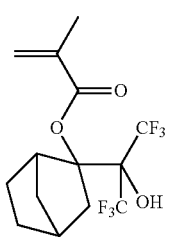
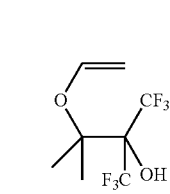
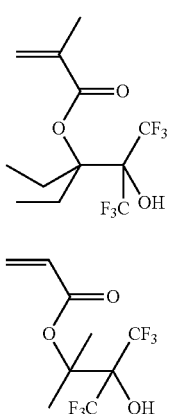
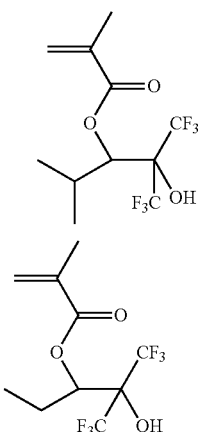
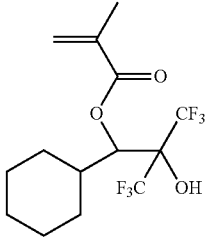
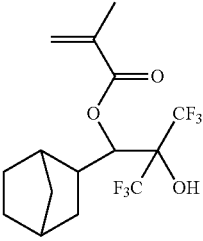
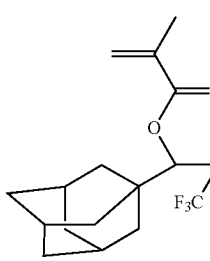
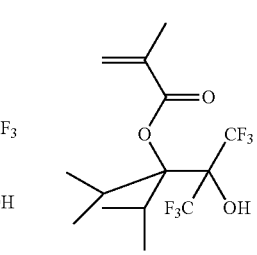
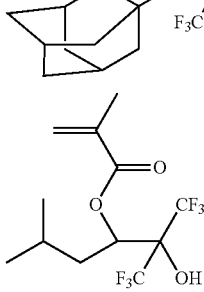
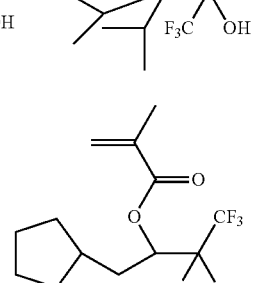

227
-continued
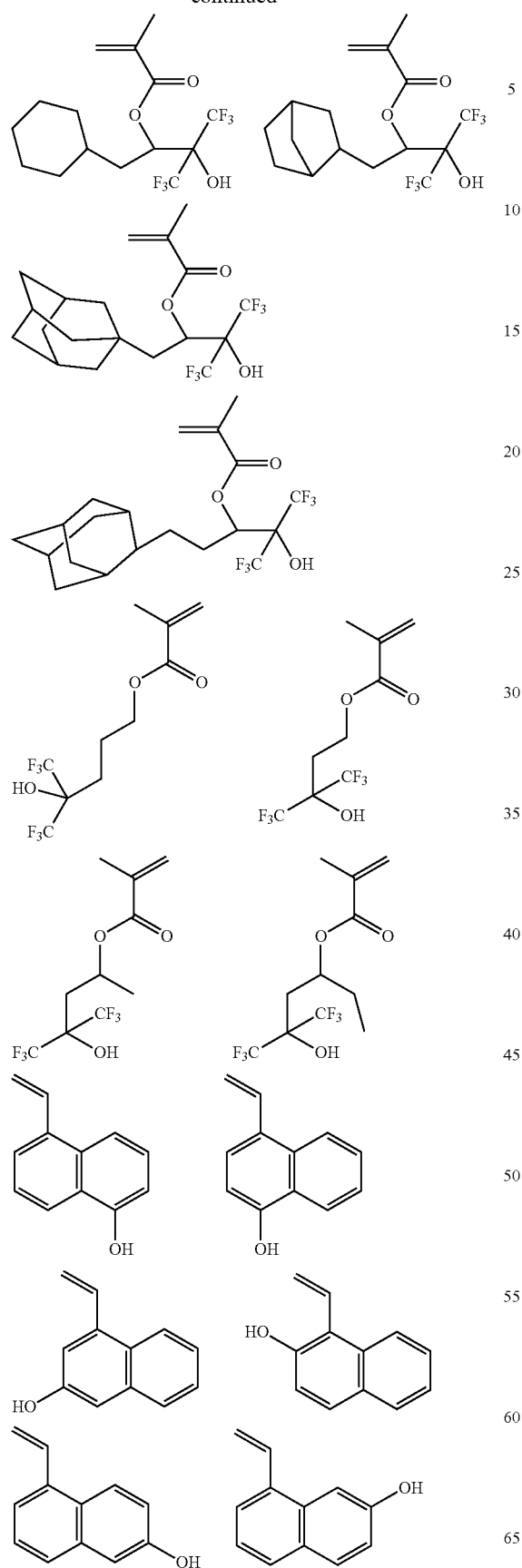
228
-continued
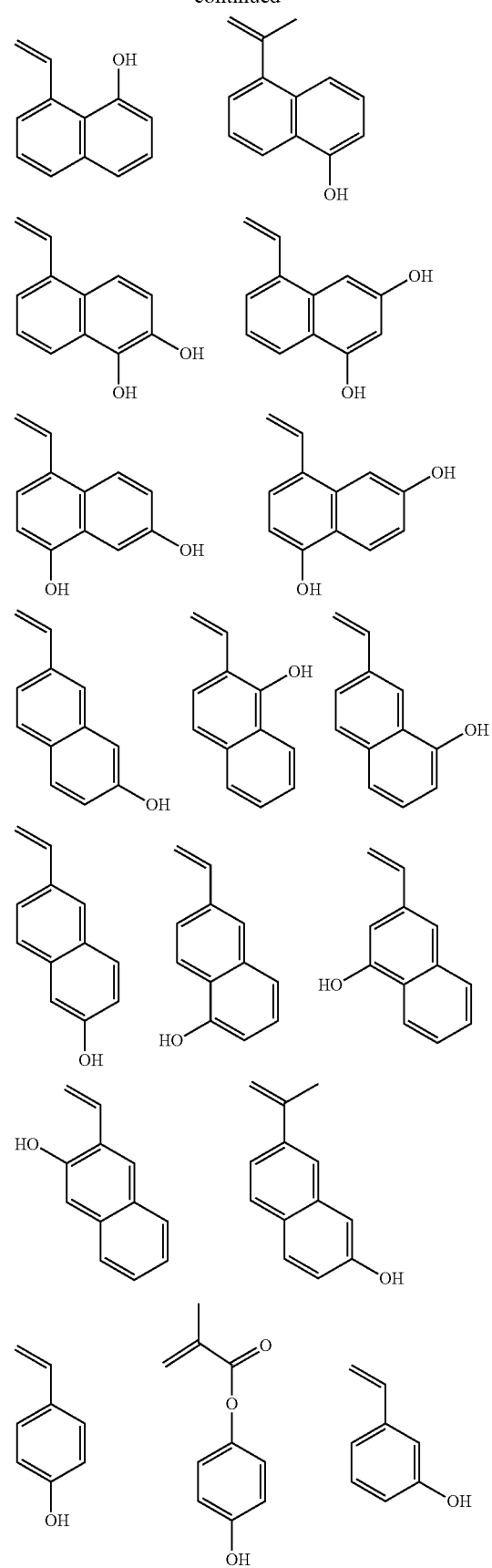

229
-continued
230
-continued
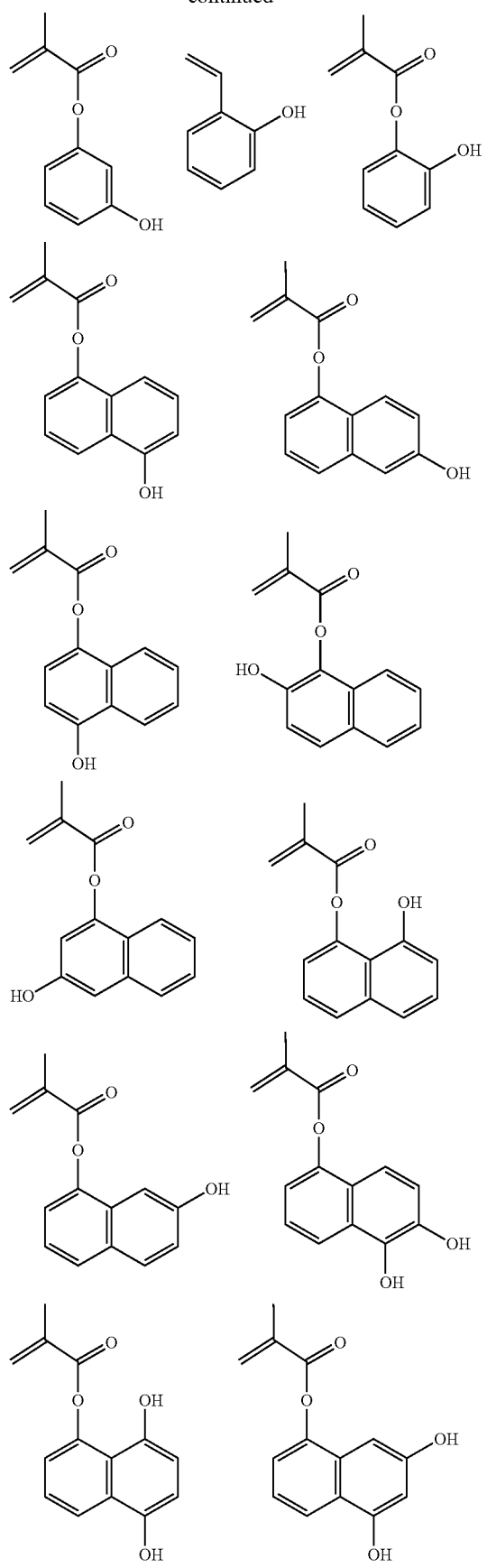
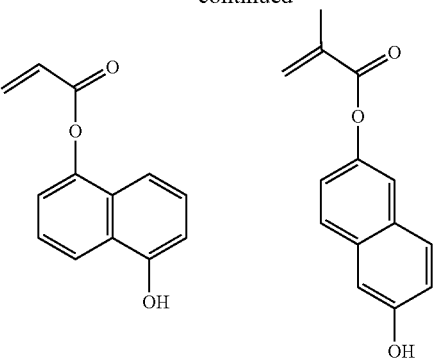
21. The resist composition of claim 10 wherein the polymer further comprises recurring units having an adhesive group selected from the class consisting of hydroxyl-containing groups derived from the following monomers:

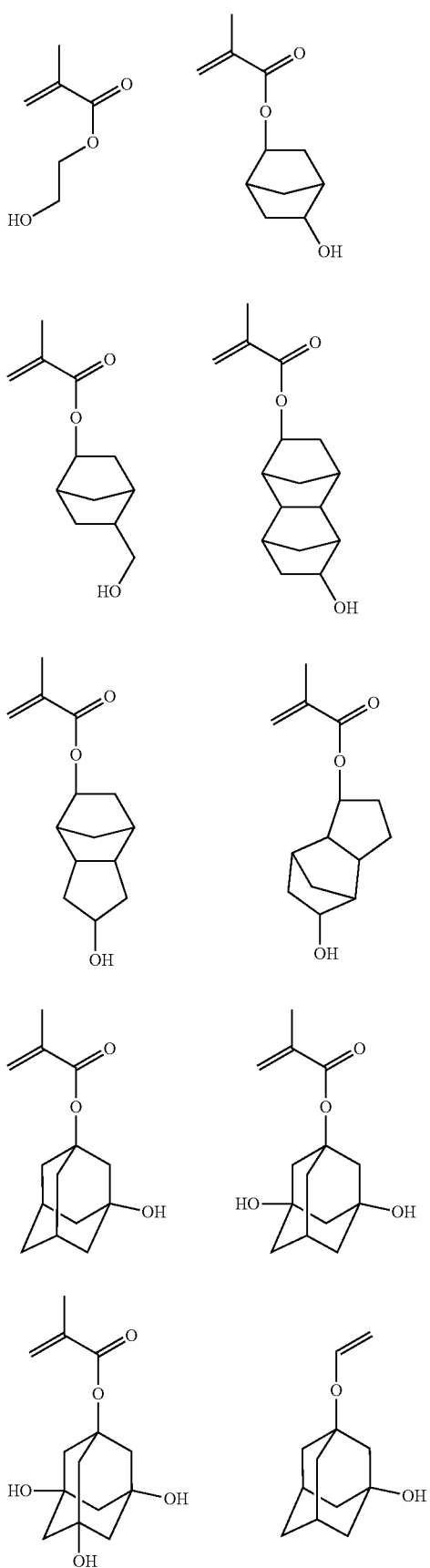
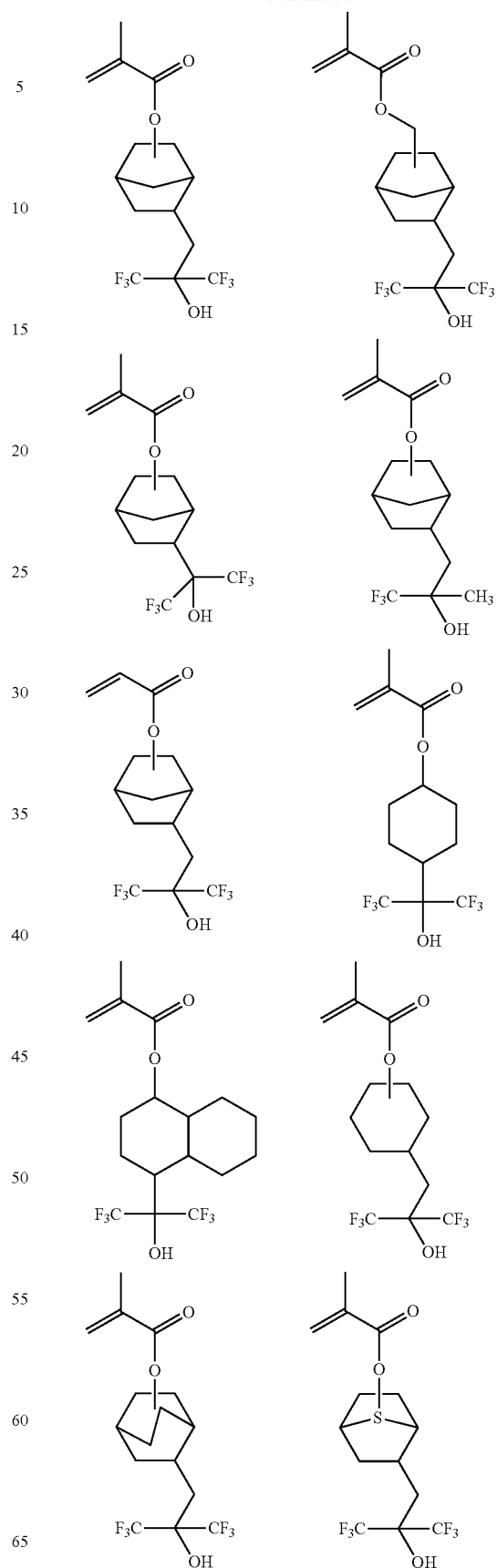

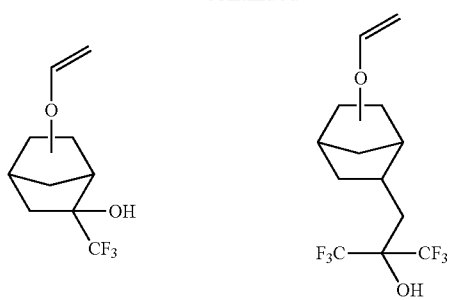
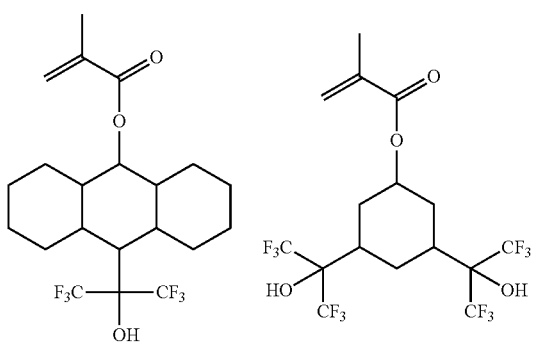
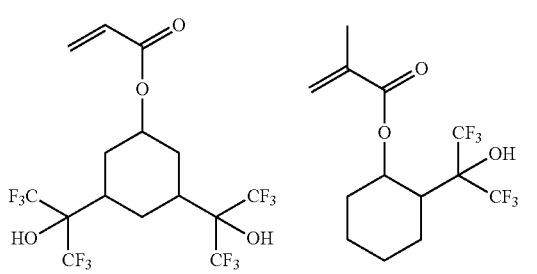
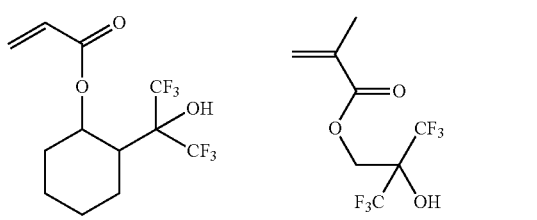
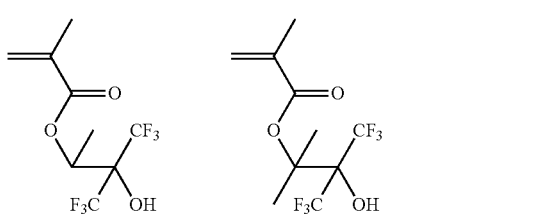
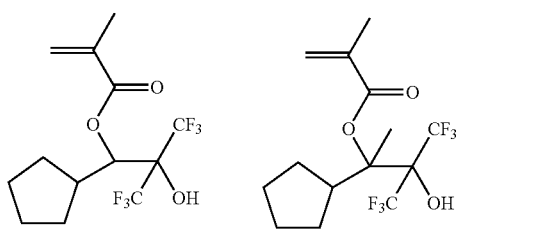
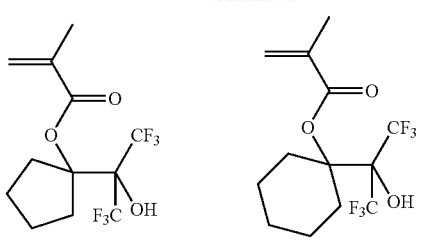
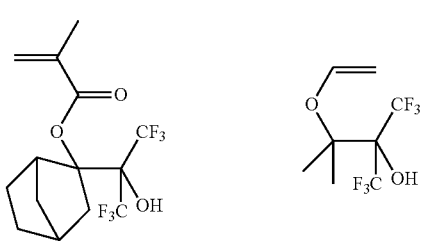
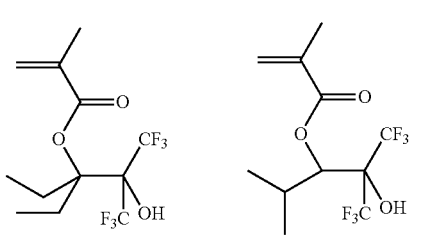
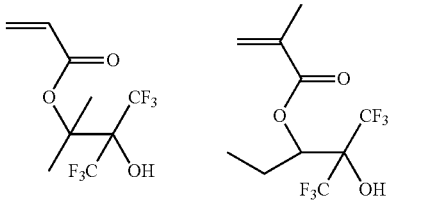
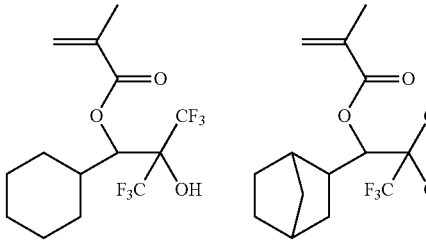
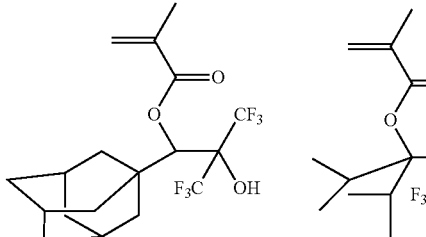
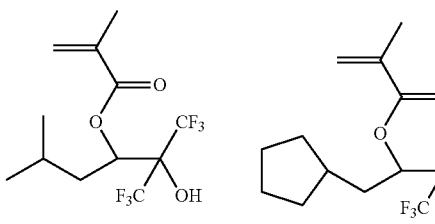

235
-continued
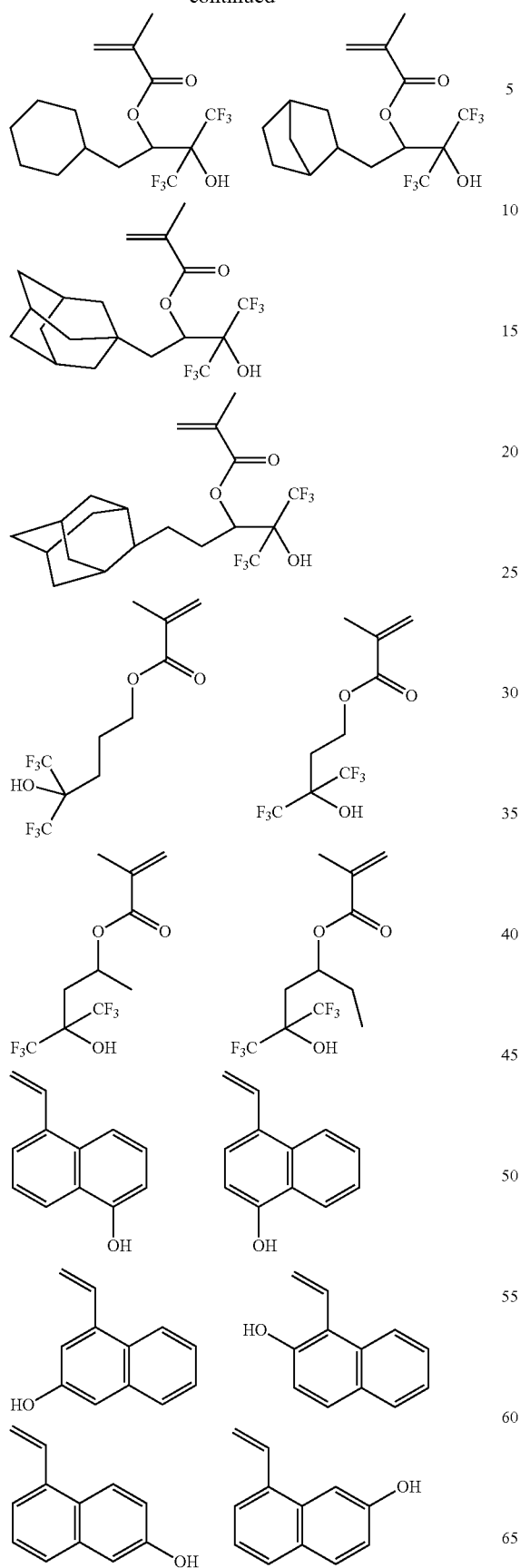
236
-continued
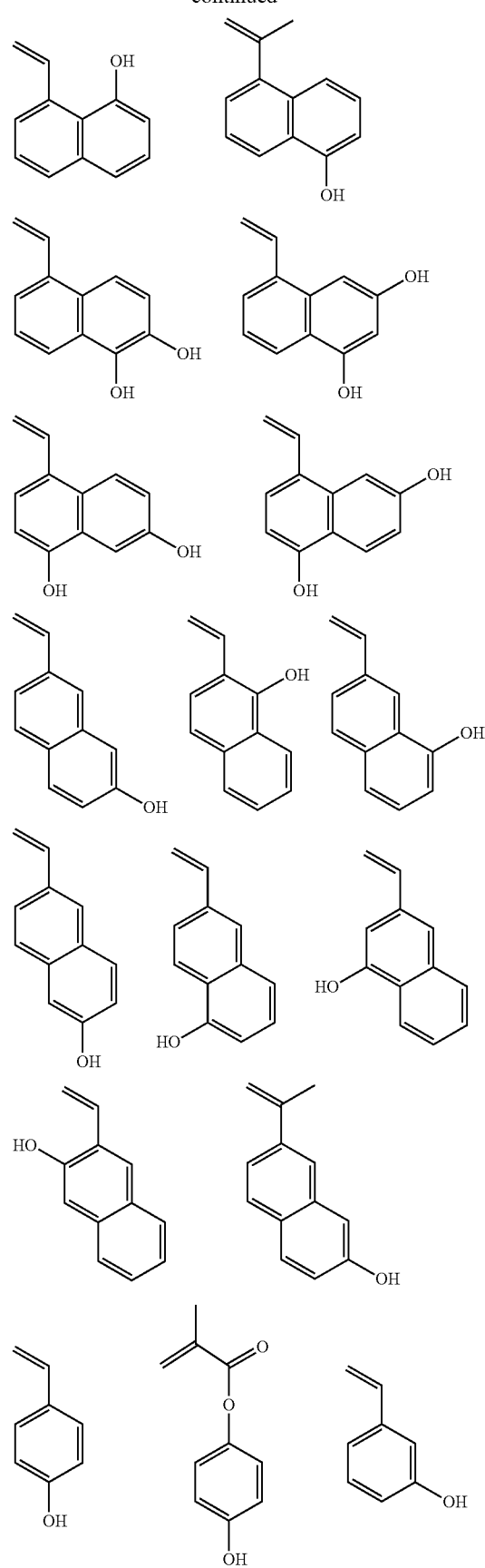

-continued
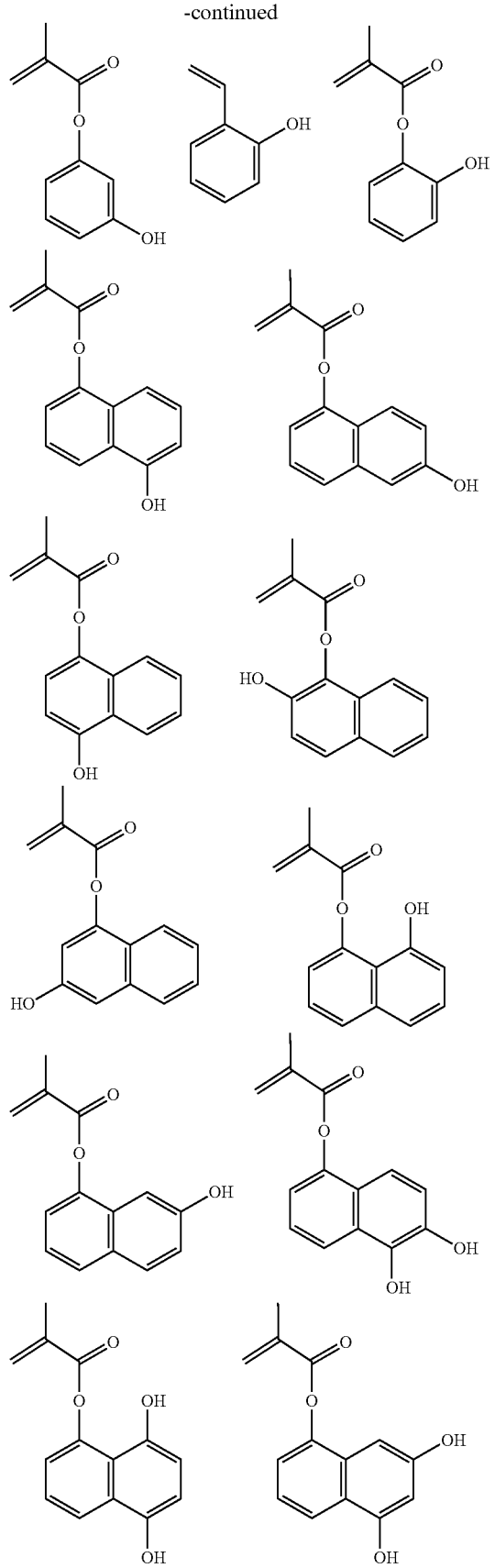
-continued
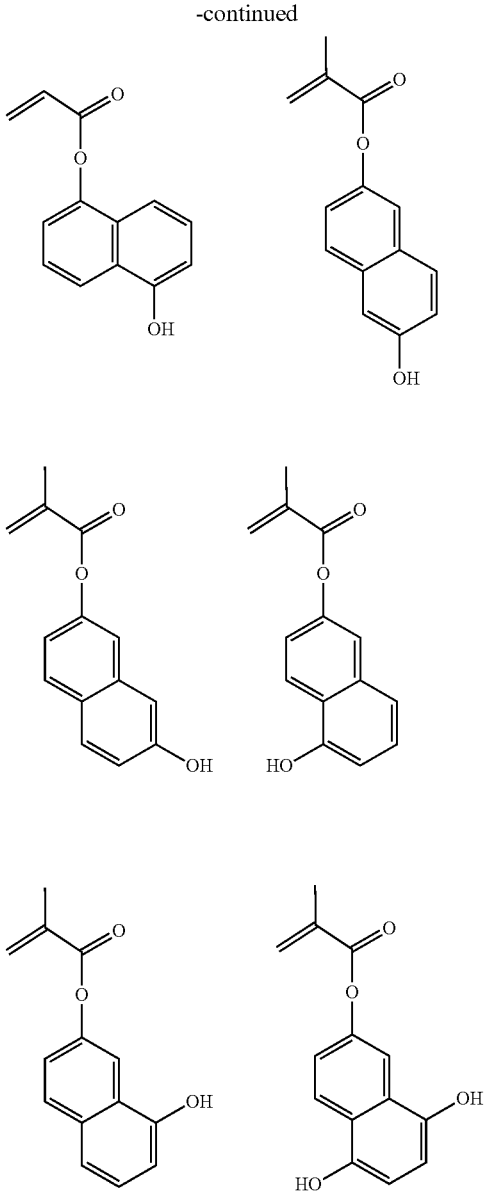
* * * * *